(12) United States Patent
Clark et al.

(10) Patent No.: US 11,101,173 B2
(45) Date of Patent: Aug. 24, 2021

(54) SELF-AWARE AND CORRECTING HETEROGENOUS PLATFORM INCORPORATING INTEGRATED SEMICONDUCTOR PROCESSING MODULES AND METHOD FOR USING SAME

(71) Applicant: Tokyo Electron Limited, Tokyo (JP)

(72) Inventors: Robert Clark, Albany, NY (US);
Jeffrey Smith, Albany, NY (US);
Kandabara Tapily, Albany, NY (US);
Angelique Raley, Albany, NY (US);
Qiang Zhao, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 157 days.

(21) Appl. No.: 16/356,372

(22) Filed: Mar. 18, 2019

(65) Prior Publication Data
US 2020/0083074 A1 Mar. 12, 2020

Related U.S. Application Data

(60) Provisional application No. 62/645,685, filed on Mar. 20, 2018, provisional application No. 62/787,607, (Continued)

(51) Int. Cl.
*H01L 21/67* (2006.01)
*H01L 21/768* (2006.01)
(Continued)

(52) U.S. Cl.
CPC ...... *H01L 21/76879* (2013.01); *G05B 13/027* (2013.01); *G05B 19/41875* (2013.01);
(Continued)

(58) Field of Classification Search
None
See application file for complete search history.

(56) References Cited

U.S. PATENT DOCUMENTS

| | | | |
|---|---|---|---|
| 2002/0194716 A1 | 12/2002 | Berner et al. | |
| 2005/0032250 A1* | 2/2005 | Mui | H01L 22/20 438/14 |

(Continued)

FOREIGN PATENT DOCUMENTS

| | | |
|---|---|---|
| JP | 2003-179120 A | 6/2003 |
| JP | 2009-64726 A | 3/2009 |

OTHER PUBLICATIONS

International Search Report and Written Opinion of the International Searching Authority dated Jul. 5, 2019, in PCT/US2019/022617, filed Mar. 15, 2019.

*Primary Examiner* — Bernard G Lindsay
(74) *Attorney, Agent, or Firm* — Oblon, McClelland, Maier & Neustadt, L.L.P.

(57) ABSTRACT

This disclosure relates to a method for using a high volume manufacturing system for processing and measuring workpieces in a semiconductor processing sequence without leaving the system's controlled environment (e.g., sub-atmospheric pressure). The system includes an active interdiction control system to implement corrective processing within the system when a non-conformity is detected. The corrective processing method can include a remedial process sequence to correct the non-conformity or compensate for the non-conformity during subsequent process. The non-conformity may be associated with fabrication measurement data, process parameter data, and/or platform performance data.

27 Claims, 46 Drawing Sheets

Related U.S. Application Data filed on Jan. 2, 2019, provisional application No. 62/787,608, filed on Jan. 2, 2019, provisional application No. 62/788,195, filed on Jan. 4, 2019.

(51) Int. Cl.

| | | |
|---|---|---|
| *H01L 21/66* | (2006.01) | |
| *H01L 21/677* | (2006.01) | |
| *H01L 21/02* | (2006.01) | |
| *H01L 21/285* | (2006.01) | |
| *H01L 21/311* | (2006.01) | |
| *G05B 13/02* | (2006.01) | |
| *G05B 19/418* | (2006.01) | |
| *C23C 14/24* | (2006.01) | |
| *C23C 14/34* | (2006.01) | |
| *H01J 37/32* | (2006.01) | |

(52) U.S. Cl.
CPC .... *H01L 21/0228* (2013.01); *H01L 21/02271* (2013.01); *H01L 21/28562* (2013.01); *H01L 21/31116* (2013.01); *H01L 21/67023* (2013.01); *H01L 21/67063* (2013.01); *H01L 21/67161* (2013.01); *H01L 21/67167* (2013.01); *H01L 21/67184* (2013.01); *H01L 21/67196* (2013.01); *H01L 21/67225* (2013.01); *H01L 21/67253* (2013.01); *H01L 21/67276* (2013.01); *H01L 21/67288* (2013.01); *H01L 21/67703* (2013.01); *H01L 21/67742* (2013.01); *H01L 21/67745* (2013.01); *H01L 21/7685* (2013.01); *H01L 21/76802* (2013.01); *H01L 21/76831* (2013.01); *H01L 21/76832* (2013.01); *H01L 21/76834* (2013.01); *H01L 21/76897* (2013.01); *H01L 22/12* (2013.01); *C23C 14/24* (2013.01); *C23C 14/34* (2013.01); *G05B 2219/32368* (2013.01); *G05B 2219/45031* (2013.01); *H01J 37/32* (2013.01); *H01L 21/67017* (2013.01); *H01L 21/67207* (2013.01)

(56) References Cited

U.S. PATENT DOCUMENTS

| | | | |
|---|---|---|---|
| 2005/0087873 | A1 | 4/2005 | Wu et al. |
| 2005/0222781 | A1* | 10/2005 | Yue ...................... G05B 13/041 702/30 |
| 2005/0263170 | A1* | 12/2005 | Tannous .................... B08B 5/02 134/1.1 |
| 2006/0245847 | A1* | 11/2006 | Haris ................ H01L 21/67184 414/217 |
| 2007/0196011 | A1 | 8/2007 | Cox et al. |
| 2009/0112520 | A1* | 4/2009 | Lymberopoulos ...... G06F 11/24 702/184 |
| 2010/0267172 | A1 | 10/2010 | Xiao et al. |
| 2011/0110752 | A1* | 5/2011 | Tauchi .............. H01L 21/67766 414/217 |
| 2011/0308453 | A1 | 12/2011 | Su et al. |
| 2012/0185813 | A1 | 7/2012 | Kaushal et al. |
| 2014/0196749 | A1* | 7/2014 | Tang ................ H01L 21/02096 134/7 |
| 2015/0040828 | A1* | 2/2015 | Morisawa ........... C23C 16/4401 118/696 |
| 2015/0079803 | A1* | 3/2015 | Huang ............. H01L 21/02378 438/758 |
| 2015/0372119 | A1 | 12/2015 | Zhang et al. |
| 2016/0090650 | A1* | 3/2016 | Qian ................ C23C 16/45536 427/9 |
| 2017/0018443 | A1* | 1/2017 | Lin .................. H01L 21/67167 |
| 2017/0037513 | A1 | 2/2017 | Haukka et al. |
| 2017/0244070 | A1 | 8/2017 | Bangert et al. |
| 2017/0263466 | A1 | 9/2017 | Ranish et al. |
| 2017/0271149 | A1 | 9/2017 | Heo et al. |
| 2017/0271196 | A1 | 9/2017 | Manna et al. |
| 2017/0350004 | A1 | 12/2017 | Kaufman-Osborn et al. |

* cited by examiner

SELF-AWARE AND CORRECTING HETEROGENOUS PLATFORM INCORPORATING INTEGRATED SEMICONDUCTOR PROCESSING MODULES AND METHOD FOR USING SAME

CROSS-REFERENCE TO RELATED APPLICATIONS

The present application claims the benefit of U.S. Provisional Application No. 62/645,685, filed on Mar. 20, 2018, entitled "Substrate Processing Tool with Integrated Metrology and Method of Using," U.S. Provisional Application No. 62/787,607, filed on Jan. 2, 2019, entitled "Self-Aware and Correcting Heterogeneous Platform incorporating Integrated Semiconductor Processing Modules and Method for using same," U.S. Provisional Application No. 62/787,608, filed on Jan. 2, 2019, entitled "Self-Aware and Correcting Heterogeneous Platform incorporating Integrated Semiconductor Processing Modules and Method for using same," and U.S. Provisional Application No. 62/788,195, filed on Jan. 4, 2019, entitled "Substrate Processing Tool with Integrated Metrology and Method of using," which are incorporated herein by reference in its entirety.

FIELD OF THE INVENTION

The present invention relates to substrate processing, and more particularly, to an integrated substrate processing system and modules configured for performing integrated substrate processing and substrate measurement and metrology in an efficient platform for providing corrective processing.

BACKGROUND OF THE INVENTION

The semiconductor manufacturing industry is evolving through another revolution in the demand for greater yield and the increased complexity of the device structures formed on substrates. Furthermore, the industry is driven by increased computerization and digitization of various processes for device fabrication.

More specifically, in the processing of substrates for forming integrated circuits, it has become more critical to increase yield and increase the efficiency and throughput in the fabrication process. Such efficiency is realized in the reduced time spent in the fabrication process, more accurate and fault-free processes, as well as the reduced costs resulting from such improvements. It is further desirable to determine that the processing steps are proceeding properly, and the various layers and features created are of the proper dimension, alignment and consistency. That is, the sooner a fault can be detected and addressed, such as by being corrected or ameliorated in further processing or the substrate being ejected, the more efficient the process becomes.

Not only must yield be maintained and increased, but it must occur within the fabrication of smaller and more complex devices. For example, as smaller circuits such as transistors are manufactured, the critical dimension (CD) or resolution of patterned features is becoming more challenging to produce. Self-aligned patterning needs to replace overlay-driven patterning so that cost-effective scaling can continue even after the introduction of extreme ultraviolet (EUV) lithography. Patterning options that enable reduced variability, extend scaling and enhanced CD and process control are needed. However, it has become extremely difficult to produce scaled devices at reasonably low cost. Selective deposition, together with selective etch, can significantly reduce the cost associated with advanced patterning. Selective deposition of thin films such as gap fill, area selective deposition of dielectrics and metals on specific substrates, and selective hard masks are key steps in patterning in highly scaled technology.

With such fabrication technologies, it is necessary to monitor the various processes to ensure that the etching and deposition steps are within specification and to detect variations in the processes. Variations in a manufacturing process can include deviations from the intended or designed target specifications for the manufacturing process. Generally, the source of variation can be classified as either a defect, such as particle contamination, or a parametric variation or non-conformity in a pattern or device. Examples of such parametric variations include, a shift in CD, in profile, in depth, in thickness, etc. Such variations can occur as lot-to-lot variations, as substrate-to-substrate (within lot) variations, within-substrate variations, and within-die variations.

Accordingly, device makers currently use a significant amount of fabrication resources qualifying and monitoring the various processes. However, such resources do not contribute to throughput and production, and as a result, are purely costs for the fabricators. Furthermore, when a process goes out of specification, and the features of the substrate are not properly fabricated, it may be necessary to remove the substrate from production. Currently, for qualifying and monitoring fabrication processes, device makers utilize various separate measurement and/or metrology steps. Implementation of metrology steps between process steps, or between important process sequences, is used but currently involves compromising substrate and the process environment control.

Specifically, for current metrology steps, the substrates are removed from the processing environment which is under vacuum, are moved at atmosphere to a metrology system or kiosk, and then returned to the processing environment. With traditional measurements made between processing steps and processing chambers, air and contaminants are exposed to the process and the substrates. This may chemically or otherwise modify one or more of the processed layers. This also introduces uncertainty in any measurements where the substrate has to be brought out of a vacuum or other controlled environment and then introduced into the metrology kiosk. Accordingly, fabricators may not be certain that they are measuring the parameters that they believe they are measuring. As such, with smaller feature sizes in three-dimensional devices/architectures, current monitoring technologies and measurement and metrology processes are inadequate.

Still further, because the metrology process is intrusive to the production cycle and limits the efficiency and throughput of the fabrication process, such metrology steps are minimized so as to not significantly affect throughput. As a result, there can often be a lag in time between a particular process going out of specification and the recognition of that fact. This further detrimentally affects yield.

An additional drawback with current fabrication protocols is the need for constant removal of substrates from platforms, such as systems with deposition modules, and the transport to other platforms, such as systems with etch modules or some other processing modules. Since fabrication involves large sequences of various deposition and etch and other processing steps, the need to remove substrates from a system, transport, re-introduce into another system, reapply vacuum or some other controlled environment introduces further time and cost into the process. The intermediary measurement or metrology processes only exacerbate the time and cost for fabrication. The constant removal from controlled environments as well as the transport further introduces incidences of substrate breakage and contamination as well.

Still further, as may be appreciated, the numerous systems and platforms involved for the deposition steps, etch steps and other processing steps, as well as separate measurement/ metrology systems, creates a significant hardware footprint within clean room environments where real estate or floor space is already expensive and at a premium.

Accordingly, it is desirable to improve substrate processing involving smaller circuit devices and features while maintaining the ability to qualify and monitor the process during production. It is desirable to reduce the number of junctures during fabrication wherein substrates are taken out of vacuum to atmosphere, and then must be subsequently placed back under vacuum in a processing chamber for further processing. It is further desirable to reduce the lag time between the process or substrate going out of specification, and the recognition of that issue by a fabricator or device maker so that they can respond more quickly. It is further desirable to continue to automate equipment and utilize process data to lessen human intervention in the fabrication process, leading to prescriptive optimization and full decision automation.

Therefore, there is an overall need to address the drawbacks in the current fabrication processes and equipment platforms.

SUMMARY OF THE INVENTION

This disclosure relates to a high volume manufacturing platform which incorporates metrology instruments integrated to measure workpieces before and/or after being treated in the platform's processing chambers. Transfer chambers connected to the process chambers are integrated with the metrology sensors to enable measurements being done within the platform, and not a stand-alone metrology tool. The measured data may detect non-conforming workpiece attributes caused by the previous processing on the platform or previous processing tools. The platform may also monitor process performance data to detect process non-conformities based on in-situ or ex-situ processing measurements. The measured and/or monitored data may be used by an active interdiction control system to implement a corrective process sequence to remediate or compensate for the non-conformities.

In one embodiment, the remedial or corrective actions taken by the platform may be implemented when processing a microelectronic workpiece through a plurality of processing modules hosted on a common manufacturing platform. The platform may gather fabrication measurement data of the workpiece which may include an attribute of the workpiece created or formed by the process sequence performed on the common manufacturing platform. The active interdiction control system may analyze the measure data or in-situ process data to detect any non-conformities of the workpiece or the process. The measured data may detect an out-of-tolerance condition for a workpiece attribute, the attribute including, particles, thickness, a critical dimension, a surface roughness, a film or surface composition, a feature profile, a pattern edge placement, a void, a loss of selectivity, a measure of non-uniformity, or a loading effect, or any combination of two or more thereof. When non-conformities are detected, the active interdiction system will interdict the process sequence to execute corrective processing within the common manufacturing platform. In some instances, the corrective action includes exposing the workpiece to a remedial process sequence to correct the non-conformity. Alternatively, the corrective action includes exposing the workpiece to an adjustment process sequence to modify the non-conformity or compensate for the non-conformity.

BRIEF DESCRIPTION OF THE DRAWINGS

A more complete appreciation of embodiments of the invention and many of the attendant advantages thereof will become readily apparent with reference to the following detailed description, particularly when considered in conjunction with the accompanying drawings, in which.

DETAILED DESCRIPTION OF EMBODIMENTS

Figure 1:
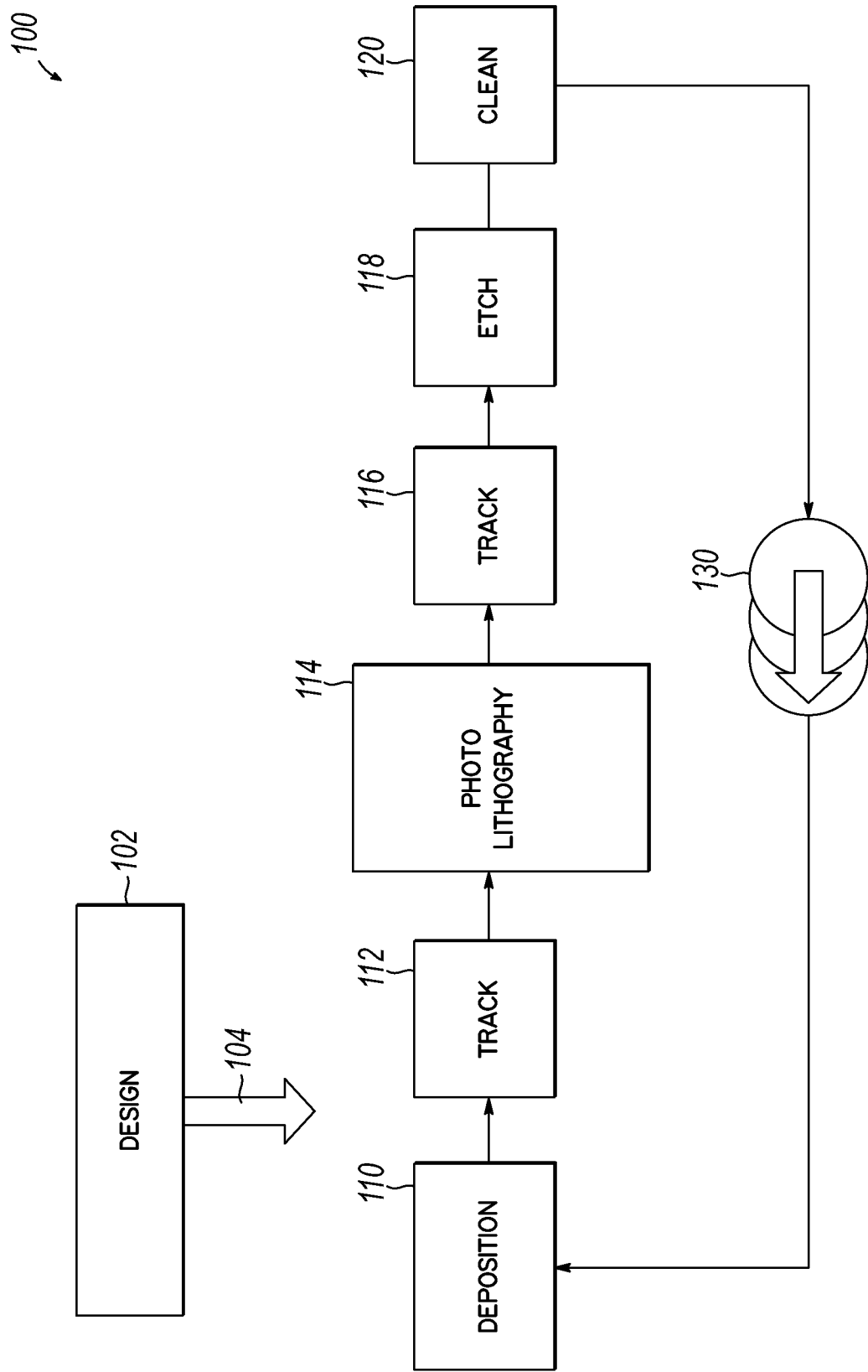
FIG. 1 is a schematic illustration of a semiconductor fabrication process flow for implementing the invention.

According to embodiments described herein, equipment modules are integrated on a common manufacturing platform to facilitate critical, end-to-end process flows without disrupting a vacuum or controlled environment, otherwise not achievable on conventional platforms. The common platform integrates heterogeneous equipment and processing modules with metrology or measurement modules that monitor substrate fabricator progress between process steps without disrupting the vacuum or controlled environment. The integrated metrology or measurement components, together with in-situ equipment module diagnostics and virtual metrology, collects data on-wafer, and collects equipment data upstream and downstream within the process sequence flow. The data is combined with equipment and process control models to create actionable information for predicting and detecting faults, predicting maintenance, stabilizing process variations, and correcting processes to achieve productivity and yield. To establish the equipment and process control models, all data is integrated, i.e., data from equipment module logs, transfer module logs, platform logs, fab host, etc., and combined with analytical techniques, including deep learning algorithms, to understand the relationships between equipment and process control parameters, and the process result on the substrate or wafer. An active interdiction control system that might be hosted in part in the common platform performs corrective processing in upstream and downstream processing modules to address detected non-conformities, defects, or other variations.

In accordance with the invention, data utilization is provided with a hierarchical knowledge base built on equipment, data, and knowledge, established process technology, sensors and metrology data including virtual metrology data to monitor equipment and process status. Data process technology and algorithm know-how, and process and equipment models are used to link equipment and process control parameters to yield and productivity. Holistic equipment and process control models can be developed. Process simulation, measurement and metrology data and diagnostics, and data analysis leads to predictive and preventive processing and action that can improve equipment up-time, optimize process, and control process variations. This improves yield and productivity. The invention can use the data collected for providing virtual metrology (VM), run-to-run (R2R) control to monitor and control process variations, statistical process control (SPC) to alert operators that equipment and/or process is operating outside control limits, advanced process control (APC), fault detection and classification (FDC), fault prediction, equipment health monitoring (EHM), predictive maintenance (PM), predictive scheduling, yield prediction, among other advantages.

Embodiments of the invention describe a platform of processing modules and tools configured for performing integrated substrate processing and substrate metrology, and methods of processing a substrate or workpiece. Herein, the workpieces that are the subject of processing may be referred to as 'workpiece' "substrate" or "wafer." The workpieces being processed remain under vacuum. That is, measurement/metrology processes and modules are integrated together with processing modules and systems, processing chambers and tools, and overall manufacturing platforms to be utilized before, during or after processing, in a vacuum environment for collecting data associated with an attribute on a workpiece, such as attributes of the workpiece surfaces, features, and devices thereon. The collected measurement/metrology data is then utilized to affect the processing steps, the processing module operation, and overall processing system, in real time with respect to the processing steps. The invention will correctively adapt or tune, or otherwise affect, one or more of the processing steps/processing modules of the system to keep the substrate in specification or to correct features or layers out of specification. The system steps and modules are not only affected going forward in the processing, but also previous processing steps and modules may be adapted through feedback in the system to correct a processing step or process chamber for future substrates. The invention may process the substrate through the most recent processing step, such as an etch step or film forming or deposition step, and then immediately collect measurement/metrology data. As used herein, measurement data/steps and metrology data/steps are referred to synonymously to generally mean data measured in accordance with the invention. The data is then processed to detect non-conformities or defects, and a future processing step may be affected to take any necessary corrective action to address a substrate found to be out of specification or defective in some manner. A future processing step, for example, might include returning the substrate to the immediately previous processing module, affecting a future processing step in another processing chamber to address the measurement/metrology data or introducing one or more additional processing steps in the processing sequence to bring the substrate back into specification. If the metrology data determines that the substrate may not be further processed to bring it into specification or to correct a non-conformity it might be ejected from the manufacturing platform much earlier in the process to avoid unnecessary further processing.

For purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention but does not denote that it is present in every embodiment. Thus, the phrases such as "in one embodiment" or "in an embodiment" that may appear in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-oninsulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein the term "workpiece" may more generally refer to a composition of materials or layers that are formed on a substrate during one or more phases of a semiconductor device manufacturing process, the workpiece ultimately comprising the semiconductor device(s) at a final stage of the processing. In any regard, the terms 'workpiece" "substrate" or "wafer" are not limiting to the invention.

The present embodiments include methods that utilize a common manufacturing platform in which multiple process steps are performed on the common platform within a controlled environment, for example, without breaking vacuum between operations. The integrated end-to-end platform includes both etching modules and film-forming modules and is configured to transfer a workpiece from one module to another while maintaining the workpiece in a controlled environment, e.g., without breaking vacuum or leaving an inert gas protective environment, and thus avoiding exposure to an ambient environment. Any of a number of processes may be carried out on the common manufacturing platform, and the integrated end-to-end platform will enable high-volume manufacturing at reduced cost with improvement to yield, defectivity levels and EPE.

As used herein, a "film-forming module" refers to any type of processing tool for depositing or growing a film or layer on a workpiece in a process chamber. The film-forming module may be a single wafer tool, a batch processing tool, or a semi-batch processing tool. The types of film deposition or growth that may be performed in the film-forming module include, by way of example and not limitation, chemical vapor deposition, plasma-enhanced or plasma-assisted chemical vapor deposition, atomic layer deposition, physical vapor deposition, thermal oxidation or nitridation, etc., and the process may be isotropic, anisotropic, conformal, selective, blanket, etc.

As used herein, an "etching module" refers to any type of processing tool for removing all or a portion of a film, layer, residue or contaminant on a workpiece in a process chamber. The etching module may be a single wafer tool, a batch processing tool, or a semi-batch processing tool. The types of etching that may be performed in the etching module include, by way of example and not limitation, chemical oxide removal (COR), dry (plasma) etching, reactive ion etching, wet etching using immersion or non-immersion techniques, atomic layer etching, chemical-mechanical polishing, cleaning, ashing, lithography, etc., and the process may be isotropic, anisotropic, selective, etc.

As used herein, "module" generally refers to a processing tool with all of its hardware and software collectively, including the process chamber, substrate holder and movement mechanisms, gas supply and distribution systems, pumping systems, electrical systems and controllers, etc. Such details of the modules are known in the art and therefore not discussed herein.

"Controlled environment" as used herein refers to an environment in which the ambient atmosphere is evacuated and either replaced with a purified inert gas or a low-pressure vacuum environment. A vacuum environment is well below atmospheric pressure and is generally understood to be 100 Torr or less, for example 5 Torr or less.

FIG. 1 shows an example of a typical semiconductor fabrication process 100 for reference that may be improved with the present invention. Before the fabrication process itself, the overall design 102 of the semiconductor workpiece or substrate and the microelectronic devices formed therein is produced. A layout is produced from the design, and the layout includes sets of patterns that will be transferred to the stacked layers of materials that are applied to the semiconductor workpiece during its fabrication in a processing sequence to form the various circuits and devices on the substrate. Since the design/processing sequence 102 affects and informs various portions of the fabrication process, it is depicted with a general arrow 104 pointing to the fabrication process rather than to particular steps thereof.

The fabrication process 100 illustrates one exemplary process flow or processing sequence which is used several times to deposit or form films on a substrate and pattern them using a variety of lithography and etch techniques. Such general fabrication steps and processes are known to a person of ordinary skill in the art and each process may have a processing module or tool associated therewith. For example, referring to FIG. 1 the method may include a film-forming or deposition process 110 to form one or more layers on the workpiece. The layer may then be coated with a light sensitive material in a track process 112 before being exposed to a patterned wavelength of light using a photolithography process 114. The light sensitive material is then developed using another track process 116 to form a pattern in the light-sensitive material which exposes the underlying workpiece or film. Next, the exposed pattern may be used as a template to remove exposed portions of the underlying workpiece or film which are removed in a pattern by using a removal or etch process 118. In this way, the pattern exposed from the photolithography process 114 is transferred to the workpiece or to one or more of the films overlaying the workpiece. In some instances, the workpiece may be cleaned, using a cleaning process 120, to remove the light sensitive material or clean the newly patterned features in preparation for subsequent processing.

For film-forming or deposition processes, the term "film-forming" will generally be used herein for consistency. For film removal, the term "etch" will be used and for a cleaning removal process, the term "clean" will be used. The figures may use other designations as applicable for illustrative clarity or convenience.

As depicted, the example fabrication process 100 represents the fabrication of a single layer on a semiconductor workpiece. Arrow 130 indicates that the fabrication process involves multiple passes through the processing steps in a sequence that results in the multiple stacking of layers of patterns to form devices on the substrate. While the fabrication of a single layer is described in a particular order herein, it is not uncommon for some steps to be skipped and other steps repeated during the fabrication of a single layer. Furthermore, more steps than film-forming, etch, and clean may be utilized as would be understood by a person of ordinary skill in the art. Still further, each of the steps of a film-forming or etch process may include various specific steps. Therefore, the exemplary illustrative process of FIG. 1 is not limiting with respect to the present invention.

For example, the noted deposition process 110 employs a deposition module/tool that grows, coats, or otherwise forms or transfers a material film onto the workpiece. A deposition process may employ one or more technologies and methods to accomplish this task. Examples of film-forming or deposition technologies include physical vapor deposition (PVD), chemical vapor deposition (CVD), electrochemical deposition (ECD), molecular beam epitaxy (MBE), atomic layer deposition (ALD), self-assembled monolayer (SAM) deposition and others. Moreover, these deposition techniques may be complemented or enhanced by the creation of plasma to affect the chemical reactivity of the processes occurring at the substrate surface.

The photolithography process 114 employs a photolithographic module/tool that is used to transfer a pattern from a photomask to the surface of the workpiece. The pattern information is recorded on a layer of photoresist which is applied on the workpiece. The photoresist changes its physical properties when exposed to light (often ultraviolet) or another source of illumination (e.g., X-ray). The photoresist is either developed by (wet or dry) etching or by conversion to volatile compounds through the exposure itself. The pattern defined by the mask is either removed or remains after development, depending on whether the type of resist is positive or negative. For example, the developed photoresist can act as an etching mask for the underlying layers.

Typically, the track process 112 includes using a track module/tool which prepares the workpiece for the photolithography process or exposure. This may involve cleaning of the workpiece or add a coating or film thereon. The coating may include a light-sensitive material, typically referred to as photoresist that is altered by the light exposed through a mask in the photolithography process 114. Similarly, the track process 116 may use a tool that handles the workpiece after the photolithography process 114, typically developing the photoresist to form the pattern that may expose portions of the underlying workpiece. Often, this involves post-lithographic cleaning or preparation for the next process step in the fabrication.

The etch process 118 includes an etching module/tool that is used to remove material selectively on the surface of the workpiece in order to create patterns thereon. Typically, the material is selectively removed either by wet etching (i.e., chemical) or dry etching (i.e., chemical and/or physical). An example of dry etching includes, but is not limited to, plasma etching. Plasma etching involves forming plasma of an appropriate gas mixture (depending on the type of film being etched) that is exposed to the workpiece. The plasma includes charged (ions and free electrons) and neutral (molecules, atoms, and radicals) species in the gas-phase that kinetically interact with the substrate or layer to remove portions of the substrate or layer, particularly the portions exposed by an overlying photolithography pattern.

The clean process 120 may include a cleaning module/tool that is used to clean the workpiece (e.g., remove photoresist) and/or prepare the workpiece for the application or deposition of the next layer. Typically, the cleaning process removes particles and impurities on the workpiece and can be a dry clean process or a wet clean process.

Figure 2:
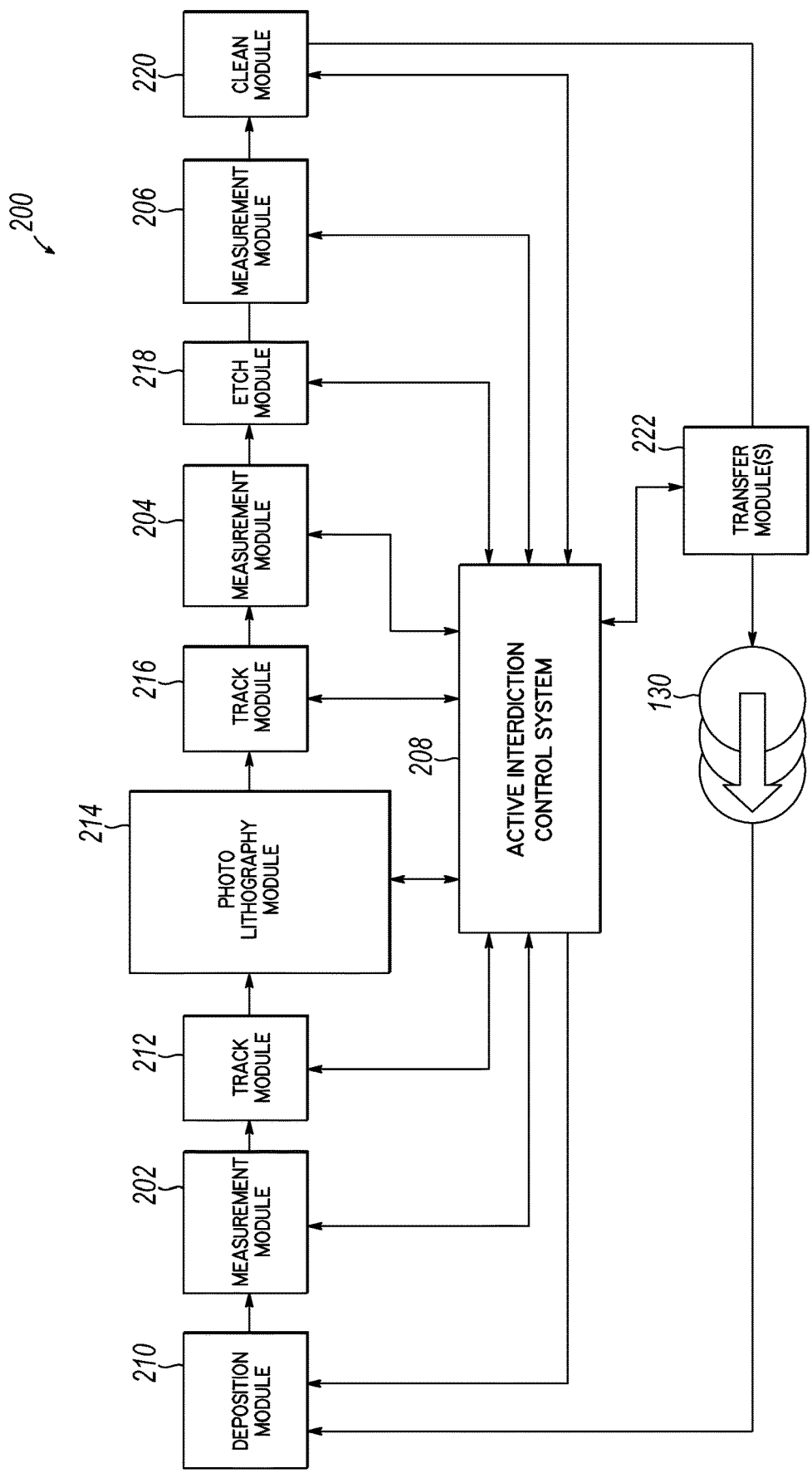
FIG. 2 is a schematic illustration of a semiconductor fabrication process flow that implements an embodiment of the invention.

In accordance with one embodiment the invention, fabrication measurement or metrology data is captured after one or more of the various substrate fabrication processes as shown in FIG. 1. As used herein, the captured data from a workpiece is referred to as measurement data or metrology data. The measurement data is captured utilizing one or more measurement modules or metrology modules that can be incorporated within separate metrology chambers on a common manufacturing platform as discussed herein or using measurement module/metrology module incorporated within a workpiece transfer module that moves workpiece between one or more of the processing modules that perform the various steps as set forth in FIG. 1. In accordance with one feature of the invention, the substrate is maintained in a controlled environment, such as under vacuum, during the capture of the measurement/metrology data. A measurement/metrology module/tool as utilized within a manufacturing platform such as shown in FIG. 2 is designed to measure data associated with an attribute of a workpiece or attributes regarding features of a workpiece to measure something otherwise measurable such as, for example, the material layers thereon, the patterns imparted thereon, or dimensions and alignment for the various devices fabricated on the substrate, for example. The measurement process, as performed by a measurement module/tool, may be implemented with one or more of a plurality of workpiece processing steps performed on a common manufacturing platform. Furthermore, a metrology measurement module or tool might be employed at various times within a process and/or at multiple locations within a common manufacturing platform based upon where data is desired to improve or correct the process. For example, the location of a measurement module might be located within a platform proximate to certain processing modules or following certain processes that might be prone to error in order to quickly assess the specifications regarding one or more layers and the attributes of features being fabricated on a workpiece.

In accordance with one embodiment of the invention, a semiconductor manufacturing platform for the processing of a workpiece and for the fabrication of electronic devices includes a plurality of processing modules that are hosted on a common manufacturing platform. The processing modules are configured for facilitating different processes and manipulating materials on a workpiece in a plurality of processing steps according to a defined processing sequence. More specifically, the processing modules may include one or more film-forming modules for depositing material layers on a workpiece and one or more etch modules for selectively removing material layers. Other modules such as cleaning or tracking or photo-lithography modules may also be included in the common platform. As used herein, the term "processing module" or "module" is used to refer to a processing system that will generally include one or more processing chambers that will contain one or more workpieces and also the supporting and surrounding infrastructure and components for the processing, such as gas supplies, dispense systems, RF (radio frequency) power supplies, DC (direct current) voltage supplies, biasing power supplies, substrate supports, substrate clamping mechanisms, substrate and chamber component temperature control elements, etc.

On the common platform, one or more metrology or measurement modules is hosted with the processing modules. The measurement module is configured to provide measurement data associated with one or a plurality of attributes of a workpiece. To that end, the measurement modules includes one or more inspection systems that are operable for measuring data associated with an attribute of the workpiece. Generally, the measurement modules will be positioned and arranged in the common platform and with the processing modules to make measurements before and/or after the workpiece is processed in a processing module in the platform.

As disclosed herein the term "metrology module" or "measurement module" refers to a module/system/sensor/tool that can make measurements on a workpiece to detect or determine various non-conformities or variations on the workpiece, such as parametric variations, or to detect or determine defects on the workpiece, such as a contamination of some kind. As used herein, the term "inspection system" will generally refer to the tool or system of a measurement process or module that measures and collects data or signals associated with the measurement. The measurement modules will make measurements and provide data for use in the processing platform as disclosed further herein. For consistency herein, the term "measurement module" will be used but that is not limiting and generally refers to measurement or metrology or sensing tools used to detect and measure attributes of a workpiece that are indicative of the processing of the workpiece and the layers and devices being formed thereon.

To move workpieces in a platform and between the various processing modules, the common manufacturing platform will generally incorporate one or more workpiece transfer modules that are hosted on the common platform and are configured for the movement of the workpiece between the processing modules and the measurement module(s). A measurement module might be coupled with the workpiece transfer module similar to a processing module. In some embodiments of the invention, as disclosed herein, a measurement module or the inspection system associated therewith is incorporated with or inside a transfer module to provide for measurement or metrology as the workpiece is moved between processing modules. For example, a measurement module, or a portion thereof, might be positioned inside an internal space of the transfer module. Herein, the combination transfer and measurement apparatus will be referred to as a transfer measurement module.

In one embodiment of the invention, the common platform including both processing chambers and measurement modules is actively controlled by a system that processes the measured data associated with an attribute on the workpiece and uses the measured data for controlling movement and processing of the workpiece in a processing sequence. In accordance with the invention, the control system uses measured data and other data to perform corrective processing based in part on the measured data, to provide active interdiction of the processing sequence to correct non-conformities or defects. More specifically, an active interdiction control system is hosted on the common manufacturing platform and is configured to perform corrective processing based in part on the measured data, wherein the corrective processing of the workpiece might be performed in the processing modules of the platform that are upstream or downstream in the process sequence to address situations where non-conformities or defects are detected. In an embodiment of the invention, the workpiece is maintained in a controlled environment, such as under vacuum, for example. That is, on the common manufacturing platform, the processing modules and the measurement module operate in a controlled environment, and the workpiece transfer module transfers the workpiece between the plurality of processing modules in the processing sequence and one or more measurement modules without leaving the controlled environment.

Figure 3:
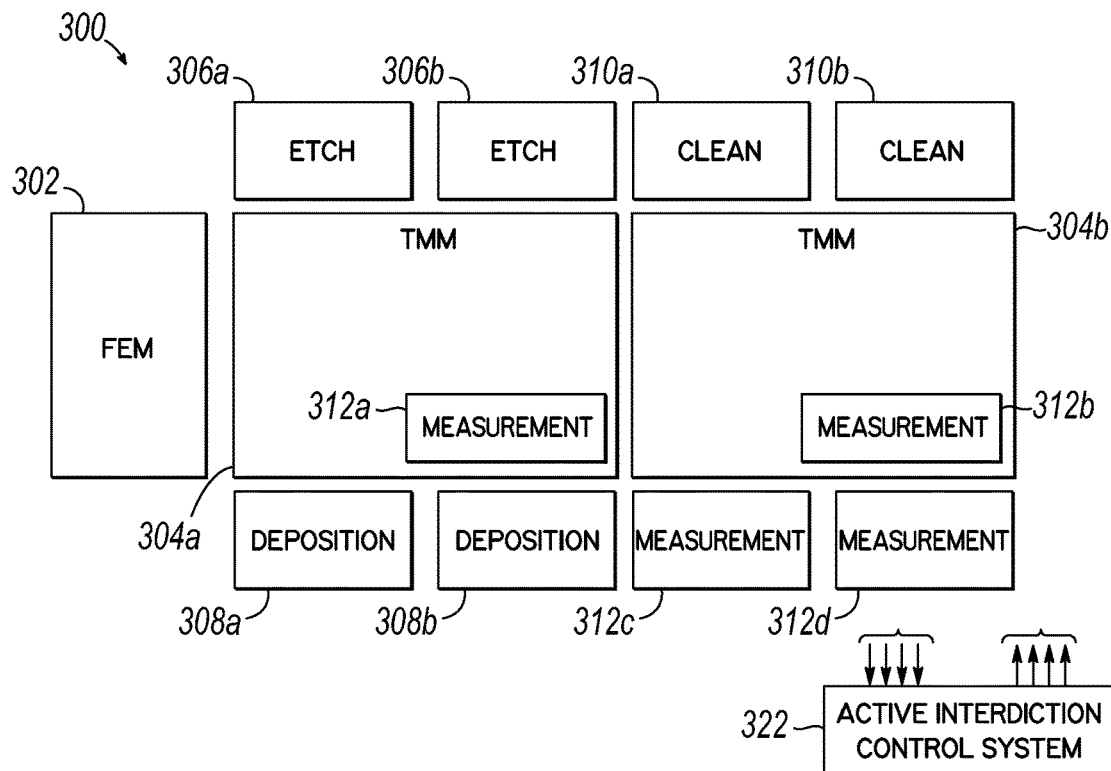
FIG. 3 is a schematic illustration of a semiconductor fabrication platform in accordance with an embodiment of the invention.

FIGS. 2 and 3 illustrate exemplary systems 200, 300 that incorporate a common platform with multiple processing modules, one or more measurement modules and one or more transfer modules coupled with an active interdiction control system. The systems enhance the yield of functional microelectronic devices produced from semiconductor fabrication in accordance with the invention as described herein. FIG. 2 diagrammatically illustrates an exemplary system 200 that facilitates the measurement of metrology data and use of the data for the amelioration or correction of systemic layer or feature non-conformities or defects during semiconductor fabrication in accordance with the invention as described herein. The exemplary system 200 includes various process modules to perform the various processes of the semiconductor fabrication method 100 described above and shown in FIG. 1. In FIG. 2, the various processes are reflected by different noted modules that perform a task or process related to the fabrication along with measurement modules and transfer modules under the control of an active interdiction system.

As depicted, the system of common platform 200 shows the interaction of the platform rather than a particular physical layout. Platform 200 includes one or more processing modules for the various processes of a semiconductor fabrication process such as deposition modules 210, etch modules 218, clean modules 220, track modules 212, 216, and photolithography modules 214. As may be appreciated, one or more modules might be incorporated into a common platform in various ways and therefore, the figures are schematic rather than indicative of how the elements/modules are incorporated onto a platform. The system of platform 200 further includes one or more metrology or measurement modules 202, 204, 206 for capturing measurement data as well as an active interdiction control system 208 using the captured measurement data to perform corrective processing based at least in part on the measured data for improving the fabrication process. The active interdiction control system is coupled with the various measurement modules and will process measured data associated with attributes on the workpiece and use the measured data to detect non-conformities on a workpiece. The active interdiction control system then controls movement and processing of the workpiece to provide correction in the processing sequence or "corrective processing."

The metrology technologies described herein may be incorporated with only one part/portion of the exemplary platforms 200, 300, or with multiple parts/portions of the exemplary platforms 200, 300. That is, the technologies described here may, for example, be incorporated around only one process or one process tool (e.g., the etch module 218). Alternatively, for example, active interdiction technologies described herein may be implemented for multiple processes and tools and systems in the process platforms 200, 300. For example, the corrective processing is performed, at least in part via the operation of one or more processing modules upstream or downstream in the process sequence.

As used herein, the term "active interdiction" refers generally to the control system as implemented for capturing measurement/metrology data in real time with respect to various fabrication processes to obtain data on workpiece attributes and thereby detect non-conformities or defects and the corrective aspects of the control to correct or ameliorate the non-conformities or defects. The active interdiction control system uses the data for correction and amelioration of various non-conformities in the semiconductor fabrication process by actively varying the processing sequence and/or the operation of modules that perform process steps. Thus, the active interdiction control system also interfaces with one or more transfer modules 222 used to move workpieces through the process. The active interdiction control system 208 as shown in FIGS. 2 and 3 coordinates the data collection and data analysis and detection of non-conformities with the fabrication process and further directs the actions of multiple processing tools and processing chambers so as to address the non-conformities or defects that are detected. The active interdiction control system is implemented generally by one or more computer or computing devices as described herein that operate a specially designed sets of programs such as deep learning programs or autonomous learning components referred to collectively herein as active interdiction components. As may be appreciated, the active interdiction control system may incorporate multiple programs/components to coordinate the data collection from various measurement modules and the subsequent analysis. The system 208 interfaces with the multiple processing modules in a manufacturing platform in order to address various measured non-conformities/defects to correct or ameliorate the non-conformities/defects. The active interdiction control system will thereby control one or more of the processing modules and the processing sequence to achieve the desired results of the invention.

The present invention also incorporates one or more transfer modules 222 within the common platform for transferring workpieces between the various processing modules according to the defined processing sequence. To that end, the active interdiction control system also controls the transfer modules in order to move the workpieces to upstream and/or downstream processing modules when non-conformities/defects are detected. That is, depending upon what is detected, the system of the invention may move the work piece further along in the processing sequence, or may go back and direct the workpiece to an upstream processing module to correct or otherwise address a detected non-conformity or defect. As such, feedforward and feedback mechanisms are provided through the transfer modules to provide the active interdiction of the invention. Furthermore, the processing sequence might be affected upstream or downstream for future workpieces.

The active interdiction features of the invention improve performance, yield, throughput, and flexibility of the manufacturing process using run-to-run, wafer-to-wafer, within the wafer and real-time process control using collected measurement/metrology data. The measured data is collected, in real time during the processing, without removing the workpiece/substrate/wafer from the processing environment. In accordance with one feature of the invention, in a common platform, the measurement data may be captured while the substrate remains in a controlled environment, such as under vacuum, for example. That is, the workpiece transfer module(s) are configured for transferring the workpiece between the plurality of processing modules and the measurement modules without leaving the controlled environment. The active interdiction control can provide a multivariate, model-based system that is developed in conjunction with feed-forward and feedback mechanisms to automatically determine the optimal recipe for each workpiece based on both incoming workpieces and module or tool state properties. The active interdiction control system uses fabrication measurement data, process models and sophisticated control algorithms to provide dynamic fine-tuning of intermediate process targets that enhance final device targets. The interdiction system enables scalable control solutions across a single chamber, a process tool, multi-tools, a process module and multi-process modules on a common manufacturing platform using similar building blocks, concepts, and algorithms as described herein.

FIG. 3 is a schematic diagram of another system for implementing an embodiment of the present invention on a common manufacturing platform. The platform 300 incorporates a plurality of processing modules/systems for performing integrated workpiece processing and workpiece measurement/metrology under the control of an active interdiction control system according to embodiments of the invention. FIG. 3 illustrates an embodiment of the invention wherein one or more substrate measurement modules are coupled together with one or more workpiece processing modules through one or more transfer modules. In that way, in accordance with features of the invention, an analysis may be made of the workpiece to provide the measurement data associated with an attribute of the workpiece, such as regarding material properties of the workpiece and the various thin films, layers and features that are formed on the workpiece while the workpiece remains within the processing system and platform. As discussed herein, measurements and analysis may be made immediately upon completion of processing steps, such as an etch or deposition step, and the measurement data gathered may be analyzed and then used within the common platform processing system to address any measurements or features that are out of specification or non-conformal or represent a defect with respect to the workpiece design parameters. The workpiece does not need to be removed from the common processing or manufacturing platform and if desired, can remain under the controlled environment.

Referring to FIG. 3, a common manufacturing platform 300 in accordance with the invention is diagrammatically illustrated. Platform 300 includes a front end module 302 for introducing one or more workpieces into the manufacturing platform. As is known, the front end module (FEM) may incorporate one or more cassettes holding the workpieces. The front end module may be maintained at atmospheric pressure but purged with an inert gas to provide a clean environment. One or more of the substrates may then be transferred into a transfer module 304a, such as through one or more load lock chambers (not shown) as discussed herein. The transfer modules of FIG. 3 are transfer measurement modules (TMM) that include measurement tools or inspection systems integrated therein for capturing data from a workpiece. Multiple TMM's, 304a, 304b may be interfaced for providing movement of a workpiece through a desired sequence. The transfer measurement modules 304a, 304b are coupled with a plurality of processing modules. Such processing modules may provide various different processing steps or functions and may include one or more etch modules 306a, 306b, one or more deposition modules 308a, 308b, one or more cleaning modules 310a, 310b, and one or more measurement modules 312a, 312b, 312c, 312d. In accordance with embodiments of the invention as disclosed further herein, measurement modules may be accessed through the transfer modules 304a, 304b before or after each processing step. In one embodiment, the measurement modules, such as 312c, 312d are located outside of the transfer modules 304a, 304b and are accessed to insert and receive workpieces similar to the various processing modules. Alternatively, measurement modules or at least a portion thereof such as modules 312a, 312b may be located in a respective transfer module. More specifically, all or a portion of a measurement module 312a, 312b is located in transfer module 304a, 304b to define a measurement region where a workpiece might be positioned for measurement during a transfer process. The measurement region is located in a dedicated area of the transfer module and is accessible by the transfer mechanism of a module for positioning the workpiece. As noted, this makes the transfer module essentially a transfer measurement module (TMM) as discussed herein.

Generally, the transfer module defines a chamber therein that houses a transfer robot that is capable of moving substrates, under vacuum, through various gate valves and access or transfer ports into various processing modules or measurement modules. By maintaining the measurement modules on the common manufacturing platform 300, they are readily accessed, such as between one or more of the processing steps to provide the necessary measured analytical data on-the-fly that will be used to address any substrates out of specification or otherwise non-conformal with the substrate design plans for a particular workpiece or to address detectable defects. In that way, real time data is provided to allow a fabricator to recognize problems early in the system so that remedial action may be taken in the current processing sequence, such as in a following processing step, in a previous processing step, and/or in a future processing step depending upon the captured data and the detected non-conformities or defects. In that way, productivity and efficiency may be increased, process monitoring overhead may be reduced, and wasted product, in the form of rejected or ejected substrates may be reduced. This all provides a significant cost savings to a fabricator or device maker.

Figure 4:
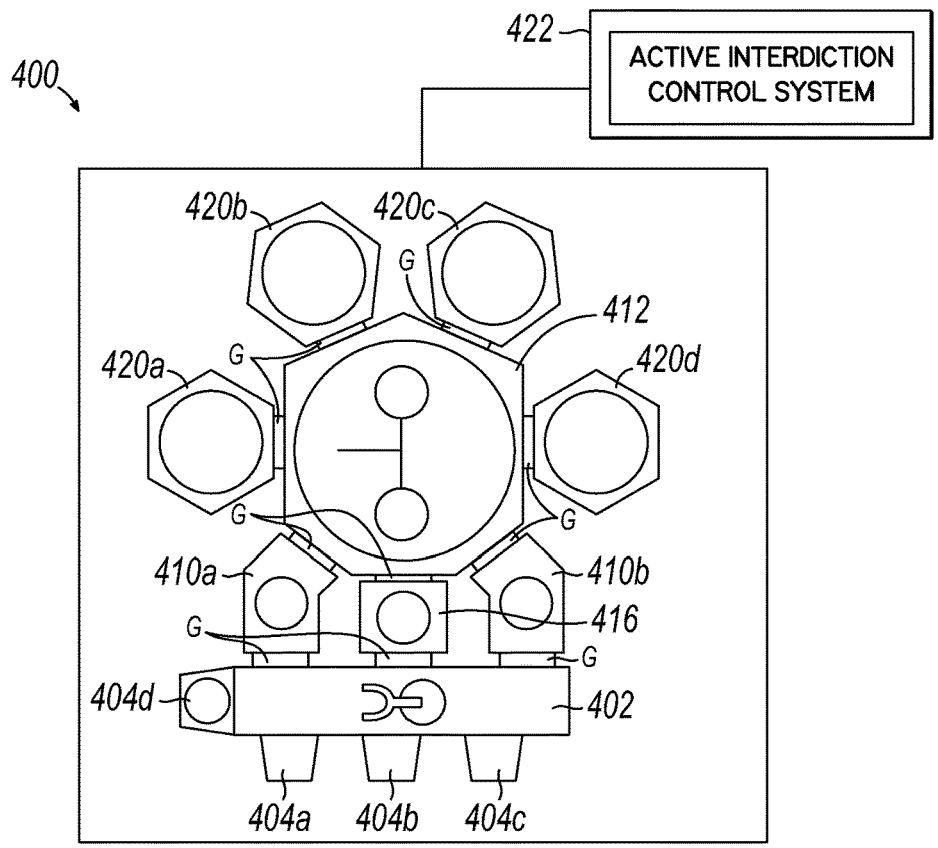
FIG. 4 is a top view of a common platform incorporating process and measurement modules in accordance with an embodiment of the invention.

As noted, in one embodiment of the invention that incorporates the active interdiction control system 322, one or more measurement modules are hosted on a common platform with processing modules for providing measured data regarding an attribute of the workpiece. The data is used by the active interdiction control system 322 for detecting non-conformities and for performing corrective processing of the workpiece when non-conformities are detected. The corrective processing is performed upstream and/or downstream in the process sequence when non-conformities are detected. Referring to FIG. 4, an exemplary processing system on a common platform 400 suitable for practicing the invention is illustrated. The processing system 400 incorporates multiple modules and processing tools for the processing of semiconductor substrates for the fabrication of integrated circuits and other devices. The processing platform 400 incorporates one or more substrate metrology/measurement modules that are incorporated within the common manufacturing platform along with the processing modules. For example, the platform 400 may incorporate a plurality of substrate processing modules that are coupled to a workpiece transfer module as shown. In some embodiments, a measurement module or tool is also positioned, at least partially, inside the substrate transfer module. As such, a substrate may be processed and then transferred immediately to a measurement module in order to collect various fabrication data associated with attributes of the workpiece that is further processed by the active interdiction control system. The active interdiction control system gathers data from the processing and measurement modules and controls a process sequence that is executed on the common manufacturing platform through the selective movement of the workpiece and control of one or more of the plurality of processing modules. Furthermore, the processing system of platform 400 may transfer a substrate or other workpiece inside the chamber of the transfer module and between the various processing modules and the measurement/metrology modules without leaving the controlled environment of the chamber. The active interdiction control system controls the sequential process flow through the various processing modules utilizing information that is derived from workpiece measurements obtained from the one or more measurement modules. Furthermore, the active interdiction control system incorporates processing modules in-situ measurements and data to control the sequential process flow through the platform 400. The on-substrate measurement data obtained in the controlled environment may be utilized alone or in combination with the in-situ processing module measurement data for process flow control and improvement of the process in accordance with the invention.

Turning again to FIG. 4, the system of platform 400 contains a front end workpiece transfer module 402 to introduce workpieces to the system. The exemplary platform 400 represents a plurality of processing modules organized in a common manufacturing platform around the periphery of workpiece transfer module 412. The system of platform 400 includes cassette modules 404a, 404b, and 404c and an alignment module 404d. Load-lock chambers 406a and 406b, are also coupled to a front end transfer module 402. The front end module 402 is generally maintained at atmospheric pressure but a clean environment may be provided by purging with an inert gas. Load-lock chambers 410a and 410b are coupled to the centralized workpiece transfer module 412 and may be used for transferring substrates from the front end 402 to the workpiece transfer module 412 for processing in the platform.

The workpiece transfer module 412 may be maintained at a very low base pressure (e.g., $5 \times 10^{-8}$ Torr, or lower) or constantly purged with an inert gas. In accordance with the invention, a substrate measurement/metrology module 416 may be operated under atmospheric pressure or operated under vacuum conditions. In accordance with one embodiment, the measurement module 416 is kept at vacuum conditions and the wafer is processed in platform 400 and measured without leaving vacuum. As disclosed further herein, the metrology module may include one or more inspection systems or analytical tools that are capable of measuring one or more material properties or attributes of a workpiece and/or of the thin films and layers deposited on the workpiece or the devices formed on the workpiece. As used herein, the term "attribute" is used to indicate a measurable feature or property of a workpiece, layer on a workpiece, feature or device on a workpiece, etc. that is reflective of the processing quality of the processing sequence. The measured data associated with an attribute is then used to adjust the process sequence by analyzing the measured data along with other in-situ processing data through the active interdiction control system. For example, the measured attribute data reflects non-conformities or defects on the workpiece for providing corrective processing.

FIG. 4 and the platform illustrated therein shows essentially a single measurement module 416. However, as will be understood and as disclosed further herein, the particular processing platform 400 may incorporate a plurality of such measurement modules that are incorporated around one or more workpiece transfer systems, such as the workpiece transfer module for 412. Such measurement modules 416 may be stand-alone modules that are accessed through the transfer module 412 like a processing module. Such stand-alone modules will generally incorporate inspection systems therein that are configured to engage a workpiece that is positioned in a measurement region of the module and to measure data associated with an attribute of the workpiece.

In an alternative embodiment of the invention, a measurement module might be implemented in a measurement region located within a dedicated area of an internal space of the transfer chamber defined by the transfer module 412. Still further, a measurement module might be incorporated wherein at least a portion of the measurement module is positioned inside of an internal space of a workpiece transfer module, and other components of the measurement module or the specific inspection system of the measurement module are incorporated outside of the workpiece transfer module and interfaced through an aperture or window into a dedicated area of the internal space that forms the measurement region in which a workpiece is located or through which a workpiece will pass.

The measurement modules of the inventive system and platform include one or more inspection systems that are operable for measuring data associated with an attribute of the workpiece. Such data may be associated with one or more attributes that reflect the quality of the processing sequence and the quality of the layers and features and devices that are being formed on a workpiece. The collected measurement data is then analyzed, along with processing module data, by an active interdiction control system for detecting various non-conformities and/or defects on the workpiece or workpiece layers/features. The system then provides for corrective processing of the workpiece, such as in upstream or downstream processing modules in the process sequence to ameliorate/correct the non-conformities or defects and improve the overall process.

In accordance with embodiments of the invention, the measurements taken by the measurement module or inspection systems thereof and the data generated is associated with one or more attributes of a workpiece. For example, the attribute measured may include, for example, on or more of: a layer thickness, a layer conformality, a layer coverage, or a layer profile of a layer on the workpiece, an edge placement location, an edge placement error (EPE) for certain features, a critical dimension (CD), a block critical dimension (CD), a grid critical dimension (CD), a line width roughness (LWR), a line edge roughness (LER), a block LWR, a grid LWR, a property relating to selective deposition process(es), a property relating to selective etch process(es), a physical property, an optical property, an electrical property, a refractive index, a resistance, a current, a voltage, a temperature, a mass, a velocity, an acceleration, or some combination thereof associated with the fabricated electronic devices on the workpiece. The list of measured attributes for generating measurement data for the invention is not limited and could include other attribute data that might be used for processing a workpiece and fabricating devices.

As further discussed herein, the measurement modules and/or inspections systems used for providing attribute data may implement a number of tools and methods for measurement for providing the measurement and metrology of the invention. The measurement modules and/or inspections systems may include optical methods, or non-optical methods. Optical methods can include high-resolution optical imaging and microscopy (e.g., bright-field, dark-field, coherent/incoherent/partially coherent, polarized, Nomarski, etc.), hyperspectral (multi-spectral) imaging, interferometry (e.g., phase shifting, phase modulation, differential interference contrast, heterodyne, Fourier transform, frequency modulation, etc.), spectroscopy (e.g., optical emission, light absorption, various wavelength ranges, various spectral resolutions, etc.), Fourier transform Infrared spectroscopy (FTIR) reflectometry, scatterometry, spectroscopic ellipsometry, polarimetry, refractometers, etc. Non-optical methods can include electronic methods (e.g., RF, microwave, etc.), acoustic methods, photo-acoustic methods, mass spectroscopy, residual gas analyzers, scanning electron microscopy (SEM), transmission electron microscopy (TEM), atomic force microscopy (AFM), energy dispersive x-ray spectroscopy (EDS), x-ray photo-emission spectroscopy (XPS), ion scattering, etc. For example, the inspection system used for measuring data that is associated with an attribute of the workpiece may use one or more of the following techniques or devices: optical thin film measurement, such as reflectometry, interferometry, scatterometry, profilometry, ellipsometry; X-Ray measurements, such as X-ray photo-emission spectroscopy (XPS), X-Ray fluorescence (XRF), X-Ray diffraction (XRD), X-Ray reflectometry (XRR); ion scattering measurements, such as ion scattering spectroscopy, low energy ion scattering (LEIS) spectroscopy, auger electron spectroscopy, secondary ion mass spectroscopy, reflection absorption IR spectroscopy, electron beam inspection, particle inspection, particle counting devices and inspection, optical inspection, dopant concentration metrology, film resistivity metrology, such as a 4-point probe, eddy current measurements; a micro-balance, an accelerometer measurement, a voltage probe, a current probe, a temperature probe for thermal measurements, or a strain gauge. The list of measurement techniques or devices for generating measurement data for the invention is not limited and could include other techniques or devices that might be used for obtaining the useful data for processing a workpiece and fabricating devices in accordance with the invention.

The measurement modules and/or inspection systems may take measurements on various substrate or workpiece structures passed through the processing system including either product workpieces, or non-product substrates, i.e., a monitoring substrate. On product workpieces, measurements can be performed on designated target structures, both device-like structures and device-unlike structures, on specified device areas, or on arbitrary areas. The measurements may also be performed on test structures created on the workpiece, that might include pitch structures, area structures, density structures, etc.

Referring again to FIG. 4, coupled to the transfer chamber 412 are a plurality of processing modules 420a-420d that are configured for processing substrates, such as semiconductor or silicon (Si) workpieces. The Si workpieces can, for example, have a diameter of 150 mm, 200 mm, 300 mm, 450 mm, or larger than 450 mm. The various processing modules and measurement modules all interface with the workpiece transfer module 412 through appropriate gate access ports with valves G, for example. According to one embodiment of the invention disclosed herein, the first processing module 420a might perform a treatment process on a workpiece, and the second processing module 420b might form a self-aligned monolayer (SAM) on a workpiece. The third processing module 420c may etch or clean a workpiece, and the fourth processing module 420d may deposit a film on a workpiece by a suitable deposition process.

The transfer module 412 is configured for transferring substrates between any of the substrate processing chambers 420a-420d and then into the substrate metrology module 416 either before or after a particular processing step. FIG. 4 further shows the gate valves G that provide isolation at the access ports between adjacent processing chambers/tool components. As depicted in the embodiment of FIG. 4, the substrate processing chambers 420a-420d and the substrate metrology module 416 may be directly coupled to the substrate transfer chamber 412 by the gate valves G and such direct coupling can greatly improve substrate throughput in accordance with the invention.

The substrate processing system of platform 400 includes one or more controllers or control systems 422 that can be coupled to control the various processing modules and associated processing chambers/tools depicted in FIG. 4 during the integrated processing and measurement/metrology process as disclosed herein. The controller/control system 422 can be coupled to one or more additional controllers/computers/databases (not shown) as well. Control system 422 can obtain setup and/or configuration information from an additional controller/computer or a server over a network. The control system 422 is used to configure and run any or all of the processing modules and processing tools and to gather data from the various measurement modules and in-situ data from the processing modules to provide the active interdiction of the invention. The controller 422 collects, provides, processes, stores, and displays data from any or all of the processing modules and tool components. The control system 422, as described further herein, can comprise a number of different programs and applications and processing engines to analyze the measured data and in-situ processing data and to implement algorithms, such as deep learning networks, machine learning algorithms, autonomous learning algorithms and other algorithms for providing the active interdiction of the invention.

As described further herein, the active interdiction control system 422 can be implemented in one or more computer devices having a microprocessor, suitable memory, and digital I/O port and is capable of generating control signals and voltages that are sufficient to communicate, activate inputs to the various modules of the platform 400, and exchange information with the substrate processing systems run on the platform 400. The control system 422 monitors outputs from the processing system of the platform 400 as well as measured data from the various measurement modules of the platform to run the platform. For example, a program stored in the memory of the control system 422 may be utilized to activate the inputs to the various processing systems and transfer systems according to a process recipe or sequence in order to perform desired integrated workpiece processing.

The control system 422 also uses measured data as well as in-situ processing data output by the processing modules to detect non-conformities or defects in the workpiece and provide corrective processing. As discussed herein, the control system 422 may be implemented as a general purpose computer system that performs a portion or all of the microprocessor based processing steps of the invention in response to a processor executing one or more sequences of one or more instructions contained in a program in memory. Such instructions may be read into the control system memory from another computer readable medium, such as a hard disk or a removable media drive. One or more processors in a multi-processing arrangement may also be employed as the control system microprocessor element to execute the sequences of instructions contained in memory. In alternative embodiments, hard-wired circuitry may be used in place of or in combination with software instructions for implementing the invention. Thus, embodiments are not limited to any specific combination of hardware circuitry and software for executing the metrology driver processes of the invention as discussed herein.

The active interdiction control system 422 may be locally located relative to the substrate processing system of platform 400, or it may be remotely located relative to the substrate processing system. For example, the controller 422 may exchange data with the substrate processing system and platform 400 using at least one of a direct connection, an intranet connection, an Internet connection and a wireless connection. The control system 422 may be coupled to an intranet at, for example, a customer site (i.e., a device maker, etc.), or it may be coupled to an intranet at, for example, a vendor site (i.e., an equipment manufacturer). Additionally, for example, the control system 422 may be coupled to other systems or controls through an appropriate wired or wireless connection. Furthermore, another computer (i.e., controller, server, etc.) may access, for example, the control system 422 to exchange data via at least one of a direct wired connection or a wireless connection, such as an intranet connection, and/or an Internet connection. As also would be appreciated by those skilled in the art, the control system 422 will exchange data with the modules of the substrate processing system 400 via appropriate wired or wireless connections. The processing modules may have their own individual control systems (not shown) that take input data for control of the processing chambers and tools and sub-systems of the modules and provide in-situ output data regarding the process parameters and metrics during processing sequence.

FIGS. 5A-5D illustrate one embodiment of a common platform with on-board measurement and metrology for implementing the invention. Similar to the system illustrated in FIG. 4, the substrate processing system implemented on platform 500 incorporates a front end transfer system or FEM 502 coupled with cassette modules 504a, 504b and load lock chambers 510a, 510b. A substrate transfer module 512 moves substrates between one or more processing modules 520a, 520b, 520c, and 520d and one or more measurement/metrology modules 516. Generally, the transfer module 512 has a chamber that incorporates one or more transfer mechanisms or robots 514 that will handle and move substrates through the internal space of the chamber and into and out of the processing module in the processing sequence.

More specifically, the transfer mechanism 514 is positioned inside of the internal space 513 of the transfer module that can define a controlled environment and is configured for moving the workpieces through the internal space and environment and selectively in and out of the plurality of processing modules 520a-520d and the measurement modules 516 or into and out of a measurement region in a dedicated area of the internal space in order for a measurement inspection system to measure data. In accordance with one feature of the invention, because the internal space 513 of the transfer module 512 and processing modules 520a-520d and measurement modules 516 are coupled together on the common platform, the controlled environment may be maintained for the workpiece generally through most of or all of the measurement and processing sequence. Such a controlled environment could involve a vacuum environment or an inert gas atmosphere in the transfer module or measurement module.

Figure 5A:
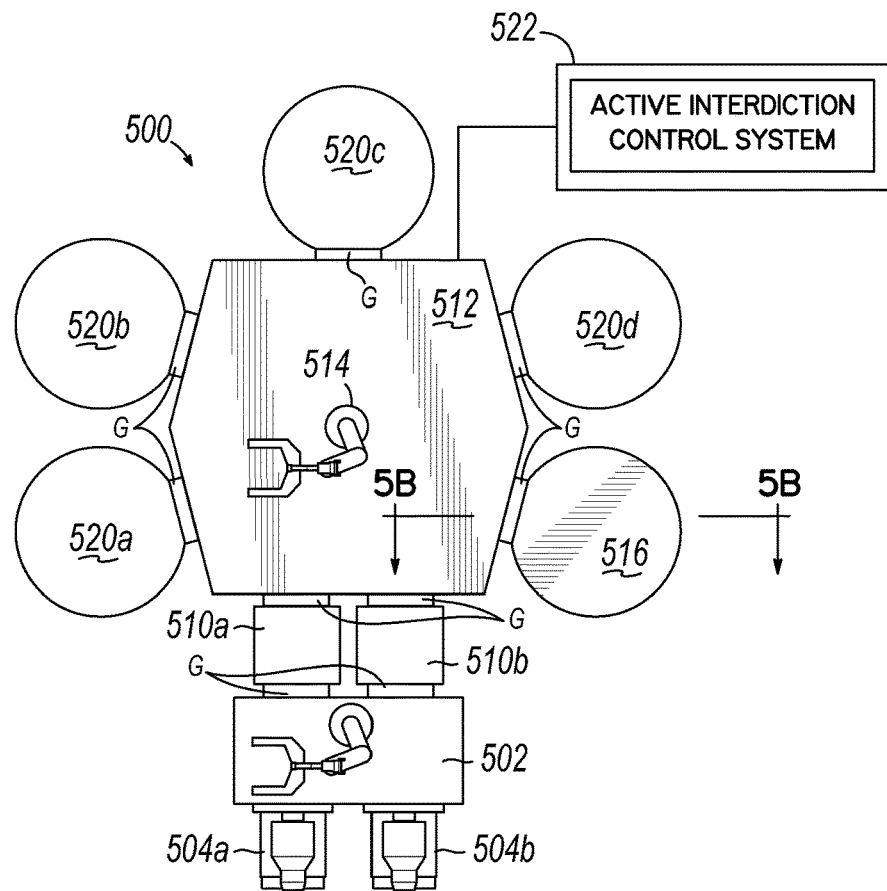
FIG. 5A is a top view of a common platform incorporating process and measurement modules in accordance with another embodiment of the invention.

Similar to the embodiment illustrated in FIG. 4, the system 500 in FIG. 5A incorporates at least one workpiece measurement/metrology module 516 that is coupled with the transfer module 514 through an appropriate access port and gate G similar to the various processing modules 520a-520d.

Figure 6A:
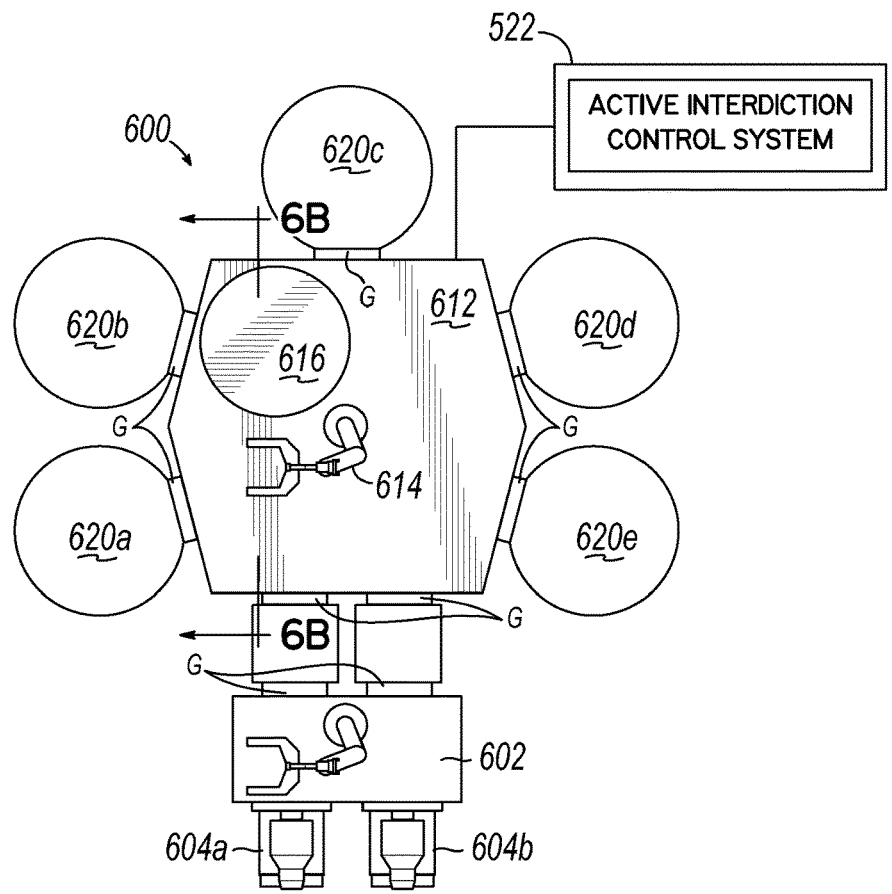
FIG. 6A is a top view of a common platform incorporating process and measurement modules in accordance with another embodiment of the invention.
Figure 7A:
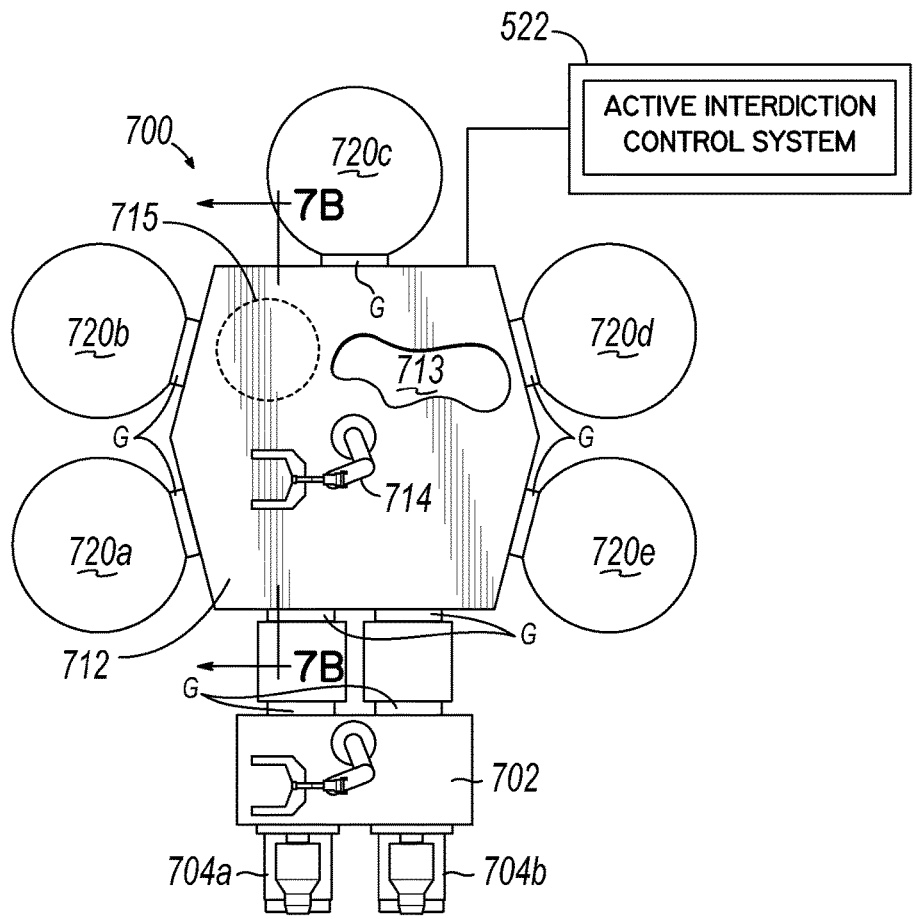
FIG. 7A is a top view of a common platform incorporating process and a measurement transfer module in accordance with another embodiment of the invention.
Figure 7B:
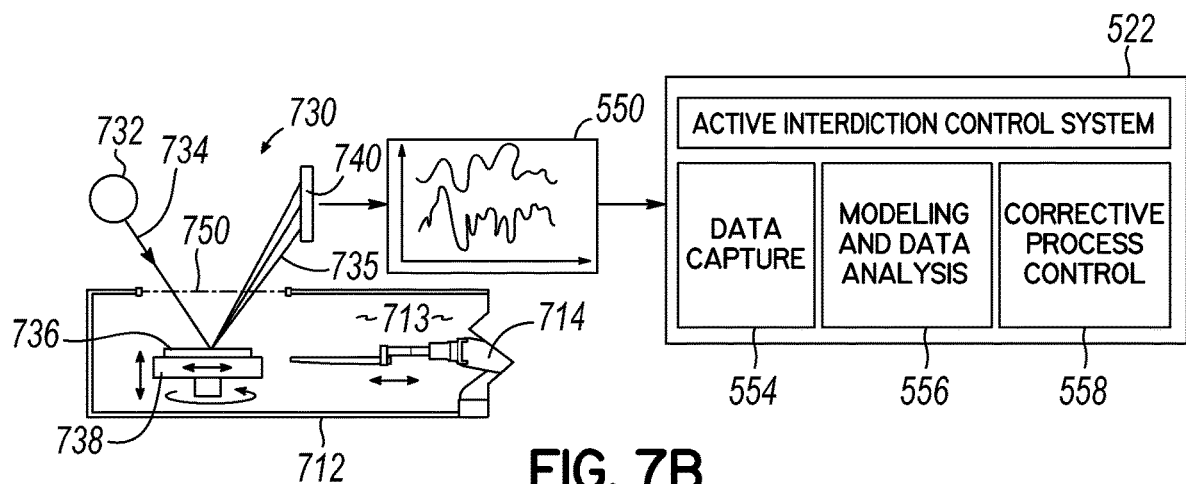
FIG. 7B is a side view in partial cross-section of a transfer measurement module incorporated in a common platform in accordance with an embodiment of the invention.
Figure 7C:
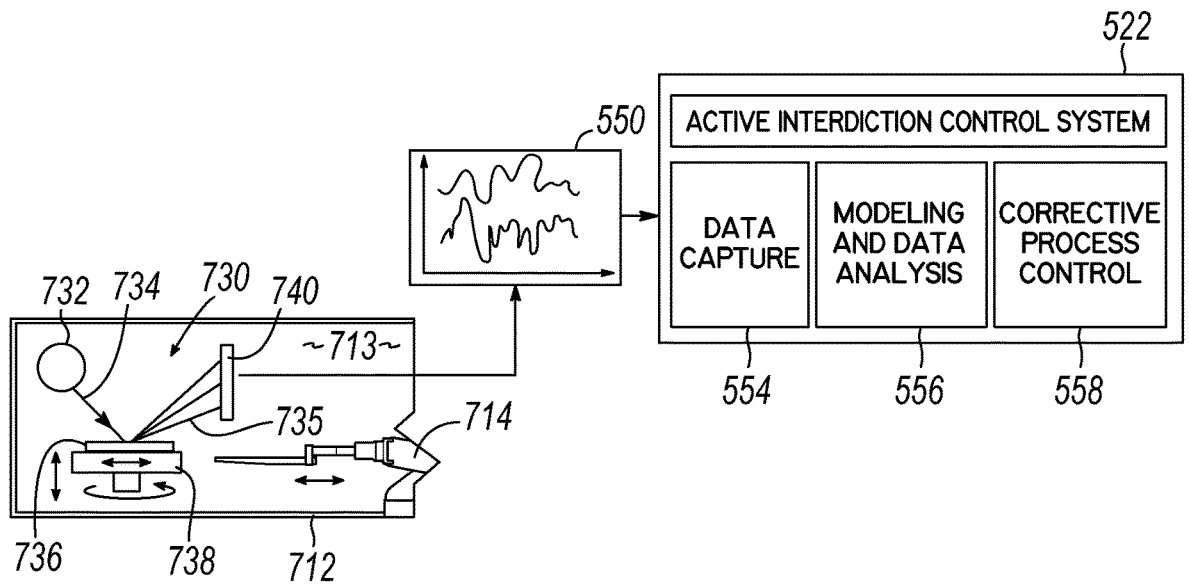
FIG. 7C is a side view in partial cross-section of a transfer measurement module incorporated in a common platform in accordance with another embodiment of the invention.

More specifically, the transfer module 512 includes a plurality of access ports or side ports, each with a suitable gate G, through which a workpiece is moved to and from the plurality of processing modules 520a-520d. To provide the necessary processing sequence for efficient through-put on platform 500, the plurality of processing modules 520a-520d includes modules that handle a variety of workpiece processing steps on the common platform. For example, the platform will include one or more etching modules and one or more film-forming or deposition modules. The measurement module 516, as illustrated in FIG. 5A is coupled with the transfer module also at one of the side or access ports through a suitable gate G. In other embodiments, as illustrated in FIG. 6A, the measurement module is coupled with the transfer module at a port formed in the top of the transfer module. In still further embodiments as described herein, the transfer module acts as a measurement module as well wherein at least a portion of the measurement module for capturing measurement data is incorporated or positioned inside of an internal space of the transfer module. The transfer measurement module (TMM) in such an embodiment, as illustrated in FIGS. 7A-7C, includes a measurement region located within a dedicated area of the internal space of the transfer module.

The active interdiction control system collects workpiece measurement data generally on-the-fly as the substrate moves in the processing sequence between one or more of the processing modules and the measurement/metrology module 516. The data is captured and then analyzed and processed to detect non-conformities and defects and provide corrective processing as discussed herein. The active interdiction control system 522 provides the necessary control of the processing steps of the sequence to make control adjustments to various fabrication processing steps as performed in order to correct for the detected non-conformities/defects. Adjustments may be made to process steps and processing chambers that precede or are upstream of the captured measurement data and/or process steps that follow or are downstream of the measurement data in sequence. Alternatively, a suitable corrective action or corrective processing might include ejection of the workpiece(s) from the processing flow-through platform 500 in order to not waste further time and materials on a workpiece(s) which cannot be saved.

Figure 5B:
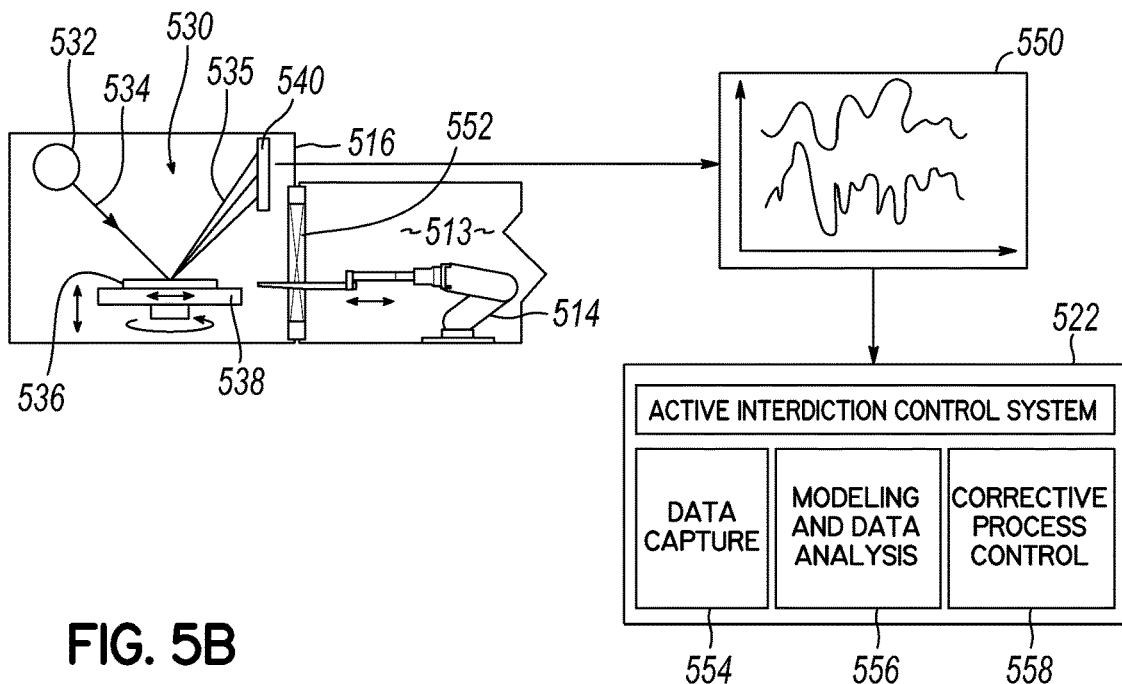
FIG. 5B is a side view in partial cross-section of a measurement module incorporated in a common platform in accordance with an embodiment of the invention.

Referring to FIG. 5B, one exemplary measurement module 516 is illustrated that incorporates an inspection system 530 for making measurements on the substrate, in real-time with respect to the processing sequence through the system of common platform 500.

The inspection system 530 measures data associated with an attribute of the workpiece that may include data associated with one or more properties, such as a physical property, a chemical property, an optical property, an electrical property, a material property or some combination of two or more thereof. The measurement data may also include data associated with one or more layers formed on the workpiece. As noted, the inspection system or tools used for measuring data in the measurement module may use various different techniques involving signal sources and signal capture sensors, contact sensors, and other measurement tools to implement one or more of the following techniques or devices: optical thin film measurement, such as reflectometry, interferometry, scatterometry, profilometry, ellipsometry; X-Ray measurements, such as X-ray photo-emission spectroscopy (XPS), X-Ray fluorescence (XRF), X-Ray diffraction (XRD), X-Ray reflectometry (XRR); ion scattering measurements, such as ion scattering spectroscopy, low energy ion scattering (LEIS) spectroscopy, auger electron spectroscopy, secondary ion mass spectroscopy, reflection absorption IR spectroscopy, electron beam inspection, particle inspection, particle counting devices and inspection, optical inspection, dopant concentration metrology, film resistivity metrology, such as a 4-point probe, eddy current measurements; a micro-balance, an accelerometer measurement, a voltage probe, a current probe, a temperature probe for thermal measurements, or a strain gauge. As the workpiece is moved through the processing sequence and through a metrology module or TMM, the inspection system measures data before or after the workpiece is processed in a processing module to determine the operation of the processing step and module and to evaluate any need for corrective processing in accordance with the invention.

In the illustrated embodiment of FIG. 5B, the inspection system 530 incorporates one or more signal sources 532 which direct a measurement signal 534 toward a workpiece 536. Incident signals 534 are reflected or scattered from the surface of the workpiece 536 and the scattered signals 535 are captured by the detector 540. In one embodiment, the workpiece is positioned by transfer mechanism 514 on a measurement platform 538 that may be translated side-to-side and up and down and rotated as indicated by the arrows in FIG. 5B so that a measurement signal 534 may be directed to various proper positions on the substrate 536.

That is, in the embodiment of FIG. 5B, the measurement module includes a separate support mechanism 538 for supporting a workpiece positioned in the measurement module 516. The inspection system engages the support mechanism 538 for measuring data associated with a workpiece attribute supported on the support mechanism. In such a scenario, the support mechanism 538 in the measurement module 516 is generally separate from the transfer mechanism that otherwise moves the workpiece and positions it on the support mechanism.

The separate support mechanism translates the workpiece, such as through vertical and/or horizontal movement and also may rotate the workpiece to provide at least two degrees of freedom for measuring data associated with an attribute of the workpiece as discussed herein. The support mechanism may also incorporate a temperature control element therein for controlling workpiece temperature. Therefore, in the embodiment of FIG. 5B, the support mechanism provides the support and movement of the workpiece necessary for the measurement of data after the workpiece is positioned thereon by the transfer mechanism. In an alternative embodiment of the invention, as shown in FIG. 5C, the transfer mechanism provides the function of supporting and moving the workpiece for engagement with the inspection system for measuring data associated with an attribute on the workpiece.

Figure 5C:
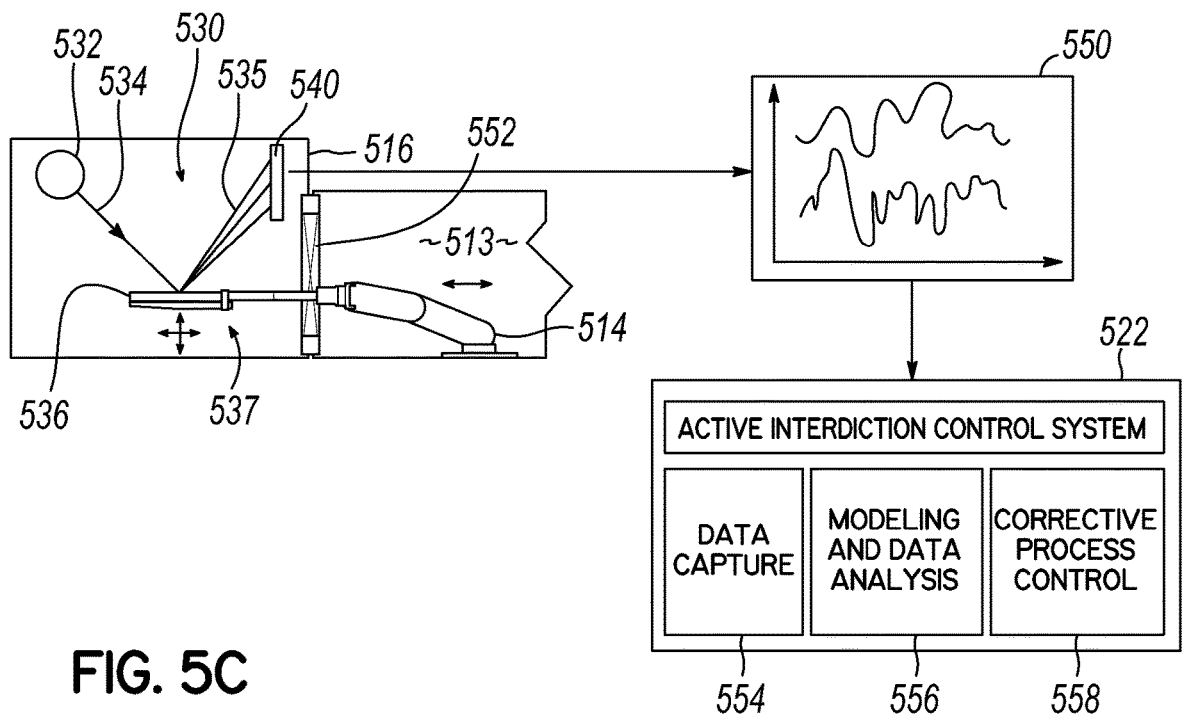
FIG. 5C is side view in partial cross-section of a measurement module incorporated in a common platform in accordance with another embodiment of the invention.

Referring to FIG. 5C, the transfer mechanism will position the workpiece either in the measurement module or in the case of a transfer measurement module, in a measurement region located within a dedicated area of a transfer chamber, so that the inspection system may engage the workpiece to obtain measurement data. That is, the transfer mechanism acts as, or includes, a suitable support mechanism for supporting the workpiece and providing the necessary translation and/or rotation for measurements associated with an attribute of the workpiece.

The support mechanism or transfer mechanism acting as a support mechanism may incorporate a clamping mechanism (as illustrated and incorporated herein by reference). Also, the support mechanism or transfer mechanism providing the workpiece support mechanism might also incorporate a magnetically levitated stage for providing one or more degrees of freedom, as disclosed herein.

The inspection system 530 includes one or more inspection signal sources 532 and one or more signal collectors or signal detectors 540 to capture reflected or scattered signals from the surface of the workpiece 536 that is being measured. The detectors 540 generate measurement data 550 which may then be directed to the active interdiction control system 522 as described herein.

Referring again to FIG. 5B, a workpiece transfer mechanism or robot 514 moves the substrate from a processing chamber 520a-520d into the measurement module 516 for placement on a support mechanism platform 538, or in the embodiment of FIG. 5C for positioning the workpiece to engage the inspection system. The inspection system 530 measures and captures measurement data. In one embodiment of the invention, the measurement module 516 operates in a controlled, but non-vacuum environment. Alternatively, measurement module 516 provides a vacuum environment for the measurement. To that end, a gate valve 552 may be incorporated at the access port between the substrate transfer chamber 512 and measurement module 516. As will be appreciated, if vacuum is necessary within measurement module 516, appropriate vacuum equipment (not shown) may be coupled with interior space of module 516 for that purpose. Once the workpiece 536 is measured, it can be moved out of measurement module 516 by the transfer mechanism 514 of the transfer chamber 512 and then directed to one or more of the other processing chambers 520a-520d in accordance with the process flow, for example, after the data has been analyzed by the active interdiction control system and an appropriate action, such as a corrective processing action, has been determined.

As described further herein, the captured measurement data 550 may then be directed to control system 522 and further evaluated and analyzed to determine a particular action for the substrate measured. If the measurement data indicates that the measured parameters are within specification of the desired design and fabrication process, and/or there are no actionable detected defects, the workpiece may proceed as normal through the process flow within the system of platform 500. Alternatively, if the measured data 550 indicates that the workpiece is beyond correction or amelioration, the workpiece might be ejected from further processing. Alternatively, in accordance with an embodiment of the invention, the active interdiction control system may analyze the data and provide corrective processing as one or more corrective steps to be taken for that workpiece or to be made in various process steps of the overall process flow in order to correct the current workpiece, and also to prevent the need for corrective action in other workpieces that are subsequently processed in the system. Specifically, referring to FIG. 5B, the active interdiction control system may incorporate one or more processing steps and processing components therein for yielding correction to the process flow. First, the necessary measurement data 550 may be captured and pre-processed as illustrated by block 554. Next, modeling and data analysis occurs on the captured data as well as any in-situ processing data associated with one or more of the processing modules and process steps as indicated by block 556. The modeling and analysis may utilize artificial intelligence, including deep learning and autonomous learning programs and components as discussed further herein. Next, the analysis may provide corrective process control for the system of platform 500 wherein one or more of the processing steps and processing chambers are controlled to correct or ameliorate perceived or detected non-conformities or defects in the layers and features that are out of specification with respect to the overall design for the substrate fabrication. The corrective process control of block 558 may be provided to one or more of the processing steps or processing modules and it may be applied to one or more processing steps that are previous in time (upstream) to the capture of the measurement data 550 or may be applied to one or more of the process steps to follow (downstream) the capture of the measurement data 550 within the overall substrate fabrication according to the desirable design. As discussed herein, the active interdiction control system 522, and its processes as indicated by blocks 554, 556 and 558 may be incorporated in software run by one or more computers of the control system 522 and/or components of that system.

In accordance with embodiments of the invention, the inspection systems for obtaining measurement data engage the workpiece by performing contact measurement or metrology or non-contact measurement or metrology depending on the attribute measured or the type of measurement. A combination of both contact and non-contact measurement might be used. Depending on the location of the inspection system, portions of the inspection system may be positioned partially or entirely inside an internal space or chamber of a module. In the embodiments of FIGS. 5A and 6A as disclosed herein, dedicated measurement modules 516, 616 may entirely contain the inspection system. Alternatively, a portion of a measurement module might be positioned inside of an internal space of a chamber, such as inside an internal space of a workpiece transfer module, with another portion of the measurement module located outside of the chamber. Such an embodiment is illustrated in FIG. 7A for example wherein a transfer measurement module is illustrated using a measurement region located within a dedicated area of the transfer chamber internal space and the inspection system is configured for engaging a workpiece positioned in the measurement region for measuring data associated with an attribute on the workpiece.

Figure 5D:
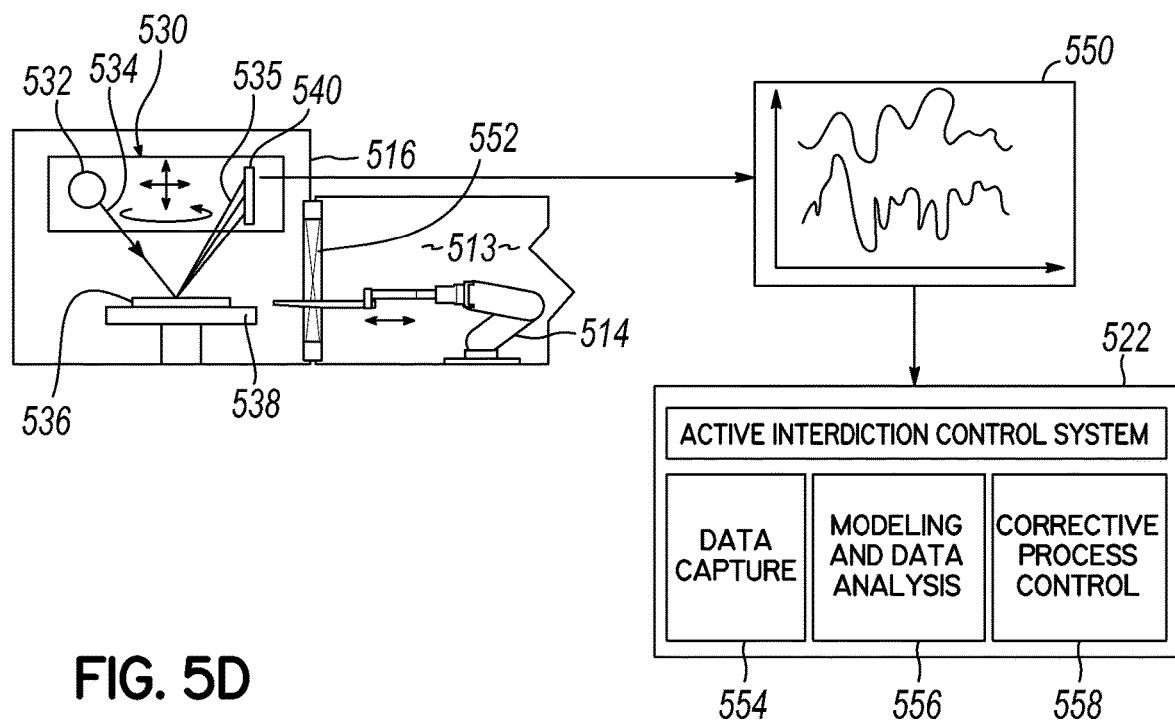
FIG. 5D is a side view in partial cross-section of a measurement module incorporated in a common platform in accordance with another embodiment of the invention
Figure 5E:
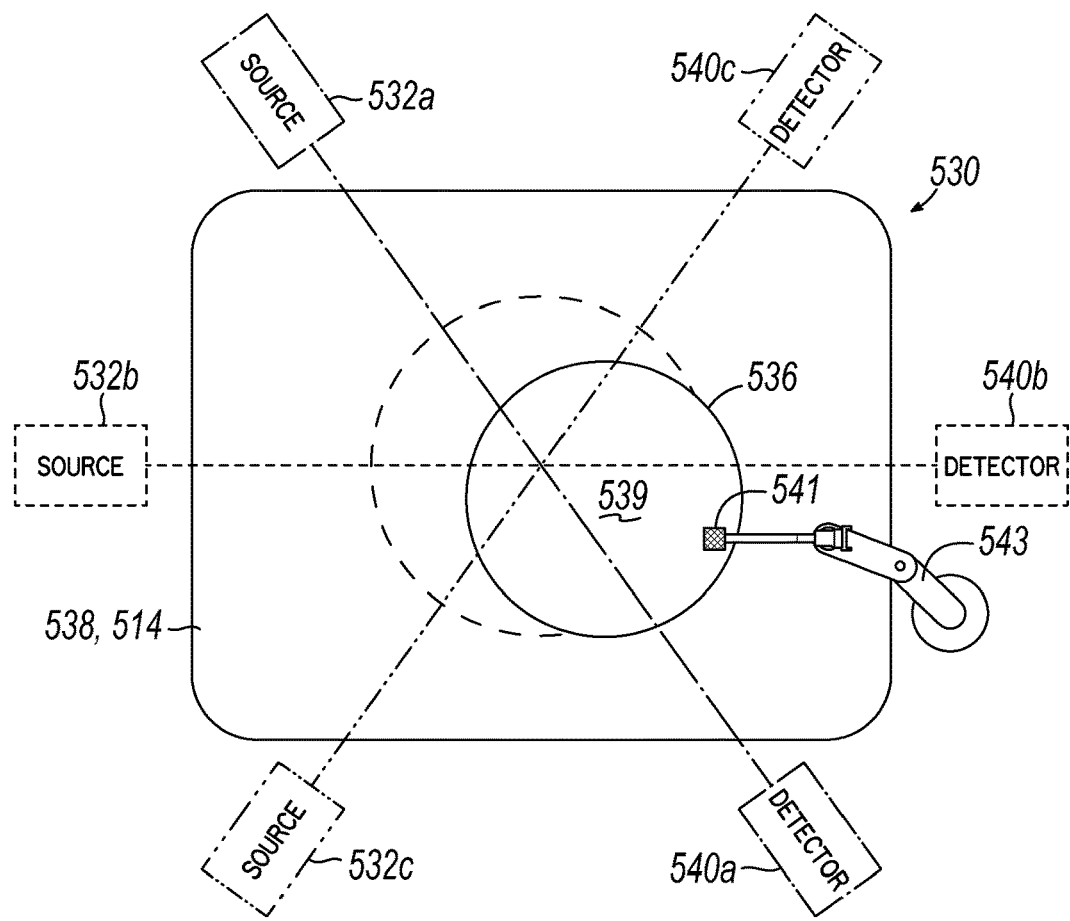
FIG. 5E is top diagrammatic view of an inspection system in accordance with an embodiment of the invention.

Referring now to FIG. 5E, the inspection system 530 may incorporate one or more inspection signal sources 532a, 532b, 532c that are utilized in conjunction with one or more detectors 540a, 540b and 540c to sense or collect inspection signals that are reflected or otherwise directed from the surface of the workpiece 536 as it is moved within the measurement module 516 or a transfer measurement module (TMM) to engage the inspection system. In embodiments of the invention, the inspection system 530 incorporates one or more signal sources 532a-532c to generate and direct signals onto the surface of workpiece 536 that is positioned and/or moved on a support mechanism 538 or on transfer mechanism 514.

In accordance with embodiments of the invention, the signal sources 532a, 532b, 532c may generate one or more of an electromagnetic signal, an optical signal, a particle beam or a charged particle beam, or other signal, to be incident upon a surface 539 of workpiece 538. Conversely, the detector elements 540a, 540b, 540c, may be arranged to receive reflected or scattered corresponding electromagnetic signals, optical signals, particle beams or charged particle beams, or other signals that might be reflected or otherwise directed from surface 539 of the workpiece 538 in order to measure data and provide metrology regarding an attribute of the workpiece.

Referring to FIG. 5E, support mechanism 538 or transfer mechanism 514 holding workpiece 536 may be translated and rotated to provide measurements of various areas on the workpiece 536. In that way, measurement data may be captured at various portions or segments of the entire workpiece. Thus, continuous measurements or point-by-point measurements are possible thereby reducing the overall measurement time and processing time.

For example, the inspection system measures data over a portion of the workpiece that is equal to or exceeding 1 square centimeter. Alternatively, the inspection system measures or images a substantive portion of the workpiece that is equal to or exceeding 90% of the working surface area of the workpiece. As noted, the inspection system may perform a measurement at plural discrete locations on the working surface of the workpiece or may perform a continuous sequence of measurements across a portion of the workpiece. For example, the inspection system may perform a measurement along a path extending across or partially across the workpiece. Such a path may include a line, a sequence of lines, an arc, a circular curve, a spiral curve, an Archimedean spiral, a logarithmic spiral, a golden spiral, or some combination thereof. Also, there may be several inspection systems, as illustrated in FIG. 5C wherein the source/detector pairs 532, 540 may each represent a different inspection signal from a different inspection system and may be different forms of signals. For example, one system 532*a*, 540*a* might use an optical signal while one or more of the others 532*ab* 540*b* might use an electromagnetic signal depending on the inspection system.

The inspection system(s) as shown in FIG. 5E perform multiple measurements of attributes on a workpiece while the workpiece is in a measurement module or in dedicated area of a transfer measurement module as discussed herein. The measurements may be made simultaneously in time. That is, different inspection systems might make measurements at the same time. Alternatively, the various inspection systems might operate at different times. For example, it may be necessary to move or position the workpiece in one position for one type of measurement or inspection system, and then move or position the workpiece for another measurement by the same or a different type of inspection system.

The inspection system(s) may be non-contact systems for providing non-contact measurement and metrology, such as shown with the signal sources 532*a*, 532*b*, 532*c* that generate the non-contact signals for the detector elements 540*a*, 540*b*, 540*c*. Alternatively, one or more inspection systems of a measurement module or transfer measurement module might use a contact sensor, such as sensor 541 that may be moved and located by mechanism 543 to position the sensor 541 at a portion of a surface 539 of the workpiece to make a measurement. The inspection systems provided in accordance with the invention may incorporate a combination of contact inspection systems and non-contact inspection systems for gather measurement data associated with an attribute of the workpiece.

The surface 539 of the workpiece, as illustrated in FIG. 5E, that is measured with the inspection systems of a measurement module or transfer measurement module as discussed herein will generally measure attributes associated with the top surface or work surface of the workpiece. However, as discussed and further illustrated herein, the inspection systems might be arranged and positioned to make measurements and gather data from a bottom surface of the workpiece, if desired.

While the workpiece 536 measured will often be a workpiece to be finished into semiconductor devices, the measurements and metrology of the invention can be performed on either such product workpieces, or non-product workpieces or substrates, i.e., a monitoring workpiece or substrate. On product workpieces substrates, measurement and metrology can be performed on designated target structures, both device-like and device-unlike, in or on specified device areas, in or on arbitrary areas, or in or on test structures that are created on the workpiece. Test structures can include pitch structures, area structures, density structures, etc.

Generally, as illustrated in several figures, the inspection system as implemented in a measurement module or in a transfer measurement module as disclosed herein may be stationary while the support mechanism or workpiece transfer mechanism moves the workpiece to engage with the inspection system and to take measurements in different areas of the workpiece. Alternatively, as illustrated in FIG. 5D, the inspection system 530, or some portion thereof is movable with respect to the workpiece support mechanism 538, the workpiece transfer mechanism 514 and the module or chamber containing the workpiece, whether a chamber of a measurement module or transfer measurement module. As illustrated shown in FIG. 5D, the inspection system might be configured to translate and or rotate with respect to the stationary workpiece to obtain measurement data from areas of the workpiece.

Figure 5F:
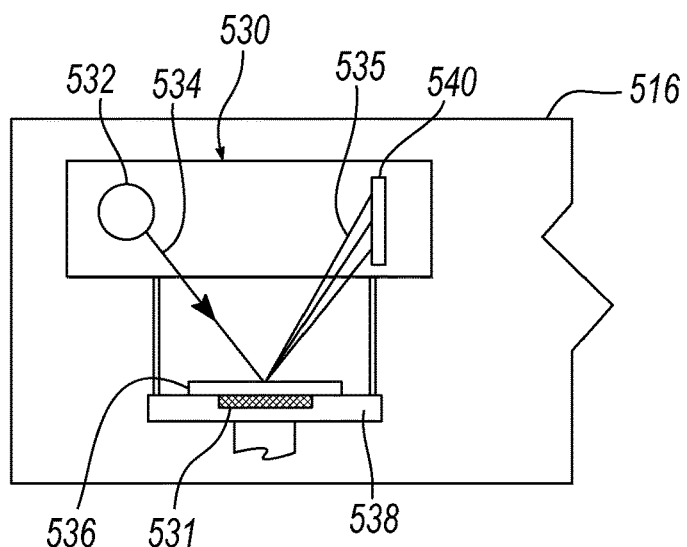
FIG. 5F is a side view in partial cross-section of a measurement module incorporated in a common platform in accordance with another embodiment of the invention.

In other embodiments of the invention, the inspection system may be embedded in or part of a workpiece support mechanism. Referring to FIG. 5F, the inspection system 530 might be mounted or supported on the support mechanism 538. Then, when the workpiece is positioned on the support mechanism, it will be in a proper position for engagement by the inspection system. Also shown in FIG. 5F, an inspection system 531, might be embedded in the support mechanism so as to sit below or otherwise proximate to a positioned workpiece. Such an inspection system might provide measurement data associated with a mass measurement or a temperature measurement of the workpiece, for example.

As discussed further herein, the inspection system 530 may be located within the measurement module, or transfer measurement module and thus might operate to provide measurement data in a vacuum or controlled environment. Alternatively, the inspection system may incorporate inspection signal sources 532 and detectors 540 that are outside of the chamber or internal space that defines the measurement module. In such cases, the signals may generally be directed through one or more apertures, irises, or windows and into a space defined by the metrology module as discussed herein with respect to a transfer measurement module as illustrated in FIG. 7A.

Figure 6B:
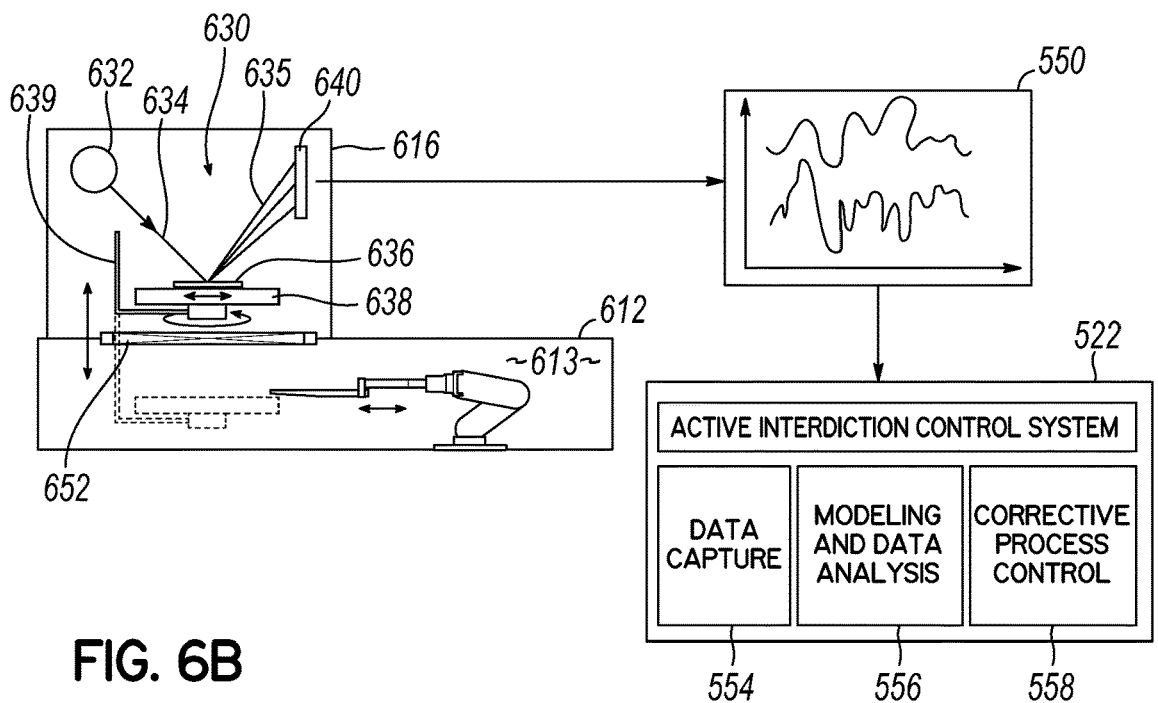
FIG. 6B is a side view in partial cross-section of a measurement module incorporated in a common platform in accordance with an embodiment of the invention.

FIGS. 6A and 6B illustrate alternative embodiments of the invention wherein the measurement/metrology module is coupled with a plurality of substrate processing chambers through a substrate transfer chamber, such as in common platform 600. In the embodiment as illustrated in FIGS. 6A and 6B, various elements noted are similar to those elements disclosed in FIG. 5A and so some of the similar reference numbers are maintained for such similar elements. More specifically, the measurement module and/or inspection systems as described herein may be similarly implemented and operated as discussed with platform 500 and the module 516 of FIG. 5A.

In the system of common manufacturing platform 600 as illustrated in FIG. 6A, a measurement/metrology module 616 is implemented as a separate module. However, the module is positioned on top of the transfer module 612 and has access through the top of the transfer module or through a top wall of the internal space of a transfer chamber 613 of the module 612. As illustrated FIG. 6A, this provides additional space and locations for additional processing modules, such as processing module 620*e*, positioned around the substrate transfer chamber 612.

Referring to FIG. 6B, the measurement/metrology module 616 as shown is located on top of the transfer chamber 612. Accordingly, the measurement/metrology module 616 may be accessed through a bottom area of the module 616 and essentially through a top wall of the transfer chamber 612. To that end, an opening or port 652 on the top of the substrate transfer chamber 612 will coincide with an opening or port in the bottom of the measurement/metrology module 616. For example, as illustrated in FIG. 6B, a gate valve might be utilized at that access 652 port as indicated at the interface between the measurement/metrology module 616 and the transfer chamber 612. The gate valve may be optional depending upon whether a vacuum is to be maintained within the measurement/metrology module 616.

A support mechanism 638 for supporting workpiece 636 thereon will include an elevation mechanism 639 for raising and lowering the support mechanism 638 as illustrated in FIG. 6B. In the lower position, as shown in dashed lines, the mechanism 638 is in position to receive a workpiece 636 from the transfer mechanism or robot 614. Then the mechanism 639 raises the support mechanism 638 into the chamber defined by the measurement module 616 for engagement by one or more inspection systems 630. While FIG. 6B discloses a single non-contact inspection system 630, other contact and non-contact inspection systems, as discussed with respect to FIG. 5E and related figures, might be utilized with respect to the measurement module 616 in platform 500. The support mechanism 638 and inspection system 630 may operate as discussed herein with respect to platform 500 and would have all of the features as noted with respect to that platform. Furthermore, although a single measurement module 616 is illustrated, it will be appreciated that other measurement modules and inspection systems might be implemented onto the top surface of the transfer module 612 on the common platform 600.

As described herein, the inspection signal source 632 sends one or more inspection signals 634 to the surface of workpiece 636 and those signals are then reflected or scattered as indicated by signals 635 to be received by appropriate detectors 640. Thereby, measurement/metrology data 550 is generated and may be appropriately processed as described herein by active interdiction control system 522 which captures data, models and analyzes the data, and then provides corrective process control for the system in platform 600. The control system affects the process flow and corrects or ameliorates any measurements which indicate that non-conformities or defects or indicate that certain layers, features or devices are out of specification for the fabrication design. As may be appreciated, the embodiments illustrated in FIGS. 6A and 6B provide the ability to host a plurality of different processing modules on a common manufacturing platform with one or more measurement/metrology modules wherein a workpiece being processed can be directed immediately to the measurement/metrology module in a controlled environment or under vacuum to capture measurement/metrology data in real time during a processing sequence and without removing the substrate from the controlled environment or vacuum environment.

While a common manufacturing platform may incorporate one or more measurement modules in combination with processing modules such as etch modules and film-forming modules, in accordance with another embodiment of the invention, the functionality of a measurement/metrology module is incorporated within a transfer module that may move workpieces through the various processing modules according to a processing sequence. More specifically, the transfer module generally includes a transfer chamber defining an internal space that holds a transfer mechanism, such as a robot, to move workpieces through the transfer module and into and out of selected processing modules. In accordance with the feature of the invention, a measurement region is located within a dedicated area of a transfer chamber internal space. The measurement region is accessible by the transfer mechanism for positioning a workpiece in the measurement region for the purposes of obtaining measurement data. More specifically, a workpiece may be positioned in the measurement region before or after the workpiece has been processed in a processing module in order to determine the particular results of a processing step or the overall processing sequence up to that point. An inspection system is configured to engage the workpiece that is positioned in the measurement region. The inspection system is operable for measuring data that is associated with an attribute on the workpiece in accordance with features of the invention. As discussed further herein, the transfer mechanism may place the substrate on a separate support mechanism located within the measurement region for taking the measurement. Alternatively, the transfer mechanism itself my act as a support mechanism and move and position the workpiece in the appropriate measurement region for engagement by the inspection system. Accordingly, a separate measurement module is not necessary. Rather, the real estate within the transfer chamber of the transfer module provides access to a workpiece for measurement.

FIG. 7A illustrates a processing system on a common platform 700 incorporating a transfer module in accordance with one embodiment the invention that utilizes a dedicated area to form a measurement region wherein measurement data may be gathered from a workpiece during transit. In that way, as noted herein, the workpiece can be processed and measured while remaining within a controlled environment, such as a vacuum environment. The workpiece does not need to leave the environment of the platform 700 for determining how the process is proceeding and for detecting any non-conformities or defects. Accordingly, the embodiment as illustrated in FIG. 7A forms a transfer measurement module (TMM) that may be utilized with one or more processing modules or as part of a common platform. Furthermore, as discussed herein multiple transfer measurement modules may be utilized and interfaced together to cooperate and form a larger common manufacturing platform.

The inspection systems incorporated within a transfer measurement module (TMM) operate in and are similar to other inspection systems as described herein. Such inspection systems as illustrated in FIGS. 7B and 7C, for example, only illustrate certain inspection systems. However, other inspection systems and features, such as those discussed with respect to FIGS. 5A-5F, would also be applicable to the transfer mechanism module is illustrated in FIG. 7A. As such, some common reference numerals are utilized in FIGS. 7A-7C as previously discussed herein.

The platform 700 incorporates a workpiece transfer module 712 that provides measurement/metrology data. The transfer measurement module (TMM) 712 includes a workpiece transfer mechanism, such as in the form of a handling robot 714 within the internal space of a transfer chamber 713. The transfer mechanism 714 is operable as in platforms 500 and 600 to move one or more or more workpieces through the transfer module 712 and between various of the processing modules that are coupled to transfer chamber 712 in the common manufacturing platform is illustrated in FIG. 7A. In accordance with one feature of the invention, transfer chamber 713 defines an internal space that includes a dedicated area that is used for measurement. The measurement region 715 of the TMM 712 is located in the dedicated area. The measurement region/area 715 is proximate to one or more inspection systems 730 for measurement.

More specifically, the measurement region 715 is positioned within the transfer chamber 713 so as to not interfere with the primary purpose of the transfer measurement module in moving workpieces through the process sequence and into and out of various processing modules. The measurement region defines one or more positions for placement of a workpiece for measurement. To that end, one or more inspection systems are configured to engage a workpiece that is positioned in the measurement region of the transfer chamber 713. The inspection system is then operable for measuring data associated with an attribute on the workpiece in accordance with the invention. As noted with the inspection systems disclosed herein, a support mechanism might be located within the measurement region 715 for supporting a workpiece during the collection of measurement data by the inspection system. Alternatively, the transfer mechanism 714 may provide the positioning and support of the workpiece within the measurement region 715 of the transfer chamber. In accordance with embodiments of the invention, the workpiece can be moved into or through the measurement region 715 during a processing sequence to obtain measurement data from one or more inspection systems that are associated with that measurement region. While a single measurement region is illustrated in FIG. 7A for illustrative purposes, multiple measurement regions 750 might be incorporated into the TMM 712.

Referring to FIG. 7B, the TMM module 712 incorporates one or more inspection systems 730 located within a measurement region 715 and provides the ability to obtain real-time measurements and measurement data during a processing sequence. In one embodiment, measurement region 715 within the TMM 712 incorporates a support mechanism 738 that receives a workpiece from mechanism 714 for measurement inside chamber 713. Measurement data is captured as the workpiece is moved between processing modules.

Generally, the inspection system 730 in the TMM 712 is positioned proximate the measurement region and is configured for engaging a workpiece in the measurement region 715 for measuring data associated with an attribute of the workpiece. As noted, the dedicated area for defining the measurement region is located so that the workpiece support mechanism and any associated inspection systems will not interfere with the primary function of the TMM in moving workpieces in the process sequence and through one or more processing modules. The measurement module or inspection system that is part of the measurement module may be entirely contained in the TMM to make measurements as shown in FIG. 7C. In other embodiments a least a portion of the measurement module or inspection system is positioned inside of an internal space of the TMM so as to define a measurement region within a dedicated area of the internal space as shown in FIG. 7B.

The inspection system 730 of a measurement module that is part of TMM 712 may be a contactless system including one or more signal sources 732 to generate inspection signals and one or more detectors 740. Incident signals 734 are reflected or scattered from the surface of the workpiece 736 and the scattered signals 735 are captured by the detector 740. Alternatively, a contact system such as that illustrated in FIG. 5E might also be used.

FIGS. 7B and 7C illustrate alternative embodiments of the TMM 712. In the embodiment of FIG. 7B, at least a portion of the measurement module or at least a portion of the inspection system associated with the measurement module is positioned inside of an internal space of chamber 713 of the TMM 712. More specifically, a measurement region 715 is defined and is located within a dedicated area of the internal space of the transfer chamber 713. The signal source and signal detector elements of an inspection system are located externally of the transfer chamber internal space 713 while the workpiece support mechanism 738 and transfer mechanism 714 for supporting a workpiece 736 are contained within the transfer for chamber 713. To that end, the inspection signals 734 pass through an appropriate access port 750 that is effectively transparent to the passage of the inspection signal from the inspection system and into the internal space to engage workpiece 736 positioned in the measurement region 715. As noted, the inspection signal might include an electromagnetic signal, an optical signal, a particle beam, a charged particle beam, or some combination of such signals. The access port 750 may be appropriately formed to operate with a specific inspection system and the sources of the inspection signal. For example, the access port might include a window, an opening, a valve, a shutter, and iris, or some combination of different structures for forming the access port in order to allow incident inspection signals to engage the workpiece 736. To that end, at least a portion of the inspection system 730 might be located generally above a top surface of the transfer chamber 713.

In accordance with features of the invention, the support mechanism 738 or transfer mechanism (whichever is supporting the workpiece for measurement) provides movement of the workpiece 736 for scanning the workpiece with respect to the system. Alternatively, as disclosed, the workpiece might be stationary while the inspection system is scanned. In one embodiment, the substrate support mechanism provides translation and rotation of the workpiece, such as under the path of inspection signals 734 is indicated by the reference arrows in FIGS. 7B and 7C. In that way, measurement/metrology data may be captured and then utilized by the control system 522 is discussed herein for providing active interdiction during substrate processing and fabrication in order to provide corrections to the fabrication process to address data indicating that substrate layers and/or features or out of specification or to correct nonconformities or defects that are detected.

In accordance with one feature of the invention, the transfer mechanism 714 takes workpieces from one or more of the processing modules 720a-720e and before moving it onto another processing chamber, passes the substrate through the measurement region 715 of the TMM. For example, the mechanism 714 may direct the workpiece 736 onto a support mechanism 738 wherein it is translated and/or rotated with respect to the signals 734 of one or more inspection systems.

FIG. 7C illustrates an alternative embodiment of the TMM of the invention. Therein, the measurement module is positioned generally entirely inside of the internal space of the transfer chamber 713. That is, the support mechanism 738 as well as the inspection system 730 and components are contained inside of the transfer measurement module 712. Generally, the components of the measurement module including the inspection system as well as support mechanisms are positioned in the defined measurement region 715 and thus have their own dedicated area within the internal space or chamber of the TMM.

The embodiments of the TMM illustrated in FIGS. 7B and 7C incorporate contactless inspection systems 730 wherein inspection signals are directed onto the workpiece. Alternatively, as noted, the inspection system 730 might also include a contact measurement system such as that shown in FIG. 5E that physically contacts the workpiece or contacts the support mechanism or does both in order to measure data associated with an attribute of the workpiece. Furthermore, while FIGS. 7B and 7C illustrate placement of a workpiece 736 onto a support mechanism 738, the transfer mechanism or robot 714 might actually act as a support mechanism for moving the workpiece with respect to the inspection system as illustrated in FIG. 5C. Still further, the inspection systems for the measurement modules used in a TMM might also incorporate a stationary workpiece wherein the inspection system itself moves as shown in FIG. 5D. Similarly, the inspection system 530 might be incorporated as part of or embedded with the support mechanism as illustrated in FIG. 5F.

Figure 7D:
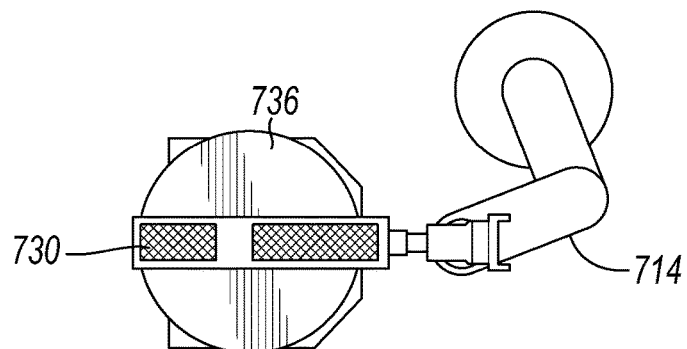
FIG. 7D is a top view of a workpiece transfer mechanism in accordance with an embodiment of the invention.
Figure 7E:
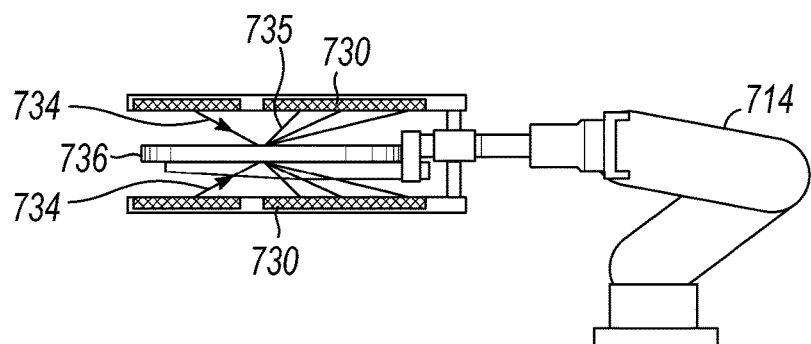
FIG. 7E is a side view of the workpiece transfer mechanism of FIG. 7D.

By incorporating at least, a portion of a measurement module to be positioned inside of an internal space of the TMM, efficiencies can be realized because the workpiece can be passed into a measurement region while being transferred between processing modules. Utilization of the transfer mechanism 714 as a support mechanism for the workpiece is particularly suitable for the TMM as illustrated in FIG. 7A. To that end, FIGS. 7D and 7E illustrate another embodiment of the invention, wherein an inspection system may be incorporated directly onto a transfer mechanism 714. As illustrated, an inspection system 730 might be coupled to the transfer mechanism 714 to move with the workpiece. In that way, when the workpiece moves between processing chambers, it can be engaged by the inspection system 730 as it is being moved for obtaining measurement data. Referring to FIG. 7E, the inspection system 730 might be incorporated above and/or below the robot associated with the transfer mechanism in order to obtain data from either surface of a workpiece 736 carried by the transfer mechanism. The system as illustrated in FIGS. 7D and 7E might be utilized to obtain data while the workpiece is actually being moved to another separate inspection system. As such, a transfer mechanism 714 is illustrated in FIGS. 7D and 7E might be incorporated with various embodiments of the measurement modules or transfer measurement modules as disclosed herein.

Figure 7F:
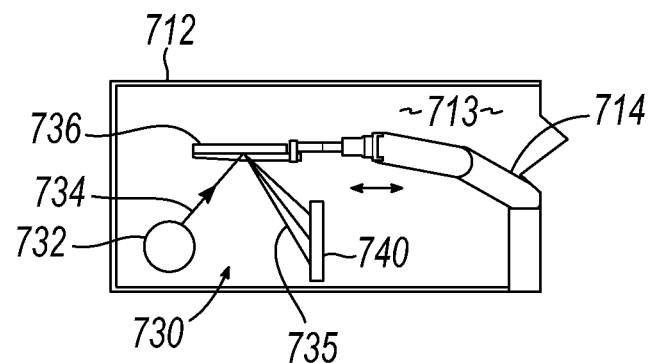
FIGS. 7F and 7G are schematic views of an inspection systems for use in measurement modules in accordance with the invention.
Figure 7G:
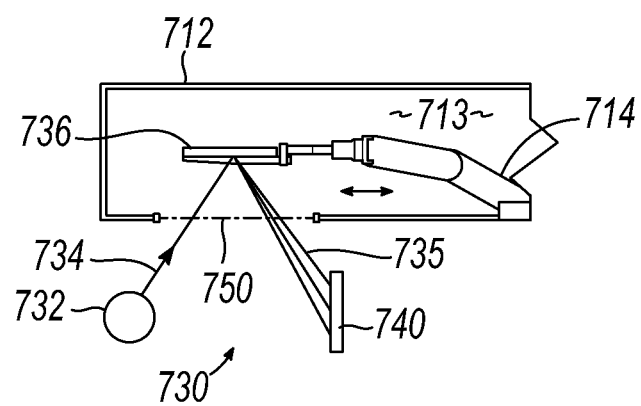

Certain of the measurement scenarios and inspection systems as described herein are shown to be directed to what is essentially a top surface of the workpiece, or essentially the work surface of the workpiece on which devices are formed. Alternatively, measurements may be desired on the bottom surface of a workpiece. That may be done by positioning the workpiece onto a support mechanism that incorporates embedded measurement systems as shown in FIG. 5F. Alternatively, as illustrated in FIGS. 7F and 7G, inspection systems might be arranged in a TMM 712 such that a bottom surface of a workpiece is measured, either from within the internal space of the chamber 713 as in FIG. 7F or externally as illustrated in FIG. 7G.

As will be appreciated, while the embodiments disclosed in FIGS. 7A-7O show a single inspection system, multiple systems 730 might be utilized inside transfer measurement module 712 to take various different measurements on the workpiece and thereby provide inputs to the active interdiction control system 522 for taking steps to correct or ameliorate any detected non-conformities or defects. The measurements may be taken on-the-fly within the processing environment of the TMM, which may be a controlled environment or under vacuum. In that way, various measurements of features and/or attributes may be determined within a contaminant-free zone in the transfer module. Inside of the transfer measurement module (TMM) workpieces may move from processing to the measurement region 715 without breaking vacuum. The transfer measurement module 712 provides a module that may be incorporated into a common manufacturing platform with a plurality of different processing chambers as illustrated. Since the workpiece is moved between various processing modules in the completion of a processing sequence, the substrate may be passed through the measurement region 715 without a significant increase in time in the overall processing sequence. Thereby, measurement data is readily gathered in real-time, and may be processed by the control system 522 discussed herein to affect or correct the processing sequence, as necessary, depending upon the measured data.

In accordance with features of the invention, the substrate support mechanism 538, 638, 738 is utilized herein provide multiple degrees of freedom and motion in order to take necessary measurements on the workpiece surface within the measurement module or transfer measurement module (TMM). For example, multi-axis X-Y-Z translation is provided as well as rotation of the substrate. The support mechanism may provide sub-micron level control of the movement of the workpiece for the purposes of capturing data. In accordance with one embodiment of the invention, a mechanical drive system may be utilized in the support mechanism and platform to provide the multiple degrees of freedom in motion. In an alternative embodiment of the invention, a magnetically levitated and rotating support platform may be utilized. Such a support mechanism and platform may reduce some of the possible contamination associated with a support platform utilizing mechanical drive systems.

Figure 7H:
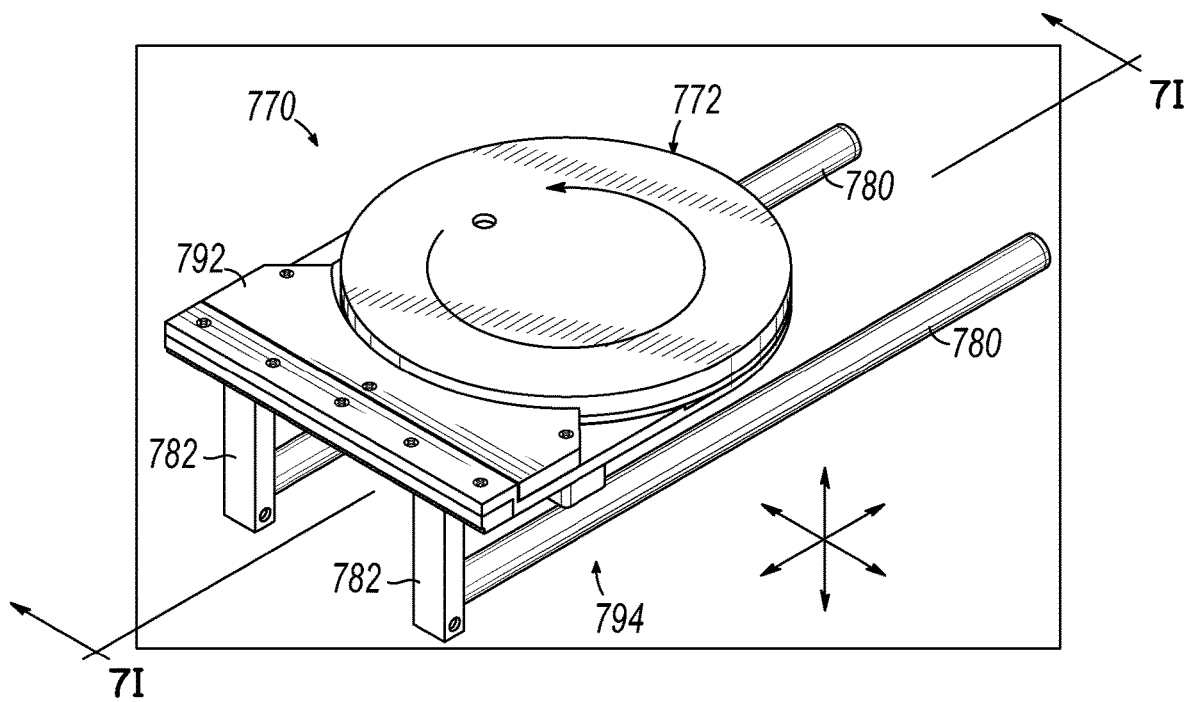
FIGS. 7H and 7I are perspective and side cross-sectional views, respectively, of a support platform for workpiece measurement in accordance with the invention.
Figure 7I:
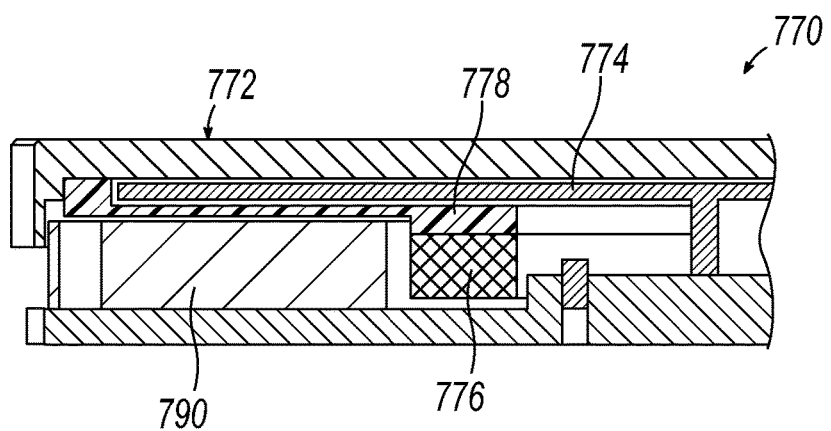

Specifically, FIGS. 7H and 7I illustrate a support platform 770 that incorporates the rotatable workpiece holder 772. The holder 772, for example, might be made of aluminum. Beneath the rotating holder 772, a heater element 774 may provide heat to the workpiece holder 772. The workpiece holder 772 is coupled to a magnetic levitation rotor element 776 through an appropriate adapter 778, which may also be made of aluminum. Generally, the magnetic levitation rotor element 776 may be ring-shaped. FIG. 7I illustrates only a partial cross-section of the workpiece holder 772. FIG. 7H illustrates the entire workpiece holder 772 coupled with a linear translation mechanism 780.

The support mechanism platform 770 also incorporates a magnetic levitation stator or element 790 which surrounds and is proximate to the magnetic levitation rotor element 776. Through the interaction of the rotor element 776 and stator element 790, the workpiece holder 772 may be rotated about a base 792.

For translation of the support platform 770, the base element 792 and rotating workpiece holder 772 are mounted to a translation mechanism 794. The translation mechanism 794 may incorporate one or more translation rods 780 which are appropriately coupled through mounting elements 782 to the base element 792 of the support platform. The support platform 770 may be incorporated into a vacuum environment and specifically may be incorporated into the various measurement modules or transfer measurement modules as disclosed herein for providing rotation and translation of a workpiece in proximity to one or more inspection systems for capturing metrology data. The support platform 770 may be translated at a rate of up to 300 mm/s at the direction of a control system in order to provide desirable measurement data. The workpiece holder may be rotated at a rate of up to 120 RPM, for example, as it is translated. Heating may also be provided through the heat element 774. The translation rods 780 may be also coupled to additional translation mechanisms for moving the workpiece holder 772 along another axis as well as an elevation mechanism (not shown) for elevating the support platform 770. While the workpiece holder 772 is located within the measurement module or a transfer measurement module as disclosed herein, various elements of the translation mechanism, such as portions of translation rods 780 and other mechanisms, including the drive motors for such mechanisms, may be located outside of the measurement module or the transfer measurement module. One or more protection layers of various materials may be applied to the rotation components to prevent outgassing and potential contaminants from entering the chamber and landing on the substrate. Details of a suitable support platform 770 are further described in U.S. Patent Application Publication Serial No. US2018/0130694 entitled "Magnetically Levitated and Rotated Chuck for Processing Microelectronic Substrates in a Process Chamber" filed Nov. 8, 2017 and incorporated by reference herein in its entirety.

Figure 8:
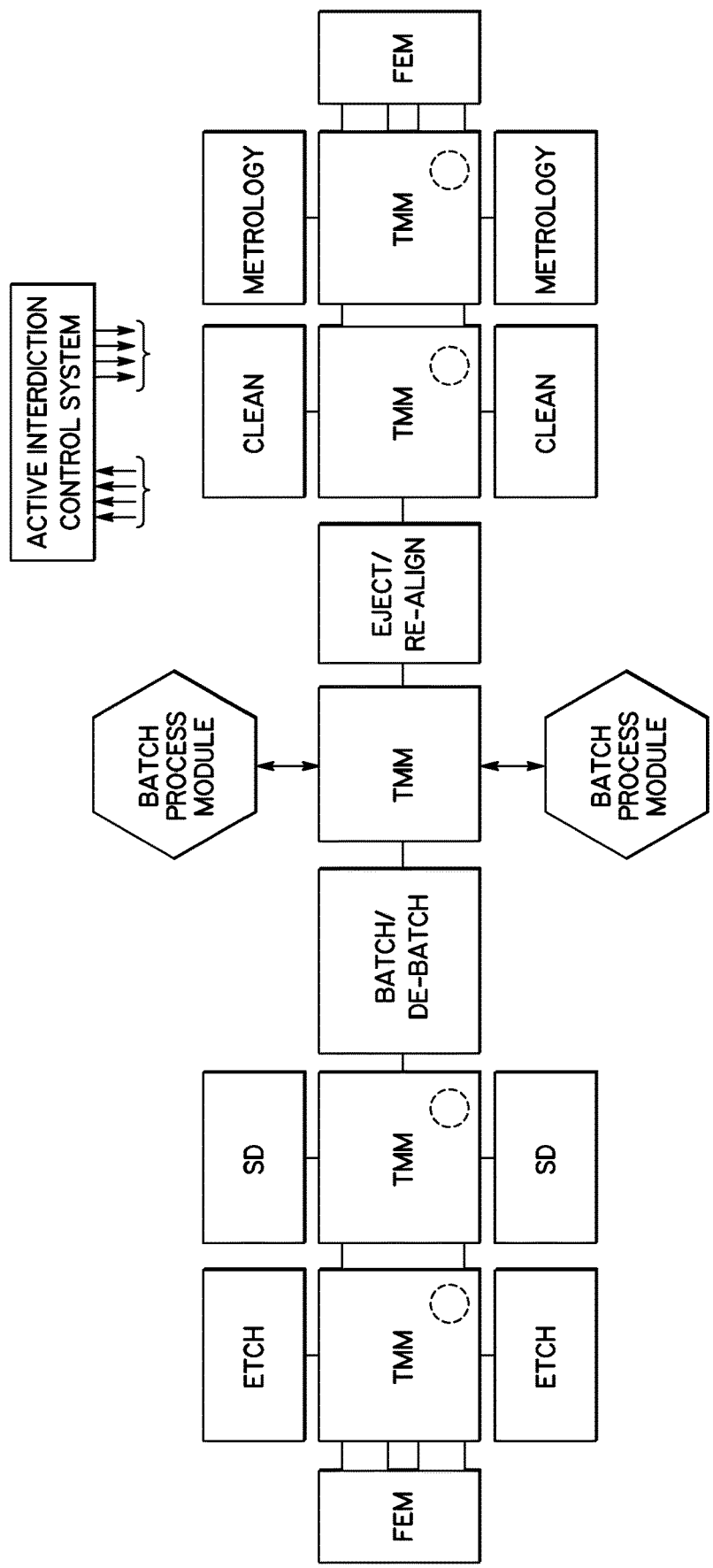
FIG. 8 is a schematic illustration of a semiconductor fabrication platform in accordance with an embodiment of the invention.
Figure 8A:
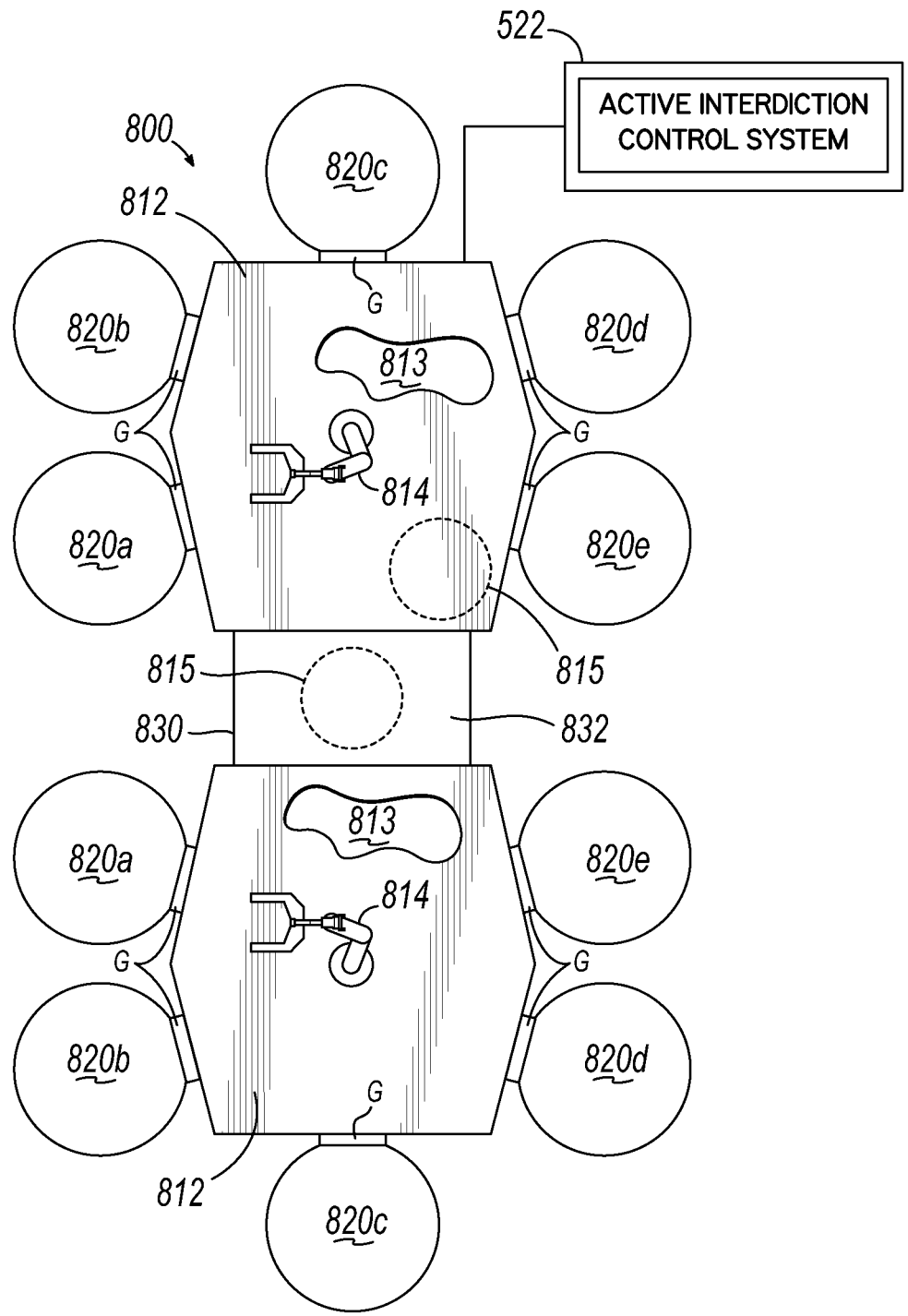
FIG. 8A is top view of a common platform incorporating process and a measurement transfer module in accordance with an embodiment of the invention.
Figure 8B:
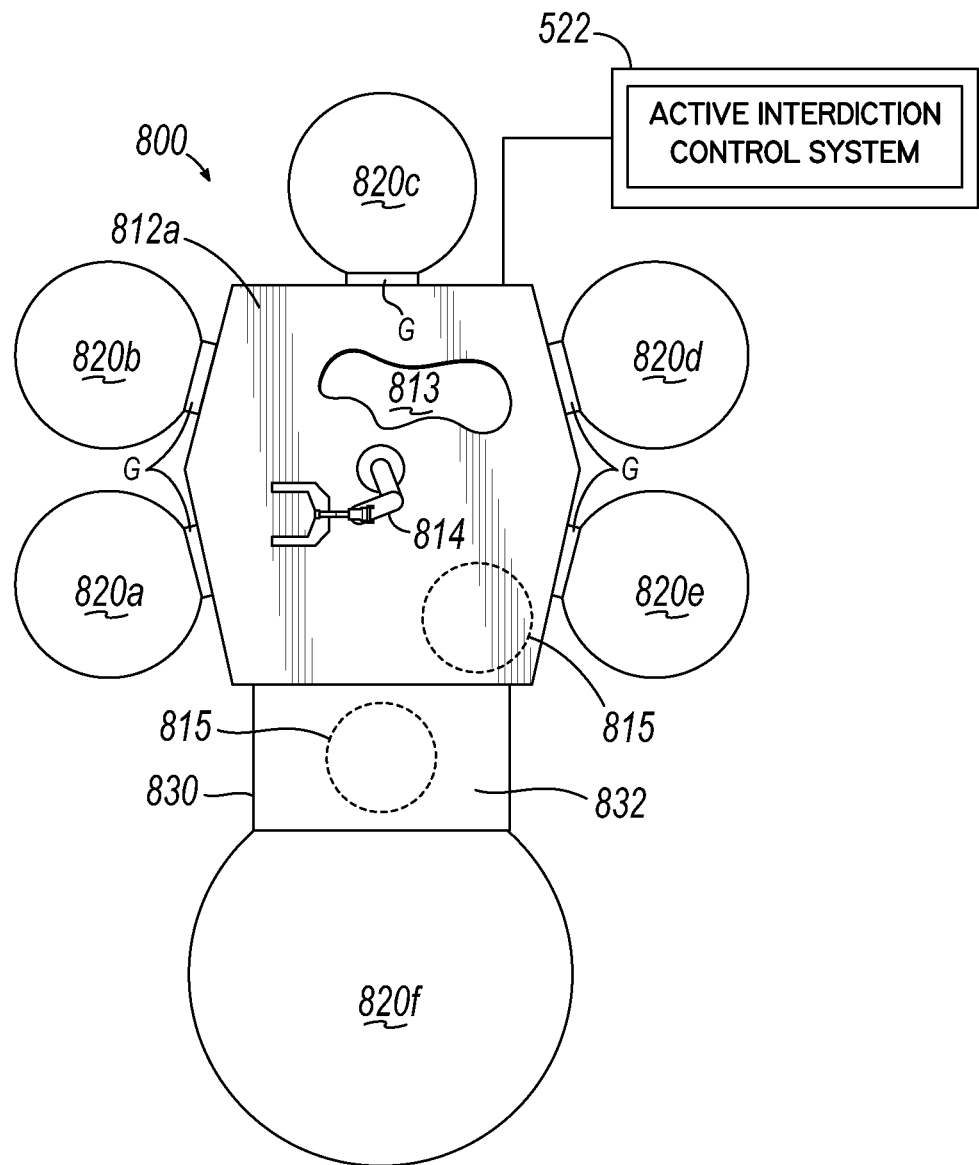
FIG. 8B is a top view of a common platform incorporating process and a measurement transfer module in accordance with another embodiment of the invention.

FIGS. 8, 8A, and 8B illustrate alternative embodiments of the invention wherein defined measurement regions are implemented not only within the transfer measurement module, but also within a pass-thru chamber utilized by a transfer measurement module to move workpieces between the transfer measurement module and one or more processing modules or other transfer modules. Such measurement regions might be located within a dedicated area of the internal space of a pass-thru chamber and are accessible by the transfer mechanism moving workpieces for the purposes of positioning a workpiece within the measurement region. This may be done before or after the workpiece has been processed in a processing module. In accordance with features of the invention, an inspection system is associated with one or more measurement regions and the inspection system is configured to engage a workpiece that is positioned in the measurement region for measuring data associated with an attribute of the workpiece. Referring to FIG. 8A, a transfer measurement module 812a is coupled with a transfer module 812b through a pass-through chamber 830. The transfer measurement module 812a will include one or more dedicated measurement regions 815 therein associated with appropriate inspection systems for gathering measurement data. Transfer module 812b is shown as a typical transfer module without measurement capability, although that transfer module might also incorporate one or more dedicated measurement regions and inspection systems. Each of the modules 812a, 812b act as a platform for supporting one or more processing modules 820a-820e. The associated transfer mechanisms 814 will move workpieces through a processing sequence and into and out of various modules of the processing modules under the control of an active interdiction control system 522 as illustrated. In that way for example, the workpiece might be moved through a processing sequence associated with the platform defined by transfer measurement module 812a and then moved to a different processing sequence passing the workpiece through the pass-thru chamber to engage the other transfer mechanism 814 within transfer module 812b.

In accordance with one embodiment of the invention, the pass-thru chamber has an internal space 832 to allow for movement of the workpiece between the transfer measurement module 812a and another transfer module 812b, or as illustrated in FIG. 8B, a processing module. Each of the transfer modules may incorporate a transfer chamber 813 that has an internal space that houses a transfer mechanism 814. As noted the transfer mechanism is configured to move various workpieces through the internal space and selectively into and out of the various processing modules or the pass-thru chamber 832. A dedicated measurement region 815 is positioned within the pass-thru chamber internal space 832. The measurement region 815 within the pass-thru chamber is accessible by either of the transfer mechanisms 814 for positioning a workpiece in that measurement region before or after the workpiece has been processed in one of the adjacent processing modules. The measurement region of transfer chamber 830 will include one or more inspection systems as described herein that are configured to engage a workpiece that is positioned in the measurement region and is operable for measuring data associated with an attribute on the workpiece. In that way, measurement or metrology data may be gathered as the workpiece is moved between adjacent processing platforms or into and out of other processing modules.

For example, FIG. 8B illustrates an alternative arrangement utilizing a pass-thru chamber 830. The platform 800 may include a transfer measurement module 812a, for example, that incorporates a number of processing modules as illustrated. The pass-thru chamber 830 may pass through to another processing module 820f rather than to another transfer module or transfer measurement module as depicted in FIG. 8A. Thus, in accordance with embodiments of the invention, measurement modules and/or inspection systems are incorporated onto a common platform with various processing modules by incorporating measurement regions and inspection systems within other areas, including a pass-thru chamber that is utilized for moving substrates between platforms or between processing modules.

Figure 9:
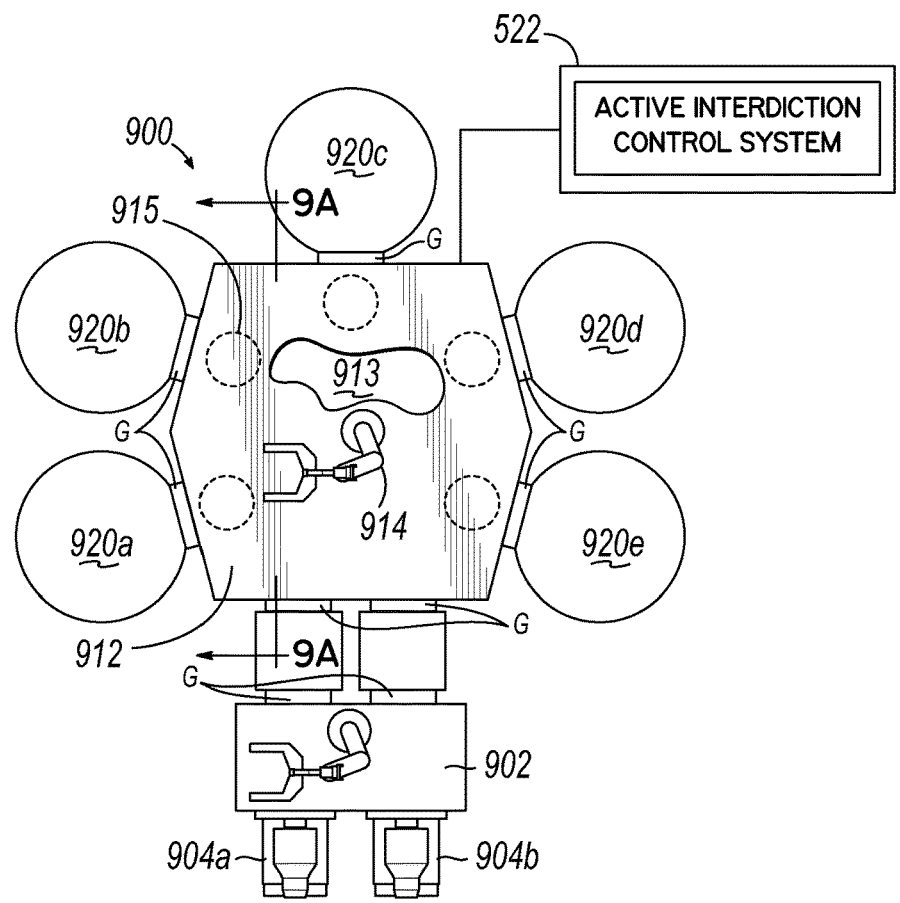
FIG. 9 is a top view of a common platform incorporating process and a measurement transfer module in accordance with another embodiment of the invention.
Figure 9A:
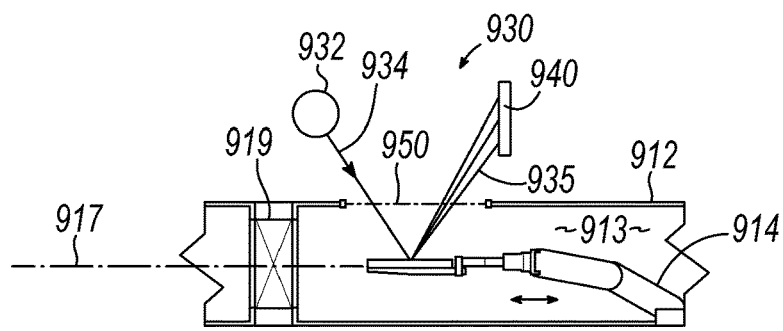
FIGS. 9A and 9B are side views in partial cross-section of transfer measurement modules incorporated in a common platform in accordance with another embodiment of the invention.
Figure 9B:
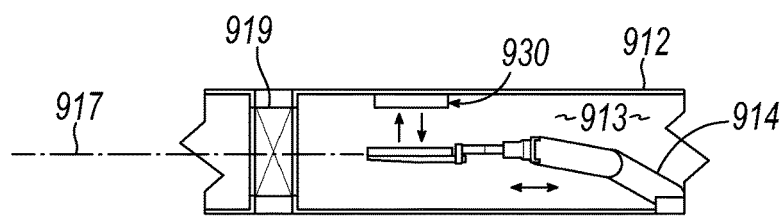

FIGS. 9, 9A, and 9B illustrate still another embodiment of the invention wherein one or more inspection systems are coupled with a transfer module specifically a transfer chamber of the module. Turning to FIG. 9, a platform 900 is illustrated that incorporates the transfer module 912 and a plurality of processing modules 920a-920e. The transfer module includes transfer chamber 913 that defines an internal space for the movement of workpieces. As illustrated, the transfer chamber 913 also utilizes one or more transfer ports 919 that are disposed around a perimeter of the transfer chamber and may be accessed through gate valves G. As shown in FIG. 9, the transfer ports 919 coincide with entry to one or more processing modules and thus the transfer ports are opposite corresponding processing modules. Transfer mechanism 914 is positioned inside an internal space of the transfer chamber 913 and is configured to move a workpiece generally along a horizontal plane 917 within the chamber internal space. The transfer mechanism 914 selectively moves workpieces into and out of one or more processing modules that are positioned opposite corresponding transfer ports in module 912.

One or more inspection systems 930 are coupled with the transfer chamber 913 and will engage in measurement regions 915 that coincide with transfer ports 919. The inspection systems will include components as discussed herein and may include a sensor access port or aperture 950 as illustrated in FIG. 9A that is disposed opposite the horizontal plane 917. Each of the inspection systems and specifically the sensor apertures are located within the perimeter of transfer chamber 913 and provide access to workpieces as they move into and out of the processing modules through corresponding transfer ports 919 as illustrated in FIGS. 9A-9B. FIG. 9A illustrates an inspection system 930 that directs inspection signals 934 from a signal source 932 through aperture 950 and then into the transfer chamber to engage a workpiece moving horizontally from the transfer chamber 913 through transfer ports 919 and into a processing module. Appropriate detectors 940 then detect or measure scattered signals 935 for obtaining measurement data.

In one embodiment of the invention, the inspection system might be an optical detection system that utilizes a light source 932 and an image capture device 940. Then the data associated with the image capture may be processed, such as by the active interdiction control system 522. An inspection system including an image processing system, as implemented through the active interdiction control system, may analyze surface components of the captured image. Alternatively, such an optical detection system may utilize pattern analysis, or thickness analysis or stress analysis associated with images captured by the optical detection system. Such measurement data may then be utilized in accordance with the invention for providing active interdiction and corrective processing associated with the detection of any non-conformities or defects.

FIG. 9B illustrates an alternative embodiment of the invention, wherein inspection system 930 might be located entirely within chamber 913 of the transfer module 912 and positioned in respective areas 915 proximate to the transfer ports to the processing modules as illustrated to internally be disposed opposite the horizontal plane 917 in which the workpiece moves. Inspection system 930 captures images associated with the surface of the workpiece that may then be processed through the active interdiction control system for providing surface analysis, pattern analysis, thickness analysis, stress analysis, etc. In that way, measurement data may be obtained, on-the-fly, as workpieces are moved into and out of various processing modules in the common platform 900.

Figure 10A:
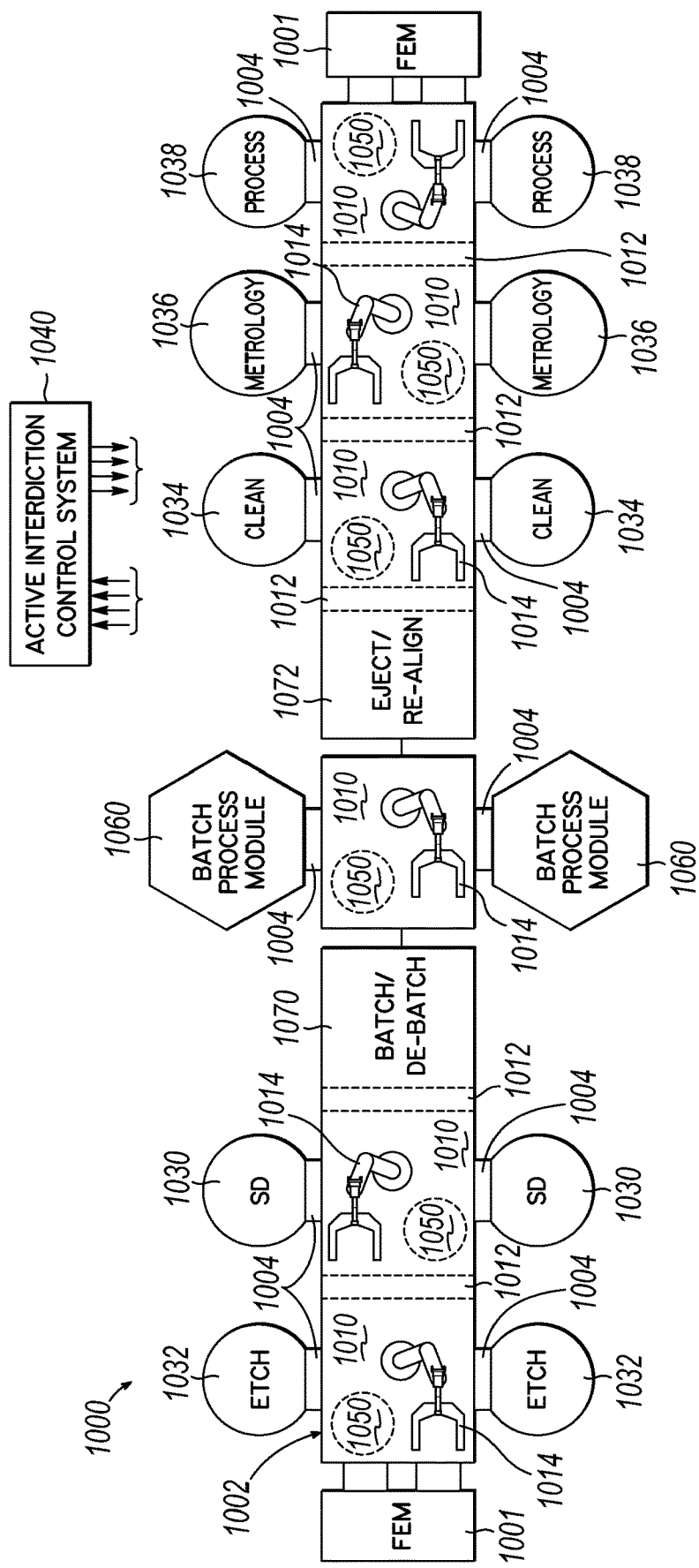
FIG. 10A is a schematic illustration of a semiconductor fabrication platform in accordance with an embodiment of the invention.
Figure 10B:
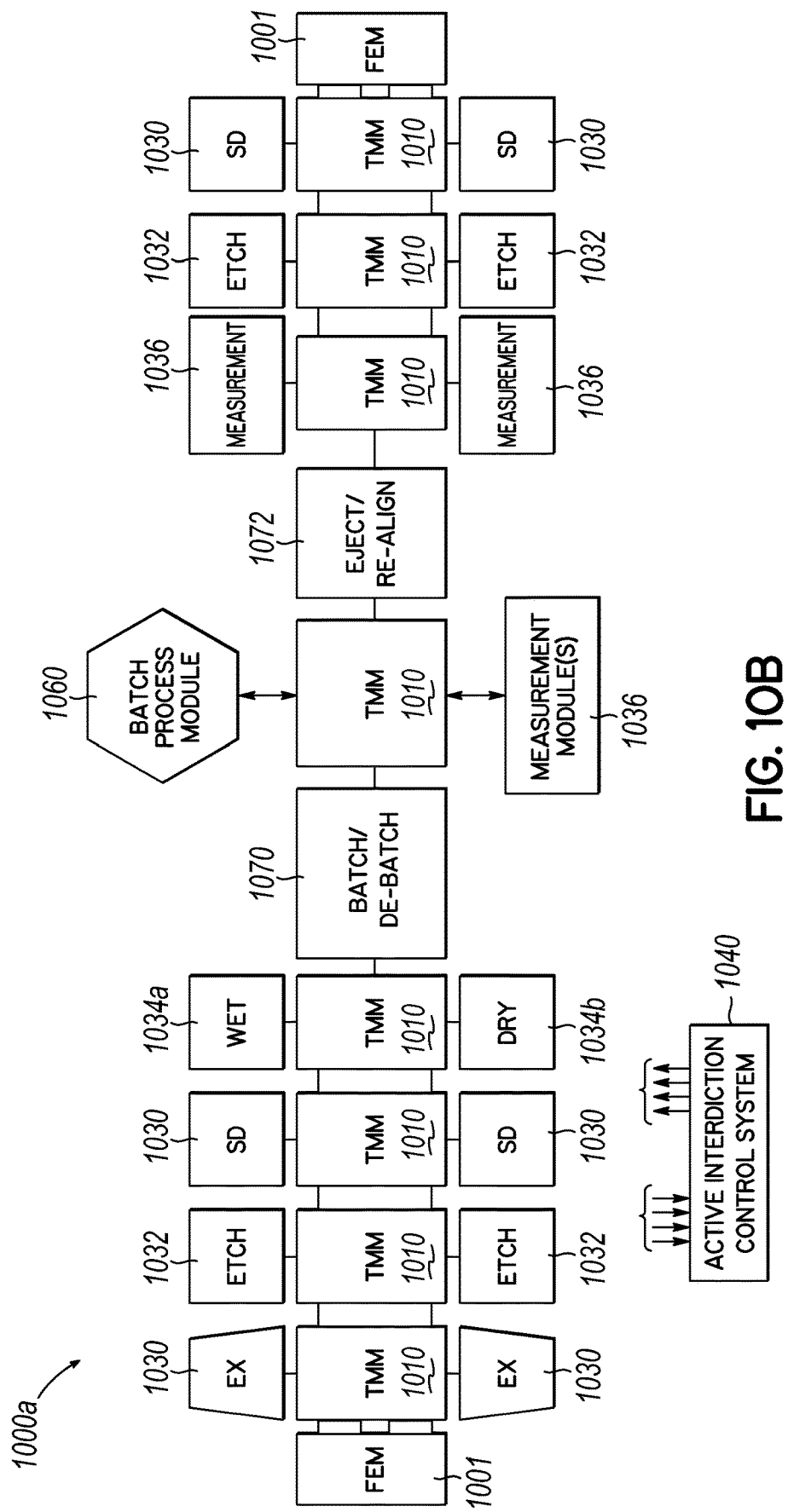
FIG. 10B is a schematic illustration of a semiconductor fabrication platform in accordance with another embodiment of the invention.

FIGS. 10A and 10B illustrate other alternative platforms, 1000 and 1000a, incorporating features of the invention, wherein substrates are processed through a plurality of different processing modules, that may include one or more etch modules and one or more film-forming modules in combination with one or more measurement/metrology modules to provide measurement data utilized by an active interdiction control system for controlling the overall process sequence in correcting non-conformities and defects. Platform 1000 may incorporate a distributed transfer system that incorporates one or more transfer mechanisms 1014 for selectively moving workpieces through the various modules of the platform. Referring to FIG. 10A, the distributed system incorporates at least one vacuum chamber 1002 that is accessed through front end modules 1001. The vacuum chamber 1002 may be a unitary chamber that defines generally a single chamber that has a plurality of ports 1004 for coupling with the chamber 1002 that contains the distributed transfer system. Alternatively, also as illustrated in FIG. 10A, the vacuum chamber 1002 might be separated into a plurality of internal vacuum chambers 1010 that are coupled together through a plurality of respective pass-thru ports 1012 as illustrated. In such an embodiment, the transfer mechanism utilized may incorporate a plurality of transfer mechanisms 1014 as illustrated that are associated with internal vacuum chambers.

Various processing modules maintained on platform 1000 might include one or more film-forming modules, such as selective deposition (SD) modules 1030. Furthermore, the platform may include one or more etch modules 1032 and one or more clean modules 1034. Also, a plurality of metrology/measurement modules 1036 may be incorporated. One or more other processing modules 1038 may also be incorporated on platform 1000, and thus the type of processing and measurement/metrology modules incorporated on the common manufacturing platform is not limited to what is illustrated in FIG. 10A. Platform 1000, including the various processing modules as well as measurement/metrology modules are coupled with an active interdiction control system 1040 to provide measurement data, in-situ processing data, and other data that control a processing sequence in accordance with the invention. That is, measurement data that indicates non-conformities and/or defects is utilized by the active interdiction control system for corrective processing and to control various of the process modules and movement of the workpiece through the platform.

The active interdiction control system 1040 also controls the pressure within the vacuum chamber 1002 and also within the individual internal vacuum chambers 1010 through which the substrate is transferred. For example, control system 1040 will control pressure differentials between various of the internal vacuum chambers 1010 when the workpiece is transferred within the distributed transfer system as illustrated in the platform 1000. Furthermore, the control system 1040 will control and maintain a treatment pressure differential between the distributed transfer system vacuum chamber 1002 and vacuum chambers associated with one or more of the various processing modules. In accordance with another feature of the invention, the platform 1000 which incorporates the vacuum chamber 1002 and one or more transfer mechanisms 1014 might also incorporate one or more inspection systems 1050 for obtaining measurement data produced by the control system 1040, as workpieces proceed through the platform 1000. As illustrated, with an internal chamber 1010 including a transfer mechanism 1014 and separate inspection system, each of the chambers 1010 may act as a transfer measurement module (TMM) as discussed herein. One or more of the pass-through ports 1012 might include a load lock mechanism to form a staging area in one of the vacuum chambers 1010 to store one or more workpieces.

In addition to various processing modules as illustrated, the platform 1000 may incorporate one or more batch process modules 1060 that provide batch processing, such as for atomic layer deposition, for example. Associated with the batch processing modules 1060 are batch/debatch stage 1070 and then eject/redesign stage 1072, wherein various of the workpieces going into or out of batch processing might be staged. Such chambers or areas may also be utilized as storage chambers while the control system 1040 is providing the desired pressure differentials between the internal vacuum chamber 1002 and one or more of the chambers associated with the processing modules.

In accordance with one aspect of the invention, as workpieces move through platform 1000, and into and out of various of the processing modules and internal vacuum chambers 1010, environmental conditions are maintained between internal vacuum chamber 1002 and a chamber of the processing module when the workpieces are transferred therebetween. The environmental conditions may comprise at least one of pressure, gas composition, temperature, chemical concentration, humidity, or phase. The control system 1040 will maintain that environmental condition(s) as necessary for processing and transfer. Also, system environmental conditions might be maintained in the vacuum chamber 1002 between the various internal sections or internal vacuum chambers 1010 by the control system 1040. Again, such environmental conditions may include at least one of pressure, gas composition, temperature, chemical concentration, phase, humidity, etc. Environmental conditions that are maintained between the various sections or internal chambers 1010 and one or more other internal vacuum chambers 1010 may be based at least in part on the type of measurement or scan that may be performed by the inspection systems 1050 on a substrate that is disposed within a particular internal vacuum chamber 1010. Such environmental conditions may include pressure, gas, composition temperature or phase concentration. As noted, for processing, it may be necessary to maintain a system pressure differential between the various internal vacuum chambers when the substrate is transferred within platform 1000 and the control system 1040 maintains such a condition. Furthermore, it might be necessary to maintain a treatment pressure differential between the vacuum chamber 1002 and one or more of the chambers of a processing module when the substrate is transferred between vacuum chamber 1002 and a process module. To that end, the batch stage 1070 and eject stage 1072 as staging areas for various workpieces within vacuum chamber 1002 until the system pressure differential or the treatment pressure differential is achieved. Still further, it may be desirable to maintain system environmental conditions based on the type of measurement or metrology process being performed. Such environmental conditions may include pressure, gas composition, temperature or phase concentration.

Platforms 1000, 1000a can host a variety of processing modules including, but not limited to, film-forming equipment, etching equipment, deposition equipment, epitaxial equipment, cleaning equipment, lithography equipment, photo-lithography equipment, electron-beam lithography equipment, photo-sensitive or electron-sensitive material coating equipment, electromagnetic (EM) treating equipment, ultraviolet (UV) treating equipment, infrared (IR) treating equipment, laser beam treating equipment, thermal treating equipment, annealing equipment, oxidation equipment, diffusion equipment, magnetic annealing equipment, ion implant equipment, plasma immersion ion implant equipment, cryogenic or non-cryogenic aerosol or non-aerosol dry cleaning equipment, neutral beam equipment, charged particle beam equipment, electron beam treating equipment, ion beam treating equipment, gas cluster beam equipment, gas cluster ion beam equipment, etc. The processing modules can include dry-phase equipment, liquid-phase equipment, vapor-phase equipment, etc. Additionally, the processing modules can include single substrate processing equipment, mini-batch processing equipment (e.g., less than 10 substrates), batch processing equipment (e.g., greater than 10 substrates), etc.

Figure 10C:
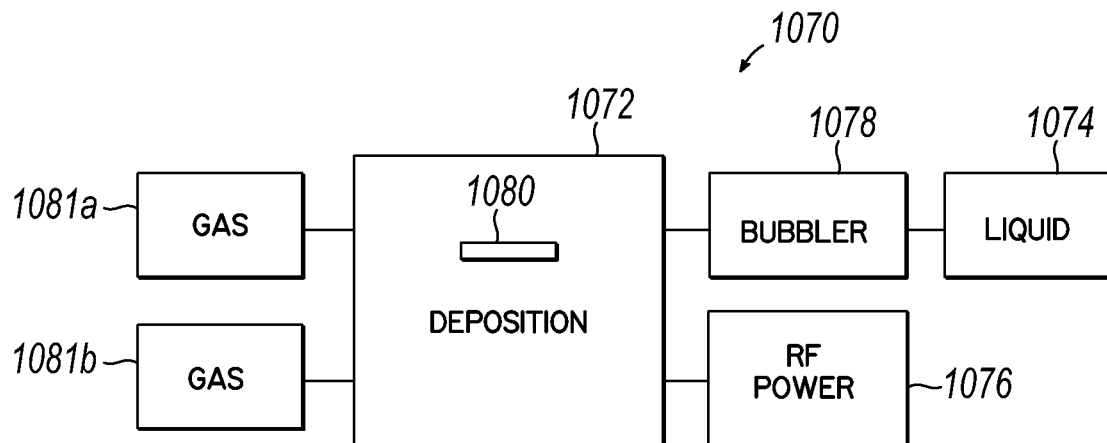
FIG. 10C is a schematic illustration of a processing module for use in semiconductor fabrication in accordance with an embodiment of the invention.
Figure 10D:
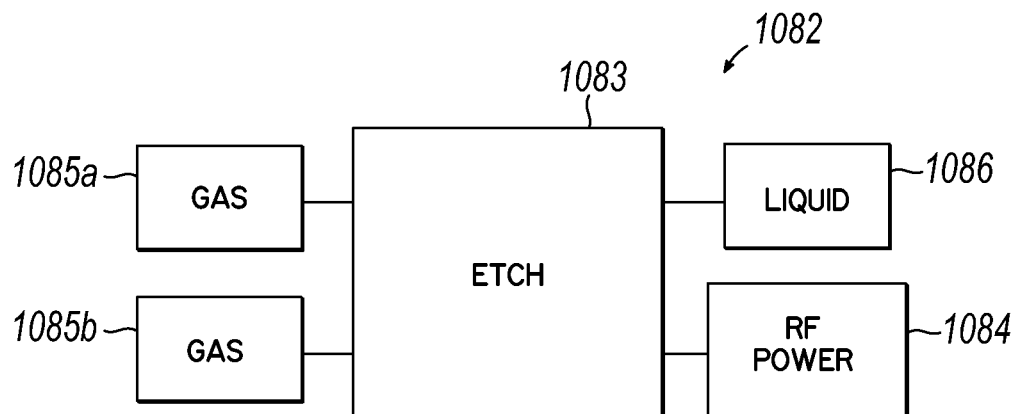
FIG. 10D is a schematic illustration of a processing module for use in semiconductor fabrication in accordance with an embodiment of the invention.
Figure 10E:
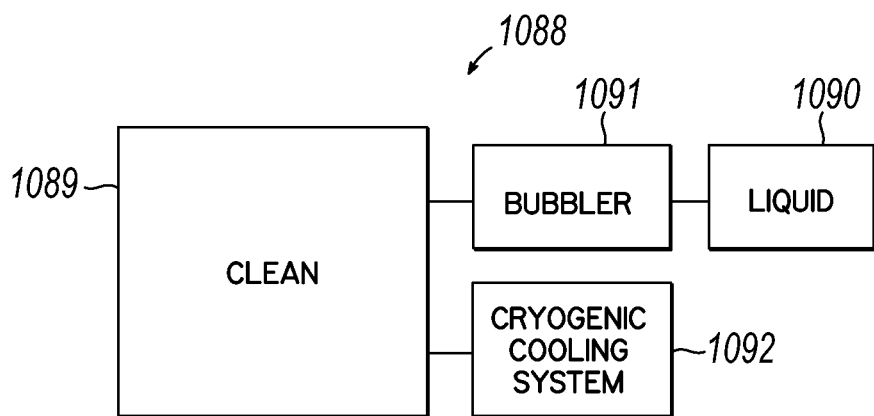
FIG. 10E is a schematic illustration of a processing module for use in semiconductor fabrication in accordance with an embodiment of the invention.

FIGS. 10C-10E illustrate exemplary processing modules that may be implemented with the common platform embodiments as discussed herein. FIG. 100 illustrates a film-forming or deposition module 1070 that will generally include a chamber 1072. The film-forming module 1070 might include a vacuum deposition chamber, or an atmospheric coating chamber. Module 1070 might also include a liquid dispensing system 1074 such as for an atmosphere coating chamber or an RF power source 1076 such as for powering a plasma in a deposition chamber 1072. The module 1070 might also incorporate a liquid source bubbler 1078 that can be coupled to a liquid dispensing system 1074 for providing the proper material phase into the chamber 1072 such as a deposition chamber. Film forming module 1070 might also utilize one or more sputter targets 1080 and might be coupled to one or more gas sources 1081a, 1081a for the purposes of film deposition in a deposition chamber 1072.

FIG. 10D illustrates a film removal or etch module 1082 that incorporates a processing or etch chamber 1083. For example, etching module may include a plasma etching module, a plasma-free etching module, remote plasma etching module, gas-phase etching module at atmospheric or sub-atmospheric conditions (e.g., vacuum), vapor-phase etching module, liquid-phase etching module, isotropic etching module, anisotropic etching module, etc. Module 1082 may, for instance, include a liquid-phase, vapor-phase, or gas-phase dispensing or distributing system (e.g., 1085a, 1085b, 1086), pressure control elements, temperature control elements, substrate-holding and controlling elements (e.g., electrostatic clamping chuck (ESC), zoned temperature control elements, backside gas system, etc.), and a power source 1084 (e.g., RF power source) for generating plasma in the etch chamber 1083.

FIG. 10E illustrates a clean module 1088 having a cleaning chamber 1089 for appropriately receiving substrates. For example, clean module 1088 may include a wet clean module, a dry clean module, a spin-type clean module, a bath-type clean module, a spray-type dispense clean module, a neutral beam clean module, an ion beam clean module, a gas cluster beam clean module, a gas cluster ion beam clean module, a cryogenic or non-cryogenic aerosol clean module, etc. The clean module 1088 may include a liquid source, a bath, a liquid dispense or spray nozzle 1090, a spin chuck, nested liquid dispense capture baffles, pressure control elements, temperature control elements, etc. The clean module 1088 may also incorporate a gas source, a cryogenic cooling system 1092, a gas nozzle, an aerosol nozzle, pressure control elements, temperature control elements, etc.

As noted, the platform 1000 might be utilize to stage one or more substrates for storage, such as while a corrective processing procedure is under way or process parameters in the platform are adjusted. To that end, the batch/debatch chamber 1070 or the eject chamber 1072 may incorporate a load lock at one of the adjacent pass-thru ports 1012 such that one or more of the individual internal vacuum chambers 1010 can operate as a separate staging area within the larger overall platform so that various workpieces may be stored within at least one internal vacuum chamber. Furthermore, the batch stage 1070 and eject stage 1072 might also act as a staging area to stage substrates for the batch processing module 1060 or while system parameters are adjusted.

FIG. 10B illustrates another possible platform layout similar to the platform of FIG. 10A with similar reference numerals utilized for various of the processing modules, control systems, and components of FIG. 10B. Turning to FIG. 10B, platform 1000a may include one or more film-forming modules 1030 and etch modules 1032 that are coupled with TMM modules 1010 for moving workpieces through the platform. Also, measurement modules 1036 may be incorporated onto the platform for detecting non-conformities and defects in accordance with the invention. Platform 1008 might also include cleaning modules such as a wet clean module 1034a or a dry clean module 1034b. Furthermore, platform 1000a might incorporate one or more measurement modules 1036 that are implemented for batch measurement. As illustrated, opposite batch process module 1060, one or more measurement modules 1036 may be implemented so that measurements may be taken, and measurement/metrology data gathered while workpieces are in a batch and before they are ejected and/or realigned through an eject stage 1072. Platform 1000a is in the control of an active interdiction control system 1040 as illustrated and workpieces can be moved back and forth in a generally linear fashion between the various processing modules and measurement modules in accordance with the invention to detect non-conformities and defects and also to provide corrective processing to the workpieces.

Active Interdiction and Workpiece Processing Examples

As described herein the active interdiction control system is configured for performing corrective processing based in part on measured data from the workpiece. Other data, such as process parameter data reflective of the processing parameters or settings of one or more processing modules may also be input to the active interdiction control system, as well as platform performance data for the common manufacturing platform. The data is processed by the active interdiction control system for determining non-conformities and defects in the workpiece and for determining a path of corrective processing to be performed in the platform during an active interdiction. As noted, the corrective processing may be performed in processing modules upstream or downstream in a process sequence when non-conformities are detected. The active interdiction control system is coupled with the various measurement modules and TMMs of the platform and processes the measured data and other data for controlling movement and processing of the workpiece in the process sequence.

In accordance with one feature of the invention, the corrective processing may include performing a remedial process sequence in the overall process sequence. For example, the remedial process may include cleaning a workpiece and/or removing a film or a portion of a film. Alternatively, an adjustment process sequence might be performed. Still further, the corrective processing might the simple ejection of the workpiece from the platform and process sequence if it cannot be corrected. In either case, an operator might be informed of a detected non-conformity.

Figure 11:
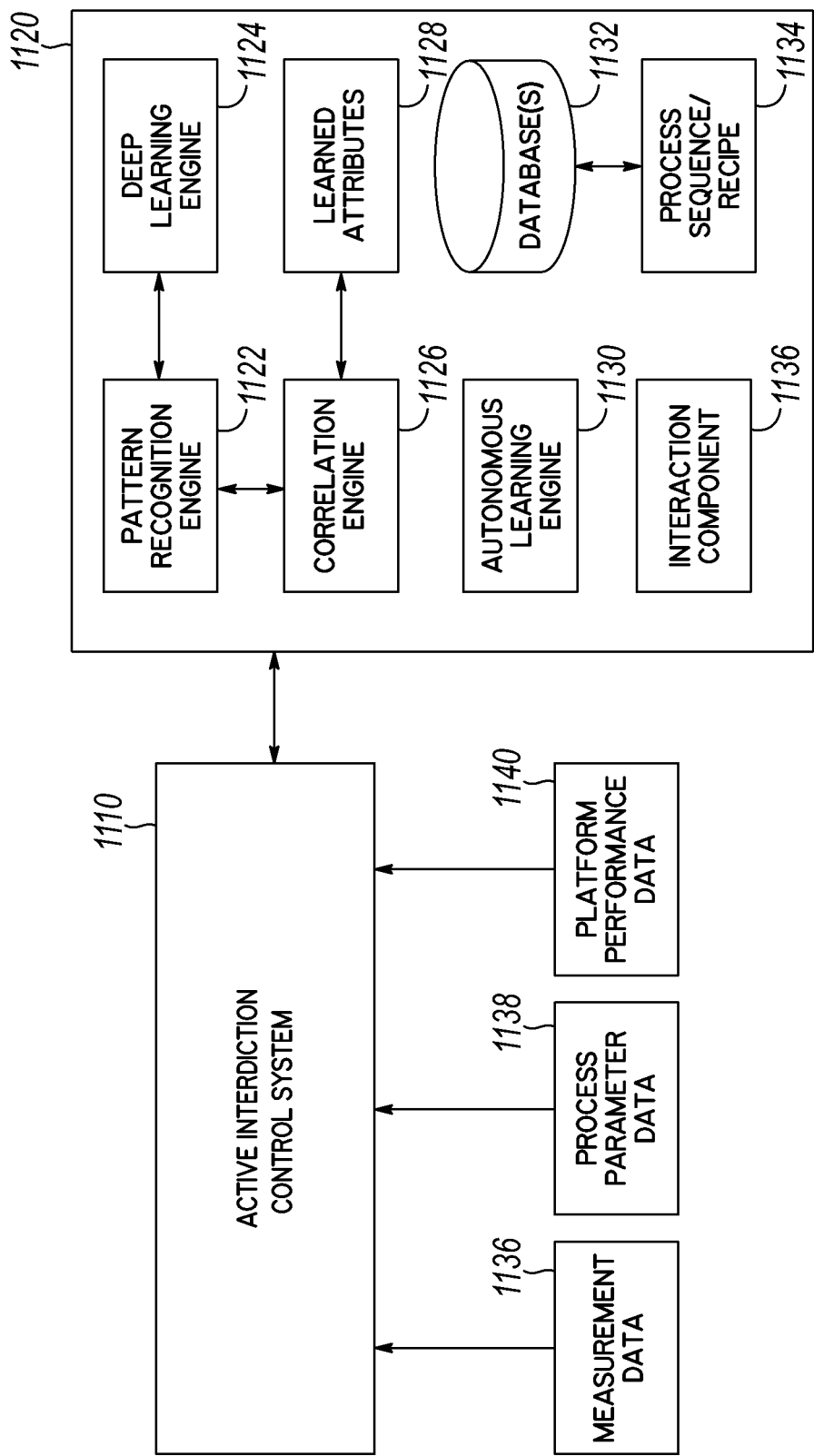
FIG. 11 is a schematic block diagram of an active interdiction control system and components in accordance with embodiments of the invention.

FIG. 11 illustrates an active interdiction control system 1110 and components 1120 for realizing the invention. The active interdiction control system might be located entirely or at least partially with the manufacturing platform and will generally be executed using a computer device having at least one processor. The components 1120 for implementing the active interdiction control system 1110 may be part of the computer used for executing the active interdiction control system or may be resources that are called upon by the active interdiction control system, such as over a network. Therefore, the various hardware layouts set forth herein are not limiting.

Figure 12:
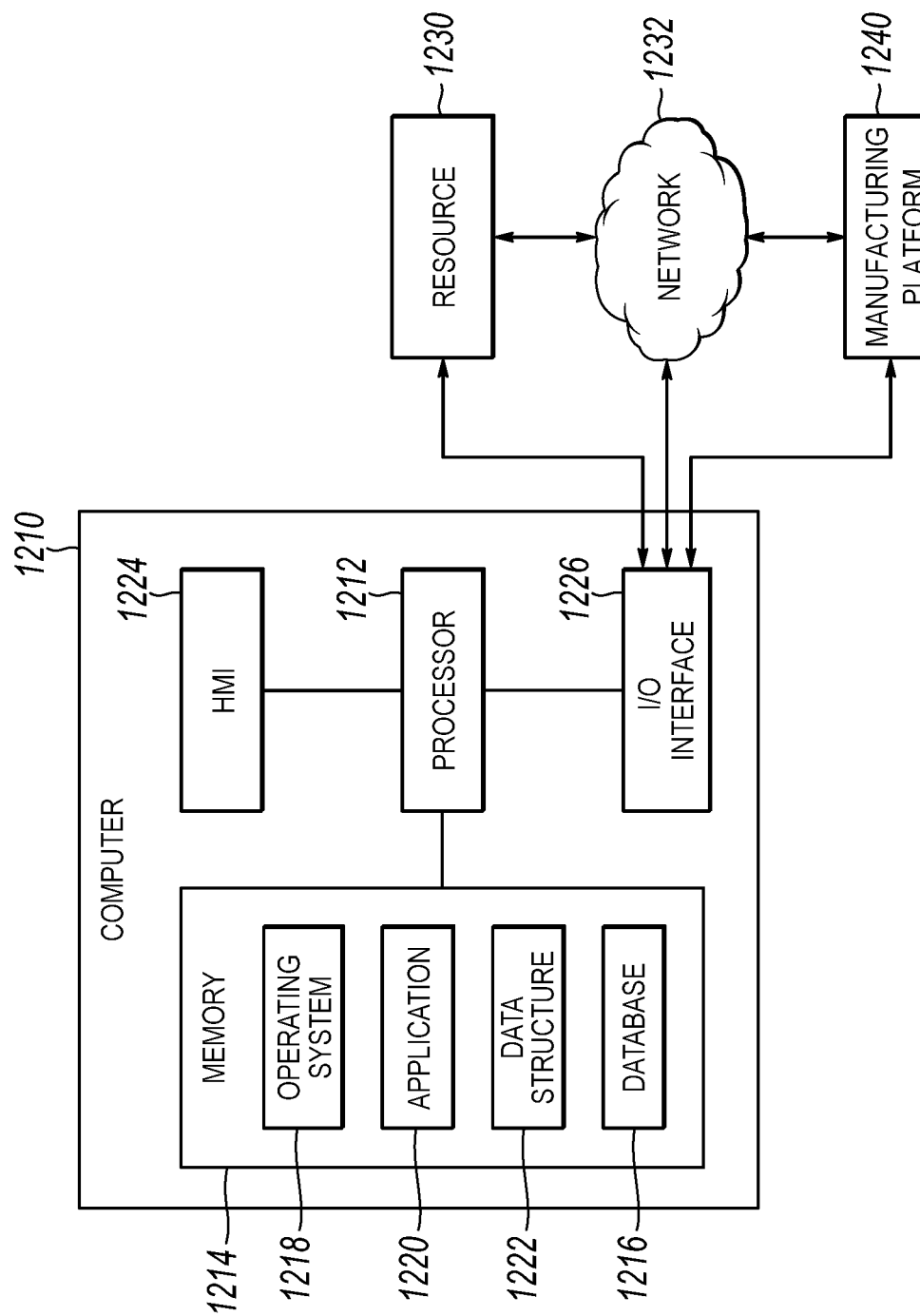
FIG. 12 is a schematic block diagram of a computer system for implementing an interdiction control system in accordance with embodiments of the invention.

FIG. 12 illustrates an exemplary hardware and software environment for an apparatus 1210 suitable for providing the active interdiction control system of the invention. For the purposes of the invention, apparatus 1210 may represent practically any computer, computer system, or programmable device e.g., multi-user or single-user computers, desktop computers, portable computers and devices, handheld devices, network devices, etc. Apparatus 1210 will hereinafter be referred to as a "computer" although it should be appreciated that the term "apparatus" may also include other suitable programmable electronic devices.

Computer 1210 typically includes at least one processor 1212 coupled to a memory 1214. Processor 1212 may represent one or more processors (e.g. microprocessors), and memory 1214 may represent the random access memory (RAM) devices comprising the main storage of computer 10, as well as any supplemental levels of memory, e.g., cache memories, non-volatile or backup memories (e.g. programmable or flash memories), read-only memories, etc. In addition, memory 1214 may be considered to include memory storage physically located elsewhere in computer 1210, e.g., any cache memory in a processor 1212, as well as any storage capacity used as a virtual memory, e.g., as stored on a mass storage device like database 1216 or any external database or other computer or system illustrated generally as resource 1230 coupled to computer 1210 directly or via a network 1232.

Computer 1210 also typically receives a number of inputs and outputs for communicating information externally. For interface with a user or operator, computer 1210 typically includes one or more user input devices coupled through a human machine interface (HMI) 1224. Computer 1210 may also include a display as part of the HMI for providing visual output to an operator in accordance with the system of the invention when non-conformities are detected. The interface to computer 1210 may also be through an external terminal connected directly or remotely to computer 10, or through another computer communicating with computer 1210 via a network 18, modem, or other type of communications device.

Computer 1210 operates under the control of an operating system 1218 and executes or otherwise relies upon various computer software applications, components, programs, objects, modules, data structures, etc. indicated generally as application 1220. The various components 1120 as shown in FIG. 11 may be part of the applications on the computer 1210 or might be accessed as a remote resource 1230 as shown for more robust processing. Part of the application and processing will also include various data structures 1222 and data as noted herein that may include for example the measurement data, process parameter data and platform performance data (e.g. database application 26). Computer 1210 communicates on the network 1232 through an appropriate network interface 1226. The computer for implementing an active interdiction system as disclosed will connect directly or through a network with the manufacturing platform 1240 and one or more of its control elements for the purposes of gathering data from the manufacturing platform and controlling the process sequence for active interdiction.

In general, the routines executed to implement the embodiments of the invention, whether implemented as part of an operating system or a specific application, component, program, object, module or sequence of instructions will be referred to herein as "computer program code", or simply "program code". The computer program code typically comprises one or more instructions that are resident at various times in various memory and storage devices in a computer, and that, when read and executed by one or more processors in a computer, causes that computer to perform the steps necessary to execute steps or elements embodying the various aspects of the invention. Moreover, those skilled in the art will appreciate that the various processing components and tools of the active interdiction control system are capable of being distributed as a program/application in a variety of forms and locations.

It should be appreciated that any particular program nomenclature that follows is merely for convenience, and thus the invention should not be limited to use solely in any specific application identified and/or implied by such nomenclature. Furthermore, given the typically endless number of manners in which computer programs/applications may be organized into routines, procedures, methods, modules, objects, and the like, as well as the various manners in which program functionality may be allocated among various software layers that are resident within a typical computer (e.g., operating systems, libraries, APIs, applications, applets, etc.), or in external resources it should be appreciated that the invention is not limited to the specific organization and allocation of program functionality described or illustrated herein. Those skilled in the art will recognize that the exemplary environment illustrated in FIG. 12 is not intended to limit the present invention. Indeed, those skilled in the art will recognize that other alternative hardware and/or software environments may be used without departing from the scope of the invention.

Referring to FIG. 11, the active interdiction control system may provide pattern recognition for predicting the existence of a non-conformity. To that end, the active interdiction control system includes a pattern recognition component, such as pattern recognition engine 1122 that is operable to extract and classify data patterns from the measured and predict whether or not a non-conformity exists based on the measured data. For example, certain features of a workpiece may be indicative of non-conformities and irregularities in data and may be reflected in patterns found in the measured data. Pattern recognition can compensate for measurement sophistication, or lack thereof, with data volume, or additional data. Measurement of multiple variables can be combined and/or correlated to identify non-conformities or irregularities in the data. In doing so, less sophisticated measurements can be made and correlated to achieve the same outcome of a more sophisticated measurement system. As an example, an optical 'fingerprint' can be created for a processed workpiece, representative of acceptable processing behavior. Deviations of the 'fingerprint' can be recognized as pattern shifts, which in turn, can identify opportunity for corrective action, e.g., perform corrective action in an upstream and/or downstream process, or rework an upstream process by removing the process outcome and repeating, etc. The pattern recognition engine 1122 may implement a deep learning architecture or engine 1124 as shown that might use one or more neural networks and supervised or unsupervised learning for implementing the pattern recognition. The deep learning engine 1124 might implement multi-variate analysis (MVA), for example, to analyze non-conformities or irregularities and determine a possible cause for use to do corrective processing. One type of multi-variate analysis includes Principal Components Analysis (PCA). PCA is a statistical procedure that transforms a set of observations of possibly correlated variables into a set of principal components. Each principal component, e.g., eigenvector, is associated with a score, e.g., eigenvalue, and the principal components can be sorted by the value of the score in descending order. In doing so, the first principal component represents the greatest variance in the data in the direction of the corresponding principal component within the n-dimensional space of the transformed data set Each succeeding principal component possesses the highest variance under the condition it is orthogonal to the preceding components. Each principal component identifies the 'weighting' of each variable in the data set. Subsequent observations can be projected onto one or more principal components, e.g., the first principal component and/or other components, to compute a score (e.g., score A from the vector product of a new observation with the first principal component), or mathematical manipulation of one of more scores (e.g., score A+score B/score C, etc.). For example, light scattered from a processed workpiece, either from a single location or multiple locations, can represent an observation. When coupled with plural observations, a model composed of one or more principal components can be established, and subsequently used to 'score' a processed workpiece. When a score, or sequence of scores, deviates from a defined 'normal behavior', or acceptable process window, corrective action can proceed, i.e., perform corrective action in an upstream and/or downstream process, or rework an upstream process by removing the process outcome and repeating, e.g.

The pattern recognition engine may correlate an extracted data pattern with a learned attribute on the workpiece. The pattern recognition engine may implement a correlation engine 1126 that accesses one or more learned attributes, 1128, such as in a database 1132 in order to correlate measured data in the form of a data pattern with a learned attribute. For example, one learned attribute might include a defect on the workpiece, such as one or more particle contaminants. Such a defect could be correlated with the measured data pattern for detecting a non-conformity to be addressed. In other embodiments, the defect might indicate an out-of-tolerance condition for a workpiece attribute. For example, the workpiece attribute that is out-of-tolerance might include a thickness, a critical dimension (CD), a surface roughness, a feature profile, a pattern edge placement, a void, a loss of selectivity, a measure of non-uniformity, or a loading effect. Such defects or various combinations of such defects may be used for pattern recognition of non-conformities by the active interdiction control system.

In another embodiment, the learned attribute, rather than being a defect, might include a probability of a defect on the workpiece. Such a learned attribute might be correlated to the measured data for predicting the existence of a non-conformity. As noted, the active interdiction control system will implement one or more human interface components, such as a display component for visualization of a region of a workpiece to show to an operator where a non-conformity exists.

The correlation engine/component 1126 might also be used for predicting whether or not a non-conformity exists. Specifically, measured data is obtained in two or more areas of a workpiece. The correlation engine 1126 uses the measured data from the multiple locations and based on a correlation of the location measured data, the existence of a non-conformity may be predicted.

In accordance with another feature of the invention, the artificial intelligence features are used by the active interdiction control system. Specifically, machine learning in the form of an autonomous learning component or engine 1130 might be implemented by the system as discussed further herein below. The autonomous learning engine receives the measured data and generates a knowledge. That knowledge characterizes the measurement data 1136 and performance of the process sequence, and upon the detection of a non-conformity decides an action plan or corrective processing plan to correct the process sequence in the event a non-conformity exists. The autonomous learning engine will also implement one or more of the process parameter data 1138 that may be associated with measured or diagnostic data for a process module and platform performance data 1140 associated with the manufacturing platform and the process modules thereon. The process parameter data and platform performance data are combined in the autonomous learning engine with the measurement data for forming the knowledge. The machine learning provided by the autonomous learning engine may incorporate supervised learning that maps inputs like the measurement data to outputs that might be used to determine corrective processing.

Alternatively, the autonomous learning engine might use cluster analysis or clustering to group various defects, for example, for determining if a non-conformity exists and determining the corrective processing for addressing the non-conformity.

Alternatively, the autonomous learning engine might use dimensionality reduction algorithms, such as, for example, determining proper corrective processing steps from a number of different processing steps that might be used to address a detected non-conformity.

Alternatively, the autonomous learning engine might use structured prediction algorithms for determining the corrective processing for addressing particular types of detected non-conformities.

Alternatively, the autonomous learning engine might use cluster analysis or clustering to group various defects, for example, for determining if a non-conformity exists and determining the corrective processing for addressing the non-conformity.

Alternatively, the autonomous learning engine might use anomaly detection algorithms for determining non-conformities.

Alternatively, the autonomous learning engine might use reinforcement learning to determine corrective processing and the result.

Various combinations of the various machine learning algorithms implemented through the autonomous learning engine might be used for generating the knowledge that characterizes the measured data and the performance of the process sequence and determines a corrective processing action to address any detected non-conformities. The autonomous learning engine may implement data associated with the process sequence or recipe 1134 in order to determine proper corrective processing steps. Furthermore, the active interdiction control system may implement existing data from one or more databases 1132 for providing the necessary machine learning and artificial intelligence processing of the measured data 1136, process parameter data 1138 and platform performance data 1140 to detect non-conformities and determine corrective processing steps.

The measured data may be a quantitative measurement of the workpiece attribute for evaluating for determining if there is a non-conformity or defect. Alternatively, measured data may be a proxy for a quantitative measurement of a workpiece attribute. As an example, a proxy allows one to measure a desired workpiece attribute, e.g., film thickness, using a less sophisticated technique, i.e., an approximation of the workpiece attribute, and/or measure another workpiece attribute, representative of the desired workpiece attribute.

In one embodiment, the active interdiction control system includes an interaction component 1136 that works with the autonomous learning engine 1130 and receives the measured data. As disclosed herein and set forth with respect to FIGS. 17-37, the autonomous learning engine/component can interface with the interaction component for processing the data for active interdiction and control of a manufacturing platform. The interaction component includes an adaptor component that is configured for packaging the measured data and conveying the packaged data to the autonomous learning engine. The autonomous learning engine receives the packaged data and generates a knowledge that characterizes the packaged data and the performance of the process sequence. The autonomous learning engine 1130 further includes a processing platform that processes the packaged data wherein the processing platform includes a set of functional units that operate on the packaged data. The set of functional units include an adaptive inference engine that analyzes the packaged data and infers an action to perform based at least in part on a process goal for the process sequence. The functional units also include a goal component that evolves the process goal based at least in part on one of the data or a context change and also a memory platform that stores the knowledge. In the autonomous learning engine, the memory platform includes a hierarchy of memories that includes a long term memory, a short term memory, and an episodic memory. The long term memory stores a set of concepts that includes at least one of an entity, a relationship, or a procedure. A concept in the set of concepts includes a first numeric attribute that indicates relevance of a concept to a current state of the process sequence, and a second numeric attribute that indicates a degree of difficulty to use the concept. The interactive component also receives module diagnostic data from one or more of the plurality of processing modules. The interactive component packages the module diagnostic data with the measured data when it prepares the packaged data.

The interaction component also includes an interaction manager that facilitates data exchange with an external actor. Training data may be part of either the packaged data or the data that is exchanged with the external actor, or both sets of data might include training data. That training data may include at least one of an identification of a module process or variable associated with a task, e.g., prepare a surface for depositing a thin film, deposit a thin film of a prescribed thickness on a targeted region of a workpiece, remove portion(s) of the thin film deposited on non-targeted regions of the workpiece, etc., a functional relationship among two or more module processes or variables associated with the task. The training data might also include a causal graph that includes a set of a priori probabilities associated with a set of module processes or variables related to the task and present in the causal graph and a set of conditional probabilities that relate one or more module processes or variables related to the task and present in the causal graph. Or, training data might also include a set of parameters that describe a behavior of the process sequence.

FIGS. 17-37 illustrate one embodiment of an autonomous learning engine/component that might be implemented by the active interdiction control system 1110 of the invention as set forth further below.

In accordance with one aspect of the invention, an active interdiction control system is implemented with the manufacturing platforms and elements as described herein. The active interdiction control system captures data from the plurality of processing modules as well as the various measurement modules to process data associated with an attribute of the workpiece in order to provide corrective processing on the workpiece if necessary. More specifically, non-conformities, defects or contamination are detected based upon measurement data and the corrective processing is performed in the processing sequence as part of an active interdiction. The corrective processing might be performed in processing modules that are either upstream or downstream in the processing sequence. For example, if a defect or non-conformity is detected, there may be a corrective adjustment made in a processing module that is upstream or downstream in the processing sequence from where the workpiece is currently located in order to try and correct the defect or non-conformity. Conversely, in order to prevent a detected defect or non-conformity from occurring in the first place, one or more processing modules in the processing flow might be adjusted or affected in a corrective manner in order to prevent the defect or non-conformity from occurring initially, such as in subsequent workpieces.

More specifically, the manufacturing platform includes one or more workpiece transfer modules that are configured and controlled for moving workpieces in the processing sequence, such as between the various processing modules and the measurement modules. The active interdiction control system is configured for controlling the movement and processing of the workpieces in the processing sequence and also for processing the measured data from a workpiece, as well as in-situ data associated with the processing modules. The active interdiction control system uses the measured data for controlling workpiece movement in the processing sequence.

Corrective processing in the upstream and downstream directions will be selectively controlled by the active interdiction control system. Generally, the manufacturing platform will include one or more film-forming modules and one or more etch modules. In one control sequence, the corrective processing is performed in an etch module after the workpiece has been processed in a film-forming module and then measured for detecting a non-conformity or defect. Alternatively, the corrective processing is performed in another film-forming module after the workpiece has been previously processed in a film-forming module. In another scenario, the invention provides corrective processing upon the detection of a non-conformity or defect and the corrective processing is performed in a treatment module, such as a cleaning module, prior to processing in a film-forming module.

One particular use of the present invention is in the multi-patterning processing such as self-aligned multi-patterning (SAMP), that includes SADP (double patterning), SATP (triple patterning), SAQP (quad-patterning), and SAOP (octo-patterning), quadruple patterning (SAQP). Such self-aligned multi-patterning techniques have enabled conventional immersion lithography to be used to print sub-resolution features, that meet the dimensional scaling needs for advanced technology nodes. The methodology generally includes creating a mandrel pattern on a substrate (a double mandrel for SATP) and conformally applying a thin film over the mandrel pattern. Then the conformal thin film is partially removed, leaving behind material on the sidewalls of the mandrel pattern. Then the mandrels are selectively removed leaving the thin patterns from the mandrel sidewalls. Such patterns can then be used for selective etching to translate or transfer the patterns to a layer.

To facilitate SAMP processing, the common platform as illustrated herein is equipped with etch modules, thin film-forming modules, clean modules, and other pre- or post-treatment modules. The common platform receives a workpiece or substrate having a mandrel pattern that has been formed thereon. During a first step in the process sequence, a thin film, referred to as a spacer film, is conformally applied to the mandrel pattern. Then, in accordance with the present invention, upon completion of this step, it is important to verify the quality of the thin conformal film. This may be done by moving the workpiece to one or more measurement modules or passing the workpiece through a measurement region of a transfer measurement module. In the measurement module, data is measured associated with thin film attributes. For example, the film conformality, the film thickness and the uniformity of the film thickness across the substrate, the composition of the film, the film stress, etc is measured. Typically, the spacer film is silicon oxide, or silicon nitride. Depending on the process conditions for applying the thin film, stress can be present in the film, either tensile or compressive, which may be a detriment to further processing. Upon completion of the conformal film application, the substrate is subjected to an etch step to partially remove the conformal film on horizontal surfaces, referred to as a spacer etch. The conformal film is anisotropically removed on the surfaces between the mandrel pattern, and on the top surfaces of the mandrel, leaving behind the conformal film on the sidewalls of the mandrel pattern. Upon completion of this step, the workpiece might also it is important to verify the quality of the thin conformal film remaining on the mandrel pattern, by assessing the film thickness on the mandrel sidewalls and the uniformity of the film thickness across the substrate, the film composition or any changes or damage to the film as a result of the etch process, the critical dimension (CD) of the remaining multi-color pattern, i.e., mandrel and spacer, etc. Thereafter, a clean process may be applied to remove residue, and a treatment step may be performed to compensate for any of the previous steps. Upon completion of the (spacer) etch step, the substrate is subjected to another etch step to selectively remove the mandrel, while preserving the sidewall spacers, referred to as a mandrel pull etch. Upon completion of this step, it is important to verify the quality of the spacer pattern remaining on the substrate, by assessing the spacer thickness or CD, the spacer height, the uniformity of the spacer CD and/or height across the substrate, the spacer profile or shape (e.g., sidewall angle, or variation from 90 degrees, etc.), etc.

The process sequence proceeds within a controlled environment and includes periodic metrology steps to assess the quality of the pitch-reducing sequence, and the resultant spacer pattern remaining on the substrate. Defects in the multiple pattern will be extended into the underlying films on the substrate. According to embodiments described herein, an intelligent equipment and process management system and active interdiction control system, located either locally or remotely on the common platform, can control the SAMP process sequence in a high volume manufacturing environment to deliver improved yield and cycling time. The controller can (i) identify process steps producing substrate results outside target specification, (ii) extract data, e.g., workpiece measurement and metrology data, etc., for the out-of-spec process step, emulate the impact of the out-of-spec condition on downstream process steps, (iii) display the data or portions of the data, (iv) optimize process recipe adjustment(s) to the process recipe, including upstream or downstream process adjustments to compensate for the defect, and (v) communicate proposed recipe adjustment(s) for adoption with the process flow to correct for the out-of-spec condition. For example, if the resultant spacer pattern formed during a SAMP process exhibits a defective profile, e.g., excessive leaning, the spacer pattern transfer will result in downstream hard mask open CD variation, and possible failure if left uncorrected. In this instance, the intelligent controller can consider all corrective options from the deposition tool recipe database, and emulate the outcome based off all downstream unit process recipe combinations for the problematic substrates. Thereafter, corrective action can be executed, including passing the current process step, failing the current process step and discarding the substrate, or remediating the process step by compensating for its deficiencies either upstream and/or downstream of the current process step.

In another example of the present invention, corrective processing and active interdiction might be implemented in an etch process. During etch applications, it is important to monitor several product parameters on-substrate to ensure the integrity of the pattern transfer process. Product parameters for measurement data capture in accordance with the invention may include feature CD (top-to-bottom), feature depth, CD and depth uniformity (across-substrate, for dense and isolated features, etc.), etch rate and selectivity relative to materials exposed on the substrate, and pattern profile, including sidewall bowing, sidewall angle, corner chamfer, etc. In accordance with the invention several control parameters exist on the etch module to adjust or control the product parameters, and such process parameters may be captured by the active interdiction control system as well for determining if non-conformities or defects have occurred in the process of a workpiece. Corrective processing might involve controlling or modifying one or more of the process parameters for future processing of a workpiece of for affecting a subsequent remedial process when such non-conformities and defects are detected. Such process parameters may include chemical composition of the gas-phase environment, flow rates of process gases entering the module, pressure, source and/or bias radio frequency (RF) power for plasma generation and maintenance, substrate temperature, substrate back-side gas pressure, chamber temperature(s), direct current (DC) voltage, parameters associated with the temporal and spatial modulation of gas flows and/or power (e.g., pulse amplitude, pulse width, pulse period, pulse duty cycle, etc.), etc. Some control parameters, such as substrate temperature, and to a lesser extent power and gas flows, can be spatially zoned to address or control process uniformity. Additionally, several process parameters exist on the etch module to monitor during processing that are predictive of product results, including plasma optical emission (e.g., optical emission spectroscopy, OES), RF power (forward and reflected) and impedance match network settings, electrical properties including voltage and current to monitor plasma condition, stability, arcing, etc., and a host of other sensors and methodologies to monitor ion temperature ($T_i$), electron temperature ($T_e$), ion energy distribution function (iedf), ion angular distribution function (iadf), electron energy distribution function (eedf), ion and/or radical flux, etc. Such process data may be captured and used by the active interdiction control system for providing corrective processing.

Film formation also provides a juncture in the process sequence wherein measurement/metrology data is a captured and if non-conformities or defects are detected, corrective processing can be performed. During thin film forming applications, several product parameters on-substrate may be measured or monitored using the measurement modules and TMM of the invention to ensure the quality of the film formed on the substrate. For example, measurement data might be captured that is associated with film thickness, film conformality to substrate topography, film composition, film stress, film selectivity, film planarizability across-substrate, for dense and isolated features, film electrical properties (e.g., dielectric constant), film optical properties (e.g., refractive index, spectral absorptivity, spectral reflectivity, etc.), film mechanical properties (e.g., elastic modulus, hardness, etc.), and the uniformity film properties, etc. Based upon non-conformities detected in the workpiece, corrective processing might be implemented on an active workpiece or future workpieces in the process sequence by controlling several control parameters in the film-formation module to adjust or control the product parameters, including chemical composition and phase of the film precursor, temperature of the vaporizer or ampoule, carrier gas flow rate, the precursor delivery line temperature, chemical composition of the gas-phase environment in the chamber, flow rates of process gases entering the module, pressure, source and/or bias radio frequency (RF) power for plasma generation and maintenance in plasma-assisted deposition apparatus, substrate temperature, substrate back-side gas pressure, chamber temperature(s), parameters associated with the temporal and spatial modulation of gas flows and/or power, etc.

Additional measurement data that might be captured is directed to particle contamination that is a source of variation during device fabrication and can be classified as a defect. In some embodiments, the common platform is equipped with etch modules, film formation modules, clean modules, and other pre- or post-treatment modules, or subsets thereof, and the platform may use process modules that include with particle removing equipment. Thus, upon detection of particle contamination, the active interdiction control system may implement a remedial process step using particle removal equipment that can include gas-phase or partially liquefied gas-phase beams or jets. The particle removal beams or jets of such a process module can be cryogenic or non-cryogenic, and may or may not include aerosols, gas clusters, etc. The common platform can also be combined with a defect inspection measurement module to perform monitoring workpiece surface scans, count particles, and identify film defects. The defect inspection module can include optical inspection, using dark field and/or bright field illumination to detect the presence of particles. Alternatively, or additionally, the defect inspection module can include electron beam inspection. Once a defect is detected, the active interdiction control system affects the process sequence in the manufacturing platform to correctively process the workpiece so as to remove any contaminating particles.

In accordance with another aspect of the invention, the data processed by the present invention by the active interdiction control system will include fabrication measurement/metrology data that is determined from measurement modules or TMMs that are implemented in a common manufacturing platform. Such fabrication measurement data is a measurement of an attribute of the workpiece based partially or completely on the process sequence performed on the common manufacturing platform. Such information may be combined with other data that is gathered, including process parameter data, associated with certain process parameters or settings of one or more of the process modules in the common platform, as well as platform performance data that is reflective of certain parameters and settings and information about the common manufacturing platform.

The process parameter data may include an indication of one or more process conditions executed in the processing modules. For example, the process conditions may be based on at least one of plasma density, plasma uniformity, plasma temperature, etch rate, etch uniformity, deposition rate, and/or deposition uniformity. Such measured process conditions might also include one of amplitude, frequency, and/or modulation of energy that is applied to a plasma source disposed within the processing module. Still further, the process conditions might include gas flow rates that are being flowed into the processing module during the process sequence, the temperature of a workpiece holder that is disposed within the processing module, and/or the pressure in the process module during the process sequence.

The platform performance data may include an indication of a platform attribute contributing to the execution of the process sequence or an indication of how long a process module has been exposed to the process sequence. Exemplary platform attributes contributing to a process sequence may include process cooling water temperature, process cooling water flow rate, process module processing time, and/or process module cumulative thickness.

When non-conformities are detected using the various data, including fabrication measurement data, the process parameter data and/or the platform performance data, the active interdiction can be performed. The active interdiction is performed to the process sequence either on the workpiece measured or on a workpiece that is subsequently processed. That is, the data might be used to correct the current workpieces or might be used later to correct subsequent workpieces that are processed so that further non-conformities do not occur.

In an alternative embodiment, measurement data might be captured in-situ in a process module and used for detecting non-conformities of a workpiece. For example, various sensors might be located inside of the chamber of a process module, such as an etch or film-formation or deposition chamber, or an inspection system might access the internal space of a process chamber. In such a case, the in-situ process measurement data might be used alone or in combination with the other measurement data that might be considered fabrication measurement data, and non-conformities of the workpiece may be detected based on at least one of the gathered fabrication measurement data or the in-situ process measurement data. Then active interdiction might be performed in the process sequence to execute corrective processing of the workpiece in the process sequence on the common manufacturing platform after the measurement data has been gathered.

In accordance with one aspect of the invention, the corrective processing of the active interdiction on a current workpiece may include a number of different paths depending on the detected non-conformity or defect. In one exemplary path, a process might be varied within one or more of the process modules. This might occur in a process or module that is upstream in the process sequence of where the workpiece currently resides or may occur in a process or module that is downstream in the process sequence.

The process variation to the process sequence might include exposing the workpiece to a remedial process sequence to correct the non-conformity. The remedial process sequence might include steps taken to address or remove the non-conformity. For example, a cleaning of the workpiece might be added as a step in the process sequence. The cleaning of the workpiece might be handled using a cryogenically cooled spray, such as with a chamber as shown in FIG. 10E. Furthermore, a film might be removed from the workpiece or a portion of a film might be removed. Such a remedial step might be performed on the common manufacturing platform. Or the remedial process sequence might be performed external to the common manufacturing platform.

Alternatively, the process variation may include exposing the workpiece to an adjustment process sequence to modify the detected non-conformity. The adjustment process sequence might include controlling one or more process parameters or conditions of a process module based, partially or completely, on a real-time measurement of the fabrication measurement data or in-situ process measurement data from which a non-conformity is detected. The adjustment process sequence may include controlling one or more process conditions of a processing module based, at least in part, on a model corresponding to correction of the non-conformity. The model can allow a user to predict the outcome of a process step in a process module provided a change to the incoming process recipe. Also, the adjustment process may include alternating processes between a film-forming process, an etching process, or a film-treatment process in order to modify the detected non-conformity.

Also, if the non-conformity is one that may not be remediated, corrected or modified, the workpiece might be discarded in the active interdiction.

In still another alternative, the active interdiction might include notifying an operator of the of the non-conformity to allow the operator to determine a path to be taken.

In accordance with another feature of the invention, in-situ process measurement data might be gathered in-situ in a processing module during a process step in the sequence. The active interdiction may indicate a corrective processing step that will also occur in-situ in the same processing module where the in-situ process measurement data was obtained or gathered. That is, the workpiece might remain in the module and for the further processing in the same process step as previously done before the in-situ measurement was made.

After performing the active interdiction, the workpiece might be moved or manipulated for obtaining additional fabrication measurement data of the workpiece to determine impact on the non-conformity based on the active interdiction and corrective processing. If the corrective processing is successful or moving in the right direction to address the non-conformity or defect, the process sequence might continue for the workpiece based on the determined impact on the non-conformity.

EXAMPLES

FIGS. 13A-13E set forth one example of active interdiction in area selective deposition for removal of undesired nuclei on a self-aligned mono layer through active interdiction.

Referring now to FIGS. 13A-13E, according to one exemplary embodiment, the manufacturing platform with an active interdiction control system may be configured to perform and monitor a method of area selective deposition on a substrate and to gather measurement data and other data. In this embodiment, the substrate 1300 contains a base layer 1302, an exposed surface of a first material layer 1304 and an exposed surface of a second material layer 1306. In one example, the substrate includes a dielectric layer 1304 and a metal layer 1306. For example, the metal layer 1306 can contain Cu, Al, T a, Ti, W, Ru, Co, Ni, or Mo. The dielectric layer 1304 can, for example, contain SiO2, a low-k dielectric material, or a high-k dielectric material. Low-k dielectric materials have a nominal dielectric constant less than the dielectric constant of SiO2, which is approximately 4 (e.g., the dielectric constant for thermally grown silicon dioxide can range from 3.8 to 3.9). High-k materials have a nominal dielectric constant greater than the dielectric constant of SiO2.

Low-k dielectric materials may have a dielectric constant of less than 3.7, or a dielectric constant ranging from 1.6 to 3.7. Low-k dielectric materials can include fluorinated silicon glass (FSG), carbon doped oxide, a polymer, a SiCOH-containing low-k material, a non-porous low-k material, a porous low-k material, a spin-on dielectric (SOD) low-k material, or any other suitable dielectric, material. The low-k dielectric material can include BLACK DIAMOND@ (BD) or BLACK DIAMOND@ II (BDII) SiCOH material, commercially available from Applied Materials, Inc., or Coral@ CVD films commercially available from Novellus Systems, Inc. Other commercially available carbon-containing materials include SILK@ (e.g., SiLK-I, SiLK-J, SiLK-H, SiLK-D, and porous SiLK semiconductor dielectric resins) and CYCLOTENE@ (benzocyclobutene) available from Dow Chemical, and GX-3™ and GX-3P™ semiconductor dielectric resins available from Honeywell.

Low-k dielectric materials include porous inorganic-organic hybrid films comprised of a single-phase, such as a silicon oxide-based matrix having CH3 bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

In addition, low-k materials include a silicate-based material, such as hydrogen silsesquioxane (HSQ) or methyl silsesquioxane (MSQ), deposited using SOD techniques. Examples of such films include FOx® HSQ commercially available from Dow Corning, XLK porous HSQ commercially available from Dow Corning, and JSR LKD-5109 commercially available from JSR Microelectronics.

Figure 14:
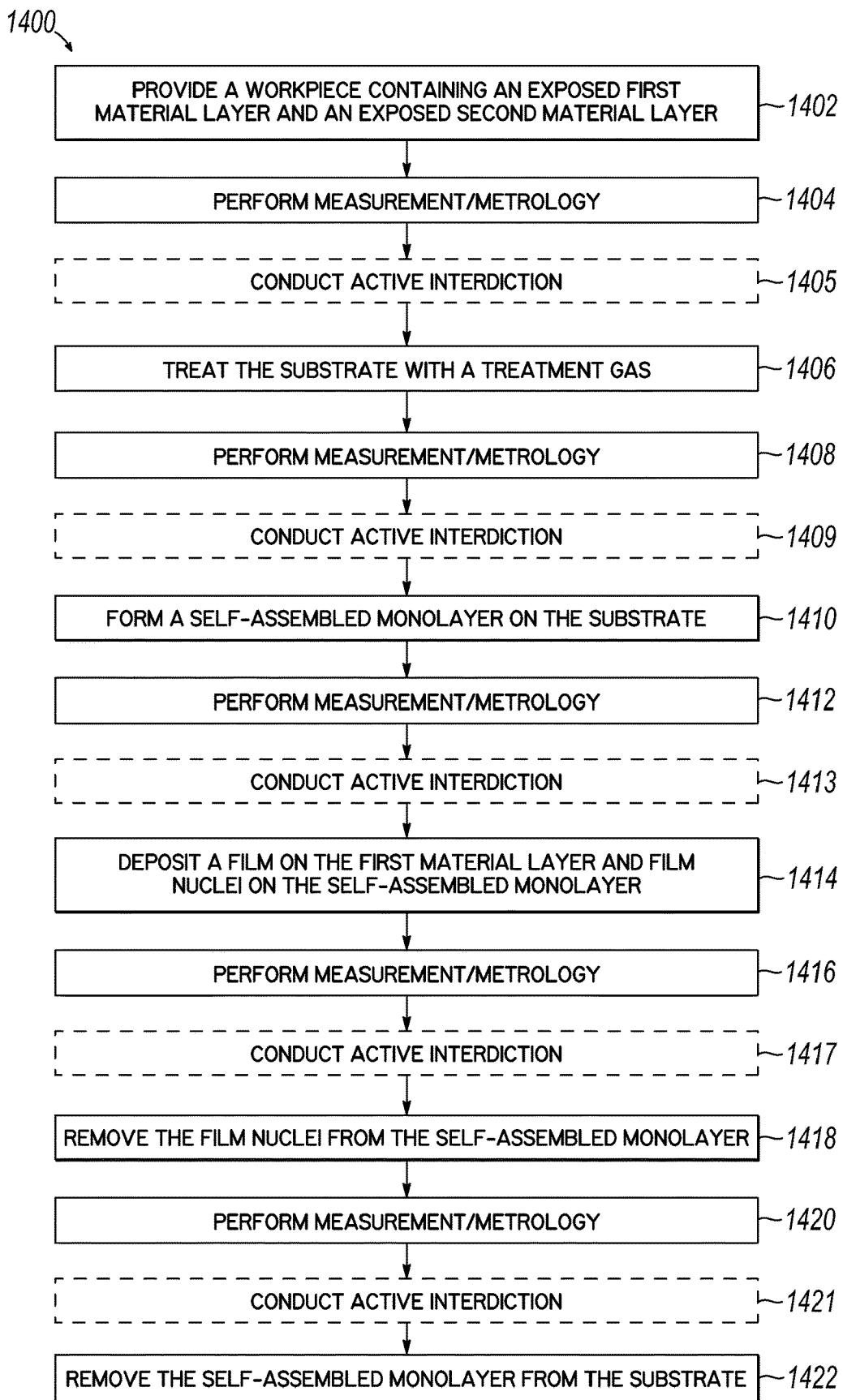
FIG. 14 is a process flow diagram for performing integrated workpiece processing, measurement/metrology and active interdiction in accordance with embodiments of the invention.

FIG. 14 illustrates a flowchart of an exemplary process sequence on the manufacturing platform implementing the invention. The process sequence 1400 includes, in step 1402, of the process flow providing the workpiece into a measurement module of the platform or into a TMM where the workpiece is measured and characterized in order to generate measurement data. (Block 1404)

Figure 15:
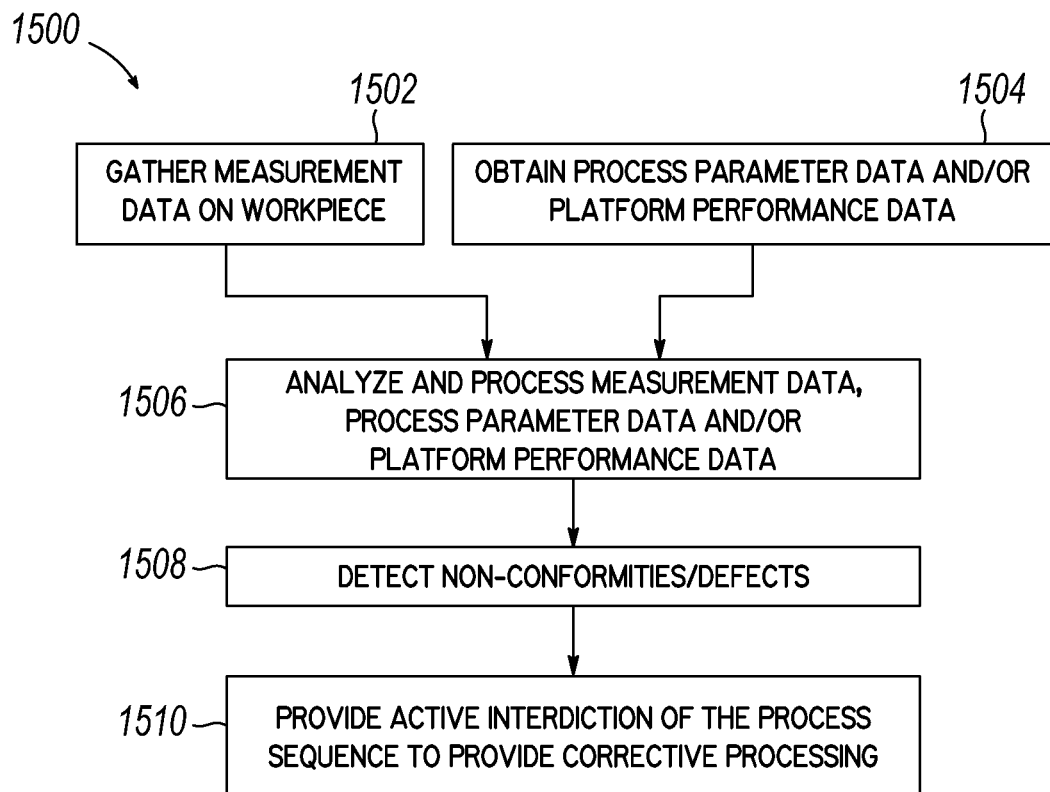
FIG. 15 is a flow diagram for performing measurement and analysis for providing active interdiction in accordance with the invention.

Referring to FIG. 15, once a workpiece has been moved to a measurement module or TMM that contains an inspection system, or data has been gathered in situ, in accordance with the process flow 1500 as illustrated in FIG. 15, the data may be analyzed and processed to determine how to proceed. More specifically, data may be gathered directly from the workpiece, such as fabrication measurement data indicative of a measurement associated with an attribute on the workpiece, such as a particular layer that has been deposited or etched (block 1502). Such data is then directed to the active interdiction control system of the common manufacturing platform. Additionally, and possibly optionally, process parameter data and/or platform performance data may be obtained by the active interdiction control system for further making decisions as disclosed herein. For example, certain process settings may be captured for the process that was performed just prior to measuring the workpiece. Furthermore, additional platform performance data may be obtained to provide some indication of whether a detected non-conformity or defect is associated with the overall manufacturing platform.

Once data has been measured and collected from other sources, such as from individual process control systems for a process module, or control systems for the manufacturing platform, the data may be analyzed and processed as set forth in step 1506. Such analysis and processing may include a number of different algorithms, such as machine learning algorithms including pattern recognition and correlation along with deep learning and autonomous learning. Through such processing, non-conformities and defects might be detected as set forth in step 1508. If no actionable non-conformities or defects are found in the measurement/metrology process, the workpiece may proceed in the process sequence as normal. Alternatively, if such defects or non-conformities are detected and the active interdiction control system determines that they may be corrected or remediated, active interdiction of the process sequence takes place to provide corrective processing as in step 1510. If they cannot be corrected or remediated, they might be ejected from the process sequence.

Figure 16:
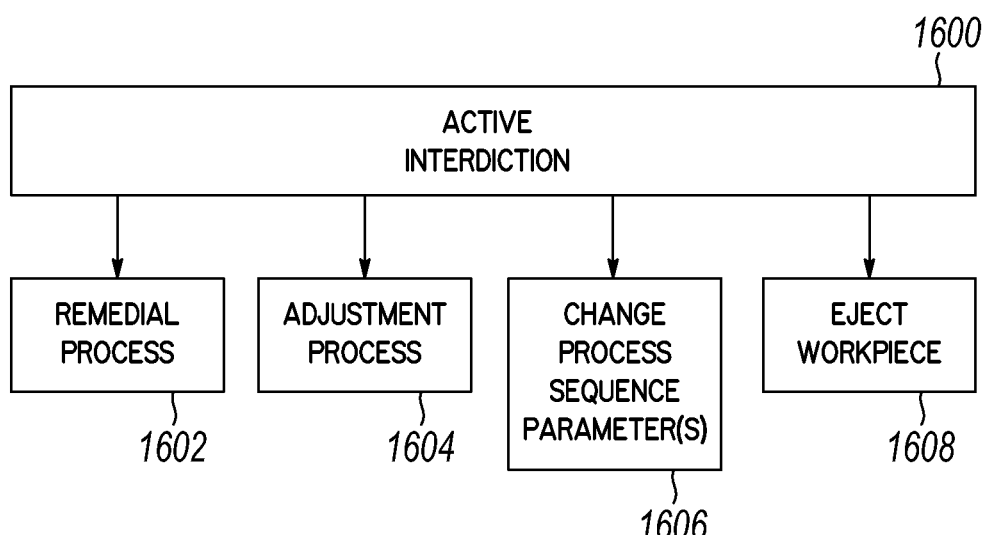
FIG. 16 is a flow diagram of selective paths of active interdiction.

Referring to FIG. 16, the active interdiction step may take a number of different paths. For example, if active interdiction is indicated by the control system (step 1600) a remedial process (step 1602) may be performed as a remedial process sequence in order to correct the non-conformity. For example, the workpiece might be directed to another processing module in order to affect a particular layer to try and correct the non-conformity. For example, if the layer was deposited and was not thick enough based upon the measurement step, the workpiece might be returned to the previous process module or directed to another process module for further deposition. Alternatively, the remedial process sequence may inject a processing step through an etch module for removing some of a layer that had been previously deposited.

Alternatively, if a non-conformity cannot be corrected, the active interdiction control system may direct the workpiece to an adjustment process sequence to modify the non-conformity or defect that is detected.

Still further, the active interdiction process 1600 might implement a step 1606 wherein process sequence parameters and various other process modules are changed. For example, rather than providing the active interdiction on a current workpiece, subsequent workpieces might be affected through changes in the steps or process parameters of a particular process sequence. Such changes would be made in order to prevent any future non-conformities or defects that had been previously detected.

Finally, if remediation and adjustment to the workpiece are not suitable and the defects or non-conformities may not be overcome, the active interdiction may involve simply ejecting the workpiece from the processed sequence in order to not waste additional time and resources in processing the workpiece.

Returning to the flowchart of FIG. 14, if active interdiction is necessary, it may be conducted is illustrated in step 1405. Alternatively, if active interdiction is not necessary the workpiece made proceed in the process sequence as normal.

Following in the process sequence, in step 1406, the workpiece is optionally transferred into a processing module for treating with a treatment gas. For example, the treatment gas can include an oxidizing gas or a reducing gas. In some examples, the oxidizing gas can include 02, 1-120, 1-1202, isopropyl alcohol, or a combination thereof, and the reducing gas can include 1-12 gas. The oxidizing gas may be used to oxidize a surface of the first material layer 204 or the second material 206 to improve subsequent area selective deposition. In one example, the treatment gas can contain or consist of plasma-excited AR gas.

In the process, step 1406 might provide an additional juncture for measurement and interdiction. In step 1408, the workpiece is optionally transferred into a measurement module or TMM where the processing or treatment of the workpiece in in step 1106 is measured and characterized. If active interdiction is indicated, it may be performed in step 1409.

Thereafter, the substrate is transferred into another processing module where a self-aligned monolayer (SAM) is formed on the workpiece 1300 in step 1410. The SAM may be formed on the workpiece 1300 by exposure to a reactant gas that contains a molecule that is capable of forming a SAM on the workpiece. The SAM is a molecular assembly that is formed spontaneously on substrate surfaces by adsorption and organized into more or less large ordered domains. The SAM can include a molecule that possesses a head group, a tail group, and a functional end group, and the SAM is created by the chemisorption of head groups onto the workpiece from the vapor phase at room temperature or above room temperature, followed by a slow organization of the tail groups. Initially, at small molecular density on the surface, adsorbate molecules form either a disordered mass of molecules or form an ordered two-dimensional "lying down phase", and at higher molecular coverage, over a period of minutes to hours, begin to form three-dimensional crystalline or semi-crystalline structures on the substrate surface. The head groups assemble together on the substrate, while the tail groups assemble far from the substrate.

According to one embodiment, the head group of the molecule forming the SAM can include a thiol, a silane, or a phosphonate. Examples of silanes include molecule that include C, H, CI, F, and Si atoms, or C, H, CI, and Si atoms. Nonlimiting examples of the molecule include octadecyltrichlorosilane, octadecylthiol, octadecyl phosphonic acic, perfluorodecyltrichlorosilane $(CF_3(CF_2)_7CH_2CH_2SiCl_3)$, perfluorodecanethiol($CF_3(CF_2)_7CH_2CH_2SH$) chlorodecyldimethylsilane ($CH_3(CH_2)_8CH_2Si(CH_3)_2Cl$), and tert-butyl(chloro)dimethylsilane (($CH3)3CSi(CH3)2Cl$)).

The presence of the SAM on a workpiece 1300 may be used to enable subsequent selective film deposition on the first material layer 1304 (e.g., a dielectric layer) relative to the second material layer 1306 (e.g., a metal layer). This selective deposition behavior is unexpected and provides a new method for selectively depositing a film on the first material layer 1304 while preventing or reducing metal oxide deposition on the second material layer 1306. It is speculated that the SAM density is greater on the second material layer 1306 relative to on the first material layer 1304, possibly due to higher initial ordering of the molecules on the second material layer 1306 relative to on the first material layer 1304. This greater SAM density on the second material layer 1306 is schematically shown as SAM 1308 in FIG. 13B.

Following the formation of the SAM 1308 on the workpiece, in step 1412, the workpiece is optionally transferred into a measurement module/TMM where the formation of the SAM 1308 on the workpiece is measured and characterized. If active interdiction is necessary, it may be performed in step 1413. The measurement system, for example, may make measurements and collect data associated with the thickness, thickness non-uniformity and/or conformity. For example, as noted herein, poor selective deposition using the SAM layer may result if the surface coverage of the SAM layer is not sufficient in thickness or conformity. Also, if the SAM layer is non-uniform, it may result in voids on the layer 1306. Through a measurement in a TMM/measurement module, such non-conformities might be detected. In such a case, the active interdiction control system may direct the workpiece to an etch or cleaning module to remove the SAM layer. For example, this might be done if it has a high level of particle contamination or the layer is not uniform or has incorrect dimensions. Alternatively, if not properly dimensioned, the SAM layer might be remediated, and the workpiece sent to a deposition chamber (e.g., back into the previous module) in order to put down more film if the layer is too thin. Alternatively, if the layer is too thick, the workpiece may be sent to an etch module as part of the active interdiction or remediation.

Thereafter, the workpiece is transferred into another processing module where, in step 1414, a film 1310 (e.g., a metal oxide film) is selectively deposited on the first material layer 1304 relative to on the second material layer 1306 by exposing the workpiece 1300 to one or more deposition gases. In one example, the film 1310 may include a metal oxide film that contains HfO2, ZrO2, or Al2O3. The film 1310 may, for example, be deposited by CVD, plasma-enhanced CVD PEALD), ALD or plasma-enhanced ALD (PEALD). In some examples, the metal oxide film 1310 may be deposited by ALD using alternating exposures of a metal-containing precursor and an oxidizer (e.g., 1-120, 1-1202, plasma-excited 02, or 03). During deposition of the film 1310, it is desirable to maintain the selective deposition and deposit layer 1310 only on layer 1304, but not on layer 1306, or even the SAM layer 1308. However, due to certain conditions, some deposition may occur on the SAM layer. Thus, in accordance with the invention, upon completion of the deposition layer 1310, measurements occur either in a TMM or other measurement module or measurement area, and active interdiction occurs to address deposition on layer 1308.

Figure 13A:
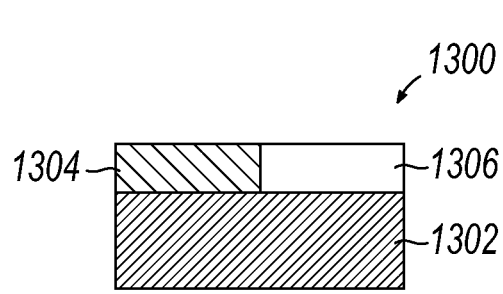
FIGS. 13A-13E illustrate schematic cross-sectional views of a workpiece with area selective film formation in accordance with embodiments of the invention.
Figure 13B:
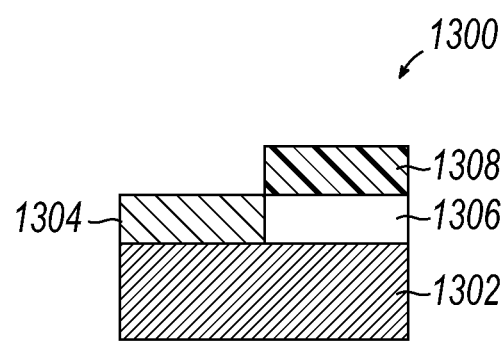
Figure 13C:
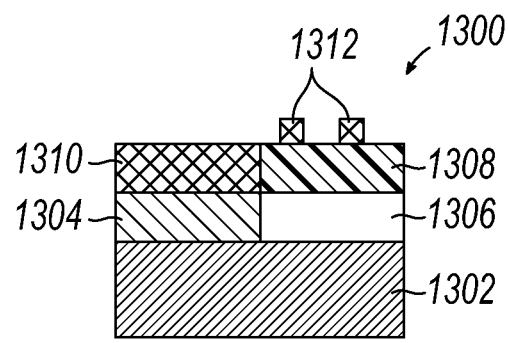
Figure 13D:
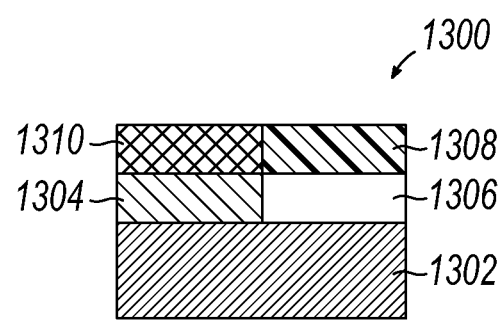
Figure 13E:
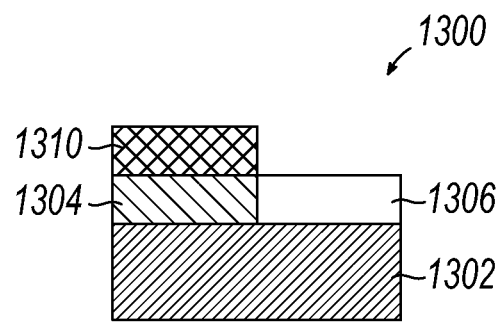

As depicted in FIG. 13C, the exposure to the one or more deposition gases in the processing module may, in addition to depositing the film 1310 on the dielectric layer 1304, also deposit film material, such as film nuclei 1312 on the SAM 1308. This loss of deposition selectivity can occur if the deposition process is carried out for too long. Alternatively, the deposition selectivity between the dielectric layer 1302 and the SAM 1308 may be poor. Poor deposition selectivity can also occur if the surface coverage of the SAM 1308 is incomplete and the layer contains voids on the second material layer 1306.

Accordingly, following the deposition of the film 1310 on the workpiece, in step 1416, the workpiece is transferred into a measurement module/TMM where the deposition of the film 1310 is measured and characterized by the active interdiction control system. The characterization can determine the degree of deposition selectivity and if any active interdiction steps are necessary for the removal of the film nuclei 1312 from the SAM 1308. If active interdiction is necessary, it may be performed in step 1417, such as by directing the workpiece to an etch module.

The film nuclei 1312 on the SAM 1308 may be removed using an etching process in order to selectively form the film 1310 on the first material layer 1304. The workpiece is transferred into another processing module to perform the etching process in step 1418. Although the film 1310 may also be partially removed by the etching process, the metal oxide nuclei 1312 are expected to etch faster than the film 1310. The etching process can include a dry etching process, a wet etching process, or a combination thereof. In one example, the etching process may include an atomic layer etching (ALE) process. The resulting workpiece shown in FIG. 13D has the film 1310 selectively formed on the first material layer 1304 with any film nuclei removal.

Following the etching process, in step 1420, the workpiece is optionally transferred into a measurement module/TMM where the workpiece is measured and characterized so as to determine the results of the process. The characterization can determine the extent of the etching process. If active interdiction is necessary, such as further etching, it may be performed in step 1421.

Thereafter, in step 1422, the SAM 1308 may be removed from the workpiece, for example by etching or cleaning a process module or by a heat-treatment.

As schematically shown in FIG. 14, the above-described processing steps may be repeated one or more times to increase the thickness of the film 1310 on the workpiece. Removal and subsequent repeated deposition of the SAM 1308 on the workpiece may be desired if the SAM 1308 becomes damaged during the film deposition and/or the etching process and therefore affects the film deposition selectivity.

Unlike traditional metrology or process control in a manufacturing process, the workpiece does not leave the controlled environment to enter a stand-alone measurement/metrology tool thereby minimizing oxidation and defect generation, the measurements are non-destructive such that no workpiece is sacrificed to obtain data thereby maximizing production output, and the data can be collected in real time as part of the process flow to avoid negatively impacting production time and to enable in-process adjustments to the workpiece or to subsequent workpieces being sequentially processed on the common manufacturing platform. Additionally, the measurements are not performed in the film-forming or etching modules, thereby avoiding issues when measurement devices are exposed to process fluids. For example, by incorporating workpiece measurement regions into the transfer module as in some of the disclosed embodiments, the data can be obtained as the workpiece is traveling between processing tools with little to no delay in the process flow, without exposure to process fluids, and without leaving the controlled environment, e.g., without breaking vacuum. While the "on the fly" data may not be as accurate as the data obtained from traditional destructive methods performed in stand-alone metrology tools, the nearly instantaneous feedback on the process flow and ability to make real-time adjustment without interrupting the process flow or sacrificing yield is highly beneficial for high-volume manufacturing.

Figure 14A:
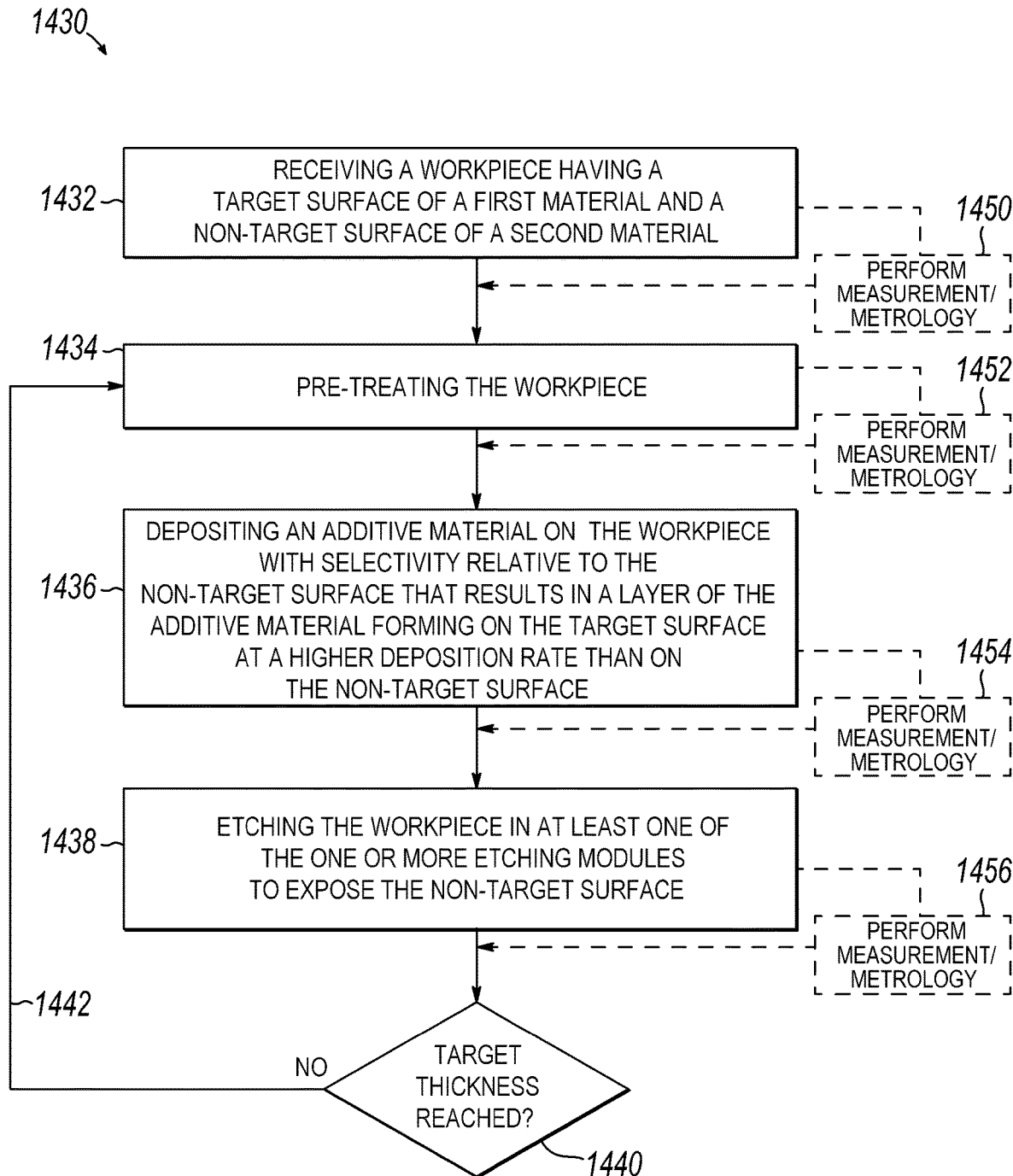
FIG. 14A is a process flow diagram for performing integrated workpiece processing, measurement/metrology and active interdiction in accordance with embodiments of the invention.

With further reference to the process flow 1430 of FIG. 14A, the method may include inspecting the workpiece, such as performing metrology, i.e., obtaining measurement data, using the active interdiction control system at any of various times throughout the integrated method, without leaving the controlled environment, e.g., without breaking vacuum. Inspection or measurement of the workpiece may include characterizing one or more attributes of the workpiece and determining whether the attribute meets a target condition. For example, the inspection may include obtaining measurement data related to an attribute and determining whether a defectivity, thickness, uniformity, and/or selectivity condition meets a target for that condition. The active interdiction control system may include one or more measurement/metrology modules or workpiece measurement region on the common manufacturing platform as discussed herein. The various measurement/metrology operations and following active interdiction steps may optional at certain junctures, as indicated by the phantom lines in FIG. 14A for example but may be advantageously performed at one or more points in the process flow to ensure the workpiece is within specification. In one embodiment, measurement data is obtained after each step of the integrated sequence of processing steps conducted on the common manufacturing platform. The measurement data may be used to repair the workpiece in one or more active interdiction/remediation/correction modules prior to leaving the common manufacturing platform, and/or may be used to alter parameters of the integrated sequence of processing steps for subsequent steps and/or for subsequent workpieces.

In broad terms, within the controlled environment, measurement data may be obtained during the integrated sequence of processing steps related to the selective deposition of the additive material and, based on the measurement data, a determination may be made whether defectivity, thickness, uniformity, and/or selectivity of the layer of additive material meets a target condition. When the defectivity, thickness, uniformity, and/or selectivity is determined to not meet the target condition, or an attribute of the workpiece is otherwise determined to be non-conforming, the workpiece may be subjected to further active interdiction processing. For example, the workpiece may be processed in one or more modules that might be considered correction/remediation modules on the common manufacturing platform to remove, minimize, or compensate for the non-conforming attribute prior to performing a next processing step in the integrated sequence of processing steps. The corrective action may include etching the target surface or non-target surface, depositing further additive material on the workpiece, repairing a barrier layer on the workpiece, thermally treating the workpiece, or plasma treating the workpiece, for example. Other steps might also be part of the active interdiction depending on the detected non-conformity or defect.

In one example, with processing using a SAM, the corrective action may include removing the SAM when the non-conformity is based, at least in part, on incomplete coverage or incomplete blocking of the non-target surface by the SAM or when an amount of exposed area of the non-target surface is greater than a predetermined exposed area threshold or when an amount of additive material on the SAM surface is greater than a predetermined threshold. In another example, the corrective action may include removing at least a portion of the layer of additive material when the non-conformity is based, at least in part, on a step-height distance between the target surface and the non-target surface being less than a predetermined step-height threshold or an amount of exposed area of the non-target surface being less than the predetermined exposed area threshold. In yet another example, the corrective action may include adding further additive material to the workpiece when the non-conformity is based, at least in part, on a thickness of the additive material overlying the target surface being less than a predetermined thickness threshold. In a still further example, the corrective action may include etching the workpiece when the non-conformity is based, at least in part, on a remaining additive material on the non-target surface or a remaining self-assembled monolayer on the non-target surface being greater than a predetermined remaining thickness threshold. In another example, the corrective action may include thermally treating or plasma treating the workpiece when the non-conforming workpiece attribute is based, at least in part, on a reflectivity from the workpiece being less than a predetermined reflectivity threshold.

The correction modules may be different film-forming and etching modules that are designated as correction modules on the common manufacturing platform or another type of treatment module integrated on the common manufacturing platform, such as a thermal annealing module, or may be the same film-forming and etching modules used to selectively deposit the additive material and etch the film nuclei.

The process flow 1430 of FIG. 14A will now be described in detail with the optional inspection or metrology operations used to characterize attributes of the workpiece to determine when a target thickness for the ASD is reached and/or to determine if a non-conformality is present. Operation 1432 includes receiving a workpiece having the target and non-target surfaces into a common manufacturing platform. Operation 1450 includes optionally performing measurement/metrology to obtain measurement data related to attributes of the incoming workpiece, such as attributes of the target surface and/or the non-target surface, which measurement data may be used to adjust and/or control process parameters of any one of operations 1434-1438.

Operation 1434 includes optionally pre-treating the workpiece. The pre-treatment may be a single operation or multiple operations executed on the common manufacturing platform. Operation 1452 includes optionally performing metrology to obtain measurement data related to attributes of the workpiece following the pre-treatment. If multiple pre-treatment operations are performed, the measurement data may be obtained after all pre-treatments are completed and/or after any individual pre-treatment step. In one example, the workpiece is inspected after a SAM is formed to determine whether the coverage is complete or if an exposed area of the treated surface exceeds a threshold value. The measurement data may be used to adjust and/or control process parameters of any one of operations 1434-1438, may be used to make adjustments for subsequent workpieces to the incoming attributes of the workpieces in operation 1432 or to operation 1434, or may be used to repair the workpiece before continued processing. In one embodiment, when the measurement data indicates that one or more attributes do not meet a target condition, the workpiece may be transferred to a correction module to repair the workpiece. For example, when coverage by a SAM on the non-target surface is incomplete, corrective action may be taken in one or more processing modules, such as removing the SAM and reapplying the SAM.

Operation 1436 includes selectively depositing additive material on the workpiece in a film-forming module hosted on the common manufacturing platform. Operation 1454 includes optionally performing metrology to obtain measurement data related to attributes of the workpiece having the layer of additive material formed on the target surface, such as attributes of the layer of additive material, the non-target surface, and/or a pre-treated surface as affected by the selective deposition, which measurement data may be used to adjust and/or control process parameters of any one of operations 1438-1442, may be used to make adjustments for subsequent workpieces to the incoming attributes of the workpieces in operation 1432 or to operations 1434-1436, or may be used to repair the workpiece before continued processing. In one embodiment, when the measurement data indicates that one or more attributes do not meet a target condition, the workpiece may be transferred to a correction module to repair the layer of additive material or the non-target surface. For example, when the defectivity, thickness, uniformity, or selectivity of the additive material does not meet a target condition, corrective action may be taken in one or more correction modules, such as by selectively depositing additional additive material onto the target surface, removing additive material from the non-target surface or target surface, removing a pre-treatment layer from the non-target surface, thermally treating or plasma treating the workpiece, or a combination of two or more thereof.

Operation 1438 includes etching the workpiece using an etching module hosted on the common manufacturing platform to expose the non-target surface. Operation 1438 may include etching film nuclei that deposited on the non-target surface or on a SAM formed on the non-target surface or etching a complete layer of additive material deposited on the non-target surface or on a SAM formed on the non-target surface at a thickness less than the thickness of the layer of additive material formed on the target surface. Operation 1438 may also include removing a SAM or other pre-treatment layer from the non-target surface, either in the same etching step or a subsequent etching step. Operation 1456 includes optionally performing measurement/metrology to obtain measurement data related to attributes of the workpiece having the layer of additive material on the target surface and the etched non-target surface, such as attributes of the layer of additive material as affected by the etching, attributes of the non-target surface exposed by the etching, and/or attributes of a SAM or other pre-treatment layer as affected by etching the film nuclei from the SAM on the non-target surface, which measurement data may be used to adjust and/or control process parameters of any one of operations, including steps 1434-1438 in the repetition of the sequence per operation 1442, may be used to make adjustments for subsequent workpieces to the incoming attributes of the workpieces in operation 1432 or to operations 1434-1438, or may be used to repair the workpiece before continued processing. In one embodiment, when the measurement data indicates that one or more attributes do not meet a target condition, the workpiece may be transferred to a correction module to the layer of additive material or the non-target surface. For example, when the defectivity, thickness, uniformity, or selectivity of the additive material does not meet a target condition, corrective action may be taken in one or more correction modules, such as by selectively depositing additional additive material onto the target surface, removing additive material from the non-target surface or target surface, removing a pre-treatment layer from the non-target surface, thermally treating or plasma treating the workpiece, or a combination of two or more thereof. Further, when the measurement data indicates that the thickness of the layer of additive material is less than a target thickness, such that determination 1440 is No, the workpiece may be subjected to repeating steps of the sequence per operation 1442. When the measurement data indicates that the thickness of the layer of additive material has reached the target thickness, such that determination 1440 is Yes, the workpiece may exit the common manufacturing platform.

Process parameters, as referred to above, may include any operating variable within a processing module, such as but not limited to: gas flow rates; compositions of etchants, deposition reactants, purge gases, etc.; chamber pressure; temperature; electrode spacing; power; etc. The intelligence system of the active interdiction system is configured to gather measurement data from the inspection system and control the integrated sequence of processing steps executed on the common manufacturing platform, for example, by making in situ adjustments to processing parameters in subsequent processing modules for the workpiece in process, or by changing process parameters in one or more processing modules for subsequent workpieces. Thus, the obtained measurement data may be used to identify a needed repair to the workpiece during the integrated sequence of processing steps to avoid having to scrap the workpiece, and/or to adjust processing parameters for the integrated sequence of processing steps for steps performed on the same workpiece after the measurement data is obtained or for processing subsequent workpieces to reduce occurrences of the target conditions not being met for the subsequent workpieces.

While some of the illustrated examples indicate and ASD layer of metal oxide film on a dielectric layer, the present invention can apply as well to metal-on-metal (MoM) selective deposition or dielectric-on-dielectric (DoD) selective deposition.

Figure 14B:
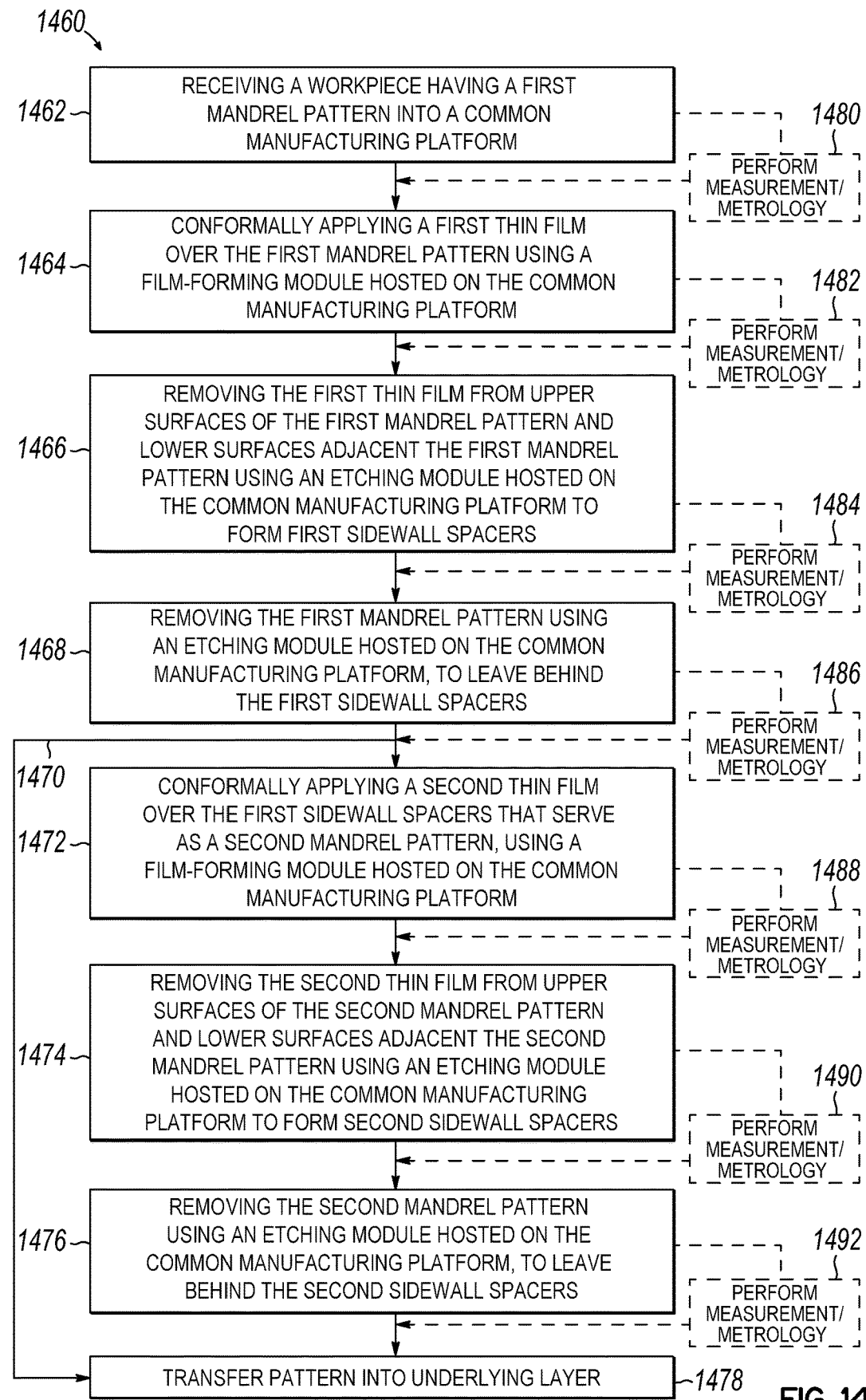
FIG. 14B is a process flow diagram for performing integrated workpiece processing, measurement/metrology and active interdiction in accordance with embodiments of the invention.

The invention might also be implemented for active interdiction with a self-aligned multi-patterning process as done on the inventive system. In such a scenario, as noted herein, the active interdiction system may one or more measurement/metrology modules or workpiece measurement regions on the common manufacturing platform. Various measurement or metrology operations may be optionally performed, as indicated in FIG. 14B, but may be advantageously performed at one or more points in the process flow to ensure the workpiece is within specification to reduce defectivity and EPE. In one embodiment, measurement data is obtained after each step of the integrated sequence of processing steps conducted on the common manufacturing platform. The measurement data may be used to initiate active interdiction and repair the workpiece in a remediation or correction module prior to leaving the common manufacturing platform, and/or may be used to alter parameters of the integrated sequence of processing steps for subsequent workpieces.

For multi-patterning processes, for example, within the controlled environment, measurement data may be obtained during the integrated sequence of processing steps related to the formation of the sidewall spacer pattern and, based on the measurement data. For example, a TMM/measurement module or a measurement region in the common platform may provide data regarding the thickness, width, or profile of the sidewall spacer pattern and the data may be analyzed by the interdiction control system to determine whether a measured thickness, width, or profile of the sidewall spacer pattern meets a target condition. When the thickness, width, or profile of the sidewall spacer pattern is determined to not meet the target condition, active interdiction may be necessary, and the workpiece may be processed in a processing module on the common manufacturing platform to alter the sidewall spacer pattern. In one embodiment, when the target thickness, width, or profile of the sidewall spacer pattern is not met, the sidewall spacer pattern may be repaired. In one example, the workpiece might be passed to a film-formation module for selectively depositing additional material onto a structure. Alternatively, a process module might be used for conformally depositing additional material onto a structure. Still further, the active interdiction may be using one or process modules to reshaping a structure, etching a structure, implant dopant into a structure, removing and reapply a material layer of a structure. Also various of the remediation correction steps might be combined for the proper active interdiction as directed by the control system.

In an embodiment, when a conformality or uniformity of a thin film applied in a film-forming module on the common manufacturing platform does not meet a target conformality or target uniformity for the thin film, corrective or active interdiction action may be taken to repair the thin film. In one example, repairing a conformally applied thin film may be accomplished by removing the thin film and reapplying the thin film. As such, the workpiece may be passed to one or more etch and/or cleaning process modules and then to a film-formation module to reapply the film. In another active interdiction example, the workpiece might go to a film-formation module for conformally applying an additional thin film or to an etch module for etching the thin film, or some combination of film-formation and etch. For example, the workpiece may be transferred to a correction etching module to remove the thin film or partially etch the thin film, and/or the workpiece may be transferred to a correction film-forming module to reapply the thin film after it is removed or to apply additional thin film over the existing thin film or partially etched thin film.

In an embodiment, when the thickness, width, or profile of the sidewall spacers formed in an etching module on the common manufacturing platform does not meet a target thickness, width, or profile of the sidewall spacers, corrective action may be taken to repair the sidewall spacers. Repairing sidewall spacers may be accomplished by selectively depositing additional material onto the sidewall spacers, reshaping the sidewall spacers, implanting dopant into the sidewall spacers, or a combination of two or more thereof. For example, the workpiece may be transferred to a correction film-forming module to selectively deposit spacer material or to one or more correction film-forming and/or etching modules to perform a sidewall spacer reshaping process.

The correction modules may be different film-forming and etching modules that are designated as correction/remediation modules on the common manufacturing platform or another type of treatment module integrated on the common manufacturing platform, such as a thermal annealing module. Alternatively, the modules used in active interdiction may be the same film-forming and etching modules used to conformally apply the thin film, etch the thin film, and remove the mandrel pattern.

The process flow 1460 of FIG. 14B will now be described in detail with the optional metrology operations. Operation 1462 includes receiving a workpiece having a first mandrel pattern into a common manufacturing platform. Operation 1480 includes optionally performing measurement/metrology to obtain measurement data related to attributes of the incoming workpiece, such as attributes of the first mandrel pattern and/or an underlying layer over which the mandrel pattern is formed and into which the final pattern is to be transferred. The measurement data may be used to adjust and/or control process parameters of any one of operations 1464-1478.

Operation 1464 includes conformally applying a first thin film over the first mandrel pattern using a film-forming module hosted on the common manufacturing platform. Operation 1482 includes optionally performing measurement/metrology to obtain measurement data related to attributes of the workpiece having the conformal first thin film applied, such as attributes of the first thin film, the first mandrel pattern as affected by the thin film deposition, and/or the underlying layer into which the final pattern is to be transferred as affected by the thin film deposition, which measurement data may be used to adjust and/or control process parameters of any one of operations 1464-1468, may be used to make adjustments for subsequent workpieces to the incoming attributes in operation 1462 or to operation 1464, or may be used to repair the workpiece before continued processing. In one embodiment, when the measurement data indicates that one or more attributes do not meet a target condition, the workpiece may be transferred to a process module to repair the conformally applied first thin film. For example, when a conformality or uniformity of the first thin film does not meet a target conformality or target uniformity for the first thin film, corrective action may be taken in one or more process modules, such as removing the thin film and reapplying the thin film, conformally applying an additional thin film, etching the thin film, or a combination of two or more thereof.

Operation 1466 includes removing the first thin film from upper surfaces of the first mandrel pattern and lower surfaces adjacent the first mandrel pattern (e.g., from the underlying layer) using an etching module hosted on the common manufacturing platform to form first sidewall spacers (referred to as a spacer etch). Operation 1484 includes optionally performing measurement/metrology to obtain measurement data related to attributes of the workpiece having the etched first thin film forming first sidewall spacers on the sidewalls of the first mandrel pattern, such as attributes of the first sidewall spacers, the first mandrel pattern as affected by the spacer etch, and/or the underlying layer as affected by the spacer etch, which measurement data may be used to adjust and/or control process parameters of any one of operations 1468-1478, may be used to make adjustments for subsequent workpieces to the incoming attributes of the workpieces in operation 1462 or to operations 1464-1466, or may be used to repair the workpiece before continued processing. In one embodiment, when the measurement data indicates that one or more attributes do not meet a target condition, the workpiece may be transferred to a correction module to repair the first sidewall spacers on the sidewalls of the mandrel pattern. For example, when the thickness, width, or profile of the sidewall spacers does not meet a target thickness, width, or profile of the sidewall spacers, corrective action may be taken in one or more process modules, such as by selectively depositing additional material onto the sidewall spacers, reshaping the sidewall spacers, implanting dopant into the sidewall spacers, or a combination of two or more thereof.

Operation 1468 includes removing the first mandrel pattern (referred to as a mandrel pull) using an etching module hosted on the common manufacturing platform to leave behind the first sidewall spacers. Operation 1486 includes optionally performing measurement/metrology to obtain measurement data related to attributes of the workpiece having the first sidewall spacers, such as attributes of the first sidewall spacers as affected by the mandrel pull and/or the underlying layer as affected by the mandrel pull, which measurement data may be used to adjust and/or control process parameters of any one of operations 1470-1478, may be used to make adjustments for subsequent workpieces to the incoming attributes of the workpieces in operation 1462 or to operations 1464-1468, or may be used to repair the workpiece before continued processing. In one embodiment, when the measurement data indicates that one or more attributes do not meet a target condition, the workpiece may be transferred to a correction module to repair the first sidewall spacers. For example, when the thickness, width, or profile of the sidewall spacers does not meet a target thickness, width, or profile of the sidewall spacers, corrective action may be taken in one or more process modules, such as by selectively depositing additional material onto the sidewall spacers, reshaping the sidewall spacers, implanting dopant into the sidewall spacers, or a combination of two or more thereof.

In a self-aligned double patterning embodiment, process flow 1460 may proceed to operation 1478, discussed below, via flow 1470, either without or after operation 1486. Operation 1472 includes conformally applying a second thin film over the first sidewall spacers that serve as a second mandrel pattern, using a film-forming module hosted on the common manufacturing platform. Operation 1488 includes optionally performing measurement/metrology to obtain measurement data related to attributes of the workpiece having the conformal second thin film applied, such as attributes of the second thin film, the second mandrel pattern as affected by the thin film deposition, and/or the underlying layer as affected by the thin film deposition, which measurement data may be used to adjust and/or control process parameters of any one of operations 1474-1478, may be used to make adjustments for subsequent workpieces to the incoming attributes of the workpieces in operation 1462 or to operations 1464-1468 or may be used to repair the workpiece before continued processing. In one embodiment, when the measurement data indicates that one or more attributes do not meet a target condition, the workpiece may be transferred to a correction module to repair the conformally applied second thin film. For example, when a conformality or uniformity of the second thin film does not meet a target conformality or target uniformity for the second thin film, corrective action may be taken in one or more process modules, such as removing the thin film and reapplying the thin film, conformally applying an additional thin film, etching the thin film, or a combination of two or more thereof.

Operation 1474 includes removing the second thin film from upper surfaces of the second mandrel pattern and lower surfaces adjacent the second mandrel pattern (e.g., from the underlying layer) using an etching module hosted on the common manufacturing platform to form second sidewall spacers (referred to as a spacer etch). Operation 1490 includes optionally performing measurement/metrology to obtain measurement data related to attributes of the workpiece having the etched second thin film forming second sidewall spacers on the sidewalls of the second mandrel pattern, such as attributes of the second sidewall spacers, the second mandrel pattern as affected by the spacer etch, and/or the underlying layer as affected by the spacer etch, which measurement data may be used to adjust and/or control process parameters of any one of operations 1476-1478, may be used to make adjustments for subsequent workpieces to the incoming attributes of the workpieces in operation 1462 or to operations 1464-1474 or may be used to repair the workpiece before continued processing. In one embodiment, when the measurement data indicates that one or more attributes do not meet a target condition, the workpiece may be transferred to a process module to repair the second sidewall spacers on the sidewalls of the second mandrel pattern. For example, when the thickness, width, or profile of the sidewall spacers does not meet a target thickness, width, or profile of the sidewall spacers, corrective action may be taken in one or more process modules, such as by selectively depositing additional material onto the sidewall spacers, reshaping the sidewall spacers, implanting dopant into the sidewall spacers, or a combination of two or more thereof.

Operation 1476 includes removing the second mandrel pattern (referred to as a mandrel pull) using an etching module hosted on the common manufacturing platform, to leave behind the second sidewall spacers. Operation 1492 includes optionally performing measurement/metrology to obtain measurement data related to attributes of the workpiece having the second sidewall spacers, such as attributes of the second sidewall spacers as affected by the mandrel pull and/or the underlying layer as affected by the mandrel pull, which measurement data may be used to adjust and/or control process parameters of operation 1478, may be used to make adjustments for subsequent workpieces to the incoming attributes of the workpieces in operation 1462 or to operations 1464-1476, or may be used to repair the workpiece before continued processing. In one embodiment, when the measurement data indicates that one or more attributes do not meet a target condition, the workpiece may be transferred to a process module to repair the second sidewall spacers. For example, when the thickness, width, or profile of the sidewall spacers does not meet a target thickness, width, or profile of the sidewall spacers, corrective action may be taken in one or more process modules, such as by selectively depositing additional material onto the sidewall spacers, reshaping the sidewall spacers, implanting dopant into the sidewall spacers, or a combination of two or more thereof.

Process parameters, as referred to above, may include any operating variable within a processing module, such as but not limited to: gas flow rates; compositions of etchants, deposition reactants, purge gases, etc.; chamber pressure; temperature; electrode spacing; power; etc. The intelligence system of the active interdiction system is configured to gather measurement data from the inspection system and control the integrated sequence of processing steps executed on the common manufacturing platform, for example, by making in situ adjustments to processing parameters in subsequent processing modules for the workpiece in process, or by changing process parameters in one or more processing modules for subsequent workpieces. Thus, the obtained measurement data may be used to identify a needed active interdiction step or repair to the workpiece during the integrated sequence of processing steps to avoid having to scrap the workpiece, and/or to adjust processing parameters for the integrated sequence of processing steps for steps performed on the same workpiece after the measurement data is obtained or for processing subsequent workpieces to reduce occurrences of the target conditions not being met for the subsequent workpieces.

Active interdiction might also be implemented in contact formation processes. Contact formation on a workpiece can be implemented on the common manufacturing platform. In one embodiment, contacts may be formed using a patterned mask layer to selectively expose transistor contact areas to a plurality of processes (e.g., clean, metal deposition, anneal, metal etch). In another embodiment, contacts may be formed using selective deposition and etch processes to apply and remove metal from the transistor contact areas without using a patterned mask layer.

In a patterned mask layer embodiment, the common manufacturing platform may receive a workpiece having one or more contact features formed and exposed through a patterned mask layer. The contact feature has a semiconductor contact surface exposed at a bottom of the contact feature, the semiconductor contact surface containing silicon, or germanium, or alloy thereof. The common manufacturing platform may begin treating the semiconductor contact surface in one of the one or more etching modules to remove contamination therefrom. In one embodiment, an X-ray photo-emission spectroscopy measurement may be conducted on the incoming wafer prior to the treatment to detect the level contamination within the contact feature. Alternatively ellispometry (e.g., thickness measurement) may be done to determine or approximate the amount of oxide on the semiconductor contact surface. In doing so, the common manufacturing platform may optimize the treatment process to remove material in the etch module.

Following the treatment, the contamination and thickness measurements may be done again to confirm the contamination or oxide layer has been adequately removed. If not, the common manufacturing platform and active interdiction control system thereof may take remedial action by treating the workpiece a one or more additional times through the etch module. This measurement and treatment process may be repeated until the contamination or oxide is below a predetermined threshold level. In some instances, a high-resolution optical measurement systems may be used in the TMM/measurement module (e.g—high-resolution optical imaging and microscopy, hyperspectral (multi-spectral) imaging, interferometry, spectroscopy, Fourier transform Infrared spectroscopy (FTIR) reflectometry, scatterometry, spectroscopic ellipsometry, polarimetry, refractometers or non-optical imaging systems (e.g., SEM, TEM, AFM) to measure the dimensions of the contact feature Next, the common manufacturing platform moves the workpiece to a metal deposition module to deposit a metal layer within the contact feature on the semiconductor contact surface. A measurement system of the a TMM or measurement module may measure the film properties of a deposited layer (e.g., thickness, resistance, uniformity, conformality) using one or more measumrent/metrology systems (e.g., optical or non-optical techniques) incorporated into the common manufacturing platform. Based on the measurement and/or process performance data, the active interdiction control system may implement a remedial action on the workpiece to increase or decrease metal layer thickness and will move the workpiece as appropriate to a film-formation module or etch module to achieve the desired result based on the measurments. Alternatively, control system may move the workpiece appropriately to remove the metal layer and reapply a second metal to replace the first metal layer. In this instance, the metal layer is in physical contact with the dielectric material of one or more transistor components, for example.

Although the metal layer is physically contacting the dielectric material of the transistor, the contact is not yet fully formed because the interface resistance between the metal and dielectric material is too high with the abrupt transition between metal and dielectric material. One approach to reduce the resistance is to anneal or heat the workpiece to form a metal-dielectric alloy, wherein the resistance of the alloy is lower than the dielectric material and higher than the metal. Following the heat treatment, the active interdiction control system may move the workpiece to measure the resistance, using a film resistivity metrology system, to confirm alloy formation is within predetermined limits. In this instance, the active interdiction control system may also determine that an additional heat treatment is needed to fully form the alloy material to achieve the desired resistance and workpiece transfer mechanisms in the common manufacturing platform are operated accordingly for such a step.

Following the heat treatment, the workpiece may be moved to an etch module to remove the unalloyed portion of the metal layer to expose the alloy within the contact feature. Again, the the active interdiction control system may position to workpiece with a TMM or measurement module or some other measurement system to measure the resistance to determine whether an unalloyed portion of the metal layer has been adequately removed. The etch process may be repeated by the active interdiction control system until the aforementioned condition is achieved. However, in some embodiments, the metal layer may be entirely consumed as a result of the alloy treatment. In this instance, the metal etch process may not be needed.

In some embodiments, the patterned-mask layer process may include applying a conductive capping layer on the deposited metal layer or the alloyed layer in one of the one or more film-forming modules to cap the metal layer or alloy layer to prevent metal oxide or other contamination.

In other embodiments, the common manufacturing platform may be configured and controlled to form via structures (e.g., W, Co, Ru) above the contact to connect the contact to the metal lines, formed later above the transistor, which provide the electrical signals to the transistor components.

In another embodiment, contact formation may be implemented using area selective deposition (ASD) techniques which rely on chemical properties of exposed materials on the workpiece and deposited films to selectively interact with each other, such that the deposited films only grow on certain exposed material or grow at a much higher rate. Hence, the patterned mask layer may be omitted from the incoming workpiece. However, the ASD embodiment still uses many of the same steps as the patterned mask layer embodiment, with two primary differences. The application and removal of the self-assembled monolayer, wherein the SAM is applied before metal deposition and removed after metal deposition. The SAM layer replaces the patterned mask layer enables the blanket metal deposition to selectively deposit on the contact features. For example, in the mask embodiment, the metal layer deposits on the contact feature and the mask layer to form a blanket layer of metal over the workpiece. In contrast, in the ASD embodiment, the metal is selectively deposited on the contact features which are not covered by the SAM layer and does not form a metal layer on the SAM that has the same metal layer thickness over the contact features.

In the ASD embodiment, the common manufacturing platform and the active interdiction control system will use various measurement/metrology systems to confirm the SAM coverage and/or density adequately covers the non-contact features on the workpiece and/or exposes the contact features on the workpiece. Likewise, the active interdiction control system and common manufacturing platform can use measurement/metrology systems to determine that the SAM material is adequately removed from the workpiece. The metrology systems may include high-resolution optical (e.g—high-resolution optical imaging and microscopy), hyperspectral (multi-spectral) imaging, interferometry, spectroscopy, Fourier transform Infrared spectroscopy (FTIR) reflectometry, scatterometry, spectroscopic ellipsometry, polarimetry, or refractometers.

Autonomous Learning Engine

The subject innovation is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present innovation.

As used in the subject specification, the terms "object," "module," "interface," "component," "system," "platform," "engine," "unit," "store," and the like are intended to refer to a computer-related entity or an entity related to an operational machine with a specific functionality, the entity can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. Also, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal).

Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Figure 17:
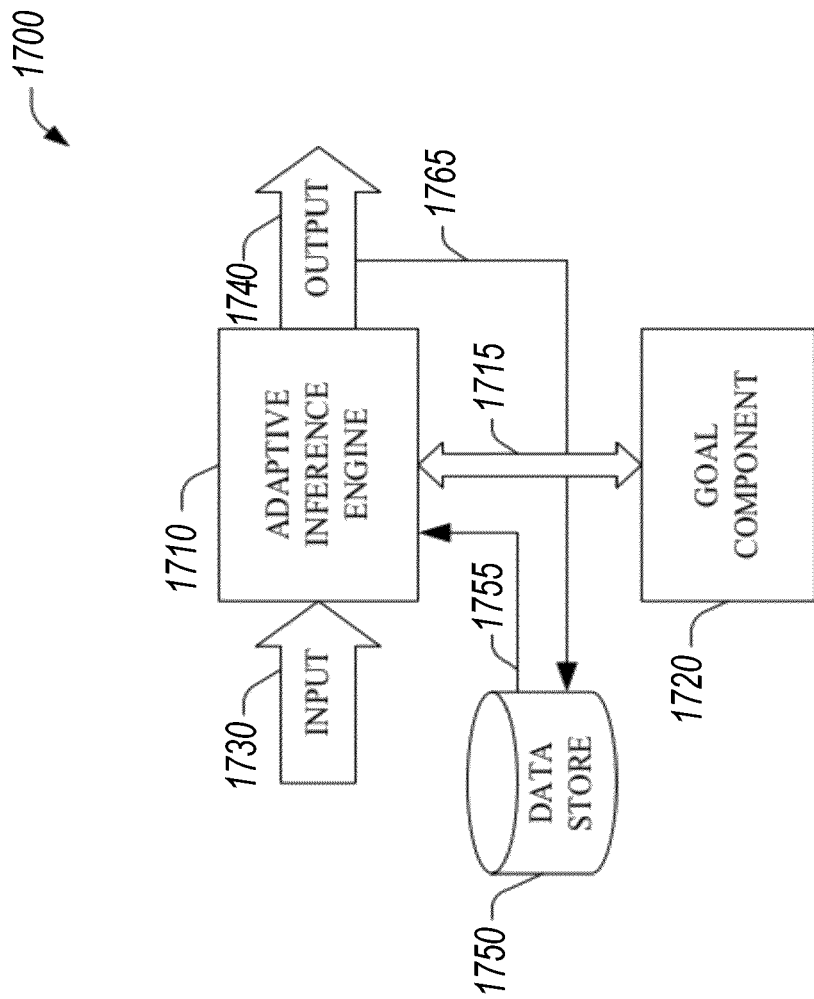
FIG. 17 illustrates a high level block diagram of an autonomous biologically based learning tool.

Referring to the drawings, FIG. 17 illustrates an example autonomous biologically based learning system 1700 that might be implemented by an active interdiction control system. An adaptive inference engine 1710 is coupled to a goal component 1720. A wired or wireless communication link 1715 couples such components. For a specific goal established or pursued by goal component 1720, adaptive inference component 1710 receives an input 1730 such as measurement data, process parameter data, platform performance data as captured herein that can be employed to accomplish the goal and conveys output 1740 that can represent or record aspects of the pursued or accomplished goal. In addition, adaptive inference engine 1710 can receive data from a data store 1750 through link 1755 and can store data or information in such data store, e.g., stored information can be a portion of output 1740 that is conveyed through a wired or wireless link 1765. It should be appreciated that (i) input 1730, output 1740, and data in data store 1750 (as well as the history of input, output, and data in the data store) comprise a context for the operation of adaptive inference engine 1710, and (ii) a feedback of that context into the engine via links 1715, 1755, and 1765 facilitates adaptation based on context. In particular, goal component 1720 can exploit fed back context to adapt a specific, initial goal and thus establish and pursue the adapted goal.

Input 1730 can be regarded as extrinsic data or information, which can include measurement module data, inspection system data, processing module parameter data, platform performance data, etc from the common manufacturing platform as well as process sequence data. This data can include instructions, records, results of measurements; and so on. Output 1740 can be substantially the same in nature as input 1730, and it can be regarded as intrinsic data. Input and output can be received and conveyed, respectively, by input and output interfaces and connections with the manufacturing platform (e.g., USB ports, IR wireless inputs), that can reside in adaptive inference component 1710. As indicated above, input 1730 and output 1740 can be a portion of a context for adaptive inference engine 1710. Additionally, adaptive inference component 1710 can request input 1730 as a result of pursuing a goal.

Components in autonomous biologically based system 1700 can be defined recursively, which can confer the autonomous system 1700 a substantial degree of competent learning complexity with basic elementary components.

Each link 1715, 1755, or 1765 can include a communication interface that can facilitate manipulation of data or information to be transmitted or received; can utilize databases for data storage and data mining; and can receive and convey information from and to an actor. Wired embodiments of links 1715, 1755, or 1765 can include a twisted-pair line, a T1/E1 phone line, an AC line, an optical fiber line, and corresponding circuitry, whereas wireless embodiments can comprise an ultra-mobile wide band link, a long-term evolution link, or an IEEE 802.11 link, and associated electronics. Regarding data store 1750, although it is illustrated as a single element, it can be a distributed data warehouse, wherein set of data memories are deployed in disparate physical or logical locations.

In example system 1700, the adaptive inference engine 1710 and the goal component 1720 are illustrated as separate components, however, it should be appreciated that one of such components can reside within the other.

Goal component 1720 can belong to one or more disciplines (e.g., a scientific discipline such as semiconductor manufacturing or enterprise sectors related to semiconductor manufacturing (e.g., a market sector, an industry sector, a research sector and so on). Additionally, as goals can typically be multidisciplinary and focus on multiple markets, a goal component can establish multiple disparate goals within one or more particular disciplines or sectors. To pursue a goal, a goal component can comprise a functional component and a monitor component. Specific operations to accomplish a goal are affected through the functional component(s), whereas conditions of variables related to the accomplishment of the goal are determined by the monitor component. Additionally, the functional component(s) can determine a space of goals that can be accomplished by the goal component 1720. A space of goals comprises substantially all goals that can be attained with a specific functionality. It should be appreciated that, for such specific functionality afforded by a functional component, a contextual adaptation of a specific goal can adapt a first goal to a second goal within a space of goals. An initial goal within a space of goals can be determined by one or more actors; wherein an actor can be a machine or a human agent (e.g., an end user). It should be noted that an initial goal can be a generic, high-level objective, as the adaptation inference engine 1710 can drive goal component 1720 towards a complex detailed objective through goal drifting. Goals, goal components, and goal adaptation are illustrated next.

Figure 18:
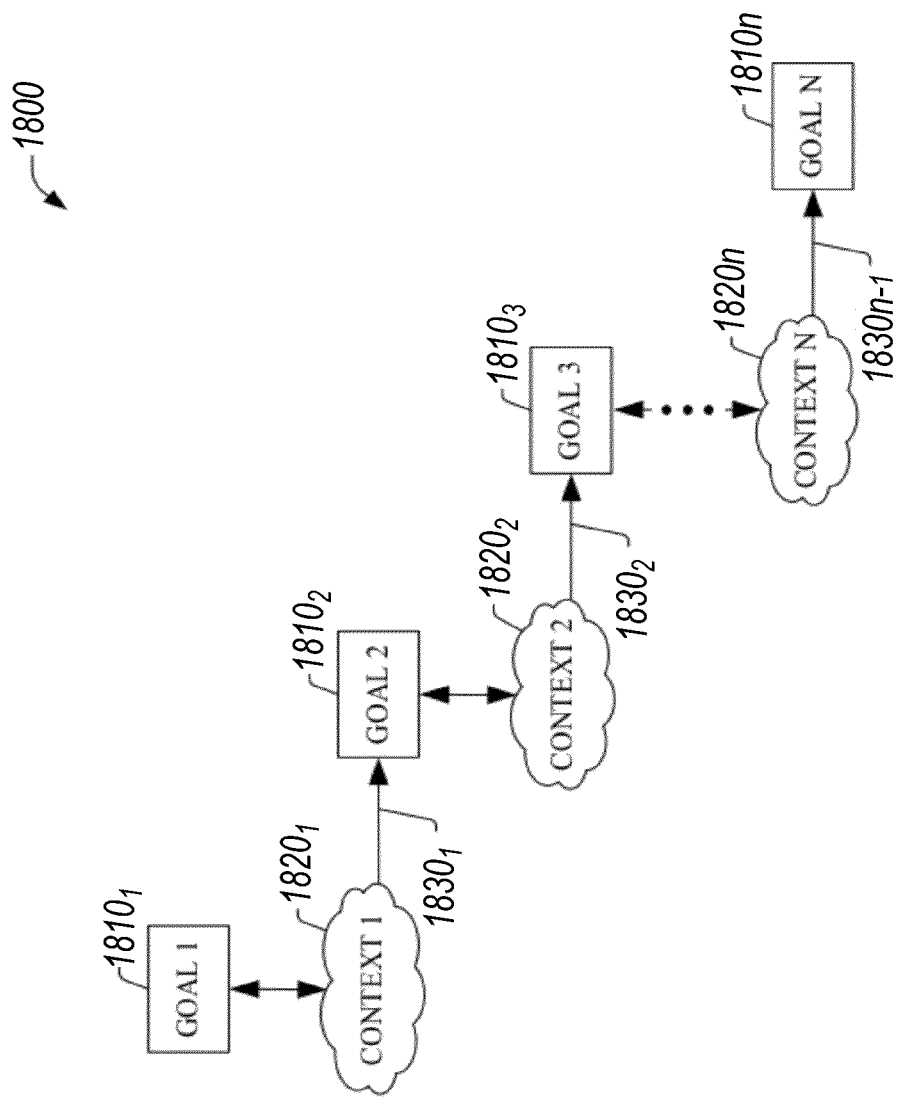
FIG. 18 is a diagram that delineates contextual goal adaptation according to aspects described herein.

FIG. 18 is a diagram 1800 that delineates contextual goal adaptation. A goal (e.g., goal $1810_1$, or goal $1810_3$) can typically be an abstraction that is associated with the functionality of a goal component (e.g., component 1720). A goal can be a high level abstraction: "Save for retirement," "secure a profit," "be entertained," "learn to cook," "to travel to a locale," "develop a database," "manufacture a product," and so on. Additionally, goals can be more specific refinements such as "save to retire early with an annual income in the range of $60,000-$80,000," "travel from the United States to Japan in low season, with travel costs including housing not to exceed $5000," or "reach a job interview site to deliver a 35 minute presentation to a group of associates of the prospective employer." Furthermore, a goal (e.g., $1810_1$) possesses an associated context (e.g., $1820_1$). As indicated above, goal component 1720 coupled to adaptive inference engine 1710 generally is compatible with an established goal (e.g., goal $1810_1$, or goal $1810_3$). For instance, the goal "manufacture a product" (e.g., goal $1810_1$) can rely on a manufacturing tool system such as a molecular beam epitaxy reactor (an example goal component 1720) that adopts standard or custom specifications to manufacture the product. During the accomplishment of such a goal (e.g., goal $1810_1$), output 1740 can include the manufactured product. In addition, an adaptive inference component (e.g., component 1710) can adapt (e.g., adaptation $1830_1$) the "manufacture a product" goal (e.g., goal $1810_1$) based on context (e.g., context $1820_1$) like the one that can be generated by tool system specifications or data gathered by a monitor component in the goal component. In particular, the initial high-level goal (e.g., goal $1810_1$) can be adapted to "manufacture a semiconductor device" (e.g., goal $1810_2$). As indicated above, a goal component 1720 can be composed of multiple functional components in order to accomplish a goal. Additionally, goal component 1720 can be modular, wherein goal sub-component can be incorporated as a goal is adapted. As an example, a goal component that pursues the "manufacture a product" goal can comprise a multi-market evaluation and forecast component that is coupled to a massively parallel, intelligent computing platform which can analyze market conditions in various markets in order to adapt (e.g., $1830_1$) the goal to "manufacture a multicore-processor that utilizes molecular electronics components" (e.g., goal $1810_N$). It should be noted that such an adaptation can involve a number of intermediate adaptations $1830_1$-$1830_{N-1}$, as well as intermediate adapted goals $1810_2$-$1810_{N-1}$ wherein intermediated adaptation is based on intermediate contexts $1820_2$-$1820_N$ generated from a previously pursued goal.

In another illustration of goal, goal component and goal adaptation, a goal can be to "purchase a DVD of movie A at store B," the goal component 1720 can be a vehicle with a navigation system that comprises an adaptive inference engine 1710. (It should be noted that in this illustration the adaptive inference engine 1710 resides in the goal component 1720.) An actor (e.g., a vehicle operator) can enter or select the location of store B and goal component can generate directions to accomplish the goal. In the instance that the adaptive inference engine 1710 receives input 1730 that store B has ceased to carry in inventory movie A (e.g., an RFID reader has updated an inventory database and an update message has been broadcasted to component 1710) while the actor is traveling to the store, adaptive inference engine 1710 can (i) request additional input 1730 to identify a store C with movie A in stock, (ii) evaluate the resources available to the actor to reach store C, and (iii) assess the level of interest of the actor in accomplishing the goal. Based on the modified context developed through input 1730 as illustrated in (i)-(iii), goal component can receive an indication to adapt the goal "to purchase a DVD of movie A at store C."

It should be appreciated that adaptive inference engine 1710 can establish sub-goals associated with a goal determined by goal component 1720. A sub-goal can facilitate accomplishing the goal by enabling adaptive inference engine to accomplish complementary task or to learn concepts associated with the goal.

As a summary, autonomous biologically based system 1700 is a goal-driven system with contextual goal-adaptation. It should be appreciated that goal adaptation based on received context introduces an additional layer of adaptation to the analysis of input information to generate actionable information output 1740. The capabilities of (a) adapting the process of information or data analysis and (b) adapting an initial goal based on context render the system massively adaptive or autonomous.

Figure 19:
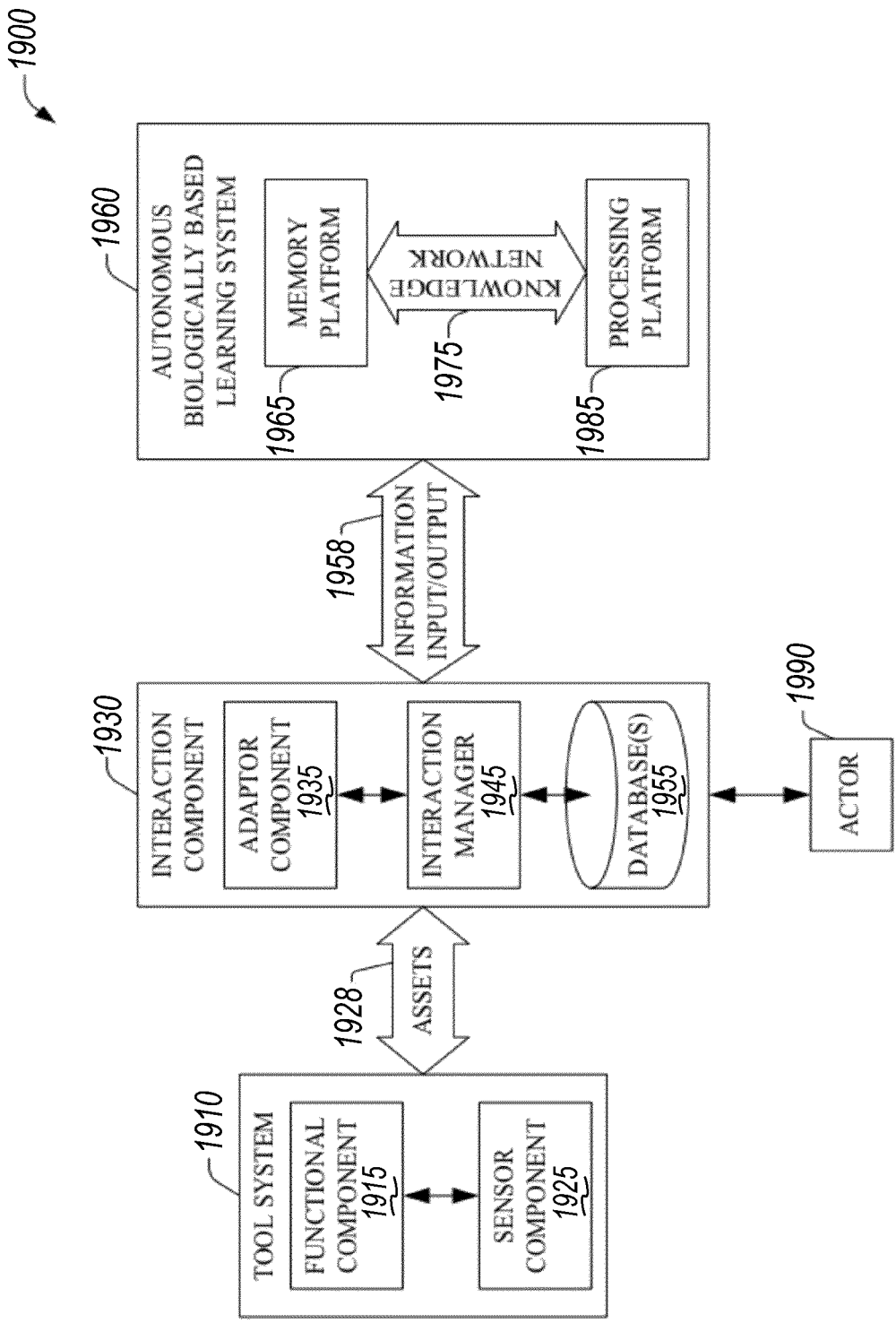
FIG. 19 illustrates a high level block diagram of an example autonomous biologically based learning tool.

FIG. 19 illustrates a high level block diagram of an example autonomous biologically based learning tool 1900. In embodiment 1900, the autonomous learning system includes a tool system 1910 that comprises a functional component 1915 which confers the tool system its specific functionality and can comprise a single functional tool component or a collection of substantially identical or diverse functional tool components, and a sensor component 1925 that can probe several observable magnitudes related to a process performed by the tool, like a thermal treatment of a semiconductor wafer, and generates assets 1928 associated with the process. Collected assets 1928, which include data assets such as production process data or test run data, can be conveyed to an interaction component 1930 which includes an adaptor component 1935 that can serve as an interface to receive assets 1928, an interaction manager 1945 which can process the received assets 1928, and database(s) 1955 that can store the received and processed data. Interaction component 1930 facilitates interaction of tool system 1910 with autonomous biologically based learning system 1960. Information associated with the data generated in the process performed by manufacturing platform tool system 1910 which can be received and incrementally supplied to autonomous learning system 1960. For example, measurement data associated with workpieces, as well as processing parameter data associated with process modules of the platform is directed to the interaction component 1930.

Autonomous biologically based learning system 1960 includes a memory platform 1365 that stores received information 1958 (e.g., data, variables and associated relationships, causal graphs, templates, and so on) which can be communicated via a knowledge network 1975 to a processing platform 1985 that can operate on the received information and can communicate back a processed information through the knowledge network 1975 to the memory platform 1965. The constituent components of autonomous learning system 1960 can generally resemble biological aspects of the brain, in which a memory is networked with processing components to manipulate information and generate knowledge. Additionally, knowledge network 1975 can receive information from, and convey information to, interaction component 1930, which can communicate the information to tool system 1910, or an actor 1990 via interaction manager 1945. As information 1958 is received, stored, processed and conveyed by the autonomous learning system 1960, multiple improvements can be effected in tool system 1910 and actors that rely on it. Namely, improvements include (a) the autonomous learning system 1960 and tool system 1910 become increasingly independent as time progresses, and require lesser actor intervention (e.g., human direction and supervision), (b) the autonomous system improves the quality of its outputs to actors (for example, better identification of root causes of failures, or prediction of system failure before occurrence thereof), and (c) the autonomous learning system 1960 improves its performance over time—the autonomous system 1960 delivers improved results at a faster rate and with fewer resources consumed.

Memory platform 1965 comprises a hierarchy of functional memory components, which can be configured to store knowledge (e.g., information 1958) received during initialization or configuration of tool system 1910 (e.g., a priori knowledge). A priori knowledge can be conveyed as information input 1958 through the interaction component 1930. In addition, memory platform 1965 can store (a) training data (e.g., information input 1958) employed to train the autonomous learning system 1960 after initialization/configuration of tool system 1910, and (b) knowledge generated by the autonomous learning system 1960; the knowledge can be conveyed to tool system 1910 or actor 1990 through interaction component 1930, via interaction manager 1945.

Information input 1958 (e.g., data) supplied by an actor 1990, e.g., a human agent, can comprise data identifying a variable associated with a process, a relationship between two or more variables, a causal graph (e.g., a dependency graph), or an episode information. Such information can facilitate to guide the autonomous biologically based system 1960 in a learning process. Additionally, in one aspect, such information input 1958 can be deemed important by actor 1990, and the importance can be related to the relevance of the information to a specific process performed by tool system 1910. For instance, an operator (e.g., actor 1990 is a human agent) of an oxide etch system can determine that etch rate is critical to the outcome of the manufacturing process; thus, etch rate can be an attribute communicated to autonomous learning system 1960. In another aspect, information input 1958 supplied by actor 1990 can be a hint, whereby an indication to learn a particular relationship among process variables is made. As an example, hint can convey a suggestion to learn the behavior of pressure in a deposition chamber in tool system 1910, within a specific deposition step, as a function of chamber volume, exhaust pressure and incoming gas flow. As another example, a hint can indicate to learn a detailed temporal relationship for a chamber pressure. Such example hints can activate one or more functional processing units in the autonomous learning system that can learn the functional dependence of pressure on multiple process variables. Moreover, such hints can activate one or more functional units that can apply and compare a learnt functionality with respect to model or empirical functionalities available to actor 1990.

A tool system 1910, e.g., a semiconductor manufacturing tool, can be complex and therefore disparate actors can specialize in manipulating and operating the tool system through disparate types of specific, complete or incomplete knowledge. As an example, a human agent, e.g., a tool engineer can know that different gases have different molecular weight and thus can produce different pressures, whereas a process/tool engineer can know how to convert a pressure reading resulting from a first gas to an equivalent pressure resulting from a second gas; an elementary example of such knowledge can be to convert a pressure reading from a unit (e.g., Pa) to another (e.g., lb/int, or PSI). An additional type of general, more complex knowledge present in the autonomous biologically based learning system can be functional relationships between properties of a tool system (e.g., volume of a chamber) and measurements performed in the tool system (e.g., measured pressure in the chamber). For example, etch-engineers know that the etch rate is dependent on the temperature in the etch chamber. To allow for the diversity of knowledge and the fact that such knowledge can be incomplete, an actor (e.g., a human agent such as an end-user) can guide an autonomous learning system 1960 through multiple degrees of conveyed knowledge: (i) No knowledge specified. Actor delivers no guidance for the autonomous learning system. (ii) Basic knowledge. Actor can convey a valid relationship between properties of a tool system and measurements in the tool system; for instance, actor conveys a relationship (e.g., relationship($K_E$, T)) between an etch rate ($K_E$) and process temperature (T) without further detail. (iii) Basic knowledge with identified output. Further to a relationship between a tool system property and a tool system measurement, actor can provide specific output for a dependent variable in a relationship (e.g., relationship(output($K_E$), T). (iv) partial knowledge about a relationship. Actor knows the structure of a mathematical equation among a tool system property and a measurement, as well as relevant dependent and independent variables (e.g., $K_E = k_1 e^{-k_2/T}$ without concrete values for $k_1$ or $k_2$). The actor 1990, however, can fail to know a precise value of one for more associated constants of the relationship. (v) Complete knowledge. Actor possesses a complete mathematical description of a functional relationship. It should be noted that such guidance can be incrementally provided over time, as the autonomous learning system 1960 evolves and attempts to learn tool functional relationships autonomously.

Knowledge network 1975 is a knowledge bus that communicates information (e.g., data) or transfers power according to an established priority. The priority can be established by a pair of information source and information destination components or platforms. Additionally, priority can be based on the information being transmitted (e.g., this information must be dispatched in real-time). It should be noted that priorities can be dynamic instead of static and change as a function of learning development in the autonomous learning system 1960, and in view of one or more demands in the one or more components present in the autonomous biologically based learning tool 1900—e.g., a problem situation can be recognized, and a communication can be warranted and effected in response. Communication, and power transfer, via knowledge network 1975 can be effected over a wired link (e.g., a twisted pair link, a T1/E1 phone line, an AC line, an optical fiber line) or a wireless link (e.g., UMB, LTE, IEEE 802.11), and can occur among components (not shown) within a functional platform (e.g., memory platform 1965 and processing platform 1985) or among components in disparate platforms (e.g., a component in memory platform of self-awareness communicating with another subcomponent of self-awareness) or the communication can be between components (e.g., a component of awareness communicates with a component in conceptualization).

Processing platform 1985 comprises functional processing units that operate on information: Input information of a specific type (e.g., specific data types such as a number, a sequence, a time sequence, a function, a class, a causal graph, and so on) is received or retrieved and a computation is performed by a processing unit to generate output information of a specific type. Output information can be conveyed to one or more components in memory platform 1965 via knowledge network 1975. In an aspect, the functional processing units can read and modify data structures, or data type instance, stored in memory platform 1965, and can deposit new data structures therein. In another aspect, functional processing units can provide adjustments to various numeric attributes like suitability, importance, activation/inhibition energy, and communication priority. Each functional processing unit has a dynamic priority, which determines a hierarchy for operating on information; higher priority units operate on data earlier than lower priority units. In case a functional processing unit that has operated on specific information fails to generate new knowledge (e.g., learn), like generating a ranking number or ranking function that distinguishes a bad run from a good run associated with operation of a tool system 1910, the priority associated with the functional processing unit can be lowered. Conversely, if new knowledge is generated, the processing unit's priority is increased.

It should be appreciated that processing platform 1985, through prioritized functional processing units, emulates a human tendency to attempt a first operation in a specific situation (e.g., a specific data type), if the operation generates new knowledge, the operation is exploited in a subsequent substantially identical situation. Conversely, when the first operation fails to produce new knowledge, a tendency to employ the first operation to handle the situation is reduced and a second operation is utilized (e.g., spread activation). If the second operation fails to generate new knowledge, its priority is reduced, and a third operation is employed. Processing platform 1985 continues to employ an operation until new knowledge is generated, and other operation(s) acquire higher priority.

In an aspect, actor 1990 can provide process recipe parameters, instructions (e.g., a temperature profile for an annealing cycle of an ion implanted wafer, a shutter open/close sequence in a vapor deposition of a semiconductor, an energy of an ion beam in an ion implantation process, or an electric field magnitude in a sputtering deposition), as well as initialization parameters for the autonomous learning system 1960. In another aspect, an actor 1990 can supply data associated with maintenance of tool system 1910. In yet another aspect, actor 1990 can generate and provide results of a computer simulation of the process performed by tool system 1910. Results generated in such a simulation can be employed as training data to train the autonomous biologically based learning system. Additionally, a simulation or an end-user can deliver optimization data associated with a process to tool system 1910.

Autonomous learning system 1960 can be trained through one or more training cycles, each training cycle can be utilized to develop the autonomous biologically based learning tool 1900 to (i) be able to perform a larger number of functions without external intervention; (ii) provide better response such as improved accuracy, or correctness, when diagnosing root cause of manufacturing system health root causes; and (iii) increase performance such as faster response time, reduced memory consumption, or improved quality of product. Training data can be supplied to the autonomous learning system 1960 via adaptor component 1935, in case training data is collected from data 1928 associated with a process calibration or standard run in tool system 1910—such data can be deemed to be internal—or through interaction manager 1945. When training data is retrieved from database(s) 1965 (e.g., data related to external measurements conducted through an external probe, or records of repair intervention in tool system 1910); such training data can be deemed external. When training data is supplied by an actor, data is conveyed through interaction manager 1945 and can be deemed external. A training cycle based on internal or external training data facilitates autonomous learning system 1960 to learn an expected behavior of tool system 1910.

As indicated above, functional component 1915 can comprise multiple functional tool components (not shown) associated with the tool specific semiconductor manufacturing capabilities of a manufacturing platform as described herein and that enable the tool to be used to (a) manufacture semiconductor substrates (e.g., wafers, flat panels, liquid crystal displays (LCDs), and so forth), (b) conduct epitaxial vapor deposition or non-epitaxial vapor deposition, (c) facilitate ion implantation or gas cluster ion infusion, (d) perform a plasma or non-plasma (dry or wet) an oxide etch treatment, (e) implement a lithographic process (e.g., photolithography, e-beam lithography, etc.), and so on. The tool system 1910 can also be embodied in a furnace; an exposure tool for operation in a controlled electrochemical environment; a planarization device; an electroplating system; measurement module or inspection system device for optical, electrical, and thermal properties, which can include lifespan (through operation cycling) measurements; various measurement and metrology modules, a wafer cleaning machine, and the like.

In the process conducted by tool system 1910, sensors and probes comprising sensor component 1925 of an inspection system can collect data (e.g., data assets) associated with an attribute of a workpiece as described and on different physical properties of process modules (e.g., pressure, temperature, humidity, mass density, deposition rate, layer thickness, surface roughness, crystalline orientation, doping concentration, etc.) as well as mechanical properties of process modules and the manufacturing platform (valve aperture or valve angle, shutter on/off operation, gas flux, substrate angular velocity, substrate orientation, and the like) through various transducers and techniques with varying degrees of complexity depending on the intended use of the gathered data. Such techniques can include but are not limited to the various measurement and metrology techniques as described herein to obtain the noted data for detecting non-conformities and defects and providing active interdiction. It should be appreciated that the sensors and measurement module inspection systems provide the data from the tool system. It should also be appreciated that such data assets 1928 effectively characterize the measured data from the workpieces manufactured or fabricated by the manufacturing platform of the tool system 1910.

In an aspect, data sources in sensor component or inspection system 1925 can be coupled to adaptor component 1935, which can be configured to gather data assets 1928 in analog or digital form. Adaptor component 1935 can facilitate data 1968 collected in a process run to be composed or decomposed according to the intended utilization of the data in autonomous learning system 1960 before the data is deposited into memory platform 1965. Adaptors in adaptor component 1935 can be associated with one or more sensors in sensor component/inspection systems 1925 and can read the data from the one or more sensors. An external data source adapter may have the ability to pull data as well as pass through data that is pushed from outside the tool. For example, an MES/historical database adaptor knows how to consult an MES database to extract information for various autobots and package/deposit the data into working memory for one or more components of the autonomous system. As an example, adaptor component 1935 can gather wafer-level run data one workpiece or wafer at a time as the tool processes the workpiece. Then, adaptor component 1935 can consolidate individual runs in a batch to form "lot-level-data," "maintenance-interval-data", etc. Alternatively, if tool system 1910 outputs a single file (or computer product asset) for lot-level data, adaptor component 1935 can extract wafer-level data, step-level data, and the like. Furthermore, decomposed data elements can relate to one or more components of tool system 1900; e.g., variables and times at which a pressure controller in sensor component 1925 is operating. Subsequent to processing, or packaging, received data 1928 as described above, adaptor component 1935 can store processed data in database(s) 1955.

Database(s) 1955 can include data originated in (i) tool system 1910, through measurements performed by sensors in the inspection system/sensor component 1925, (ii) a manufacturing execution system (MES) database or a historical database, or (iii) data generated in a computer simulation of tool system 1910, e.g., a simulation of semiconductor wafer manufacturing performed by actor 1990. In an aspect, an MES is a system that can measure and control a manufacturing process and process sequence, can track equipment availability and status, can control inventory, and can monitor for alarms.

It is to be appreciated that products, or product assets, fabricated by tool system 1910 can be conveyed to actor 1990 through interaction component 1930. It should be appreciated that product assets can be analyzed by actor 1990 and the resulting information, or data assets, conveyed to autonomous learning system 1960. In another aspect, interaction component 1930 can perform analysis of a product asset 1928 via adaptor component 1935.

In addition, it is to be noted that in embodiment 1900 the interaction component 1930 and autonomous learning system 1960 are externally deployed with respect to tool system 1910. Alternative deployment configurations of autonomous biologically based learning tool 1900 can be realized, such as embedded deployment wherein interaction component 1930 and autonomous biologically based learning system 1960 can reside within the manufacturing platform tool system 1910, in a single specific tool component; e.g., single embedded mode, or in a cluster of tool components of the platform; e.g., multiple embedded mode. Such deployment alternatives can be realized in a hierarchical manner, wherein an autonomous learning system supports a set of autonomous learning tools that form a group tool or platform, or a tool conglomerate. Such complex configurations are discussed in detail below.

Figure 20:
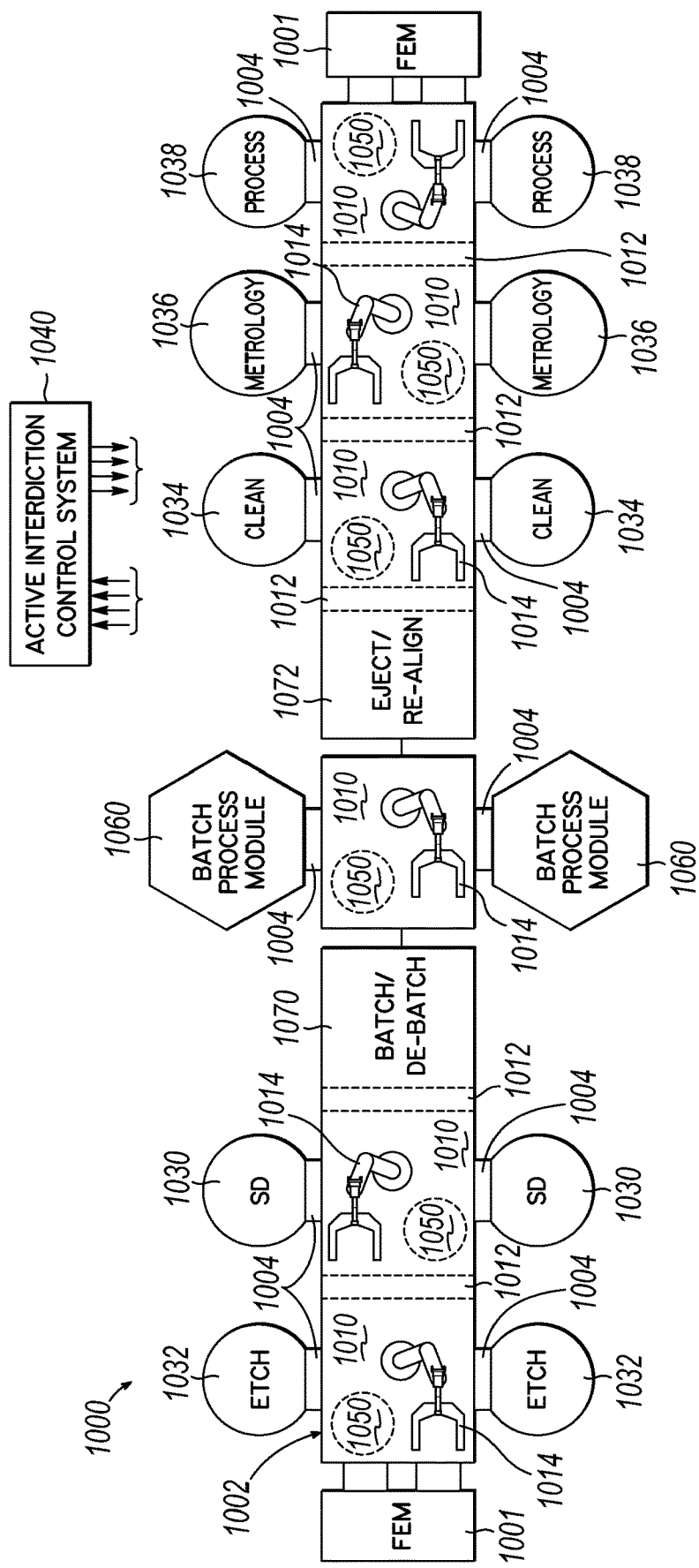
FIG. 20 is a diagram of an example tool system for semiconductor manufacturing that can exploit an autonomous biologically based learning system.

Next, an illustrative tool system 2000 is discussed in connection with FIG. 20, and an example architecture for the autonomous biologically based learning system 1960 is presented and discussed in detail with respect to FIGS. 21-25.

Figure 21:
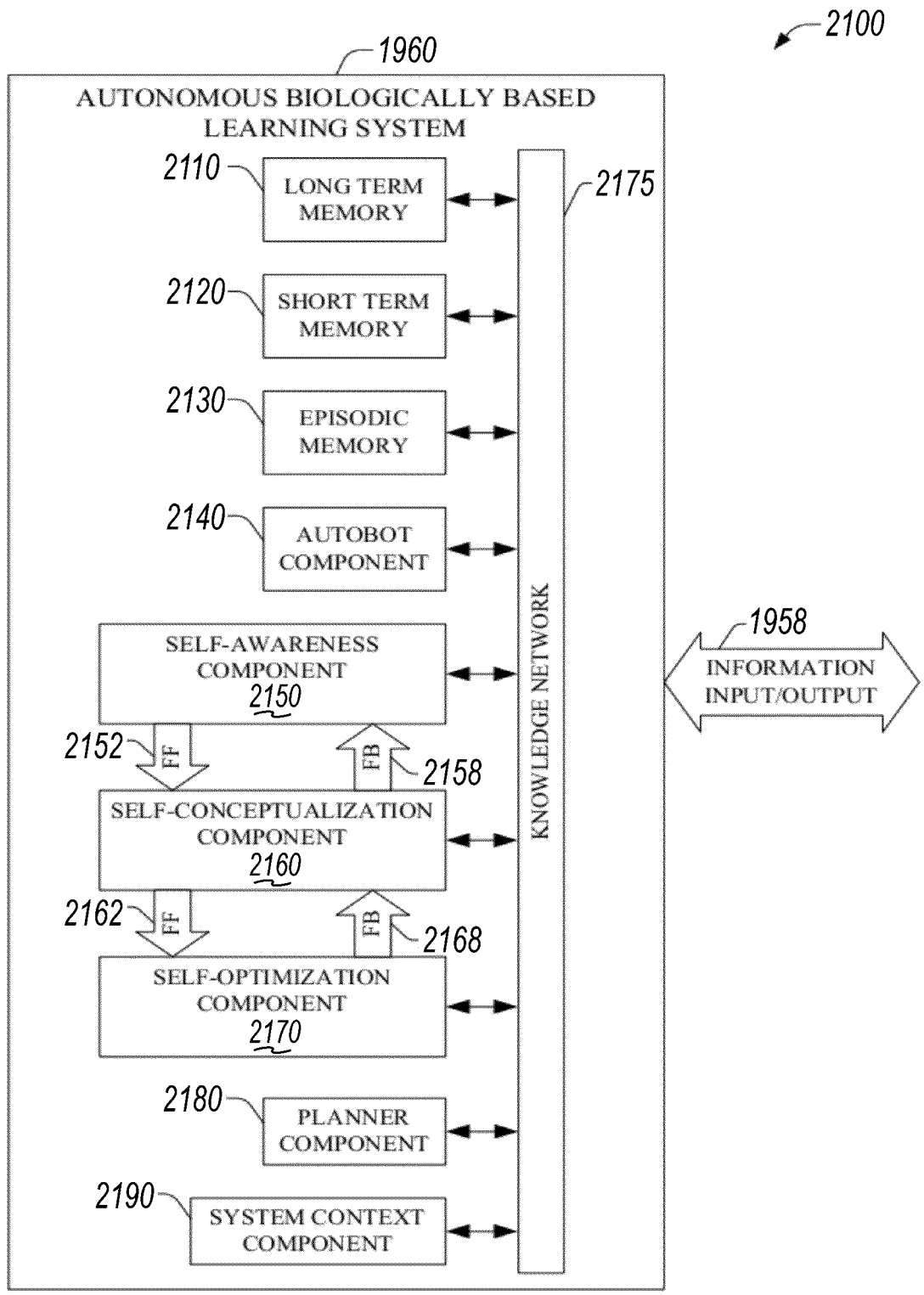
FIG. 21 illustrates a high level block diagram of example architecture of autonomous biologically based learning system.

FIG. 21 illustrates a high level block diagram of example architecture 2100 of an autonomous biologically based learning system. In embodiment 2100, autonomous learning system 1960 comprises a hierarchy of functional memory components that include a long term memory (LTM) 2110, a short term memory (STM) 2120, and an episodic memory (EM) 2130. Each of such functional memory components can communicate through knowledge network 1975, which operates as described in discussed in connection with FIG. 19. In addition, autonomous learning system 1960 can include an autobot component 2140 that includes functional processing units identified as autobots, with substantially the same characteristics as those functional units described in connection with processing platform 1985. It is to be noted that that autobot component 2140 can be a part of processing platform 1985.

Furthermore, autonomous learning system 1960 can comprise one or more primary functional units which include a self-awareness component 2150, a self-conceptualization component 2160, and a self-optimizing component 2170. A first feed forward (FF) loop 2152 can act as a forward link and can communicate data among self-awareness component 2150 and self-conceptualization 2160. In addition, a first feedback (FB) loop 2158 can act as a reverse link and can communicate data among self-conceptualization component 2170 and self-awareness component 2150. Similarly, forward link and reverse link data communication among self-conceptualization component 2160 and self-optimization component 2170 can be accomplished, respectively, through a second FF loop 2162 and a second FB loop 2168. It should be appreciated that in an FF link, data can be transformed prior to communication to the component that receives the data to further process it, whereas in a FB link a next data element can be transformed by the component that receives the data prior to process it. For example, data transferred through FF link 2152 can be transformed by self-awareness component 2150 prior to communication of the data to self-conceptualizing component 2160. It should further be appreciated that FF links 2152 and 2162 can facilitate indirect communication of data among components 2150 and 2170, whereas FB links 2168 and 2158 can facilitate an indirect communication of data among components 2170 and 2150. Additionally, data can be conveyed directly among components 2150, 2160, and 2170 through knowledge network 1975.

Long term memory 2110 can store knowledge supplied through interaction component 1930 during initialization or configuration of a tool system (e.g., a priori knowledge) to train the autonomous learning tool system 1900 after initialization/configuration. In addition, knowledge generated by autonomous learning system 1960 can be stored in long term memory 2110. It should be appreciated that LTM 2110 can be a part of a memory platform 1965 and thus can display substantially the same characteristics thereof. Long term memory 2110 can generally comprise a knowledge base that contains information about manufacturing platform components (e.g., processing modules, measurement modules, inspection systems, transfer modules and so on), relationships, processing steps and procedures. At least a portion of the knowledge base can be a semantic network that describes or classifies data types (for example as a sequence, an average, or a standard deviation), relationships among the data types, and procedures to transform a first set of data types into a second set of data types.

A knowledge base may contain knowledge elements, or concepts. In an aspect, each knowledge element can be associated with two numeric attributes: a suitability ($\xi$) and an inertia ($\iota$) of a knowledge element, or concept; collectively such attributes determine a priority of a concept. A well-defined function, e.g., a weighted sum, a geometric average, of these two numeric attributes can be a concept's situation score ($\sigma$). For example, $\sigma=\xi+\iota$. The suitability of a knowledge element can be defined as a relevance of the knowledge element (e.g., concept) to a tool system or a goal component situation at a specific time. In an aspect, a first element, or concept, with a higher suitability score than a second element can be more relevant to a current state of the autonomous learning system 1960 and a current state of a tool system 1910 than the second element with a lower suitability score. The inertia of a knowledge element, or concept, can be defined as the difficulty associated with utilization of the knowledge element. For example, a low first value of inertia can be conferred to a number element, a list of numbers can be attributed a second inertia value higher than the first value, a sequence of numbers can have a third value of inertia that is higher than the second value, and a matrix of numbers can have a fourth value of inertia which can be higher than the third value. It is noted that inertia can be applied to other knowledge or information structures like graphs, tables in a database, audio files, video frames, code snippets, code scripts, and so forth; the latter items can substantially all be a portion of input 1730. The subject innovation provides for a well-defined function of the suitability and the inertia that can influence the likelihood that a knowledge element is retrieved and applied. Concepts that have the highest situational score are the most likely concepts to be rendered to short term memory 2120 for processing by processing units.

Short term memory 2120 is a temporary storage that can be utilized as a working memory (e.g., a workspace or cache) or as a location where cooperating/competing operations, or autobots, associated with specific algorithms or procedures, can operate on data types. Data contained in STM 2120 can possess one or more data structures. Such data structures in STM 2120 can change as a result of data transformations effected by autobots and planner überbots (e.g., autobots dedicated to planning). The short term memory 2120 can comprise data, learning instructions provided by the interaction manager 1945, knowledge from the long term memory 2110, data provided and/or generated by one or more autobots or überbots, and/or initialization/configuration commands provided by an actor 1990. Short term memory 2120 can track a state of one or more autobots and/or überbots used to transform data stored therein.

Episodic memory 2130 stores episodes which can include an actor-identified set of parameters and concepts which can be associated with a process. In an aspect, an episode can comprise extrinsic data or input 1730, and it can provide with a specific context to autonomous learning system 1900. It is noted that an episode can generally be associated with a particular scenario identified or generated (e.g., by tool system 1910, a goal component 1720, or an autonomous learning system 1960) while pursuing a goal. An actor that identifies an episode can be a human agent, like a process engineer, a tool engineer, a field support engineer, and so on, or it can be a machine. It should be appreciated that episodic memory 2130 resembles a human episodic memory, wherein knowledge associated with particular scenario(s)—e.g., an episode—can be present and accessible without a recollection of the learning process that resulted in the episode. Introduction, or definition, of an episode typically is a part of a training cycle or substantially any extrinsic provision of input, and it can lead to an attempt by the autonomous biologically based learning system 1960 to learn to characterize data patterns, or input patterns, that can be present in data associated with the episode. A characterized pattern of data associated with an episode can be stored in episodic memory 2130 in conjunction with the episode and an episode's name. The addition of an episode to episodic memory 2130 can result in a creation of an episode-specific autobot that can become active when a set of parameters in a process conducted by a tool system 1910, or a generally a goal component 1720, enter an operating range as defined in the episode; the episode-specific autobot receives sufficient activation energy when the first feature associated with a pursued goal or process is recognized. If the parameters meet the criteria established through a received episode, the episode-specific autobot compares the pattern of data in the episode with the current data available. If the current situation (as defined by the recognized pattern of data) of the tool system 1910, or a goal component, matches the stored episode, an alarm is generated to ensure the tool maintenance engineers can become aware of the situation and can take preventive action(s) to mitigate additional damage to functional component 1915 or sensor component 1925 or material utilized in a tool process.

Autobot component 2140 comprises a library of autobots that perform a specific operation on an input data type (e.g., a matrix, a vector, a sequence, and so on). In an aspect, autobots exist in an autobot semantic net, wherein each autobot can have an associated priority; a priority of an autobot is a function of its activation energy ($E_A$) and its inhibition energy ($E_I$). Autobot component 2140 is an organized repository of autobots that can include autobots for the self-awareness component 2150, self-conceptualization component 2160, self-optimization component 2170, and additional autobots that can participate in transforming and passing data among components and among the various memory units. Specific operations that can be performed by an autobot can include a sequence average; a sequence ordering; a scalar product among a first and a second vector; a multiplication of a first matrix and a second matrix; a time sequence derivative with respect to time; a sequence auto-correlation computation; a cross-correlation operation between a first and a second sequence; a decomposition of a function in a complete set of basic functions; a wavelet decomposition of a time sequence numeric data stream, or a Fourier decomposition of a time sequence. It should be appreciated that additional operations can be performed depending on input data; namely, feature extraction in an image, sound record, or biometric indicator, video frame compression, digitization of environment sounds or voice commands, and so on. Each of the operations performed by an autobot can be a named function that transforms one or more input data types to produce one or more output data types. Each function for which there exists an autobot in autobot component 2140 can possess an element in LTM, so that itherbots can make autobot activation/inhibition energy decisions based on the total "attention span" and needs of the autonomous learning system 1960. Analogously to the autonomous learning system 1960, an autobot in autobot component 2140 can improve its performance over time. Improvements in an autobot can include better quality of produced results (e.g., outputs), better execution performance (e.g., shorter runtime, capability to perform larger computations, and the like), or enhanced scope of input domain for a particular autobot (e.g., inclusion of additional data types that the autobot can operate on).

Knowledge—concepts and data—stored in LTM 2110, STM 2120 and EM 2130 can be employed by primary functional units, which confer autonomous biologically based learning system 1960 a portion of its functionality.

Self-awareness component 2150 can determine a level of tool system degradation between a first acceptable operating state of the tool system 1910 and a subsequent state, at a later time, in which tool system has degraded. In an aspect, autonomous learning system 1960 can receive data that characterizes an acceptable operating state, and data associated with a product asset such as a workpiece fabricated in such acceptable state; such data assets can be identified as canonical data. Autonomous biologically based learning system 1960 can process the canonical data and the associated results (e.g., statistics about important parameters, data regarding non-conformities and defects in a workpiece observed drift in one or more measured attributes or parameters of a workpiece, predictive functions relating tool parameters, and so on) can be stored by self-awareness component 2150 and employed for comparison to data supplied as information input 1958; e.g., production process data or test run data or patterns on a workpiece. If a difference between generated, learnt results of the canonical data and the device process run-data or patterns is small, then the manufacturing system degradation can be considered to be low. Alternatively, if the difference between stored learnt results of the canonical data and the sample process data or other workpiece data is large, then there can be a significant level of non-conformities or defects in the workpiece. A significant level of non-conformities and process degradation can lead to a process, or goal, contextual adjustment. Degradation as described herein can be computed from a degradation vector $(Q_1, Q_2, \ldots, Q_U)$ where each component QA $(\lambda=1, 2, \ldots, U)$ of the degradation vector is a different perspective of an available data set— e.g., $Q_1$ may be a multivariate mean, $Q_2$ the associated multivariate deviation, $Q_3$ a set of wavelet coefficients for a particular variable in a process step, $Q_4$ may be the mean difference between a predicted pressure and measured pressure, etc. Normal training runs produce a specific set of values (e.g., a training data asset) for each component, which can be compared with component $Q_1$-$Q_U$ generated with run data (e.g., a run data asset) from each component. To assess degradation, a suitable distance metric can be employed to compare the (e.g., Euclidean) distance of a run degradation vector from its "normal position" in $\{Q\}$ space; the large such Euclidean distance, the more a tool system is said to be degraded. In addition, a second metric can be to compute a cosine similarity metric among the two vectors.

Self-conceptualization component 2160 can be configured to build an understanding of important manufacturing platform and tool system 1910 relationships (e.g., one or more process chamber behavior functions) and descriptions (e.g., statistics regarding requested and measured parameters, influence of parameters on degradation, etc.). It is to be appreciated that relationships and descriptions are also data, or soft, assets. The understanding is established autonomously (e.g., by inference and contextual goal adaptation originated from input data; inference can be accomplished, for example, via multivariate regression or evolutionary programming, such as genetic algorithms) by autonomous learning system 1960, or through an actor 1990 (e.g., a human agent) supplied guidance. Self-conceptualization component 2160 can construct a functional description of a behavior of a single parameter of a tool system 1910, or generally a goal component like component 1720, such as pressure in a film-forming module in a semiconductor manufacturing system as a function of time during a specific deposition step. In addition, self-conceptualization component 2160 can learn a behavior associated with a tool system, like a functional relationship of a dependent variable on a specific set of input information 1958. In an aspect, self-conceptualization component 2160 can learn the behavior of pressure in a deposition chamber of a given volume, in the presence of a specific gas flow, a temperature, exhaust valve angle, time, and the like. Moreover, self-conceptualization component 2160 can generate system relationships and properties that may be used for prediction purposes. Among learnt behaviors, self-conceptualization component 2160 can learn relationships and descriptions that characterize a normal state. Such normal state typically is employed by autonomous learning system 1960 as a reference state with respect to which variation in observer tool behavior is compared.

Self-optimization component 2170 can analyze a current health or performance of an autonomous biologically based learning system 1900 based on the level of a tool system 1910 deviation between predicted values (e.g., predictions based on functional dependence or relationships learnt by self-conceptualization component 2160 and measured values) in order to identify (a) a potential cause of a non-conformity from the manufacturing platform/tool system 1960, or (b) one or more sources of root cause of the manufacturing platform/tool system degradation based on information gathered by autonomous learning system 1960. Self-optimizing component 2170 can learn over time whether autonomous learning system 1960 initially incorrectly identifies an erroneous root cause for a non-conformity or defect, the learning system 1900 allows for input of maintenance logs or user guidance to correctly identify an actual root cause. In an aspect, the autonomous learning system 1960 updates a basis for its diagnosis utilizing Bayesian inference with learning to improve future diagnosis accuracy. Alternatively, optimization plans can be adapted, and such adapted plans can be stored in an optimization case history for subsequent retrieval, adoption, and execution. Moreover, a set of adaptations to a process conducted by tool system 1910, or generally a goal pursued by a goal component 1720, can be attained through the optimization plans. Self-optimization component 2170 can exploit data feedback (e.g., loop effected through links 1965, 1955, and 1915) in order to develop an adaptation plan that can promote process or goal optimization.

In embodiment 2100, autonomous biologically based learning system 1960 can further comprise a planner component 2180 and a system context component 2190. The hierarchy of functional memory components 2110, 2120, and 2130, and the primary functional units 2150, 2160, and 2170 can communicate with planner component 2180 and the system context component 2190 through knowledge network 1975.

Planner component 2180 can exploit, and comprise, higher level autobots in autobot component 2140. Such autobots can be identified as planner überbots and can implement adjustments to various numeric attributes like a suitability, an importance, an activation/inhibition energy, and a communication priority. Planner component 2180 can implement a rigid, direct global strategy; for instance, by creating a set of planner überbots that can force specific data types, or data structures, to be manipulated in short term memory 2120 through specific knowledge available in short term memory 2120 and specific autobots. In an aspect, autobots created by planner component 2180 can be deposited in autobot component 2140 and be utilized over the knowledge network 1975. Alternatively, or in addition, planner component 2180 can implement an indirect global strategy as a function of a current context of an autonomous learning system 1960, a current condition of a tool system 1910, a content of short term memory 2120 (which can include associated autobots that can operate in the content), and a utilization cost/benefit analysis of various autobots. It should be appreciated that the subject autonomous biologically based learning tool 1900 can afford dynamic extension of planner components.

Planner component 2180 can act as a regulatory component that can ensure process, or goal, adaptation in an autonomous biologically based tool 1900 does not result in degradation thereof. In an aspect, regulatory features can be implemented through a direct global strategy via creation of regulatory überbots that infer operational conditions based on planned process, or goal, adaptation. Such an inference can be effected through a semantic network of data types on which the regulatory überbots act, and the inference can be supported or complemented by cost/benefit analysis. It should be appreciated that planner component 2180 can preserve goals drifting within a specific region of a space of goals that can mitigate specific damages to a goal component, e.g., a tool system 1910.

System context component 2190 can capture the current competency of an autonomous biologically based learning tool 1900 that exploits autonomous learning system 1960. System context component 2190 can include a state identifier that comprises (i) a value associated with an internal degree of competency (e.g., a degree of effectiveness of a manufacturing platform/tool system 1910 in conducting a process (or pursuing a goal), a set of resources employed while conducting the process, a quality assessment of a final product or service (or an outcome of a pursued goal), a time-to-delivery of devices, and so on), and (ii) a label, or identifier, to indicate the state of the autonomous learning tool 1900. For instance, the label can indicate states such as "initial state," "training state," "monitoring state," "learning state," or "applying knowledge." The degree of competency can be characterized by a numerical value, or metric, in a determined range. Further, the system context component 2190 can include a summary of learning performed by the autonomous learning system 1960 over a specific time interval, as well as a summary of possible process or goal adaptations that can be implemented in view of the performed learning.

Figure 22A:
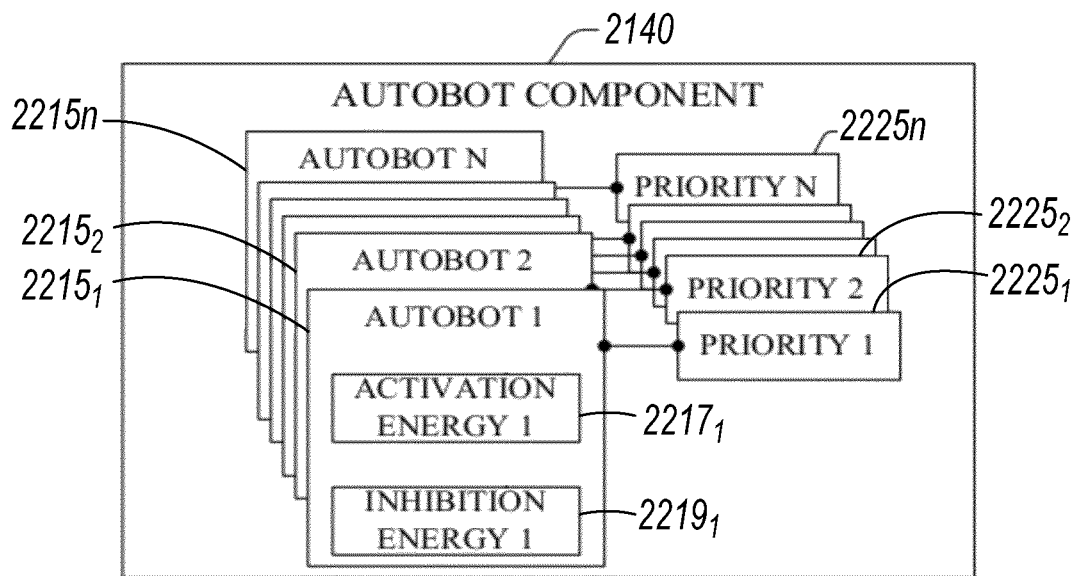
FIGS. 22A and 22B illustrate, respectively an example autobot component and an example autobot architecture.

FIG. 22A illustrates an example autobot component 2140. Autobots 2215$_1$-2215$_N$ represent a library of autobots and überbots, each with specific dynamics priority 2225$_1$-2225$_N$. Autobots 2215$_1$-2215$_N$ can communicate with a memory (e.g., a long term or short term memory, or an episodic memory). As indicated supra, an autobot's priority, is a determined by the autobot's activation energy and inhibition energy. An autobot (e.g., autobot 2215$_1$, or 2215$_N$) gains activation energy (through überbots) when data that can be processed by the autobot is in STM. A weighted sum of an autobot (e.g., autobot 2215$_2$) activation energy and inhibition energy, e.g., $I=w_A E_A + w_I E_I$ can determine when the autobot can activate itself to perform its functional task: The autobot self-activate when $\Sigma > \psi$, where $\psi$ is a predetermined, inbuilt threshold. It should be appreciated that the subject autonomous biologically based learning tool 1900 can afford dynamic augmentation of autobots.

Figure 22B:
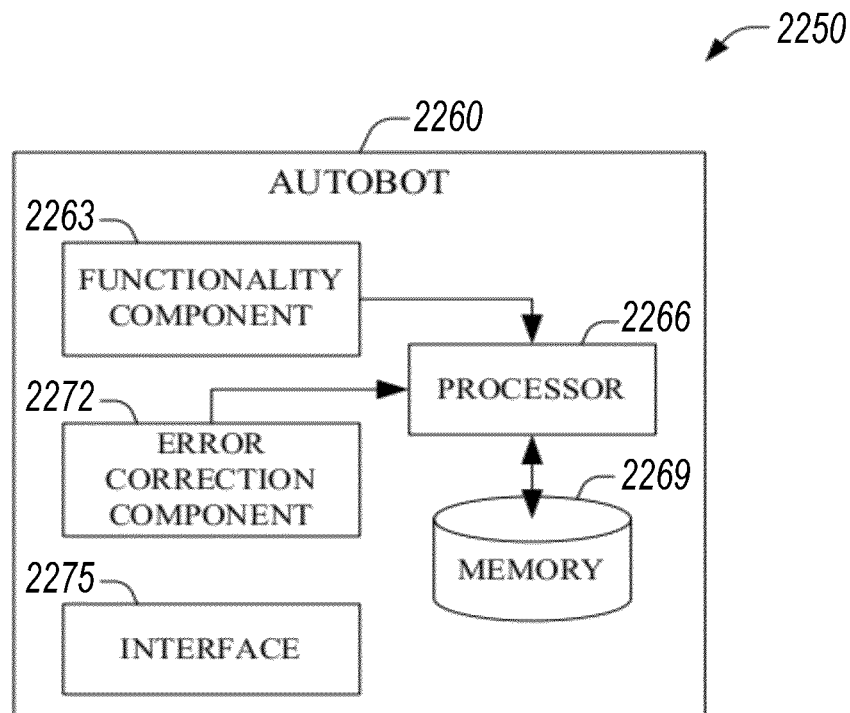

FIG. 22B illustrates an example architecture 2250 of an autobot. The autobot 2260 can be substantially any of the autobots included in an autobot component 2140. A functionality component 2263 determines and executes at least a portion of an operation that autobot 2260 can perform on input data. Processor 2266 can execute at least a portion of the operation performed by the autobot 2260. In an aspect, processor 2266 can operate as a co-processor of functionality component 2263. Autobot 2260 can also comprise an internal memory 2269 in which a set of results of previously performed operations. In an aspect, internal memory operates as a cache memory that stores input data associated with an operation, current and former values of $E_A$ and $E_I$, a log of the history of operation of the autobot, and so on. Internal memory 2269 can also facilitate autobot 2260 to learn how to improve quality of forthcoming results when a specific type and quantity of error is fed back or back propagated to the autobot 2260. Therefore, autobot 2260 can be trained through a set of training cycles to manipulate specific input data in a specific manner.

An autobot (e.g., autobot 2260) can also be self-describing in that the autobot can specify (a) one or more types of input data the autobot can manipulate or require, (b) a type of data the autobot can generate, and (c) one or more constraints on input and output information. In an aspect, interface 2275 can facilitate autobot 2260 to self-describe and thus express the autobot's availability and capability to überbots, in order for the überbots to supply activation/inhibition energy to the autobots according to a specific tool scenario.

Figure 23:
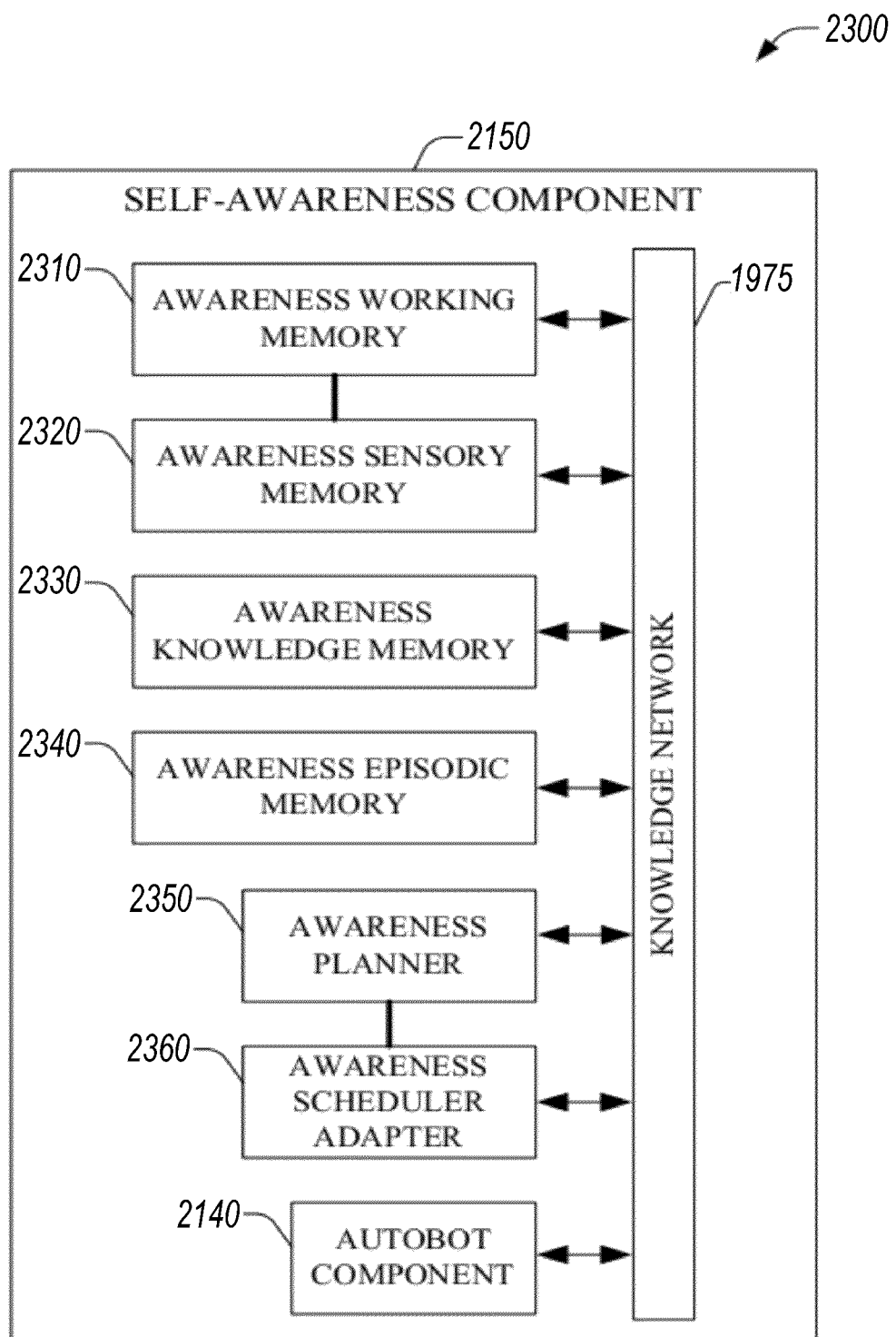
FIG. 23 illustrates an example architecture of a self-awareness component of an autonomous biologically based learning system.

FIG. 23 illustrates example architecture 2300 of a self-awareness component in an autonomous biologically based learning system 1960. Self-awareness component 2150 can determine a current level of degradation with respect to a learned normal state in a manufacturing platform/tool system (e.g., tool system 1910). Non-conformities in a workpiece and degradation can arise from multiple sources such as wear-and-tear or mechanical parts in the tool system; improper operation or developmental operation to develop recipes (e.g., a data asset) or processes that can force the manufacturing platform/tool system to operate outside one or more optimal ranges; improper customization of the manufacturing platform/tool system; or inadequate adherence to maintenance schedules. Self-awareness component 2150 can be recursively assembled, or defined, through (i) a hierarchy of memories, e.g., awareness memories which can be part of memory platform 1965, (ii) functional operational units such as awareness autobots that can reside in an autobot component 2140 and be a part of processing platform 1985, and (iii) a set of awareness planners. Based on the level of degradation, autonomous learning system 1960 can analyze available data assets 1928 as well as information 1958 to rank the possible faults. In an aspect, in response to an excessive level of non-conformities the autonomous learning system can provide control for corrective processing through the platform. In case of a successful corrective processing as confirmed, for example, by further measurement/metrology and associated data (e.g., data assets and patterns, relationships, and substantially any other type of understanding extracted from such combination) that preceded the corrective processing activities can be retained by autonomous learning system 1960. Thus, in forthcoming instances in which learned symptoms are identified through new understanding autonomously gleaned from data assets, and analysis, the manufacturing platform and the process sequence may be adapted to prevent further non-conformities.

Awareness working memory (AWM) 2310 is a S™ that can include a special region of memory identified as awareness sensory memory (ASM) 2320 that can be utilized to store data, e.g., information input 1958, that can originate in a sensor in sensor component 1925 or in actor 1990, can be packaged by one or more adaptors in adaptor component 1935, and can be received by knowledge network 1975. Self-awareness component 2150 can also comprise multiple special functionality autobots, which can reside in autobot component 2140 and include awareness planner überbots (APs).

In addition, self-awareness component 2150 can comprise an awareness knowledge memory (AKM) 2330 which is a part of a L™ and can include multiple concepts—e.g., an attribute; an entity such as a class or a causal graph; a relationship, or a procedure-relevant to the operation of self-awareness component 2150. In an aspect, a self-awareness component 2150 for a semiconductor manufacturing platform tool can include domain specific concepts like a step, a run, a batch, a maintenance-interval, a wet-clean-cycle, etc., as well as general purpose concepts like a number, a list, a sequence, a set, a matrix, a link, and so on. Such concepts can enter a higher level of abstraction; for instance, a workpiece run can be defined as an ordered sequence of process steps where a step has both recipe parameter settings (e.g., desired values), and one or more step measurements. Furthermore, AKM 2330 can include functional relationships that can link two or more concepts like an average, a standard deviation, a range, a correlation, a principal component analysis (PCA), a multi-scale principal component analysis (MSPCA), a wavelet or substantially any basis function, etc. It should be noted that multiple functional relationships can be applicable, and hence related, to a same concept; for example, a list of numbers is mapped to a real number instance by the average, which is a (functional) relation and a standard-deviation relation, as well as a maximum relation, and so forth). When a relationship from one or more entities to another entity is a function or a functional (e.g., a function of a function), there can be an associated procedure that can be executed by an überbot in order to effect the function. A precise definition of a concept can be expressed in a suitable data schema definition language, such as UML, OMGL, etc. It should be further noticed that a content of AKM 2330 can be augmented dynamically at (tool system) runtime without shutting the system down.

Each concept in AKM 2330, as any concept in a knowledge base as described herein, can be associated with a suitability attribute and an inertia attribute, leading to the concept's specific situation score. Initially, before the autonomous system is provided with data, the suitability value for all elements in AKM 2330 is zero, but the inertia for all concepts can be tool dependent and can be assigned by an actor, or based on historical data (e.g., data in database(s) 1955). In an aspect, inertia of a procedure that produces an average from a set of numbers can be substantially low (e.g., t=1) because computation of an average can be regarded as a significantly simple operation that can be applicable to substantially all situations involved collected data sets, or results from computer simulations. Similarly, maximize and minimize procedures, which transform a set of numbers, can be conferred a substantially low inertia value. Alternatively, compute a range and compute a standard deviation can be afforded higher inertia values (e.g., t=2) because such knowledge elements are more difficult to apply, whereas calculate a PCA can display a higher level of inertia and calculate a MSPCA can have a yet higher value of inertia.

A situation score can be employed to determine which concept(s) to communicate among from AKM 2330 and AWM 2310 (see below). Knowledge elements, or concepts, that exceed a situation score threshold are eligible to be conveyed to AWM 2310. Such concepts can be conveyed when there is sufficient available storage in AWM 2310 to retain the concept and there are no disparate concepts with a higher situation score that have not been conveyed to AWM 2310. A concept's suitability, and thus a concept's situation score, in AWM 2310 can decay as time progresses, which can allow new concepts with a higher suitability to enter awareness working memory 2310 when one or more concepts already in memory are no longer needed or are no longer applicable. It is noted that the larger the concept's inertia the longer it takes the concept to both be conveyed to and be removed from AWM 2310.

When a manufacturing platform/tool system state changes, e.g., a sputter target is replaced, an electron beam gun is added, a deposition process is finished, an in situ probe is initiated, an annealing stage is completed, and so on, awareness planner 2350 überbots can document which concepts (e.g., knowledge elements) can be applied in the new state, and can increase a suitability value, and thus a situation score, of each such concept in AKM 2330. Similarly, the activation energy of autobots $2215_1$-$2215_N$ can be adjusted by überbots in order to reduce the activation energy of specific autobots, and to increase $E_A$ for autobots that are appropriate to a new situation. The increment in suitability (and situation score) can be spread by planner überbots to those concepts' first neighbors and then to second neighbors, and so forth. It should be appreciated that a neighbor of a first concept in AKM 2330 can be a second concept that resides, in a topological sense, within a specific distance from the first concept according to a selected measure (e.g., number of hops, Euclidean distance, etc.) It is noted that the more distant a second concept is from a first concept that received an original increment in suitability, the smaller the second concept's increment in suitability. Thus, suitability (and situation score) increments present a dampened spread as a function of "conceptual distance."

In architecture 2100, self-awareness component 2150 comprises an awareness schedule adapter (ASA) 2360 which can be an extension of awareness planner component 2350 and can request and effect changes in collection extrinsic data or intrinsic data (e.g., via sensor component 1925 through interaction component 1930, via input 1730, or via (feedback) link 1755). In an aspect, awareness schedule adapter 2360 can introduce data sampling frequency adjustments—e.g., it can regulate a rate at which different adaptors in adaptor component 1935 can convey data to knowledge network 1975 (e.g., information input 1958) intended for ASM 2320. Moreover, awareness schedule adapter 2360 can sample at low frequency, or substantially eliminate, collection of data associated with process variables that are not involved in the description of normal patterns of data, or variables that fail to advance the accomplishment of a goal as inferred from data received in an adaptive inference engine 1710. Conversely, ASA 2360 can sample at higher frequency a set of variables extensively used in a normal pattern of data, or that can actively advance a goal. Furthermore, when the autonomous learning system 1960 acknowledges a change of state of manufacturing platform/tool system 1910 (or a change in a situation associated with a specific goal) wherein measured data indicates that product quality or process reliability are gradually deviating from normal data patterns (or a goal drift is resulting in significant departure from an initial goal in the space of goals or hat non-conformities exist), the autonomous learning system can request, via ASA 2360, a more rapid sampling of data to collect a larger volume of actionable information (e.g., input 1730) that can effectively validate the non-conformities and process degradation and trigger an appropriate corrective processing action or active interdiction.

An actor 1990 (e.g., a human agent) can train self-awareness component 2150 in multiple manners, which can include a definition of one or more episodes (including, for instance, illustrations of successfully adapted goals). A training of the autonomous learning system 1960, through self-awareness component 2150, for an episode can occur as follows. The actor 1990 creates an episode and provides the episode with a unique name. Data for the newly created episode can then be given to autonomous learning system 1960. The data can be data for a specific sensor during a single specific operation step of a tool system 1910, a set of parameters during a single specific step, a single parameter average for a run, etc.

Alternatively, or additionally, more elementary guidance can be provided by actor 1990. For example, a field support engineer can perform preventive tool maintenance (PM) on tool system 1910. PM can be planned and take place periodically, or it can be unplanned, or asynchronous. It should be appreciated that preventive tool maintenance can be performed on the manufacturing system in response to a request by the autonomous learning system 1960, in response to routine preventive maintenance, or in response to unscheduled maintenance. A time interval elapses between consecutive PMs, during such a time interval one or more processes (e.g., wafers/lots manufacturing) can take place in the tool system. Through data and product assets and associated information, such as effected planner and unplanned maintenance, autonomous learning system can infer a "failure cycle." Thus, the autonomous learning system can exploit asset(s) 1928 to infer a mean time between failures (MTBF). Such inference is supported through a model of time-to-failure as a function of critical data and product assets. Furthermore, autonomous learning system 1960 can develop models, through relationships among disparate assets received as information I/O 1958 or through historic data resulting from supervised training sessions delivered by an expert actor. It should be appreciated that an expert actor can be a disparate actor that interacts with a trained disparate autonomous learning system.

Actor 1990 can guide the autonomous system by informing the system that it can average wafer level run data and assess a drift in critical parameters across PM intervals. A more challenging exercise can also be performed by the autonomous system, wherein the actor 1990 indicates through a learning instruction to autonomous learning system 1960 to learn to characterize a pattern of data at the wafer average level before each unplanned PM. Such an instruction can promote the autonomous learning system 1960 to learn a pattern of data prior to an unplanned PM, and if a pattern of data can be identified by an awareness autobot, the self-awareness component 2150 can learn such a pattern as time evolves. During learning a pattern, awareness component 2150 can request assistance (or services) from self-conceptualization component 2160 or awareness autobots that reside in autobot component 2140. When a pattern for the tool system is learned with a high degree of confidence (e.g. measured by a degree of reproducibility of the pattern as reflected in coefficients of a PCA decomposition, a size of a dominant cluster in a K-cluster algorithm, or a prediction of the magnitude of a first parameter as a function of a set of disparate parameters and time, and so forth), autonomous biologically based learning system 1960 can create a reference episode associated with the malfunction that can lead to the need of tool maintenance so that an alarm can be triggered prior to occurrence of the reference episode. It is noted that awareness autobots, which can reside in autobot component 2140, can fail to characterize completely a data pattern for the malfunction reference episode, or substantially any specific situation that can require unplanned maintenance, before it is necessary. It should be appreciated nonetheless that such a preventive health management of a tool system 1910, which can include a deep behavioral and predictive functional analysis, can be performed by autobots in self-conceptualization component 2160.

Figure 24:
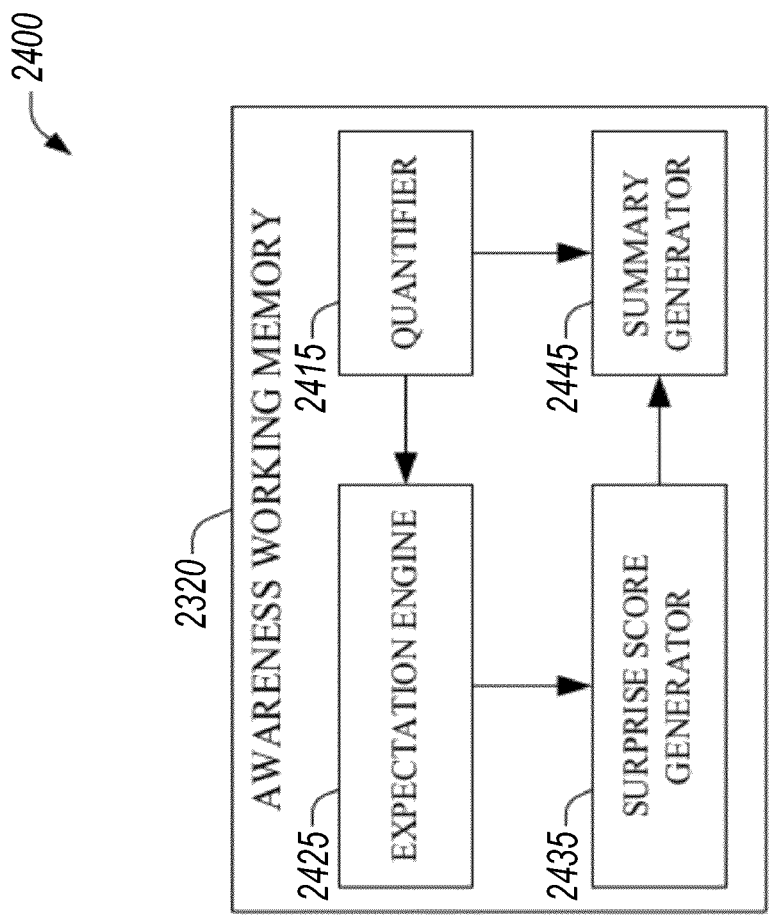
FIG. 24 is a diagram of example autobots that operate in an awareness working memory according to aspects described herein.

FIG. 24 is a diagram 2400 of autobots that can operate in an awareness working memory 2320. Illustrated autobots—quantifier 2415, expectation engine 2425, surprise score generator 2435, and summary generator 2445—can compose an awareness engine; a virtual emergent component, whose emergent nature arises from the concerted operation of elementary constituents, e.g., autobots 2415, 2425, 2435, and 2445. It should be appreciated that the awareness engine is an example of how one or more planning überbots can use a collection of coordinated autobots to perform a sophisticated activity. The planning überbots employ the various autobots (e.g., average, standard deviation, PCA, wavelet, derivative, etc.) or the services of self-conceptualization component 1560 to characterize a pattern of the data received in an autonomous biologically based learning system. Data for each step, run, lot, etc. run can be labeled by an external entity as being normal or abnormal during training. Quantifier 2415 can be employed by planning überbots to exploit normal data to learn a pattern of data for a prototypical, normal process. In addition, quantifier 2415 can assess an unlabeled data set (e.g., information input 1958) that is deposited into ASM 2320 and compare the normal data pattern with a data pattern of unlabeled data. Expected patterns for normal data or equations to predict parameters with normal data can be stored and manipulated through expectation engine 2425. It should be noted that the pattern of unlabeled data can differ from the normal data pattern in various ways, according to multiple metrics; for instance, a threshold for a Hotelling T2 statistic (as applied to PCA and MS-PCA and derived from training runs) can be exceeded; an average of a data subset of the unlabeled data set can differ by more than 36 (or other predetermined deviation interval) from the average computed with normal, training run data; a drift of measured parameters can be substantially different from that observed in the data associated with a normal run; and so forth. Summary generator 2445 thus generates a vector of components for normal data, whereas surprise score generator 1835 can incorporate, and rank or weight substantially all such differences in components of the vector and compute a net degradation surprise score for the tool system that reflect a health condition of the tool system and reflect how far "away from normal" the tool system is. It should be appreciated that discrepancies among a normal and unlabeled metric can vary as a function of time. Thus, through collection of an increasing amount of normal data, the autonomous learning system 1960 can learn various operational limits with greater level of statistical confidence as time evolves and can adjust manufacturing process recipes (e.g., a goal) accordingly degradation condition, as measured through a surprise score, for example, can be reported to an actor via summary generator 2445.

Figure 25:
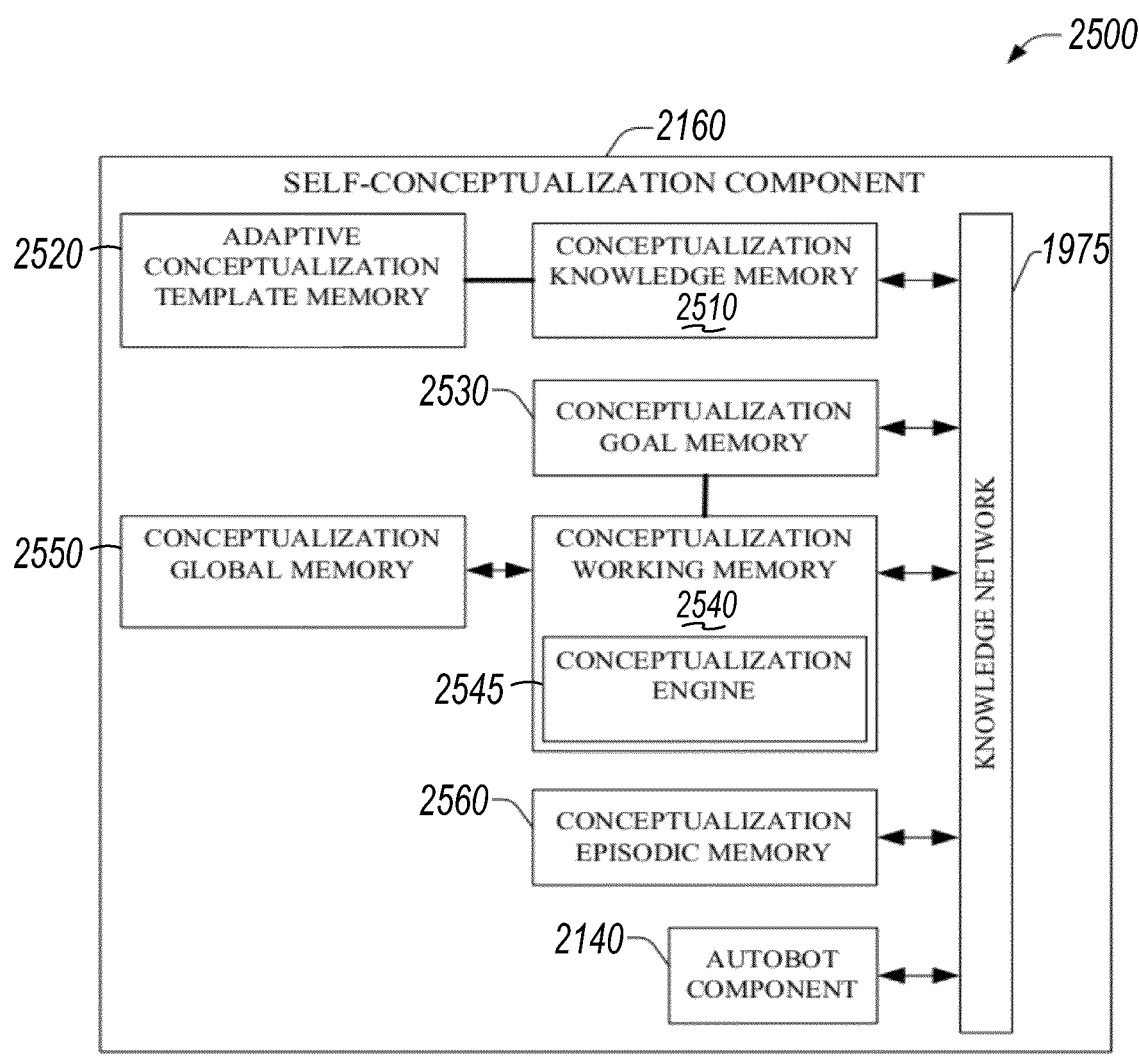
FIG. 25 illustrates an example embodiment of a self-conceptualization component of an autonomous biologically based learning system.

FIG. 25 illustrates and example embodiment 2500 of a self-conceptualization component of an autonomous biologically based learning system. A functionality of self-conceptualization component is to build an understanding of important semiconductor manufacturing tool relationships and descriptions. Such an understanding can be employed to adjust a manufacturing process (e.g., a goal). This acquired understanding is built autonomously or in conjunction with end-user (e.g., actor 1990) supplied guidance. Similarly, to the other primary functional components 2150 and 2160, self-conceptualization component 2160 is assembled or defined recursively in terms of a hierarchy of memories, operational units, or autobots, and planners; such components can communicate a priority-enabled knowledge network.

Embodiment 2500 illustrates a conceptualization knowledge memory (CKM) 2510 that includes concepts (e.g., attributes, entities, relationships, and procedures) necessary for operation of self-conceptualization component 2160. Concepts in CKM 2510 include (i) domain specific concepts such as a step, a run, a lot, a maintenance-interval, a wet-clean-cycle, a step-measurements, a wafer-measurements, a lot-measurements, a location-on-wafer, a wafer-region, a wafer-center, a wafer-edge, a first-wafer, a last-wafer, etc.; and (ii) general purpose, domain independent concepts like a number, a constant (e.g., e, π), a variable, a sequence, a time-sequence, a matrix, a time-matrix, a fine-grained-behavior, a coarse-grained-behavior, etc. Self-conceptualization component also includes a vast array of general purpose functional relations such as add, subtract, multiply, divide, square, cube, power, exponential, log, sine, cosine, tangent, of and so forth, as well as other domain specific functional relations that can present various levels of detail and reside in adaptive conceptualization template memory (ACTM) 2520.

ACTM 2520 is an extension of CKM 2510 that can hold functional relationships that are either completely or partially known to an actor (e.g., an end user) that interacts with a tool system 1910 (a semiconductor manufacturing platform tool). It should be noted that while ACTM is a logical extension of CKM, autobots, planners, and other functional components are not affected by such separation, as the actual memory storage can appear a single storage unit within self-conceptualization component 2160. Self-conceptualization component 2160 can also include a conceptualization goal memory (CGM) 2530 which is an extension of a conceptualization working memory (CWM) 2540. CGM 2530 can facilitate autobots of a current goal, e.g., to learn (f, pressure, time, step); for a particular process step, learn a function f of pressure wherein the function depends on time. It should be noted that learning function f represents a sub-goal that can facilitate accomplishing the goal of manufacturing a semiconductor device utilizing tool system 1910.

Concepts in ACTM 2520 also have a suitability numeric attribute and an inertia numeric attribute, which can lead to a situation score. A value of inertia can indicate a likelihood of a concept to be learnt. For example, a higher inertia value for a matrix concept and a lower inertia for a time-sequence concept can lead to a situation where self-conceptualization component 2160 can learn a functional behavior of time-sequences rather than a functional behavior of data in a matrix. Similarly, to self-awareness component 2150, concepts with lower inertia are more likely to be conveyed from CKM 2510 to CWM 2540.

Conceptual planners (CPs) provide activation energy to the various autobots and provide situation energy to various concepts in CKM 2510 and ACTM 2520, as a function of a current context, a current state of tool system 1910 (or generally a goal component 1720), a content of CWM 2540, or current autobot(s) active in CWM 2540. It should be appreciated that activation energy and situation energy alterations can lead to goal adaptation based on the knowledge generated (e.g., based on learning) as a result of the altered semantic network for concepts in CWM 2540 or CKM 2510—as inference by an adaptive inference engine can be based on propagation aspects of concepts.

Contents of CTM 2520 are concepts which can describe the knowledge discussed above, and thus those concepts can have suitability and inertia numeric attributes. The contents of CTM 2520 can be used by autobots to learn the functional behavior of the tool system 1910 (subject to the constraint that concepts with lower inertia are more likely to be activated over concepts with higher inertia). It is not necessary for all guidance to have the same inertia; for instance, a first complete function can be provided a lower inertia than a second complete function even though both concepts represent complete functions.

When partial knowledge like a partially-defined equation is uploaded in CWM 2540, it can be completed, e.g., with existing knowledge—CPs coordinate autobots to employ available data to first identify values for unknown coefficients. A set of ad hoc coefficients can thus complete the partially-defined equation concept into a complete function concept. The complete equation concept can then be utilized in a pre-built functional-relation concept such as add, multiply, etc. Basic knowledge with output (e.g., relationship (output($K_E$), T)) can facilitate autobots in CWM 2540 to construct and evaluate various functional descriptions that involve data for $K_E$ and T in order to identify the best function that can describe a relationship among $K_E$ and T. Alternatively, basic knowledge without output can facilitate autobots, with assistance of CPs, to specify a variable as an output, or independent, variable and attempt to express it as a function of the remaining variables. When a good functional description is not found, an alternative variable can be specified as an independent variable the process is iterated until it converges to an adequate functional relationship or autonomous learning system 1960 indicates, for example to actor 1990, that an adequate functional relationship is not found. An identified good functional relationship can be submitted to CKM 2510 to be utilized by autobots in autonomous learning system 1960 with a level of inertia that is assigned by the CPs. For instance, the assigned inertia can be a function of the mathematical complexity of the identified relationship—a linear relationship among two variables can be assigned an inertia value that is lower than the assigned inertia to a non-linear relationship that involve multiple variables, parameters, and operators (e.g., a gradient, a Laplacian, a partial derivative, and so on).

Conceptualization engine 2545 can be a "virtual component" that can present coordinated activities of awareness autobots and conceptualization autobots. In an aspect, self-awareness component 2150 can feed forward (through FF loop 2152) a group of variables (e.g., variables in the group can be those that display good pairwise correlation properties) to self-conceptualization component 2160. Forwarded information can facilitate self-conceptualization component 2160 to check CKM 2510 and ACTM 2520 for function relation templates. The availability of a template can allow an autobot of a conceptualization learner (CL), which can reside in the conceptualization engine 2545, to more quickly learn a functional behavior among variables in a forwarded group. It should be appreciated that learning such a functional behavior can be a sub-goal of a primary goal. A CL autobot with the assistance of a CP autobot can also use autobots of a conceptualization validator (CV). CV autobots can evaluate a quality of proposed functional relationships (e.g., average error between a predicted value and a measurement is within instrument resolution). A CL autobot can independently learn a functional relationship either autonomously or through actor-supplied guidance; such actor supplied guidance can be regarded as extrinsic data. Functions learned by a CL can be fed back (e.g., via FB link 2158) to self-awareness component 2150 as a group of variables of interest. For example, after learning the function $K_E = K_0 \exp(-U/T)$, wherein $K_0$ (e.g., an asymptotic etch rate) and U (e.g., an activation barrier) possess specific values known to the CL, self-conceptualization component 2160 can feed back the guidance group (output($K_E$, T) to self-awareness component 2150. Such feedback communication can afford self-awareness component 2150 to learn patterns about such group of variables so that degradation with respect to the group of variables can be quickly recognized and, if necessary, an alarm generated (e.g., an alarm summary, an alarm recipient list verified) and triggered. Memory 2560 is a conceptualization episodic memory.

The following two aspects related to CL and CV should be noted. First, CL can include autobots that can simplify equations (e.g., through symbolic manipulation), which can facilitate to store a functional relationships as a succinct mathematical expression. As an example, the relationship $P=((2+3)\phi)((1+0)\div\theta)$ is simplified to $P=3\phi\div\theta$, where P, $\phi$ and $\theta$ indicate, respectively, a pressure, a flow and an exhaust valve angle. Second, CV can factor in the complexity of the structure of an equation when it determines a quality of the functional relationship—e.g., for parameters with substantially the same characteristics, like average error of predicted values versus measurements, a simpler equation can be preferred instead of a more complicated equation (e.g., simpler equation can have lower concept inertia).

Additionally, important FF 2152 communication of information from self-awareness component 2150 to self-conceptualization component 2160, and FB 2158 communication from self-conceptualization component 2160 to self-awareness component 2150, can involve cooperation of awareness autobots and conceptualization autobots to characterize a pattern of data for an episode. As discussed above in connection with FIG. 21, when self-awareness component 2150 fails to learn an episode, self-conceptualization component 2160 can assist self-awareness component 2150 through provision of a set of relevant functional relationships. For example, characterization of an episode can require a fine-grained description of time dependence of a pressure in a stabilization step in a process run in a tool system 1910. Self-conceptualization component 2160 can construct such a detailed (e.g., second by second) time dependence of the pressure in the stabilization step. Thus, through FB loop 2158, self-awareness component 2150 can learn to characterize the pattern of pressure during the stabilization step in a normal tool situation and to compare the learnt pressure time dependence with a pattern of pressure in a specific episode data. As an illustration, presence of a spike in a measured pressure prior to a stabilization step for data in an episode, and the absence of the spike in pressure data during normal tool operation can be detected as a data pattern that identifies the occurrence of the episode in an autonomous biologically based learning tool 1900.

Similarly, a prediction of an unscheduled PM can rely on knowledge of temporal fluctuations of critical measurements of tool system data and the availability of a set of predictive functions conveyed by self-conceptualization component 2170. The predictive functions can assist a self-awareness component (e.g., component 2150) to predict an emerging situation of an unplanned PM in cases where the prediction depends on projected values of a set of variables as a function of time.

Figure 26:
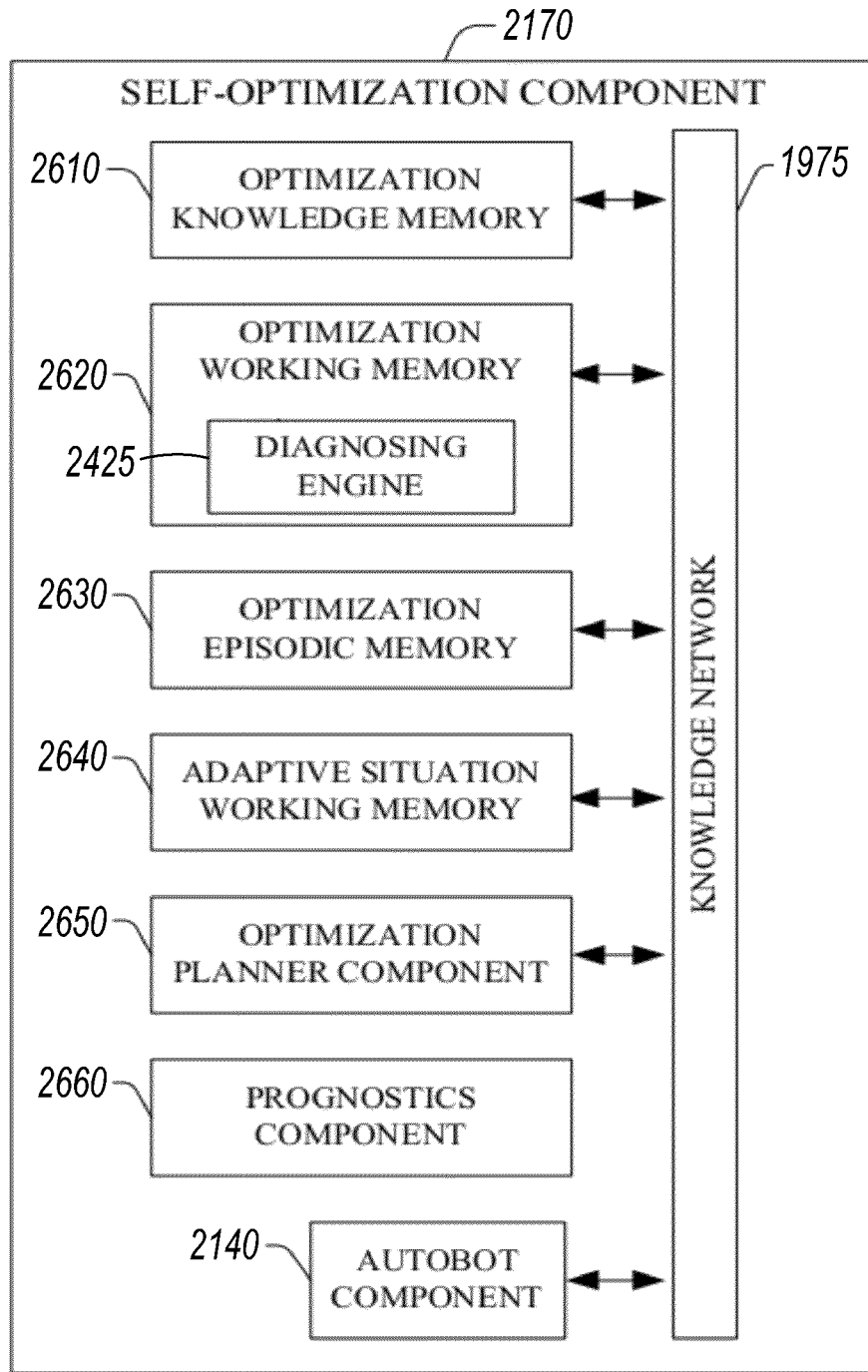
FIG. 26 illustrates and example embodiment of a self-optimization component in an autonomous biologically based learning system.

FIG. 26 illustrates an example embodiment 2600 of a self-optimization component in an autonomous biologically based learning system. As indicated above, self-optimization component functionality is to analyze the current health (e.g., performance) of a manufacturing platform/tool system 1910 and then determine if non-conformities are detected and, based on the results of the current health analysis, diagnose or rank substantially all potential causes for health deterioration of the tool system 1910 and the cause of such non-conformities, and identify a root cause of non-conformities based on learning acquired by autonomous learning system 1960 in order to provide the necessary control of the manufacturing platform to provide corrective processing. Analogously to the other primary functional components 2150 and 2160, self-optimization component 2170 is built recursively from a hierarchy of memories that can belong to a memory platform 1965, and autobots and planners which can be a part of a processing platform 1985.

Optimization knowledge memory (OKM) 2610 contains concepts (e.g., knowledge) related to diagnosis and optimization of the behavior of manufacturing platform/tool system 1910. It should be appreciated that a behavior can include a goal or a sub-goal. Accordingly, OKM 2610 contains domain, or goal, specific concepts such as step, step-data, run, run-data, lot, lot-data, PM-time-interval, wet-clean-cycle, process-recipe, sensor, controller, etc. The latter concepts are associated with a tool system 1910 that manufactures semiconductor devices. In addition, OKM 2610 comprises domain independent concepts, which can include a measurement (e.g., measurements from measurement modules), a sequence, a comparator, a case, a case-index, a case-parameter, a cause, an influence, a causal-dependency, an evidence, a causal-graph, etc. Furthermore, OKM 2610 can comprise a set of functional relations like compare, propagate, rank, solve, etc. Such functional relations can be exploited by autobots, which can reside in autobot component 2140 and can confer OKM 2610 at least a portion of its functionality through execution of procedures. Concepts stored in OKM 2610 possess a suitability numeric attribute and an inertia numeric attribute, and a situation score attribute derived there from. The semantics of suitability, inertia and situation score is substantially the same as that for self-awareness component 2150 and self-conceptualization component 2160. Therefore, if a run-data is provided with a lower inertia than step-data, self-optimization component 2170 planners (e.g., überbots) are more likely to communicate the concept of run-data from OMK 2610 to optimizing working memory (OWM) 2620. In turn, such inertia relationship between run-data and step-data can increase the activation rate of optimization autobots that work with run related concepts.

It should be noted that through FF links 2152 and 2162, self-awareness component 2150 and self-conceptualization component 2160 can influence the situation score of concepts stored on OKM 2610, and the activation energy of optimization autobots through optimization planners (OPs), which can reside in optimization planner component 2650. It should be appreciated that concepts which are stored in OKM 2610 and are influenced through self-awareness component 2150 and self-conceptualization component 2160, can determine aspects of a specific goal to be optimized as a function of a specific context. As an illustration, if self-awareness component 2150 recognizes that a pattern of data for a process step has degraded significantly and produced non-conformities in a workpiece, the situation score of the associated step concept can be increased. Accordingly, OPs can then supply additional activation energy to optimizing autobots related to the step concept in order to modify a set of steps executed during a process to provide corrective processing (e.g., while pursuing a goal). Similarly, if self-conceptualization component 2160 identifies a new functional relationship among tool measurements for a product lot, FF information received from self-conceptualization component 2160 (via FF 2162, for example) self-optimization component 2170 can increase (1) a situation score of a lot concept and (2) an activation energy of an optimization autobot with a functionality that relies on a lot concept; therefore, modifying aspects of the lot concept (e.g., number or type of wafers in a lot, cost of a lot, resources utilized in a lot, and so on).

Health assessment of a tool system 1910 can be performed through diagnosing engine 2425 as discussed. It should be noted that a health assessment can be a sub-goal of a manufacturing process. Diagnosing engine 2425 autonomously creates a dependency graph and allows actor 1990 to augment the dependency graph. (Such a dependency graph can be regarded as extrinsic data or as intrinsic data.) The causal graph can be conveyed incrementally, according to the dynamics of the process conducted by the tool system 1910, and a diagnosis plan that can be devised by the actor 1990. For example, a causal graph can show that a "pressure" malfunction is caused by one of four causes: a deposition chamber has a leak, gas flow into the chamber is faulty, exhaust valve angle (which controls the magnitude of gas flow) is faulty, or a pressure sensor is in error. Components of tool system 1910 have a priori probabilities of failure (e.g., a chamber leak can occur with probability 0.01, a gas flow can be faulty with probability 0.005, and so on). In addition, actor 1990, or self-conceptualization component 2160, can define a conditional dependency for pressure malfunction which can be expressed as a conditional probability; e.g., probability of pressure being at fault given that the chamber has a leak can be p(P|leak). Generally, conditional probabilities causally relating sources of tool failure can be provided by actor 1990. It should be noted that autonomous learning system 1960 assumes that probability assignments defined by actor 1990 can be approximate estimates, which in many cases can be significantly different from a physical probability (e.g., actual probability supported by observations). Examples of causal graphs are presented and discussed next in connection with FIGS. 27A and 27B below.

Self-optimization component 2170 can also comprise a prognostic component 2660 which can generate a set of prognostics regarding performance of manufacturing platform/tool system 1910 through information I/O 1958 associated with the tool. Such information can comprise quality of materials employed by functional component, physical properties of product assets 1928 produced by manufacturing platform/tool system 1910, such as index of refraction, optical absorption coefficient, or magnetotransport properties in cases product assets 1928 are doped with carriers, etc. Multiple techniques can be utilized by prognostics component 2660. The techniques comprise first characterization techniques substantially the same as those techniques that can be employed by self-awareness component when processing information 1958; namely, such as (i) frequency analysis utilizing Fourier transforms, Gabor transforms, wavelet decomposition, non-linear filtering based statistical techniques, spectral correlations; (ii) temporal analysis utilizing time dependent spectral properties (which can be measured by sensor component 1925), non-linear signal processing techniques such as Poincaré maps and Lyapunov spectrum techniques; (iii) real- or signal-space vector amplitude and angular fluctuation analysis; (iv) anomaly prediction techniques and so forth. Information, or data assets generated through analysis (i), (ii), (iii) or (iv) can be supplemented with predictive techniques such as neural-network inference, fuzzy logic, Bayes network propagation, evolutionary algorithms, like genetic algorithm, data fusion techniques, and so on. The combination of analytic and predictive techniques can be exploited to facilitate optimization of tool system 1910 via identification of ailing trends in specific assets, or properties, as probed by sensor component 1925, as well as information available in OKM 2610, with suitable corrective measures generated by optimization planner component 2650, and optimization autobots that can reside in component 2140.

Figure 27A:
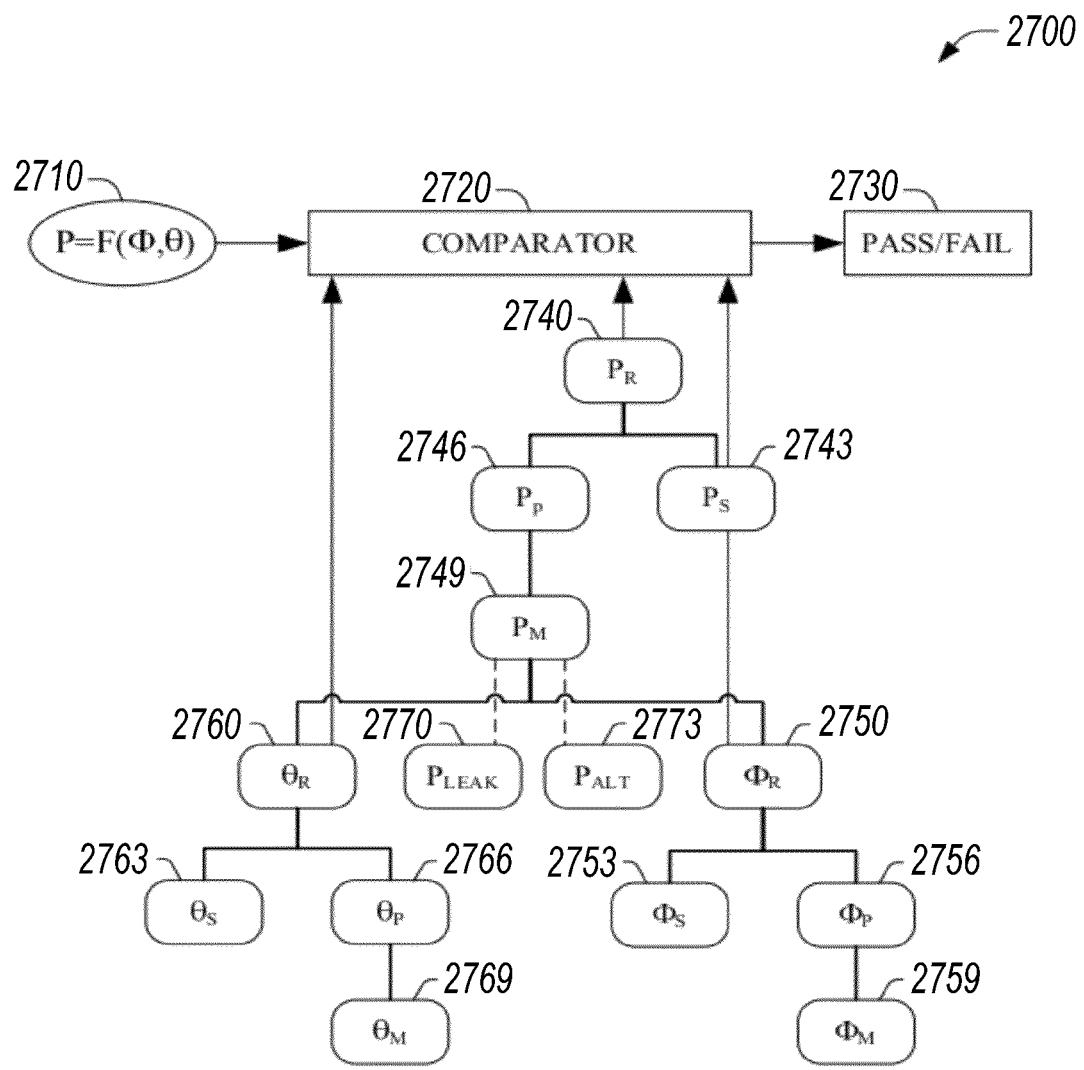
FIGS. 27A and 27B illustrate an example dependency graph with a single prediction comparator and two recipe comparators, respectively, generated according to an aspect of the subject disclosure.

FIG. 27A illustrates an example causal graph 2700 generated by self-conceptualization component 2130. A causal graph represents a relationship between dependent and independent variables of mathematical function, or relationship, predicted by self-conceptualization component 2130. As an example, by accessing data for pressure (P), gas flow ($\phi$), and valve angle ($\theta$), self-conceptualization component 2130 can use one or more mathematical techniques, such as curve fitting, linear regression, genetic algorithm, etc. to conceptualize, or learn, a predictive function 2710 for an output of interest or dependent variable, e.g., pressure, as a function of data inputs or independent variables—gas flow, valve angle, temperature, humidity, etc. An example learnt predictive function 2710 can be the following relationship between pressure and the two input variables $\phi$, $\theta$: $P=2\pi(\phi/\theta^3)$. From such a learnt function, self-conceptualization component 2160 autonomously constructs the dependency graph 2700.

To generate the dependency graph 2700 self-conceptualization component 2160 can proceed in two steps. (i) Comparator 2720 is introduced as a root node that receives as input a single learnt function 2710. A failure in comparator 2720 implies a failure in manufacturing platform/tool system 1910 that employs a biologically based autonomous learning system. A comparator failure can be a Boolean value (e.g., "PASS/FAIL" 2730) result which can be based on comparing a measured value for example, of a workpiece attribute with a predicted value generated through learnt function 2710. Self-conceptualization component 2160 flags a failure in comparator 2720 when the average difference between predicted pressure values and collected pressure data (e.g., as reported by a pressure sensor residing in sensor component) fails to remain within user-specified bounds—e.g., average difference is to remain within 5% of predicted pressure. A failure of comparator 2720 is made dependent on the output of the predictive function 2710. Thus, a comparator failure depends on (is influenced by) the failure of the pressure reading ($P_R$ 2740); which can fail because a pressure sensor ($P_S$ 2743) has failed or a physical pressure (e.g., the physical quantity $P_P$ 2746) has failed. Physical pressure $P_P$ 2746 can fail because a pressure mechanism ($P_M$ 2749) can fail. Thus, the system autonomously creates the dependencies between $P_R$ 2740 and {$P_S$ 2743, $P_P$ 2746} and between $P_P$ 2740 and {$P_M$ 2749}.

(ii) Dependent variables in learnt function 2710 are employed to complete the dependency graph as follows. Physical mechanism $P_M$ 2749 can fail when a gas-flow reading ($\phi_R$ 2750) fails or a valve-angle reading ($\theta_R$ 2760) fails—dependent variables in learnt function 2710. Thus, self-conceptualization component 2160 creates dependencies between $P_M$ 2749 and {$\theta_R$ 11150, $\phi_R$ 2760}. Substantially the same processing, or reasoning, for a failure in a reading can be employed by self-conceptualization component 2160 to create dependencies between $\phi_R$ 2750 and $\{\phi_S$ 2753, $\phi_P$ 2756$\}$ and between $\theta_R$ 2760 and $\{\theta_S$ 2763, $\theta_P$ 2766$\}$. Self-conceptualization component 2160 then can add the dependency between $\phi_P$ 2756 and $\{_M$2759$\}$ and between $\theta_P$ and $\{\theta_M\}$. It is to be noted that the relationship between the physical quantity (e.g., $P_P$ 2746, $\phi_P$ 2756, $\theta_P$ 2766) and the associated mechanism (e.g., $P_M$ 2749, $\phi_M$ 2759, and $\theta_M$ 2769) is redundant and presented to enhance clarity—mechanism nodes (e.g., nodes 2749, 2759, and 2769) can be removed, and their children made the children of the associated physical magnitude nodes (e.g., nodes 2746, 2756, and 2769).

In a dependency graph such as dependency graph 2700, leaf-level nodes are physical points of failure; e.g., nodes 2740, 2743, 2746, and 2749; nodes 2740, 2753, 2756, and 2759; and 2760, 2763, 2766, and 2769. In an aspect, an actor (e.g., actor 1990, which can be a user) can supply a biologically autonomous learning system with a priori probabilities for all physical points of failure. Such a priori probabilities can be obtained from manufacturing specifications for the component, field data, MTBF data, etc., or can be generated by simulation of the performance of parts present in a manufacturing tool and involved in a relevant manufacturing processing. The actor can also supply conditional probabilities based on prior experience, judgment, field data, and possible failure modes (e.g., the presence of a first failure can eliminate the possibility of a second failure, or the first failure can increase the probability of occurrence of the second failure, etc.). Upon receiving a priori and conditional probabilities, for example via an interaction component, such as component 1940, the autonomous system can use Bayesian network propagation with learning to update the probabilities based on actual failure data submitted to the autonomous system. Thus, in case the initial probabilities provided by the actor are erroneous, the autonomous system adjusts the probabilities as field data contradicts or supports a failure outcome; namely, a PASS or FAIL result of a comparator.

It should be noted that an actor (e.g., actor 1990, which can be a user) can add dependencies to an autonomously generated dependency graph (e.g., dependency graph) rooted at mechanism failures. Such an addition can be effected, for instance, through interaction manager 1955. In an aspect, as an illustration, dependency graph 2700 is augmented with two nodes labeled $P_{LEAK}$ 2770 and $P_{ALT}$ 2773 that result in a dependency of $P_M$ 2749 on $\{\phi_R$ 2750, $\theta_R$ 2760, $P_{LEAK}$ 2770, and $P_{ALT}$ 2773$\}$. It is to be appreciated that dependency graph 2700 can be augmented with a deeper graph as well. Addition of node $P_{LEAK}$ 2770 informs the autonomous system, through self-conceptualization component 2160, that besides a failure of a gas flow reading or a valve angle reading, the pressure mechanism can also fail should a leak be present in the tool. Node $P_{ALT}$ 2773 is complementary to node 2770 in that it represents the likelihood that mechanisms alternative to a leak results in system failure. Upon addition of a node, or a deeper graph, the actor is to assign a priori probabilities for the node and associated conditional probabilities describing the dependencies.

It should be appreciated that learnt functions can be more complex than the function $P = F(\phi, \theta)$ discussed above, and can include substantially more independent variables; however, causal graphs can be prepared in substantially the same manner.

Figure 27B:
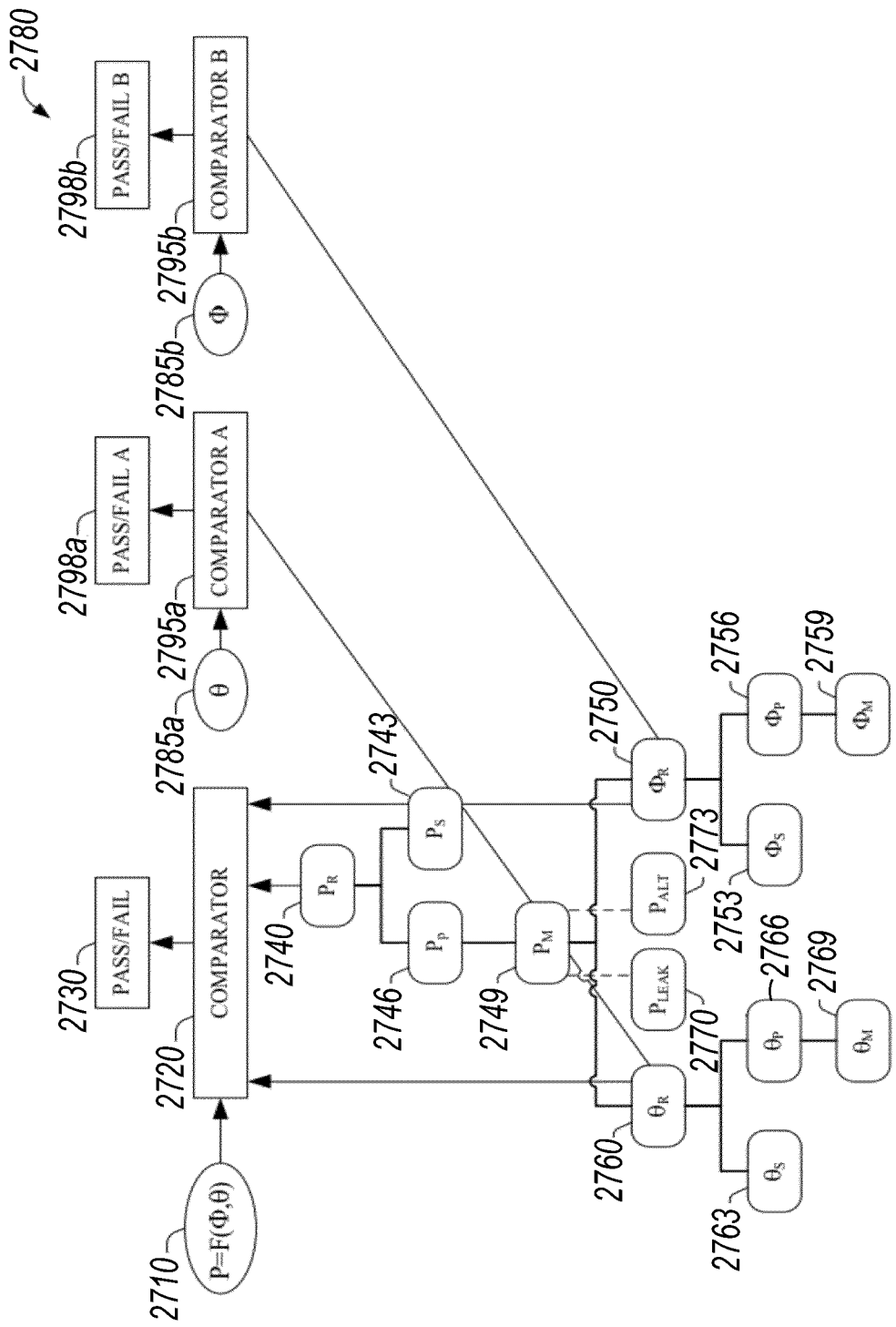

FIG. 27B is a diagram 2780 of an example learnt function dependency graph with prediction and recipe comparators. In addition to learnt-function comparators (e.g., comparator 2720), a biologically based autonomous learning system can generate one or more recipe comparators. A recipe comparator (e.g., comparator A 2795$_A$ or comparator B 2795$_B$) compares a set value of a recipe parameter with a corresponding average measure value, or reading, that arises from an associated sensor in a tool system (e.g., tool system 1910). In an aspect, given a collection of recipe parameters (e.g., $\theta$ 2785$_A$ or $\phi$ 2785$_B$) that have an associated sensor and corresponding prescribed values, the autonomous system generates a recipe comparator for each set parameter. Similarly, to a predicted function comparator, if the set recipe value and the reading differ by a specific threshold which can be determined by an actor (e.g., actor 1990), the recipe comparator signals failure. It should be noted that in diagram 2780 a recipe comparator for pressure is not generated since a process pressure is not set to a specific value.

In order to identify a root cause, e.g., the physical point of failure with the highest probability of failure, a biologically based autonomous learning system can utilize a failure of one or more predictor or recipe comparators to rank all physical points of failure present in a dependency graph. In an aspect, for a complete dependency graph with one or more comparators, the biologically based autonomous learning system can use Bayesian inference to propagate the probabilities given the failure signature of the comparators. Thus, the system can compute the probability of failure for a particular PASS/FAIL outcome (e.g., outcome 2798$_A$ for comparator A 2795$_A$ or outcome 2798$_B$ for comparator B 2795$_B$) for each comparator. As an example, suppose that predictor comparator 2720 and recipe comparator A 2795$_A$ fail whereas comparator B 2795$_E$ passes. The autonomous system can compute the failure probability for each physical point of failure given the comparator failures. (For example, what is the probability of the pressure sensor failure given that comparator 2795$_A$ and comparator A 2795$_A$ fail whereas comparator B 2795$_E$ passes). Each point of failure is then ordered from most likely to fail (highest computed probability), or the most likely root cause, to least likely to fail (lowest computed probability). Identification of a root cause, which can be deemed as actionable intelligence (e.g., output 1740), can be conveyed to an actor via an interaction manager for further process; e.g., order a new part, request a maintenance service (an actor communicates with or resides in the tool's manufacturer location), download a software update, schedule a new training session, and the like.

Figure 28:
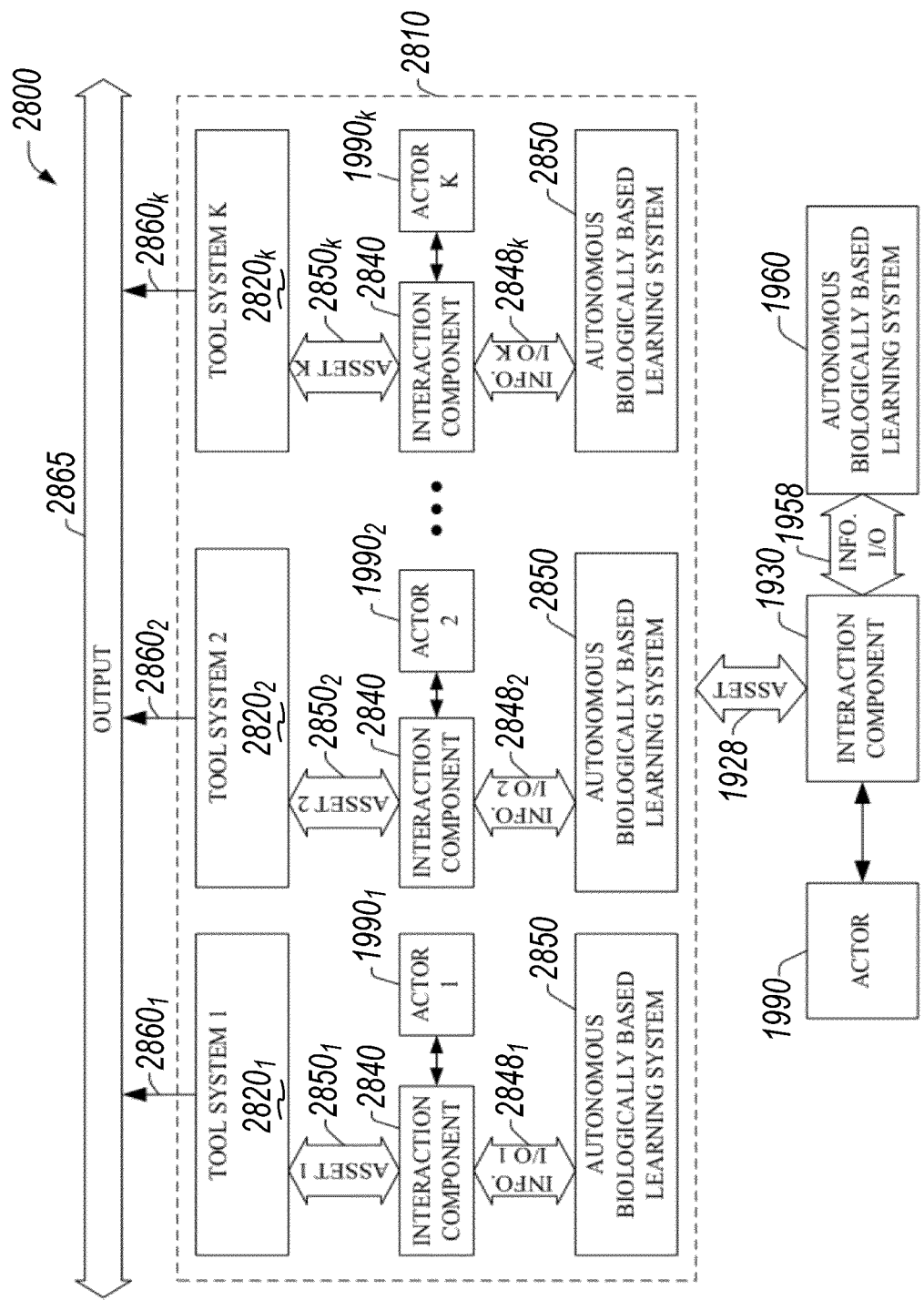
FIG. 28 illustrates a diagram of an example group deployment of autonomous biologically based learning tool systems in accordance with aspects described herein.

FIG. 28 illustrates a high level block diagram 2800 of an example group deployment of autonomous biologically based learning tool systems. The group of autonomous tools systems 2820$_1$-2820$_K$ can be controlled by an autonomous biologically based learning tool 1960 which receives (input) and conveys (output) information 1958 to an interface 1930 that facilitates an actor 1990 to interact with the group of autonomous tools system 2820$_1$-2820$_K$ and with autonomous learning system 1960. Individually, each of the autonomous tool systems 2820$_1$-2820$_K$ are supported, or assisted, by associated autonomous learning systems 2850. Such learning system possesses substantially the same functionality of learning system 1960. It should be appreciated that in group 2810 each of autonomous tools 2820$_1$-2820$_K$ can afford independent interaction, respectively, with associated local actors 1990$_1$-1990$_K$. Such actor possesses substantially the same functionality as actor 1990, as discussed in connection with FIG. 19 above. Additionally, an interaction with autonomous tools $2820_1$-$2820_K$ takes place in substantially the same manner as in autonomous system 1900, through an interaction component 2840 and by providing and receiving tool-specific information (e.g., $2848_1$-$2848_K$) and assets, which both are typically tools system specific (e.g., assets $2850_1$-$2850_K$). In particular, it should be appreciated that in group deployment 2812, each of actors $1990_1$-$1990_K$ can monitor disparate aspects of operation its associated system tool (e.g., system tool $2820_2$). As an example, local actors $1990_1$-$1990_K$ can establish a set of specific outputs (e.g., $2860_1$-$2860_K$) to be critical. Such a determination can be based on historic data or design (e.g., recipe for a process), or it can originate autonomously through generated patterns, structures, relationships and the like. In absence of such a determination, group autonomous learning system 1960 assumes substantially all outputs (e.g., $2860_1$-$2860_K$) leading to group output 2865 are critical.

In an aspect, autonomous learning system 1960 can learn (through learning mechanisms described above in connection with system) expected values for the critical output parameters during normal (e.g., non-faulty) group tool 2800 operation. In an aspect, when measured output 2865 deviates from an expected output, autonomous learning system 1960 can identify a performance metric of group 2800 performance as degraded. It should be appreciated that the latter assessment can proceed in substantially the same manner as described in connection with single autonomous tool system 1900; namely, through a self-awareness component in autonomous learning system 1390. It is to be noted that even though autonomous group tool 2800 can present a degraded performance, a subset of autonomous tool system 2801-2820K can provide output that is not degraded and meet individual expectation values for a predetermined metric.

In addition, similarly to the scenario of a single tool system (e.g., tool system 1910), autonomous learning system 1960 can construct a predictive model for a critical output parameter as a function of individual tool related output parameters. It should be appreciated that such output parameters can be collected through asset 1928 input/output. It is to be noted that in group tool 2800, measurements of tool output (e.g., $2860_1$-$2860_K$) can be available to autonomous biologically based learning system 1960 via sensor components residing in each of tool systems $2820_1$-$2820_K$, which can be accessed through deployed knowledge network extant in each autonomous learning system (e.g., 1960, or 2850).

Furthermore, the autonomous system 1960 can also construct a predictive model of group time-to-failure as a function of assets 1928 of tool group or platform 2800; e.g., group input data, group outputs, group recipes, or group maintenance activities. In an aspect, to determine a group time-to-failure, autonomous learning system 1960 can gather failure data, including time between detected (e.g., through a set of sensor components or inspection systems) failures, associated assets $2850_1$-$2850_K$, outputs 2801-2860K, and maintenance activities for substantially all operation tools in the set of tools 2801-2820K. (It should be appreciated that as a consequence of prior failure assessments, specific tools (e.g., tool system 2 $2820_1$ and tool system K $2820_K$) in the set of tools (e.g., tools $2820_1$-$2820_K$) in group 2800 can be out of operation.) Collected data can be autonomously analyzed (e.g., through a processing component 1985 in autonomous learning system 1960) to learn a predictive function for time-to-failure as a function of the group assets (e.g., inputs, recipes, . . . ), outputs, and maintenance activities. It should be appreciated that the group time-to-failure model constructed from the collected data can readily display substantially dominant factors that impact performance of group tool 2800.

In an aspect, time-to-failure models constructed for individual components of tool systems (e.g., $2820_1$-$2820_K$) in group tool 2800 can be employed by actor 1990 (e.g., a group level controller) to optimize part inventory and optimize maintenance scheduling. It should be appreciated that such optimization can be conducted, at least in part, by autonomous system 1960. For example, the autonomous system accesses the MES (or ERP) system to identify the number of available parts. When a set of parts that provide functionality to tool systems $2820_1$-$2820_K$ (e.g., parts in one or more of components within a functional component like a component 1915 in system 1910), and can be expected to be necessary (e.g., for replacement) within a specific time period $\Delta\tau$, exceeds an available supply in stock, additional parts can be ordered. Alternatively, or in addition, when parts are available, an expected schedule of necessary parts can be analyzed to determine an optimal, or adequate, time to place a new order.

It should be appreciated that maintenance schedules can be reassessed and optimized during a necessary, previously scheduled, maintenance activity, in order to exploit an opportunity available to autonomous system 1360 to analyze parts and identify parts that can fail in a substantially short period of time. It should further be appreciated that a group or individual time-to-failure schedule can be complemented, autonomously in an aspect, with additional information such as cost of parts, time to replace parts, and so forth, to determine whether replacement of a part during a current maintenance cycle is beneficial with respect to the replacement of the part in a forthcoming scheduled maintenance cycle. It is noted that autonomous system 1960 can also take as input various costs associated with the operation of group tool 2800 in order to compute a cost per output product (e.g., a workpiece, etc.) for the group, and a total cost to produce a specific order during operation of the group tool 2800. After building a model of cost as a function of individual tool assets $2850_1$-$2850_K$ (e.g., recipes), outputs $2860_1$-$2860_K$, and maintenance activities, autonomous system 1960 can rank individual tool systems $2820_1$-$2820_K$ in increasing order of operation cost. A combined cost data asset can be utilized construct a predictive model of cost versus assets, outputs, and maintenance activities associated with the individual tool systems—for example, such an assessment can identify operational assets and variables that affect substantially an operation or maintenance cost for the group tool. In an aspect, autonomous system 1960 can utilize available historic data assets to redesign a production line, or equipment configuration in a floor plant, in order to minimize costs. In addition, during such an optimization process, autonomous system 1960 can rely on shutdown of various tool systems in order to exploit alternative patterns of operation. Furthermore, autonomous system 1960 can utilize cost-benefit analysis to determine a set of trade-off scenarios in which production of specific output proceeds without output for specific, highly costly tool systems.

Tools system $2820_1$-$2820_K$ can be substantially the same, or can be disparate (e.g., tool systems $2820_1$-$2820_3$ are steppers, tool $2820_j$ is a stepper, and 2820K-2820K are turbomolecular vacuum pumps). Typically, a central difference amongst homogeneous (e.g., tool systems are alike) and heterogeneous (e.g., tools are disparate) can lie in that input and output measurements (e.g., measurement assets) are distinct. For example, a critical output of interest for tool group or platform 2800 can be D1 CD uniformity, but a coating or film-forming system that is part of the group tool or platform 2800 can fail to provide such output measurements. Accordingly, autonomous system 1960 can construct a model for expressing a tool group's outputs as a function of individual tool (e.g., 2820$_1$-2820$_K$) outputs. Thus, when a group performance appears degraded, individual performances associated with individual tools can be analyzed to isolate a tool that has the largest weight in causing the performance degradation.

Figure 29:
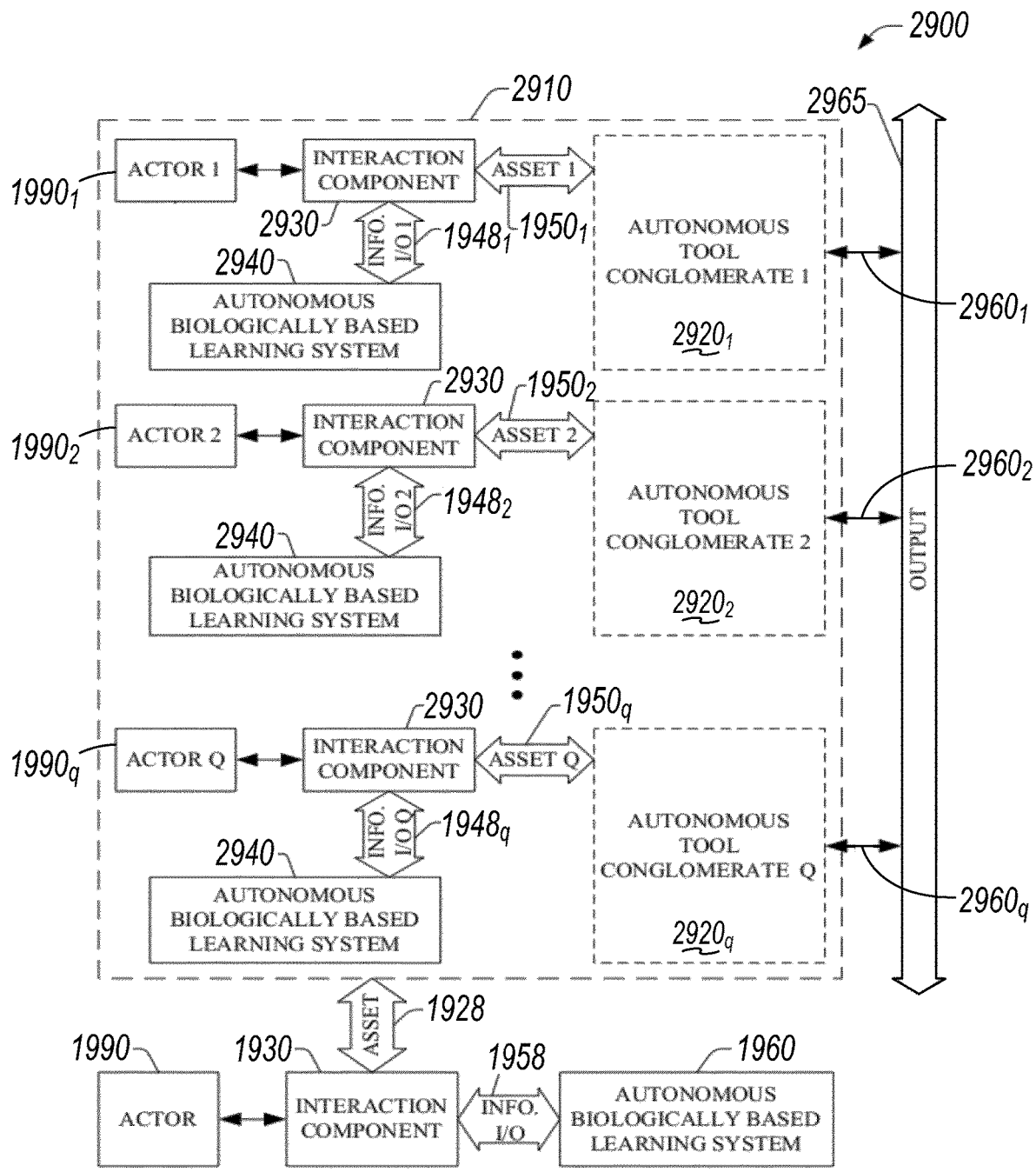
FIG. 29 illustrates a diagram of a conglomerate deployment of autonomous tool systems according to aspects described herein.

FIG. 29 illustrates a diagram of a conglomerate deployment of autonomous tool systems. Conglomerate system 2910 comprises a set of autonomous tool conglomerates 2920$_1$-2920$_Q$. Each of the tool conglomerates can comprise homogeneous or heterogeneous groups of autonomous tools, e.g., a set of disparate autonomous tools groups which can comprise an autonomous fabrication facility (not shown), or a set of disparate autonomous fabrication facilities. For example, the tool conglomerates may request manufacturing platforms. It should be appreciated that autonomous conglomerates 2920$_1$-2920$_Q$ can typically be located in disparate geographic locations. Similarly, groups of autonomous tools in a factory can be deployed in disparate locations within a plant in view that a manufacturing process can comprise multiple steps. Accordingly, product output chain 2965 can facilitate providing disparate autonomous tool conglomerates 2920$_1$-2920$_Q$ with partially manufactured or processed or analyzed products; such features is indicated with bidirectional arrows 2960$_1$-2960$_Q$ which represent output/input associated with conglomerates 2920$_1$-2920$_Q$.

Conglomerate system 2910 can be autonomously supported by an autonomous learning system comprising an interaction component 1940, an actor 1990, and an autonomous learning system 1960. In an aspect, autonomous support can be directed toward improving an overall fabrication effectiveness (OFE) metric of output assets (e.g., output 2965). In addition, each of the autonomous tool conglomerates 2920$_1$-2920$_Q$ can be in turn autonomously supported by an interaction component 2930, and an autonomous learning system 2940. Interface component 2930 facilitates interaction between autonomous learning system 2940 and actors 2990$_1$-2990$_Q$. Functionality of each of such components is substantially the same as the functionality of respective component described above in connection with system 1960 and system 2800. Information 2948$_I$(I=1, 2, . . ., Q) communicated among interaction component 2930 and autonomous system 2940 is associated with the respective autonomous tool conglomerate 2920$_I$. Similarly, assets 2950$_I$ conveyed to and received from an autonomous tool conglomerate 2920$_I$ are specific thereof.

To address performance in an autonomous tool conglomerate 2910$_1$-2910$_Q$, the multi-step characteristics of a fabrication process can be incorporated through a performance tag that identifies products utilizing a composite conglomerate index $C_a$, wherein the index a indicates a specific tool group within conglomerate C (e.g., autonomous conglomerate 2920$_Q$), and a run index (R); thus, a product quality, or performance metric associated with a specific product is identified via a label ($C_a$;R), which can be termed "group-layer output." Such label facilitates identifying each autonomous operation group as an individual component $C_a$. Therefore, autonomous system 1960 can map quality and performance metrics as a function of fabrication conglomerate (e.g., autonomous tool conglomerate 2910$_2$) and as a function of tool group within each fabrication conglomerate. The latter facilitates root-cause analysis of poor performance or quality, by first identifying a conglomerate (e.g., a fabrication facility) and subsequently performing the analysis for the tool associated with the assessed degradation. It should be appreciated that index $C_a$ to account for the fact that output assets generated in an autonomous system comprised of multiple conglomerate tools can be transported from a first conglomerate (N) to a second conglomerate (N'). Thus, the composite symbol for tracking performance associated with a transfer of assets (e.g., as a part of a multi-step fabrication process) can read $C_{a;N \to N''}$.

Performance of an autonomous tool conglomerate can be performed as a function of product yield. Such yield is utilized to rank disparate conglomerates. In an aspect, autonomous learning system 1960 can develop a model for yield based at least in part on output assets from each autonomous tool, or autonomous group tool. For example, for tools, or group of tools, employed in semiconductor manufacturing, yield can be expressed as a function of detected non-conformities in workpieces based on measured data. Moreover, other yield metrics can be utilized to determine a model for a yield, especially in an autonomous learning systems comprising tool conglomerates systems (e.g., 2920$_1$-2920$_Q$) wherein output assets can be transported among conglomerates: an overall equipment efficiency (OEE), a cycle time efficiency, an on-time-delivery rate, a capacity utilization rate, a rework rate, a mechanical line yield, a probe yield and final test yield, an asset production volume, a startup or ramp-up performance rate, etc. It is to be noted that an autonomous system that supports operation of a set of autonomous tool conglomerates can autonomously identify relationships amongst yield metrics in order to redesign processes or communicate with actors 1990$_1$-1990$_Q$ with respect to adjustments in connection to said yield metrics.

The yield function mentioned supra can be analyzed through a combination of static and dynamic analysis (e.g., simulation) to rank group layer outputs according to degree of influence, or weight, in leading to a specific yield. It is to be noted that ranking tools, group of tools, or conglomerates, at a group-layer-output level based at least in part on influence in affecting asset output, or yield, can afford a group or conglomerate autonomous learning system 1960 to autonomously identify, through autonomous systems associated with each of the tools in a group or group in a conglomerate, whether a specific tool can be isolated as a dominant tool in yield deterioration. When such a tool is located, the group or conglomerate level autonomous system 1960 can issue an alarm to a maintenance department with information regarding ranking the faults that can be candidates for performance degradation.

In addition, yield for the lowest ranking autonomous tool conglomerate can be employed to identify the group layer outputs of the tool group that is dominant in its impact on yield. The time-to-failure for such tool-group can be compared with substantially the same tool groups in disparate autonomous conglomerates in order to identify cause(s) of poor performance. Furthermore, an autonomous tool conglomerate system ranks tools within a specific tool group in disparate tool conglomerates. It is to be noted that an autonomous learning system that supports and analyzes a group of autonomous tool conglomerates (e.g., 2920$_1$-2920$_Q$) can rank each of the conglomerates according to inferred time-to-failure for each conglomerate. Since time-to-failure can change over operational time intervals in view of, e.g., input/output asset (e.g., asset 1958) load, a database with time-to-failure projection can be updated at specified periods of time (e.g., weekly, monthly, quarterly, or yearly).

Further yet, when an individual tool or module that is primarily responsible for a group tool's poor performance (e.g., the tool ranks the lowest in performance within a group tool, such as a tool that most frequently fails to output assets with specified target properties of quality like uniform doping concentration or uniform surface reflection coefficient) is identified, an autonomous system associated with the lowest performing tool, or with the conglomerate system that includes such poor performing tool, can analyze the tool's outputs to identify those outputs that most significantly affect the output of the lowest performing group. For example, a tool in a tool group or conglomerate that outputs assets with low uniformity as illustrates above, can lead to a substantial percentage (e.g., 60%) of tool groups uniformity variation (for example, variation in uniformity change of surface reflectivity of an optical display due to uniformity issues on surface reflectivity of coatings on otherwise high-quality displays). To that end, in an aspect, for each output in the group the tool autonomous system constructs a function that expresses tool output as a function of tool assets (e.g., inputs, recipes, and process parameters, tool operator or actor, and so on). This model is then analyzed to identify the dominant factors in poor performance. It is to be noted that an autonomous system can identify best performing tools in a group tool and analyze causes that result in the tool having the best performance; e.g., the vacuum level of the tool during operation is consistently lower than vacuum level of disparate tools in the group tool, or during epitaxial deposition a wafer in the best performing tool rotates at a lower speed than in disparate tool carrying out a deposition, thus the tool consistently achieves greater device quality. Such factors in highest ranking and lowest ranking tools can be compared with same parameters in other tools in conglomerate system. In case the comparison indicates that the factors identified as the root causes of highest and lowest ranking performance appear to be substantially the same throughout the tool conglomerate system, then a new model can be developed, and alternative root causes can be identified. Such iterative, autonomous processes of model development and validation can continue until root causes are identified and best practices are emulated (e.g., a coating recipe utilized in tool conglomerate $11320p$ is adopted in substantially all tool conglomerates in view that it increases output asset performance by a specific, desirable margin) and root causes for low performance are mitigated (e.g., abandoning a specific brand of paint whose viscosity at the operating temperature of a painting tunnel results in non-uniform coloration of painted products). Ranking of tools, group of tools, or conglomerate of tools is autonomous and proceeds in substantially the same manner as in a single autonomous tool system (e.g., system 1960). Autonomous systems that support operation of a conglomerate of autonomous tools considers such autonomous conglomerates as a single component regardless of the complexity of its internal structure, which can be accessed and managed through an autonomous system associated with the conglomerate.

Figure 30:
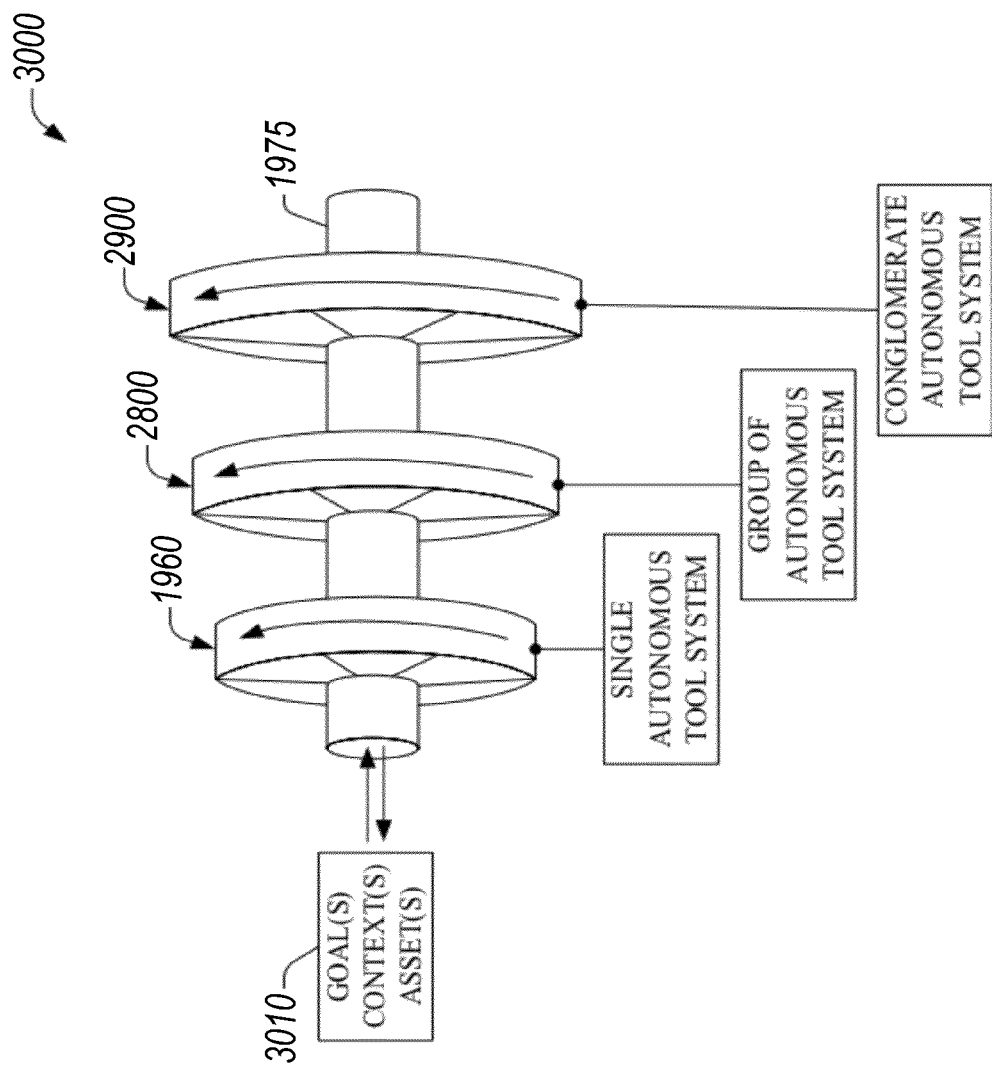
FIG. 30 illustrates the modular and recursively-coupled characters of autonomous tool systems described in the subject specification.

FIG. 30 is a diagram 3000 that illustrates the modularity and recursive coupling among classes of tools systems or manufacturing platforms or process modules described above—e.g., individual autonomous tool 1960, autonomous group tool 2800, and autonomous conglomerate tool 2900. In autonomous system 3000, goals, contexts, and assets circulate through knowledge network 1975 which is depicted as an axial gateway, and are conveyed to disparate autonomous tool systems 1960, 2800 and 2900. Such information and assets are acted upon in each autonomous system, acts can include analysis, modification, generation of new information and assets; such acts are pictorially depicted as an arrow on the outer belt of each representation of autonomous systems 1960, 2800, 2900. Processed and generated assets are conveyed to the knowledge network 1975, where can be circulated among autonomous system. In diagram 3000, processing and generation of assets is represented as occurring azimuthally, whereas communication of assets is a radial process. As diagram 3000 depicts, autonomous tool systems are based on substantially the same elements that function in substantially the same manner.

Figure 31:
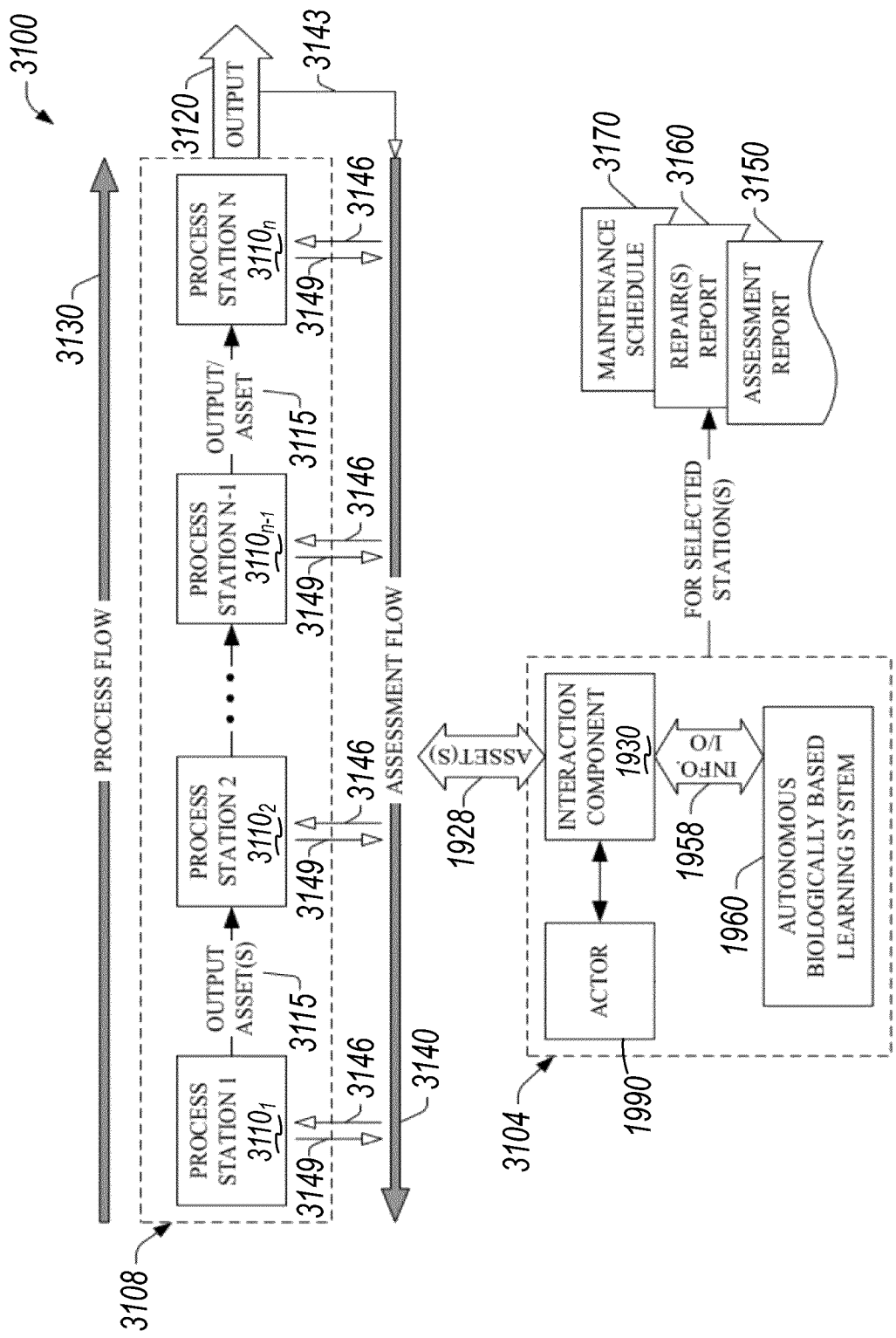
FIG. 31 illustrates an example system that assesses, and reports on, a multi-station process for asset generation in accordance with aspects described herein.

FIG. 31 illustrates an example system 3100 that assesses, and reports on, a multi-station process for asset generation. An autonomous system 3105 that comprises an autonomous biologically based learning system 1960, an actor 1990, and associated interaction component 1930 can receive and convey asset(s) 1928 that originate in an N-station process 3110 and assess performance through backward chaining. The N-station process is effected through a set of N process stations $3110_1$-$3110_N$ that produce an output 3120 and can include individual autonomous tools 1960, autonomous tool groups 2820, or autonomous tool conglomerates 2920. As a result of performance assessment(s), autonomous system 3108 can locate tools, or group of tools, in process stations $3110_1$-$3110_N$ with specific degrees of performance degradation. In addition, for the selected station, autonomous system 3108 can provide an assessment report, a repair(s) report, or a maintenance schedule. It should be appreciated that disparate process stations can perform substantially the same operations; such a scenario would reflect the situation in which an output asset 3115 returns to a specific tool, or tool group, for further processing after the asset 3115 has been generated and transported to a disparate tool, or group of tools, for further processing.

In backward chaining, action flow (e.g., process flow 3130) which leads to an output typically counters a probe flow (e.g., assessment flow 3140) which typically assesses the action flow. Thus, assessment generally takes place in a top-bottom manner, in which assessment is conducted on a high-level stage of a specific action, e.g., a finalized asset output 3120, and proceeds to lower-level stages in a quest to focus the assessment on a specific stage prior to completion of a specific action. As applied by autonomous system 3104, output asset 3120 is received via process station N $3110_N$. The autonomous system 3104 can evaluate, as illustrated by 3146, a set of performance metrics $\{P^{(C)}_{N-1 \to N}\}$ leading to a specific degradation vector (not shown), based at least in part on an expected performance, for substantially all operational components (e.g., tool, group or conglomerate tool) in the process station $3110_N$. Additionally, it should be appreciated that in process 3130, output assets (e.g., assets 3115) can be transported across disparate geographical areas, therefore the degradation vector assessed by autonomous system 3104 can comprise metrics associated with the in-transit portion of the process that leads to a partially finished asset 3115. For example, when process 3130 regards semiconductor process, a workpiece may have less non-conformities or defects in certain process platforms. When result(s) 3149 of such an assessment indicate that N-station output 3120 is faulty, autonomous system 3104 isolates a faulty tool, or group of tools or platform, associated with process station N, and generates a report (e.g., assessment report 3150, repair(s) report 3160, or maintenance schedule 3170). The generated report(s) can contain information to be utilized by one or more actors (e.g., actors $1990_1$-$1990_Q$). In addition, reports can be stored to create a legacy of solutions (or "fixes") or corrective processing for one or more manufacturing platforms for specific issues with performance, especially issues that appear infrequently so that an actor's intervention can be preferred with respect to an autonomously developed solution which typically can benefit from extensively available data. Moreover, availability of reports can facilitate failure simulations or forensic analysis of a failure episode, which can reduce manufacturing costs in at least two levels: (a) costly, infrequently failing equipment can be predicted to fail under rare conditions, which can be simulated by autonomous system 1960, arising from operation of equipment by an actor with a background non-commensurate with the complexity of the equipment, (b) optimization of parts inventory through prediction of various failure scenarios based at least in part on historical data stored in assessment reports 3150 and repair reports 3160.

In case results 3149 of process station N 3110$_N$ yield no faulty tool, or group or platform of tools, assessment is performed on a lower-level process station N-3110$_{N-1}$ that generates a partially processed output asset 3115 and is a part in the process cycle 3130 to generate output 3120. Through analysis of a set of disparate performance metrics $\{P^{(C)}_{N-2 \rightarrow N-1}\}$, a degree of degradation can be extracted and associated tool, or group of tools (e.g., conglomerate C) can be located. In instances that no faulty conglomerate of autonomous tools, or group of autonomous tools, or individual autonomous tool, autonomous system 3104 continues the backward, top-bottom assessment flow 3140 with the object to locate sources of poor performance in final output 3120.

Figure 32:
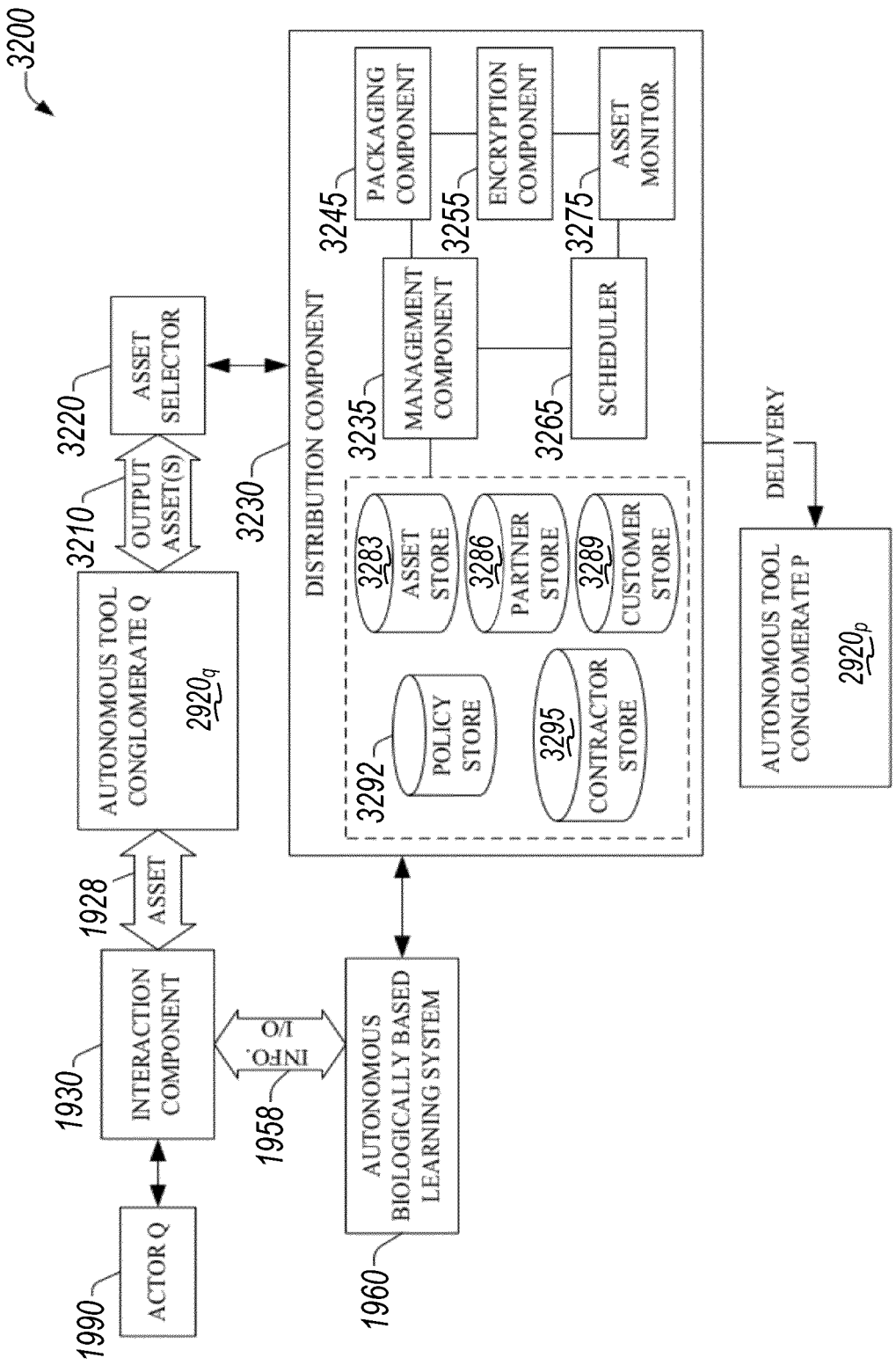
FIG. 32 is a block diagram of an example autonomous system which can distribute output assets that are autonomously generated by a tool conglomerate system in accordance with aspects set forth herein.

FIG. 32 is a block diagram of an example autonomous system 3200 which can distribute output assets that are autonomously generated by a tool conglomerate system. In system 3200, tool conglomerate 2920$_Q$ can autonomously generate a set of output assets 3210, which can be (i) information (e.g., structures and data patterns, relationships among measured variables like a remedy to an existing degradation episode or condition in alike or disparate tool groups that compose the autonomous tool conglomerate 2920$_Q$, and the like) gleaned or inferred about a state, including a performance degradation condition, of one or more tools that can compose tool conglomerate system 2920$_Q$, or (ii) an output product fabricated by said conglomerate. In addition, in system 3200 output assets 3220 can be filtered by an asset selector 3220 and conveyed, or communicated, to a distribution component 3230. Such distribution component 3230 can exploit intelligent aspects of autonomous biologically based learning system 1960. The distribution component 3230 comprises a management component 3235 that can manipulate a packaging component 3245 and an encryption component 3255 that can prepare the data, as well as a scheduler 3265 and an asset monitor 3275. Packaging component 3245 can prepare the asset to be distributed for a distribution process; such preparation can include damage prevention as well lost prevention. For information (e.g., an event in episodic memory 3130 such as a system unwanted condition that develops as a result of operation outside a part specification like a temperature above a threshold) or data assets, packaging component 3245 can alter specific formats to present the information depending, at least partially, on the intended recipient of the asset to be distributed. For example, proprietary information can be abstract and presented without specificity (e.g., explicit names of gases can be replaced with the word "gas;" relationships among specific parameters can be generalized to a relationship among variables such "p(O$_2$)<10$^{-8}$ Torr" can be packaged as "p(gas)<10$^{-8}$ Torr.") In addition, packaging component 11645 can exploit an encryption component 3255 to ensure information integrity during asset transmission and asset recovery at the intended recipient.

Additionally, in an aspect, management component 3235 can access (i) an asset store 3283, which typically contains assets scheduled to be distributed or assets that have been distributed; (ii) a partner store 3286 comprising commercial partners associated in the distribution or completion of specific assets; (iii) a customer store 3289 which can contain current, past, or prospective customers to which the selected asset has been, or can be distributed; (iv) a policy store that can determine aspects associated to the distribution of assets, such as licensing, customer support and relationships, procedures for asset packaging, scheduling procedures, enforcement of intellectual property rights, and so on. It should be appreciated that information contained in policy store can change dynamically based at least in part on knowledge, e.g., information asset, learned or generated by autonomous biologically based learning system.

Once an asset has been packaged and it has been scheduled for distribution, a record of distribution can be stored, or if the asset is a data asset then a copy of the asset can be stored. Then, the asset can be delivered to a disparate autonomous tool conglomerate P 2920$_P$.

Figure 33:
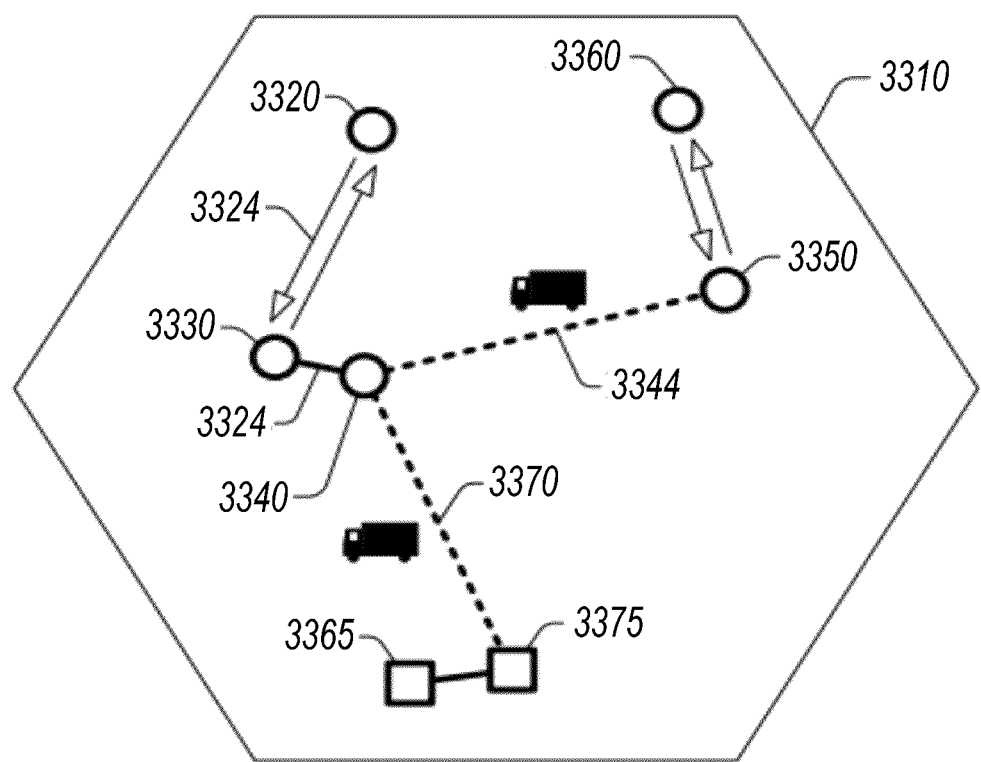
FIG. 33 illustrates an example of autonomously determined distribution steps, from design to manufacturing and to marketing, for an asset (e.g., a finished product, a partially finished product, . . . ).

FIG. 33 illustrates an example of autonomously determined distribution steps, from design to manufacturing and to marketing, for an asset (e.g., a finished product, a partially finished product, . . . ). The hexagonal cell 3310 represents a specific geographic area (e.g., a city, a county, a state, one or more countries) wherein two classes of autonomous tool conglomerates; e.g., "circular" conglomerates 3320, 3330, 3340, 3350, and 3360, and "square" conglomerates 3365 and 3375, participate in the manufacturing chain of a set of products, or assets. (It is to be noted that the geographical area can encompass substantially any bound area in addition to a hexagonal cell.) As an example, scenario, and not by way of limitation, manufacturing of an asset starts at conglomerate 3320 which can be a conglomerate that provides design for custom-made solid state devices for optical management for high-mountain sports (e.g., skiing, climbing, paragliding, and so on). Design can consist in performing computational simulations of the optical properties of source materials and their combinations, as well as device simulation. In such an instance, conglomerate 3320 can be a massively parallel supercomputer which can be construed in the subject example as a set of autonomous tool groups (FIG. 28), wherein each computer in the network of simulation computers is considered an autonomous tool group. Conglomerate 3320 outputs a one or more designs of the optical device and a series of reports associated with description of the devices—e.g., a data asset. Such an output or asset (not shown), after appropriate encryption and packaging (e.g., through component), can be conveyed to conglomerate 3330 via a communication link 3324 which can be a wireless link.

Conglomerate 3330 can receive the data asset and, as a non-limiting example, initiates a deposition process to fabricate a solid-state device according to the received asset. To that end, conglomerate 3330 can partner with conglomerate 3340 and both can be regarded as fabrication facilities that are part of a two-conglomerate autonomous conglomerate tool 2910. Such conglomerates can produce multiple devices according to the received specification asset, once a device is fabricated it can be tested, and assigned a quality and performance metric, such metrics can lead to backward chaining to located "poor performers" among the autonomous tools that enter conglomerates 3330 and 3340. Through determination of multiple metrics, it is possible to autonomously adjust the operation of conglomerates 3320 and 3330 to optimize production of the device, or output asset. It is noted that link 3324 indicates an internal link, wherein conglomerates 3330 and 3340 are part of a same fabrication plant; thus, the asset can be transported in substantially different conditions than when utilizing link 3324 which provides a vehicular transportation route. Link 3344 can be employed to ship devices for commercial packaging in a disparate geographic location (such transportation can be motivated by advantageous packaging costs, skillful labor, corporate tax incentives, and so on). It should be appreciated that an autonomous learning system at conglomerate 3340 can optimize the shipping times (via a scheduler, for example) and routes (e.g., link 3344) in order to ensure timely and cost effective delivery. At conglomerate 3350 assets are packed and remotely tested, via a wireless link, in conglomerate 3360. In an aspect, the volume of devices tested and the lots from which devices are tested can be determined by an autonomous system in conglomerate 3360. Once packed devices have been approved for commercialization, the assets are shipped through road link 3344 to conglomerate 3340, and subsequently shipped via road link 3370 to a disparate class of conglomerate 3375. Such conglomerate can be a partner vendor, and conglomerate 3375, a storage warehouse, which can be considered a tool group conglomerate. Such conglomerate is linked, internally, to conglomerate 3365 which can be a showroom for the received assets.

Figure 34:
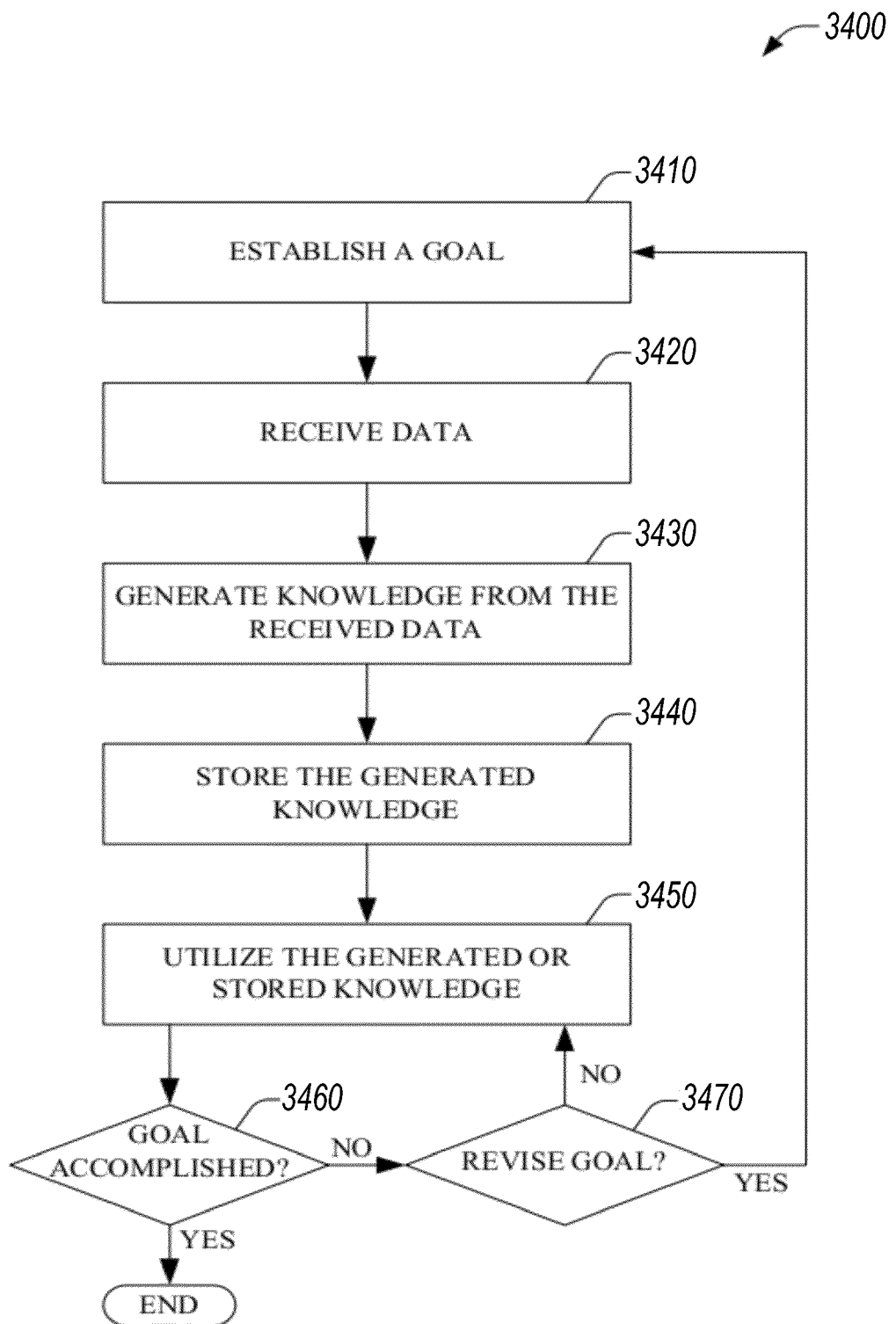
FIG. 34 presents a flowchart of an example method for biologically based autonomous learning according to aspects described herein.
Figure 35:
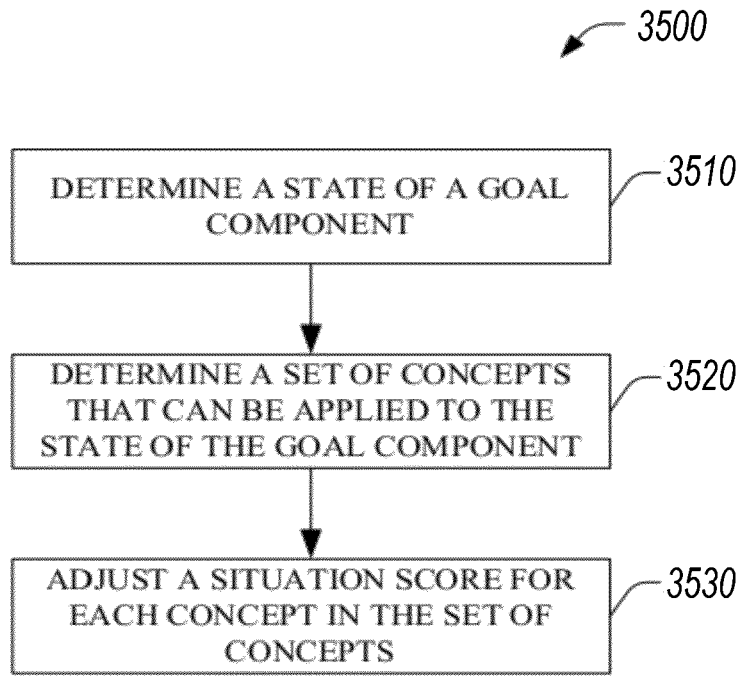
FIG. 35 presents a flowchart of an example method for adjusting a situation score of a concept according to an aspect described in the subject specification.
Figure 36:
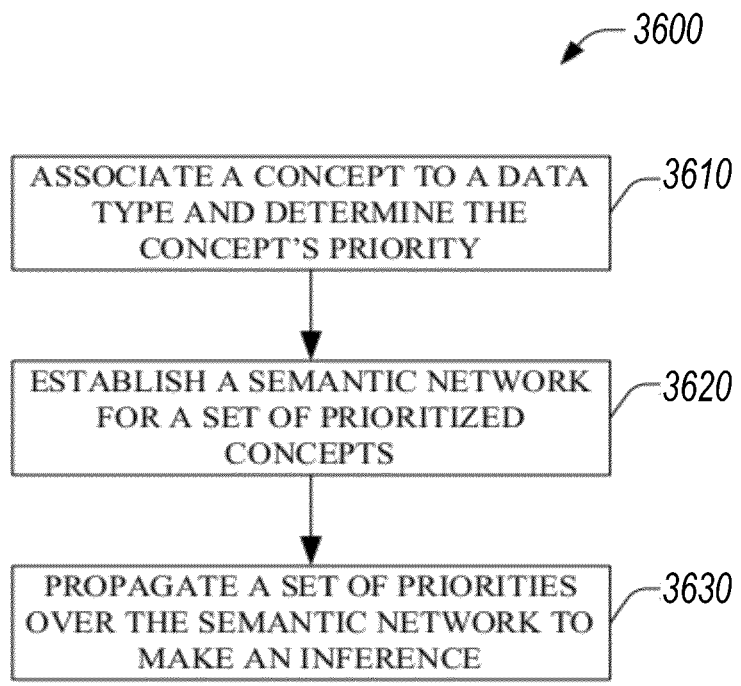
FIG. 36 presents a flowchart of an example method for generating knowledge in accordance with an aspect set forth herein.

In view of the example systems presented and described above, a methodology that may be implemented in accordance with the disclosed subject matter, will be better appreciated with reference to the flowchart of FIGS. 34, 35, and 36. While, for purposes of simplicity of explanation, the methodologies are shown and described as a series of blocks, it is to be understood and appreciated that the disclosed aspects are not limited by the number or order of acts, as some acts may occur in different orders and/or concurrently with other blocks from what is depicted and described herein. Moreover, not all illustrated acts may be required to implement the methodologies described hereinafter. It is to be appreciated that the functionality associated with the blocks may be implemented by software, hardware, a combination thereof or any other suitable means (e.g., device, system, process, component). Additionally, it should be further appreciated that the methodologies disclosed hereinafter and throughout this specification are capable of being stored on an article of manufacture to facilitate transporting and transferring such methodologies to various devices. Those skilled in the art will understand and appreciate that a methodology could alternatively be represented as a series of interrelated states or events, such as in a state diagram.

FIG. 34 presents a flowchart of an example method 3400 for biologically based autonomous learning with contextual goal adjustment. At act 3410 a goal is established. A goal is an abstraction associated with a functionality of a goal component that is employed to accomplish the goal or objective. A goal can be multi-disciplinary and span various sectors (e.g., industrial, scientific, cultural, political, and so on). Generally, act 3410 can be executed by an actor that can be external, or extrinsic, to a goal component that can be coupled to a learning system (e.g., adaptive inference engine). In view of the multi-disciplinary nature of a goal, a goal component can be a tool, device, or system that possesses multiple functionalities; for instance, a tool system (e.g., tool system 1910) that performs a specific process, or a device that provides with a specific outcome to a set of requests, or the like. At act 3420 data is received such as measurement data of a workpiece. Such data can be intrinsic, e.g., data generated in a goal component (e.g., component 1720) that pursues a goal. In an aspect, as a part of performing the specific process, a set of inspection systems with sensors or probes associated with the measurement module can gather the data that is received in an adaptive intelligent component. Received data can also be extrinsic, such as data conveyed by an actor (e.g., actor 1990), which can be a human agent or a machine. Extrinsic data can be data that is utilized to drive a process or, generally, to drive an accomplishment of a specific goal. A human agent can be an operator of the tool system and can provide instructions or specific procedures associated with the processes performed by the tool. An example of an actor can be a computer performing a simulation of the tool system, or substantially any goal component. It should be appreciated that simulation of the tool system can be employed to determine deployment parameters for the tool system, or for testing alternative conditions of operation for the tool (e.g., conditions of operations that can pose a hazard to a human agent or can be costly). The received data can be training data or production data associated with a specific process, or generally a specific code.

In a further aspect, the received data can be associated with data types or with procedural, or functional, units. A data type is a high level abstraction of actual data; for instance, in an annealing state in the tool system a temperature can be controlled at a programmed level during the span of the annealing cycle, the time sequence of temperature values measured by a temperature sensor in the tool system can be associated a sequence data type. Functional units can correspond to libraries of received instructions, or processing code patches that manipulate data necessary for the operation of the tool or for analyzing data generated by the tool. Functional units can be abstracted into concepts related to the specific functionality of the unit; for example, a multiplication code snippet can be abstracted into a multiply concept. Such concepts can be overloaded, in that a single concept can be made dependent on a plurality of data types, such as multiply(sequence), multiply(matrix), or multiply (constant, matrix). Moreover, concepts associated with functional units can inherit other concepts associated with functional units, like derivative (scalar_product(vector, vector)) which can illustrate a concept that represents a derivative of a scalar product of two vectors with respect to an independent variable. It should be appreciated that functional concepts are in direct analogy with classes, which are in themselves concepts. Furthermore, data types can be associated a priority and according to the priority can be deposited in a semantic network. Similarly, functional concepts (or autobots), can also be associated with a priority, and deposited in a disparate semantic network. Concept priorities are dynamic and can facilitate concept activation in the semantic networks.

At act 3430 knowledge is generated from the received data, which can be represented in semantic networks, as discussed above. Generation of knowledge can be accomplished by propagating activation in the semantic networks. Such propagation can be determined by a situation score assigned to a concept in addition to a score combination. In an aspect, score combination can be a weighted addition of two scores, or an average of two or more scores. It should be appreciated that a rule for score combination can be modified as necessary, depending on tool system conditions or information input received from an external actor. It should be appreciated that a priority can decay as time progresses to allow concepts that are seldom activated to became obsolete, allowing new concepts to become more relevant.

The generated knowledge can be complete information; for instance, a steady-state pressure in a deposition step is a precise, well-defined mathematical function (e.g., a single-valued function with all parameters that enter the function deterministically assessed, rather than being stochastic or unknown) of two independent variables like steady-state flow and steady state exhaust valve angle. Alternatively, the generated knowledge can represent a partial understanding; for example, an etch rate can be possess a known functional dependence on temperature (e.g., an exponential dependence), yet the specific relationship—e.g., precise values of parameters that determine the functional dependence—between etch rate and temperature is unknown.

At act 3440 the generated knowledge is stored for subsequent utilization of for autonomous generation of further knowledge. In an aspect, knowledge can be stored in a hierarchy of memories. A hierarchy can be determined on the persistence of knowledge in the memory and the readability of knowledge for creation of additional knowledge. In an aspect, a third tier in the hierarchy can be an episodic memory (e.g., episodic memory 2130), wherein received data impressions and knowledge can be collected. In such a memory tier manipulation of concepts is not significant, the memory acting instead as a reservoir of available information received from a tool system or an external actor. In an aspect, such a memory can be identified as a meta database, in which multiple data types and procedural concepts can be stored. In a second tier, knowledge can be stored in a short term memory wherein concepts can be significantly manipulated and spread activation in semantic networks can take place. In such a memory tier, functional units or procedural concepts operate on received data, and concepts to generate new knowledge, or learning. A first tier memory can be a long term memory (e.g., LTM 2110) in which knowledge is maintained for active utilization, with significant new knowledge stored in this memory tier. In addition, knowledge in a long term memory can be utilized by functional units in short term memory.

At act 3450 the generated or stored knowledge is utilized. Knowledge can be employed to (i) determine a level of degradation of a goal component (e.g., tool system 1910) by identifying differences between stored knowledge and newly received data (see self-awareness component 2150), wherein the received data can be extrinsic (e.g., input 1730) or intrinsic (e.g., a portion of output 1740); (ii) characterize either extrinsic or intrinsic data or both, for example by identifying data patterns or by discovering relationships among variables (such as in a self-conceptualization component 2160), wherein the variables can be utilized to accomplish the established goal; or (iii) generate an analysis of the performance of the tool system that generates the data (e.g., self-optimization component 2170), providing indications of root cause for predicted failures or existing failures as well as necessary repairs or triggering alarms for implementing preventive maintenance before degradation of the tool system causes tool failure. It is to be noted that utilization of the stored and generated knowledge is affected by the received data—extrinsic or intrinsic—and the ensuing generated knowledge.

Act 3460 is a validation act in which the degree of accomplishment of a goal can be inspected in view of generated knowledge. In case the established goal is accomplished, example method 3400 can end. Alternatively, if the established goal has not been accomplished, the established goal can be reviewed at act 3470. In the latter, flow of method 2400 can lead to establishing a new goal in case a current goal is to be revised or adapted; for instance, goal adaptation can be based on generated knowledge. In case no revision of a current goal is to be pursued, flow of method 3400 is returned to generate knowledge, which can be utilized to continue pursuing the currently established goal.

FIG. 35 presents a flowchart 3500 of an example method for adjusting a situation score of a concept associated with a state of a goal component. At act 3510 a state of a goal component is determined a state typically is established through a context, which can be determined by various data input (e.g., input 1730), or through a network of concepts associated with the input and exhibiting specific relationships. The input data relates to a goal that is pursued by the goal component; for instance, a recipe for a coating process of a specific thin-film device can be deemed as input associated with a "deposit an insulating device" goal. At act 3520 a set of concepts that can be applied to the state of the goal component is determined. Such concepts can be abstractions of data types entered in act 3510 or can be existing concepts in a memory platform (e.g., long term memory 2110, or short term memory 2120). Generally, functional concepts that can act on descriptive concepts (e.g., concepts with no functional component) can be utilized more frequently towards achieving a goal. At act 3530 a situation score for each concept in a set of concepts associated with the goal state is determined a set of situation scores can establish a hierarchy for concept utilization or application, which can determine the dynamics of a goal, like goal adaptation or sub-goal creation/randomization. Adjustment of situation scores for specific concepts can drive goal accomplishment as well as propagation within a space of goals as part of goal adaptation.

FIG. 36 presents a flowchart 3600 of an example method for generating knowledge through inference. At act 3610 a concept is associated to a data type and a priority for the concept is determined. Priorities typically can be determined based on a probability of utilization of a concept, or a concept's weight. Such a weight can be determined through a function (e.g., a weighted sum, or a geometric average) of parameters that can represent the ease to utilize a concept (e.g., the complexity to operate on a data type), such a parameter can be identified with a concept's inertia, and the suitability parameter of a concept to describe a state (e.g., a number of neighboring concepts that can be related the concept). It should be appreciated that a priority can be time dependent as a consequence of explicitly time-dependent inertia and suitability parameters, or as a result of concept propagation. Time dependent priorities can introduce aging aspects into specific concepts and thus can promote knowledge flexibility (e.g., knowledge (for example, a paradigm employed to pursue a goal, such as a recipe for preparation of a nano-structured device) through concepts ceasing to be relevant in a particular knowledge scenario (e.g., node structure in a priority-based knowledge network). At act 3620 a semantic network for a set of prioritized concepts is established. It should be appreciated that the semantic network can comprise multiple sub-networks, wherein each of the multiple networks can characterize a set of relationships among concepts in a class. As an example, in a two-tier semantic network, a first sub-network can represent relationships among concepts derived from data types, whereas a second sub-network can comprise relationships among functional concepts (e.g., a planner autobot or uberbot, a conceptual autobot) describing operations that can be utilized to alter upon a data type. At act 3630 the set of priorities is propagated over the semantic network to make an inference and thus generate knowledge associated with the network of concepts. In an aspect, such propagation can be utilized to generate optimization plans for goal adaptation, or to predict failures in a system that pursues a specific goal.

Figure 37:
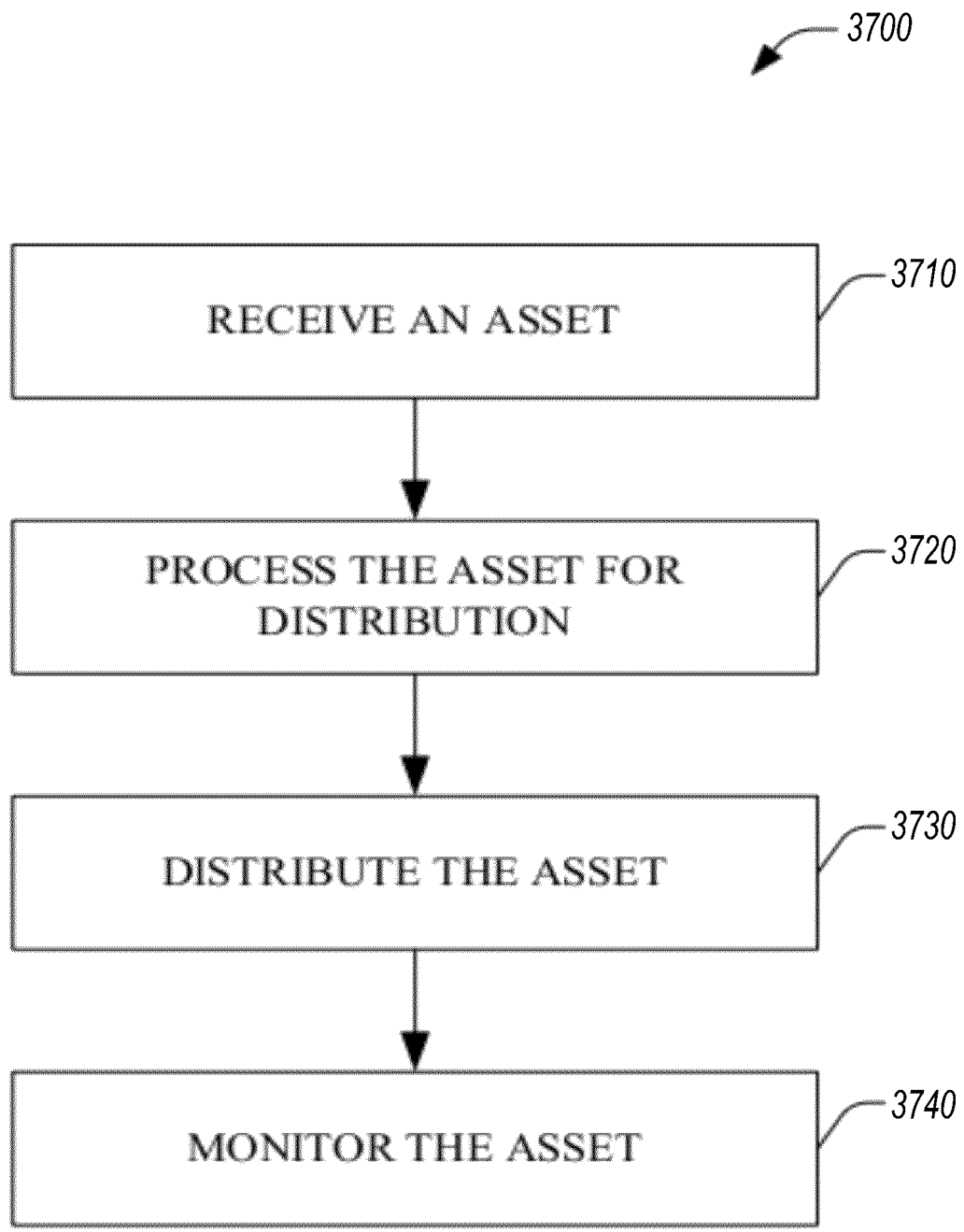
FIG. 37 presents a flowchart of an example method for asset distribution according to aspects disclosed herein.

FIG. 37 is a flowchart of an example method 3700 for asset distribution. Asset(s) can be provided by an individual autonomous tool, an autonomous group tool (e.g., system 2810), or an autonomous conglomerated tool system (e.g., system 2910). It should be appreciated that assets can be generated in alternative manners as well. At act 3710 an asset is received. In an aspect, the received asset can be an asset selected from output asset(s) generated by one or more autonomous tools. At act 3720 the received asset is processed for distribution. As discussed above, an asset typically carries advantages associated with knowledge utilized in generating the asset; thus, an asset can be packaged in such a manner that prevent a competitor to reverse-engineer the asset. It should be appreciated that depending on the destination of the asset, packaging information associated to the asset can be customized, delivering disparate levels of information based at least in part on whether the entity that receives the asset is a commercial partner, or a customer, or other branch, division, or group of an organization that fabricates the asset. The level of information packaged with the asset can follow specific policies (for example, policies stored in policy store 3292). Additionally, for data assets or computer program assets, such assets can be encrypted while being packaged in order retain integrity of the information conveyed by the asset. Moreover, part of the processing for distributing an asset can include retaining the asset in storage (e.g., asset store 3283) while a suitable distribution schedule is followed. In an aspect, such schedule can be optimized by an autonomous system (e.g., system 2960) that supports a tools system the fabricates, or produces, the asset to be distributed.

At act 3730 the processed asset is distributed. Distribution typically depends on the asset features and characteristics, as well as on the destination of the asset. For example, assets can be distributed within a factory plant, in order to complete asset production like in an assembly line wherein an unfinished vehicle (e.g., an asset) can be transported through different stages of assembly. Similarly, in the food industry, a frozen meal (e.g., asset) is distributed throughout a food preparation plant. Alternatively, or in addition, depending on industry, an unfinished asset can be distributed to overseas to be finished in order to benefit from cost-effective production markets.

At act 3740, a distributed asset is monitored in order to ensure, for example, the asset distribution adheres to applicable distribution regulation, or to ensure adequate inventory replenishment by having access to distribution status of the asset. In addition, monitoring distribution of the asset can mitigate losses and damages, as well as can facilitate interaction with commercial partners and customers.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

The invention claimed is:

1. A method, comprising:
    processing a workpiece through a plurality of processing modules hosted on a common manufacturing platform, the workpiece comprising a plurality of electronic devices, wherein the processing includes performing a process sequence having at least one film-forming process and at least one etching process or film-treatment process;
    gathering fabrication measurement data of the workpiece on the common manufacturing platform, wherein the fabrication measurement data is a measurement of an attribute of the workpiece based on at least a portion of the process sequence performed on the common manufacturing platform;
    gathering in-situ process measurement data from a workpiece being processed in at least one of the processing modules that is performing a process of at least a portion of the process sequence;
    detecting non-conformities of the workpiece based on at least one of the gathered fabrication measurement data and the in-situ process measurement data; and
    performing active interdiction to the process sequence when non-conformities are detected to execute corrective processing of the workpiece in the process sequence on the common manufacturing platform after the at least one of the fabrication measurement data and the in-situ process measurement data has been gathered, wherein
    the common manufacturing platform includes a first transfer measurement module and a second transfer measurement module,
    each of the first and second transfer measurement modules includes a respective measurement module,
    the first transfer measurement module is connected to the second transfer measurement module via a first pass through chamber,
    the second transfer measurement module is connected to a workpiece batch/de-batch module via a second pass through chamber, and
    each processing module from the plurality of processing modules is connected to one of the first transfer measurement module and the second transfer measurement module.

2. The method of claim 1, wherein the corrective processing includes at least one of varying processing in a processing module on the common manufacturing platform, or discarding the workpiece, or notifying an operator of the non-conformities.

3. The method of claim 2, wherein the gathering of in-situ process measurement data occurs in-situ in the processing module during a process step of the process sequence.

4. The method of claim 3, wherein the corrective processing occurs in-situ in a same processing module where the in-situ process measurement data was obtained.

5. The method of claim 1, wherein the gathering of fabrication measurement data occurs ex-situ of the processing module and within the common manufacturing platform.

6. The method of claim 3, wherein the corrective processing occurs ex-situ of the processing module where the process measurement data was gathered and within the common manufacturing platform.

7. The method of claim 1, further comprising:
gathering at least one of process parameter data regarding the operation of one or more processing modules or platform performance data regarding the operation of the common manufacturing platform; and
performing active interdiction to a process sequence of a subsequent workpiece based on at least one of fabrication measurement data, the process parameter data, or the platform performance data.

8. The method of claim 1, wherein active interdiction to a process sequence comprises exposing the workpiece to a remedial process sequence to correct the non-conformities.

9. The method of claim 8, wherein the remedial process sequence comprises at least one of cleaning the workpiece, removing a film from the workpiece, or removing a portion of the film from the workpiece.

10. The method of claim 8, wherein the remedial process sequence is performed on the common manufacturing platform.

11. The method of claim 9, wherein the remedial process sequence is performed external to the common manufacturing platform.

12. The method of claim 8, wherein the remedial process sequence comprises cleaning the workpiece using cryogenically cooled spray.

13. The method of claim 1, wherein active interdiction to a process sequence comprises exposing the workpiece to an adjustment process sequence to modify the non-conformities detected.

14. The method of claim 13, wherein the adjustment process sequence comprises controlling one or more process conditions based, at least in part, on fabrication measurement data or in-situ process measurement data from which a non-conformity is detected.

15. The method of claim 13, wherein the adjustment process sequence comprises controlling one or more process conditions of a processing module based, at least in part, on a model corresponding to correction of the non-conformities.

16. The method of claim 13, wherein the adjustment process comprises alternating between a film-forming process, an etching process, and a film-treatment process.

17. The method of claim 1, further comprising gathering fabrication measurement data of the workpiece after performing active interdiction to determine impact on the non-conformities based on the active interdiction.

18. The method of claim 17, further comprising continuing the process sequence for a workpiece based on the determined impact on the non-conformities.

19. The method of claim 1, wherein the fabrication measurement data is a measurement associated with an attribute including one or more of the following: a layer thickness, a layer conformality, a layer coverage, a layer profile, an edge placement location, an edge placement error (EPE), a critical dimension (CD), a block critical dimension (CD), a grid critical dimension (CD), a line width roughness (LWR), a line edge roughness (LER), a block LWR, a grid LWR, a property relating to selective deposition, a property relating to selective etch, a physical property, an optical property, an electrical property, a refractive index, a resistance, a current, a voltage, a temperature, a mass, a velocity, an acceleration, or a combination thereof associated with fabricated electronic devices on the workpiece.

20. The method of claim 7, wherein the process parameter data comprises an indication of one or more process conditions executed in the processing modules.

21. The method of claim 20, wherein the process conditions are based on at least one of plasma density, plasma uniformity, plasma temperature, etch rate, etch uniformity, deposition rate, and/or deposition uniformity.

22. The method of claim 20, wherein the process conditions comprise at least one of amplitude, frequency, modulation of energy that is applied to a plasma source disposed within the processing module.

23. The method of claim 20, wherein the process conditions comprise gas flow rates being flowed into the processing module during the process sequence.

24. The method of claim 20, wherein the process conditions comprise temperature of a workpiece holder disposed within the processing module.

25. The method of claim 20, wherein the process conditions comprise pressure in the process module during the process sequence.

26. The method of claim 20, wherein the platform performance data comprises at least one of an indication of a platform attribute contributing to the execution of the process sequence or an indication of how long a process module has been exposed to the process sequence.

27. The method of claim 26, wherein the platform attribute comprises process cooling water temperature, process cooling water flow rate, process module processing time, process module cumulative thickness.

* * * * *

UNITED STATES PATENT AND TRADEMARK OFFICE
CERTIFICATE OF CORRECTION

PATENT NO. : 11,101,173 B2
APPLICATION NO. : 16/356372
DATED : August 24, 2021
INVENTOR(S) : Clark et al.

It is certified that error appears in the above-identified patent and that said Letters Patent is hereby corrected as shown below:

On the Title Page

Column 1, Item (54), Line 4, and in the Specification, Column 1, Line 4, insert --AND TRANSFER MEASUREMENT-- after "PROCESSING".

Signed and Sealed this
Nineteenth Day of April, 2022

Katherine Kelly Vidal
*Director of the United States Patent and Trademark Office*